United States Patent [19]

Etoh et al.

[11] Patent Number: 5,526,313
[45] Date of Patent: Jun. 11, 1996

[54] LARGE SCALE INTEGRATED CIRCUIT WITH SENSE AMPLIFIER CIRCUITS FOR LOW VOLTAGE OPERATION

[75] Inventors: Jun Etoh, Hachioji; Kiyoo Itoh, Higashikurume; Yoshiki Kawajiri, Hachioji; Yoshinobu Nakagome, Hachioji; Eiji Kume, Hachioji; Hitoshi Tanaka, Tachikawa, all of Japan

[73] Assignees: Hitachi Ltd.; Hitachi VLSI Engineering Corporation, both of Tokyo, Japan

[21] Appl. No.: 104,508

[22] Filed: Aug. 10, 1993

Related U.S. Application Data

[63] Continuation of Ser. No. 366,869, Jun. 14, 1989, Pat. No. 5,297,097.

[30] Foreign Application Priority Data

Jun. 17, 1988 [JP] Japan .................................. 63-148104
Sep. 7, 1988 [JP] Japan .................................. 63-222317
Feb. 10, 1989 [JP] Japan .................................. 1-29803
Mar. 20, 1989 [JP] Japan .................................. 1-66175

[51] Int. Cl.⁶ ......................................................... G11C 7/00
[52] U.S. Cl. ........................... 365/205; 365/190; 365/203
[58] Field of Search ................................... 365/190, 226, 365/203, 205, 207, 208

[56] References Cited

U.S. PATENT DOCUMENTS

| | | | |
|---|---|---|---|
| 4,780,850 | 10/1988 | Miyamoto | 365/205 |
| 4,780,852 | 10/1988 | Kajigaya | 365/205 |
| 4,943,952 | 7/1990 | Terayama | 365/207 |
| 4,961,166 | 10/1990 | Sato | 365/207 X |
| 4,962,482 | 10/1990 | Jinbo | 365/207 X |
| 5,046,052 | 9/1991 | Miyaji et al. | 365/226 |
| 5,227,697 | 7/1993 | Sakagami | 365/203 |

Primary Examiner—David C. Nelms
Assistant Examiner—Son Mai
Attorney, Agent, or Firm—Fay, Sharpe, Beall, Fagan, Minnich & McKee

[57] ABSTRACT

Disclosed is a one-chip ULSI which can carry out the fixed operation in a wide range of power supply voltage (1 V to 5.5 V). This one-chip ULSI is composed of a voltage converter circuit(s) which serves to a fixed internal voltage for a wide range of power supply voltage, an input/output buffer which can be adapted to several input/output levels, a dynamid RAM(s) which can operate at a power supply voltage of 2 V or less, etc. This one-chip ULSI can be applied to compact and portable electronic devices such as a lap-top type personal computer, an electronic pocket note book, a solid-state camera, etc.

12 Claims, 129 Drawing Sheets

FIG. 13

|  | N CHANNEL MOS-FET | P CHANNEL MOS-FET |
|---|---|---|
| GATE OXIDE THICKNESS $t_{OX}$ (nm) | 6.5 (5~8) | 6.5 (5~8) |
| EFFECTIVE CHANNEL LENGTH $L_{eff}$ (μm) | 0.3 (0.2~0.4) | 0.3 (0.2~0.4) |
| GATE THRESHOLD VOLTAGE — $V_{TO}$ (V) | 0.1 (0~0.2) | −0.1 (−0.2~0) |
| GATE THRESHOLD VOLTAGE — $V_{TI}$ (V) | 0.3 (0.2~0.4) | −0.3 (−0.4~−0.2) |

(PERIFERAL CKT)

(MEMORY CELL ARRAY)

| | LOW INPUT (T₁₀₀ CUT OFF, T₁₀₁ ON) | HIGH INPUT (T₁₀₀ ON, T₁₀₁ CUT OFF) |
|---|---|---|
| $T_{101}$ | $V_{CC} - V_P + |V_{TP}|$ | $V_{CC} - V_P + |V_{TP}|$ |
| $T_{103}$ | $V_{CC} - V_P$ | $V_P$ |
| $T_{102}$ | $V_{CC} - V_n$ | $V_n$ |
| $T_{100}$ | $V_n - V_{TN}$ | $V_n - V_{TN}$ |

MAXIMUM VOLTAGE APPLIED TO GATE ELECTORODE

F I G. 24
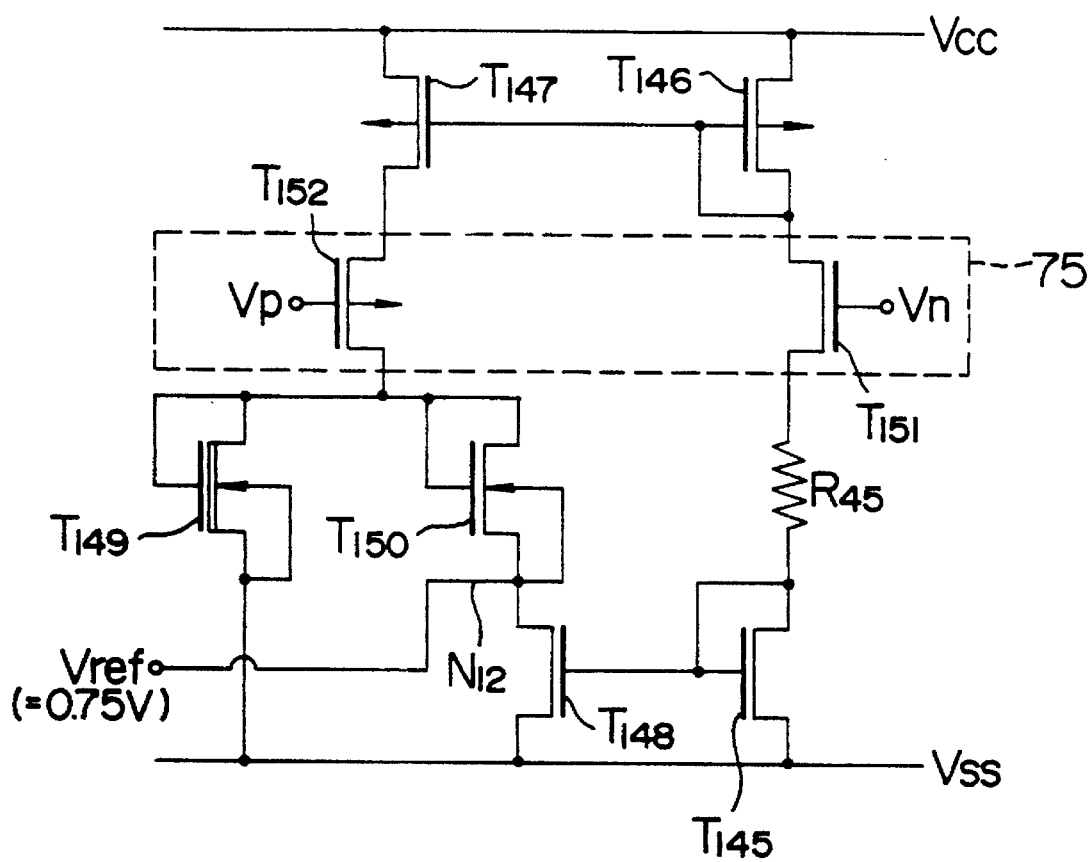

F I G. 34A
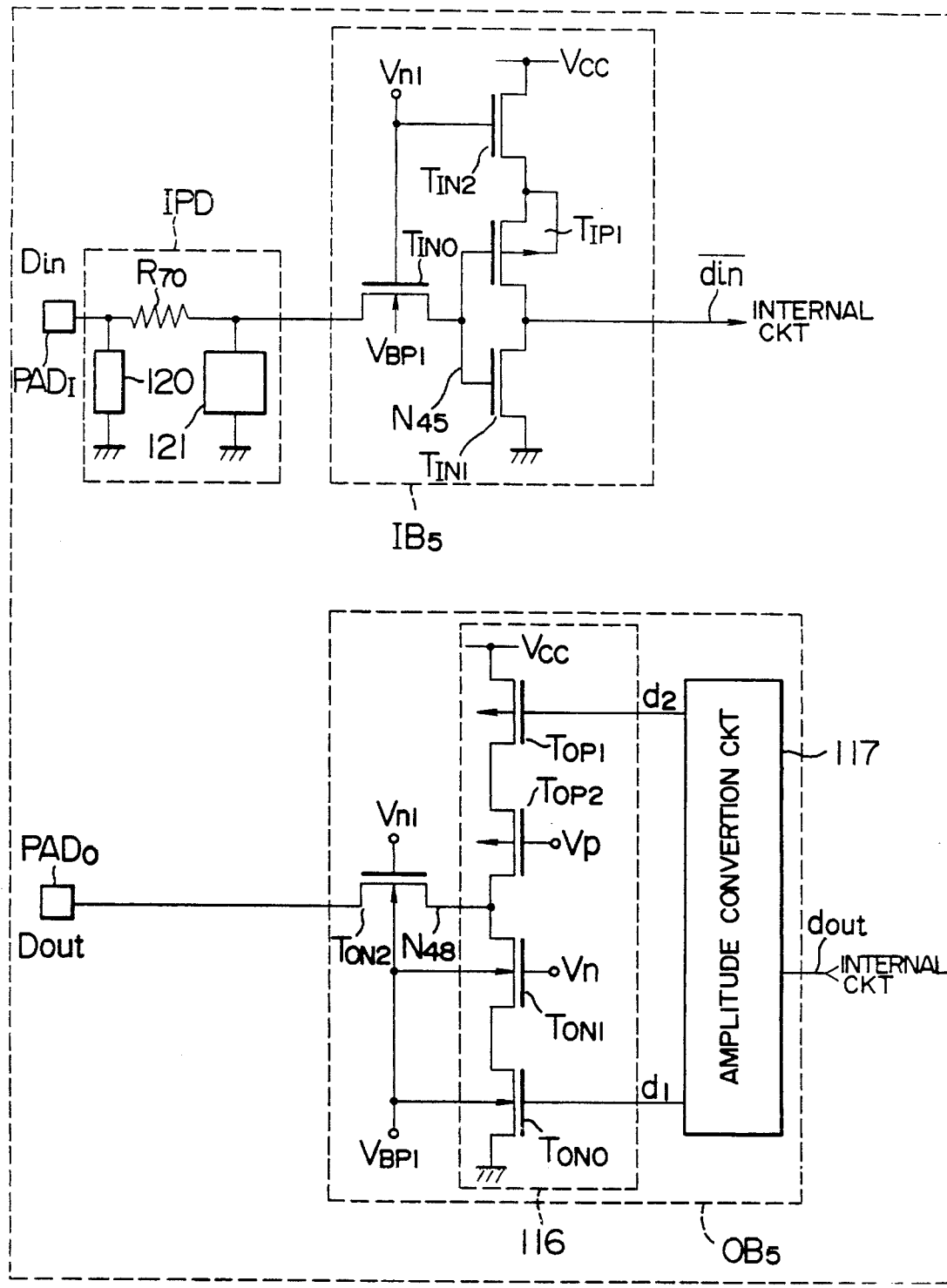

LARGE SCALE INTEGRATED CIRCUIT WITH SENSE AMPLIFIER CIRCUITS FOR LOW VOLTAGE OPERATION

This application is a continuation of application Ser. No. 07/366,869 filed Jun. 14, 1989, now U.S. Pat. No. 5,297,097.

BACKGROUND OF THE INVENTION

The present invention relates to a large scale integrated circuit, and more particularly to a high-density integrated semiconductor device constituted by a voltage converter circuit and miniaturized devices (devices with small dimension) which can keep up with a wide range of an operating power-supply voltage and kinds of power supplies, i.e. a large scale integrated circuit in which integrated on a monolithic chip are a microcomputer, a logic circuit, a dynamic RAM (random access memory), a static RAM, a ROM (read-only memory), etc.

In recent years, onto the market have come portable electronic machines such as a lap-top type personal computer, an electronic pocket notebook, etc., and portable electronic media machines such as a solid-state voice recorder which performs voice recording without using a magnetic medium, a solid-state camera (electronic still camera) which performs image recording without using the magnetic medium. In order for these portable electronic machines to be widely popularized, it is indispensable to realize an ultra large scale integrated circuit (ULSI) which permits a battery based operation or an information (data) retention operation using a battery (battery back-up). On the other hand, there has been increased demand for a semiconductor disk, which can provide higher speed accessing than a magnetic disk, as a large-capacity-file memory system for implementing a computer with higher performance. And this semiconductor disk requires a very large-capacity memory LSI which can perform the information using a battery.

The ULSIs used for these applications must satisfy the following requirements.

(1) The operation in a wide range of operating power supply voltage (1–5.5 V). This requirement permits one-chip ULSI to be adapted for many kinds of power supplies including, e.g. 5 V which is a standard power supply voltage for the present TTL compatible digital LSI, 3.3 V which is one candidate for the standard power supply voltage for the future TTL reversible digital LSI, 3–3.6 V which is a typical output voltage of a primary cell of lithium, etc., 1.2 V which is a typical output voltage of a secondary cell of cadmium and nickel, and so on.

(2) The measures for a secular change or time-dependent fluctuation (for a short period or long period) in the power supply voltage. This requirement removes fear of operation failure due to voltage fluctuation resulting from the secular change in the cell voltage and the switching of power supply in shifting between the operation under a nominal condition and a battery back-up operation.

(3) The power reduction in the standard operation or the battery back-up operation. This requirement permits a small-sized battery to operate the ULSI for a long period.

(4) The reduction in a switching current. This requirement decreases voltage fluctuation caused by switching in the battery voltage, thus preventing the operation failure.

One example of the product of microprocessor which operates in a wide range of the operating voltage is disclosed in the 4-bit microprocessor handbook, p 148 published by NIPPON DENKI Co., Ltd. The product name is μPD7507SC. The range of the power supply voltage in this microprocessor is 2.2–6.0 V. Information in a data memory (static RAM) is retained with a minimum voltage of 2 V. In this memory, the recommendable voltage is generally 5 V for the operating power supply voltage and for 2 V the data retention.

An example of the dynamic memory for battery back-up in which power consumption in the data retention (refresh) is decreased is disclosed in IEEE, Journal of Solid-State Circuits, Vol. 23, No. 1, pp. 12–18, February 1988. The power supply voltage is 5 V for both nominal operation and data retention.

An example in which an external voltage is dropped to be supplied to an internal circuit is disclosed in U.S. Pat. No. 4,482,985.

An example of the battery back-up for a memory is disclosed in U.S. Pat. No. 4,539,660.

A technique for changing the plate voltage of a dynamic RAM is disclosed in Japanese Patent Publication No. 61-61479.

The battery back-up of a static RAM is disclosed in the catalogue published by Hitachi, Ltd., pp. 44–45.

The other relevant references and patent publications will be identified in the following description.

SUMMARY OF THE INVENTION

The present invention intends to lower the operation voltage of a system provided on a monolithic chip so that the operation speed is not affected by changes in the power supply voltage supplied from the outside.

The present invention has been accomplished by devising voltage converter means which is capable of stably supplying a fixed voltage in a wide range of power-supply voltage. The voltage converter means in the present invention is referred to as means including at least one amplifier which generates an output voltage on the basis of an input reference voltage, and is different from means of only dropping voltage using resistors, etc.

In the present invention, it is also critical to improve a dynamic RAM which is the biggest obstacle against lowering the operation voltage. This is because the dynamic RAM requires a refresh operation even during data retention due to its dynamic operation and so does not permit only the operation voltage during data retention to be lowered unlike the static RAM.

The microprocessor and static RAM as mentioned above have a wide range of the operating power-supply voltage of 2–5 V. However, since they are designed around the power supply voltage of 5 V, the operation speed thereof (the highest clock frequency in the case of the microprocessor and access time in the case of the static RAM) is not assured for the operation outside the recommended fluctuation (generally, +10%) in the power supply voltage. Particularly at a low power supply voltage, it is common that the operation speed is greatly lowered. The dependency of the operation speed on the power-supply voltage is different with the products. Therefore, the operation speed of a system must be designed to accord with the lowest one of the operation speeds of LSIs constituting the system. This made it impossible to provide a necessary performance of the system for the operation outside at 5 V and difficult to design the system for the operation at a low power supply voltage.

These LSIs, the lowest operating power supply voltage of which is 2.2 V, are difficult to adapt to all of many power kinds of power supply voltages as mentioned above, which is a restriction to system design. Further, the dynamic RAM to be incorporated in the system, the lowest operating power supply voltage of which is 4.5 V, are further difficult to adapt to the many kinds of power supply voltages. Particularly, the absence of difference between the power supply voltage for normal operation and that for data retention made very complicated the arrangement of a power supply switching circuit, thereby making the data retention difficult.

Meanwhile, with rapid development of miniaturization (scaling down) of semiconductor devices, by using the processing technology lower than 0.5 μm, it is possible to constitute a so-called system LSI in which several LSI blocks are integrated on a monolithic chip. In such a system LSI, it is required that the operating power-supply voltage ranges and operating speeds of the respective LSI blocks are aligned with each other. However, as mentioned above, only combining the conventional LSIs could not constitute such a system LSI.

The present invention can be constituted by an LSI circuit block which has a power down mode suited for battery back-up can operate at a low power supply voltage of about 1 V at the minimum; a power supply voltage converter circuit which supplies an internal power supply voltage suitable to the operating mode to the LSI; and an input/output circuit for converting the signal amplitude.

By operating the main LSI block, which performs storage and processing of information, at a substantially fixed low voltage regardless of the external power supply voltage, it is possible to provide substantially constant operation speed performance over a wide range of the power supply voltage. The external power supply voltage can be reduced to the operation voltage of the LSI block as required so that power consumption during data retention can be reduced to a necessary and minimum value and also a battery back-up circuit can be simplified in its constitution. Further, the optimum operation voltage according to the characteristic of miniaturized devices constituting the main LSI block can be set independently of the external power supply voltage so that performances of high integration degree, high operation speed, and low power consumption can be obtained simultaneously.

An object of the present invention is to provide a large scale integrated circuit (LSI) which can operate at a fixed operation speed against wide range fluctuation of an operating power supply voltage.

Another object of the present invention is to provide voltage converter means which can produce a constant output voltage against wide range fluctuation of the operating power supply voltage.

Still another object of the present invention is to reduce power consumption in an LSI and particularly the power consumption during battery based operation.

Yet another object of the present invention is to prevent operation failure of an LSI which performs a low voltage operation.

A further object of the present invention is to provide an LSI with a plurality of input/output levels.

A further object of the present invention is to provide a dynamic RAM which can perform a low voltage operation.

A further object of the present invention is to improve a sense amplifier used for the dynamic RAM which performs a low voltage, and its operation.

These and other objects and many of the attendant advantages of the present invention will be readily appreciated as the same become better understood by reference the following detailed description when considered in connection with the accompanying drawings.

BRIEF DESCRIPTION OF THE DRAWINGS

FIGS. 1A to 19B are views showing the basic idea of the present invention and embodiments relative to improvement of a voltage converter, etc. used in the present invention;

FIGS. 20A to 36C are views showing embodiments relative to improvement of an input/output buffer, etc. used in the present invention;

DESCRIPTION OF THE PREFERRED EMBODIMENTS

The present invention intends to an LSI which can operate at a wide range of an operating power supply voltage (for example 1 to 5.5 V). The following description discloses four techniques roughly classified:
(1) a voltage converter (limiter) which can produce a stabilized internal power supply voltage even in a wide range of the operating power supply voltage,
(2) an input/output buffer which can be adapted to several input/output levels,
(3) a dynamic RAM which can operate at a power supply voltage of 2 V or less, and
(4) a sense amplifier suited for the dynamic RAM operating at a low voltage and its operation.

These techniques enables one (single) chip LSI to perform a stabilized operation by many kinds of power supplies including a battery (e.g. 1.2 V) to a normal power supply (e.g. 5 V). It is apparent that the following embodiments can be combined and also it can be understood by those skilled in the art that only necessary parts may be adopted without aparting from the spirit of the present invention.

EMBODIMENTS

Figure 1A:
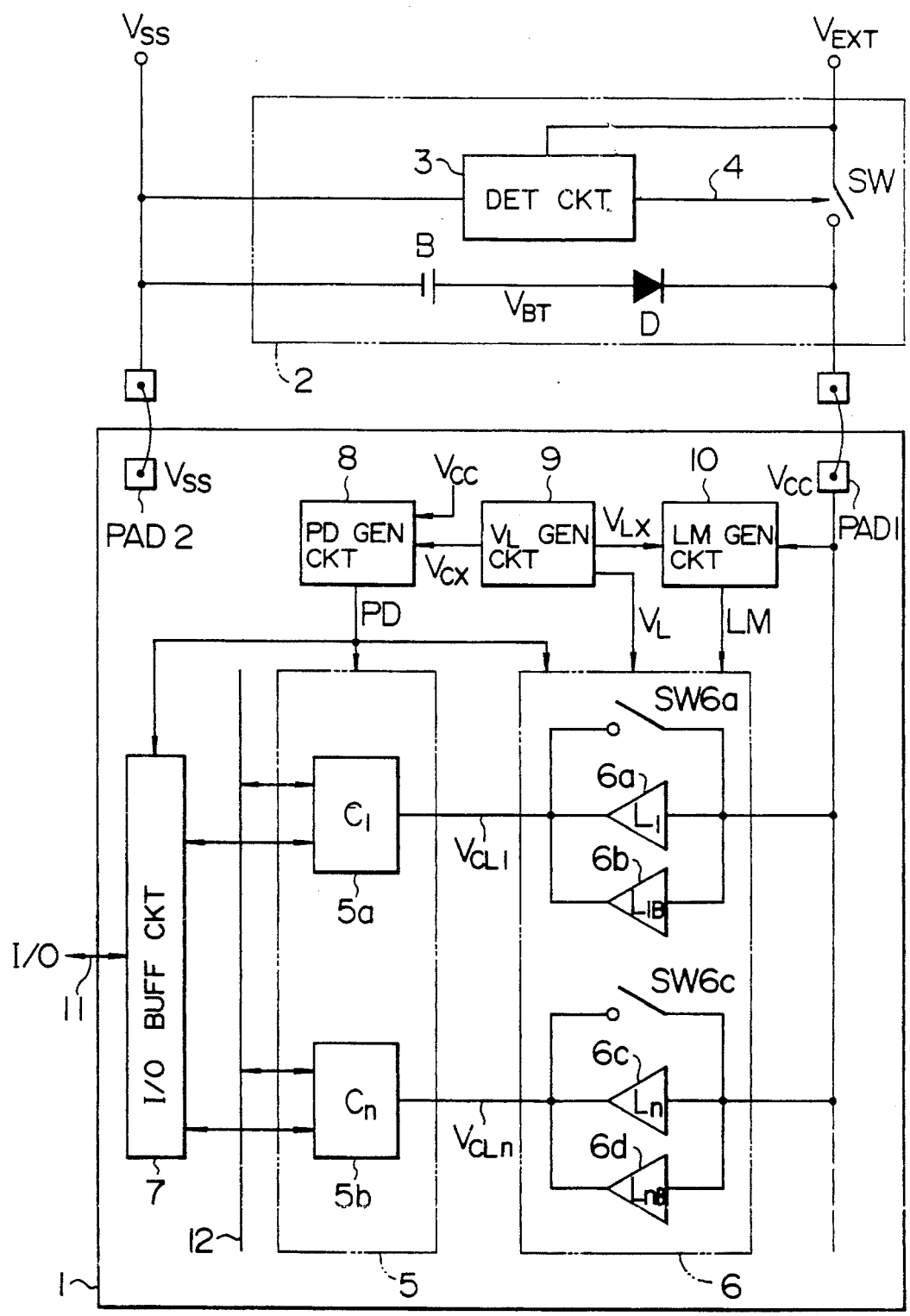
Figure 1B:
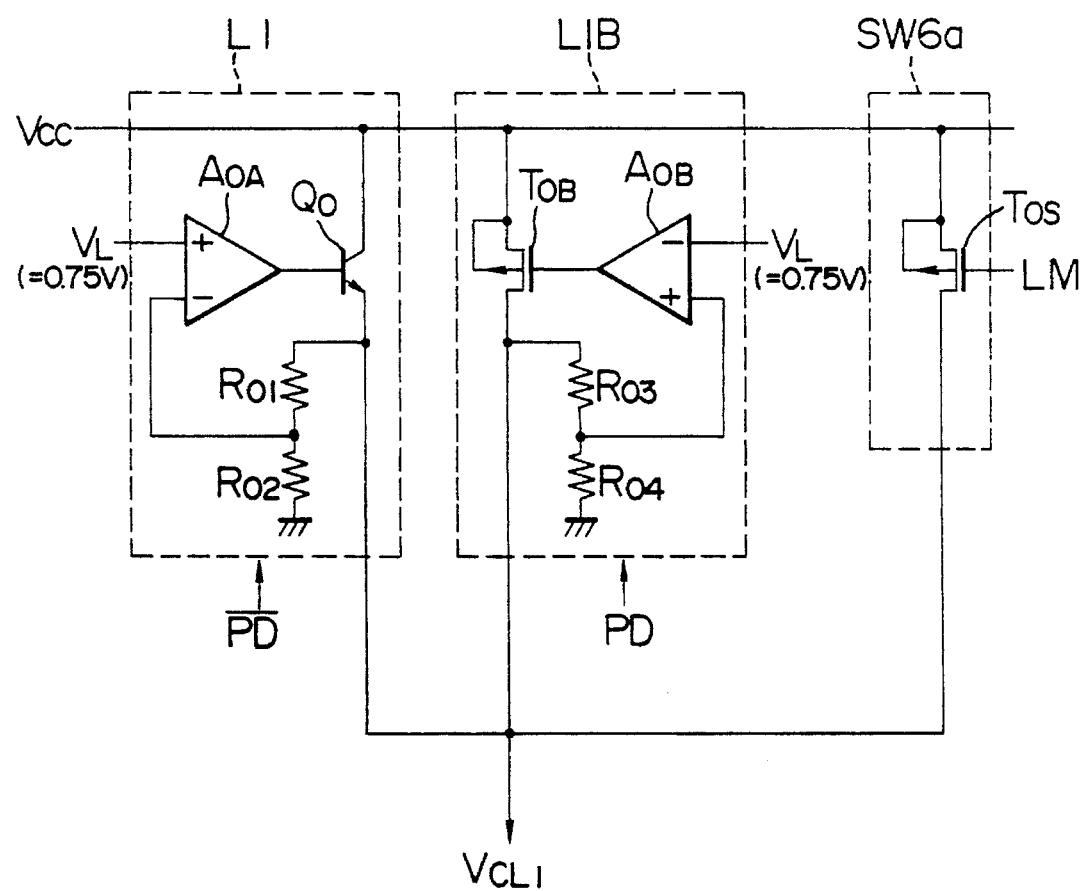

FIGS. 1A and 1B are block diagrams for explaining the basic idea of an LSI chip in accordance with the present invention. In these figures, numeral 1 is an LSI chip which has functions of data storage and/or data processing. This LSI chip may be in any form of an memory LSI including a dynamic or static RAM, a serial access memory (SAM) and read-only-memory (ROM); a logic LSI including a microprocessor (MPU), a memory management unit (MMU) and a floating point operation unit (FPU); and a system LSI in which a plurality of these LSIs are integrated. The individual devices constituting the LSI chip may be bipolar transistors, metal-insulator-semiconductor (MIS) transistors (generally, metal-oxide-semiconductor (MOS) FET), combination of these devices, or devices or material other than Si e.g. GaAs. Numeral 2 is an exemplary power supply circuit which detects a drop of an external power supply voltage (Vext) to shift the LSI chip into a back-up state by a battery. This power supply circuit serves to prevent data stored in the LSI chip from disappearing even when Vext is lowered due to shut-down of the commercially available power source. In this power supply circuit, numeral 3 is a voltage drop detection circuit for the power supply voltage, SW is a switch for preventing current from flowing the battery to an external power supply terminal during data retention, numeral 4 is a control signal for the switch, B is a battery by which the entire LSI chip operates in the data retention mode (Vbt is its voltage), and D is a diode for preventing current from flowing the external power supply into the battery in the normal operation mode. This power supply circuit applies to a power supply terminal Vext during normal operation and Vbt–0.7 V (0.7 V is voltage drop in the forward direction of the diode D) during data retention. Although the voltage Vext for normal operation is now assumed to be 3.3±0.3 V which is proposed as a future TTL standard power supply voltage, it may be 5 V which is the present TTL standard power supply voltage or the other voltage value. Vbt may be 3 V from the primary cell, 2.4 V from two secondary cells connected in series, etc. In the following example, explanation will be given for the case where Vext varies in the range of 3.3±0.3 V and Vbt varies in the range of 1–2 V.

Numerals 5a and 5b are a main circuit block, respectively. Numeral 5 is a collection thereof. Numeral 6 is a power supply voltage converter circuit block for converting a power supply voltage Vcc supplied from the outside of the LSI chip into internal power supply voltages $V_{CL1}$, and $V_{CLn}$ for the respective circuit blocks. In the power supply voltage converter circuit, numerals 6a and 6c are a converter circuit for normal operation, respectively, and numerals 6b and 6d are a converter circuit for data retention.

In the present invention, the external power supply voltage Vext in a wide range (e.g. 1–5.5 V) so that only one power supply voltage can not cover this wide range. This is because the power supply voltage converter circuits in the present invention serve to produce output voltages ($V_{CL1}$, $V_{CL2}$) on the basis of an input reference voltage $V_L$. For this reason, a plurality of the power supply voltage converter circuits are provided.

The power supply voltages for the circuit blocks are produced on the basis of the reference voltage as mentioned above. For this reason, if the external power supply voltage Vext or the battery voltage Vbt becomes equal to the reference voltage $V_L$ (or the internal voltage $V_{CL1}$–$V_{CL2}$), the operation of the voltage converting circuits become unstable. For such a case, a switch 6a is provided to connect the external power supply voltage with the circuit blocks 5a and 5b.

In an example of the present invention, the internal power supply voltages (e.g. $V_{CL1}$, $V_{CL2}$) for the main circuit blocks 5a and 5b are adapted to be 1.5 V. In this case, if the external power supply voltage varies in a wide range of 1.5 V to 3.6 V, it is difficult to produce the internal power supply voltage using only one voltage converter. For this reason, a plurality of the voltage converter circuits L1 and L1B are provided. The voltage converter circuit L1b mainly serves to convert the power supply voltage of 2.5 to 3.6 V into 1.5 V to be supplied to the main circuit 5a (C1) and the voltage converter L1B mainly serves to convert the power supply voltage 1.5 to 2.5 V to be supplied to the main circuit 5a. Switching of L1 and L1B is controlled by a data retention state signal PD as described later.

Generally, the operation voltage and current required during data retention may be smaller than during normal operation so that even when the current to be consumed in the voltage converter circuits is reduced to lower the driving capability thereof, any trouble does not occur. This enables the current consumed in the entire LSI chip to be remarkably reduced together with reduction in the power consumption in the main circuit blocks. Incidentally, although in this example, switching is made between two voltage converter circuits, three or more voltage converters may be provided. Also, only one voltage converter circuit may be used to vary its output voltage and power consumption.

As mentioned above, SW6a and SW6c are a switch for directly apply the power supply voltage Vcc to the circuit blocks when Vcc is decreased to a value substantially equal to $V_{CL1}$ or $V_{CLW}$. By using this switch to turn off the voltage converter circuits, the consumed current can be further reduced. Although in the above example, the power supply voltage converter circuit 6 is constituted by a plurality of switches and a plurality of voltage converter circuits, only one voltage converter circuit may be used when viewed in a block form as long as the same effect can be obtained.

Numeral 9 is a circuit for generating the reference voltage V on the basis of which the internal power supply voltage $V_{CL1}$ or $V_{CL2}$ is created. Numeral 8 is a circuit for generating a signal PD indicative of the data retention operation state. Although the signal PD can be generated through several techniques, there is here adopted a method of comparing the power supply voltage Vcc with a reference voltage Vcx and producing the signal PD when the former is smaller than the latter. Numeral 10 is a circuit for generating a limiter enable signal LM. If the external power supply voltage is higher than the internal power supply voltage, thereby operating the voltage converter circuit (voltage limiter), LM of a high voltage ("1") is generated whereas if the external power supply voltage is decreased to a value equal to the internal power supply voltage, LM of a low voltage of ("0") is generated. In the latter case, the external power supply voltage is directly applied to the main circuit block and also the voltage converter is not operated to restrain power consumption. In the example as shown, when the power supply voltage Vcc is compared with the reference voltage Vcx, and LM is generated if the former is larger than the latter. The output voltage and consumed current of the power supply voltage converter circuit 6 can be changed using the above two signals PD and LM.

Numeral 7 is an input/output buffer circuit; numeral 11 is an input/output bus for transmitting/receiving control signals and data between the inside and the outside of the chip; and numeral 12 is an internal bus which is within the chip and serves to transmit/receive control signals and data. The input/output buffer circuit 7, which also serves as a voltage level converting circuit, can transmit/receive the control signals and data even if the logic swing in the chip does not coincide with that in the outside. In the data retention operation state, the control signals and data are not required to be transmitted/received between the inside and the outside of the chip so that the input/output buffer circuit 7 is turned off by the data retention state signal PD. Thus, the power consumption can be reduced.

FIG. 1B shows an exemplary concrete construction of the power supply voltage converter circuit 6. In this figure, L1 is constituted by a differential amplifier circuit $A_{OA}$, an NPN bipolar circuit $Q_O$, and resistors $R_{O1}$, $R_{O2}$. With $R_{O1}=R_{O2}$, and the input reference voltage $V_L$=0.75, 1.5 V which is twice as large as $V_L$ is provided at the output of $V_{CL1}$. If the power supply voltage $V_{cc}$ in the voltage converter circuit L1 is decreased to be $V_{cc} < V_{cL1} + V_{BE}$ ($V_{BE}$ is a base-emitter voltage of the bipolar transistor $Q_O$ which is about 0.7 V), the output voltage $V_{CL1}$ is decreased. Thus, the voltage converter circuit L1 operates when $V_{cc}$ is 2.2 V. In the example of FIG. 1B, as a voltage converter circuit operating when $V_{cc}$ is lower than 2.2 V, L1B is arranged in parallel to L1 and at the low voltage of $V_{cc}$, L1 is switched into L1B. The voltage converter circuit L1B is constituted by a differential amplifier circuit $A_{OB}$, a p-channel MOS transistor $T_{OB}$, and resistors $R_{O3}$, $R_{O4}$. Also in this case, with $R_{O3}=R_{O4}$ and the input reference voltage $V_L$=0.75 V, 1.5 V is provided at the output voltage of $V_{CL1}$. This voltage converter circuit L1B uses the p-channel MOS transistor as a device for supplying the power supply current, so that it advantageously operates in the range where $V_{cc}$ is close to $V_{CL1}$. However, the voltage converter circuit V1 a disadvantage that it is necessary to make careful consideration for the phase characteristic of a feedback loop since the voltage gain of the MOS transistor itself is larger than 1, thereby making difficult the designing of the voltage converter circuit. Particularly, in the case where the voltage converter circuit is to be operated in a wide range of the power supply voltage of 1.5 to 3.6 V, it is difficult to design the voltage converter circuit so that it can operate over the entire range of the power supply voltage since the p-channel MOS transistor operates in both saturation region and linear region. In this example, by designing L1 so that it operates in a narrow range of the power supply voltage of 1.5 to 2.5 V, the operation of L1B can be stabilized. In the case where the power supply voltage is 1.5 V or less, it is directly supplied to the internal circuit (circuit block 5a) by making the switch SW 6a conductive. Here, a p-channel MOS transistor $T_{OS}$ is used as the switch.

Further, as a value of the input reference voltage $V_L$ in the power supply voltage converter circuit, 1.5 V itself which is the internal power supply voltage is not adopted. This is due to the following two reasons:

(1) If the power supply voltage is close to the reference voltage level, the voltage stabilizing characteristic of the reference voltage generating circuit is generally deteriorated, thereby reducing the reference voltage level.

(2) The upper limit of the in-phase input range in the differential amplifier circuit is generally slightly lower than the power supply voltage level. Therefore, in order to sufficiently use the characteristic of the differential amplifier circuit, the input reference voltage is desired to be lower than the power supply voltage (1.5 V at the minimum).

By setting the input reference voltage at a level lower than the minimum value of the power supply voltage, the power supply voltage converter circuit can be stably operated in the range where difference between the external power supply voltage and the internal power supply voltage is small. Incidentally, L1 and L1B are activated by a $\overline{PD}$ signal and PD signal, respectively.

Further, in the above example, a bipolar transistor is used in L1 and a p-channel MOS transistor is used in L1B. However, a p-channel MOS may be used for L1 and L1B. Also in this case, since the phase characteristic of the circuits can be individually designed, a more stabilized power supply converter circuit can be provided than the case where only one voltage converter is used. Moreover, by means of the combination of the other devices without being limited to that of the above devices, if the voltage condition adapted for the characteristic of the devices is selected, a power supply voltage converter circuit which can operate in a wide range of the power supply voltage.

Figure 1C:
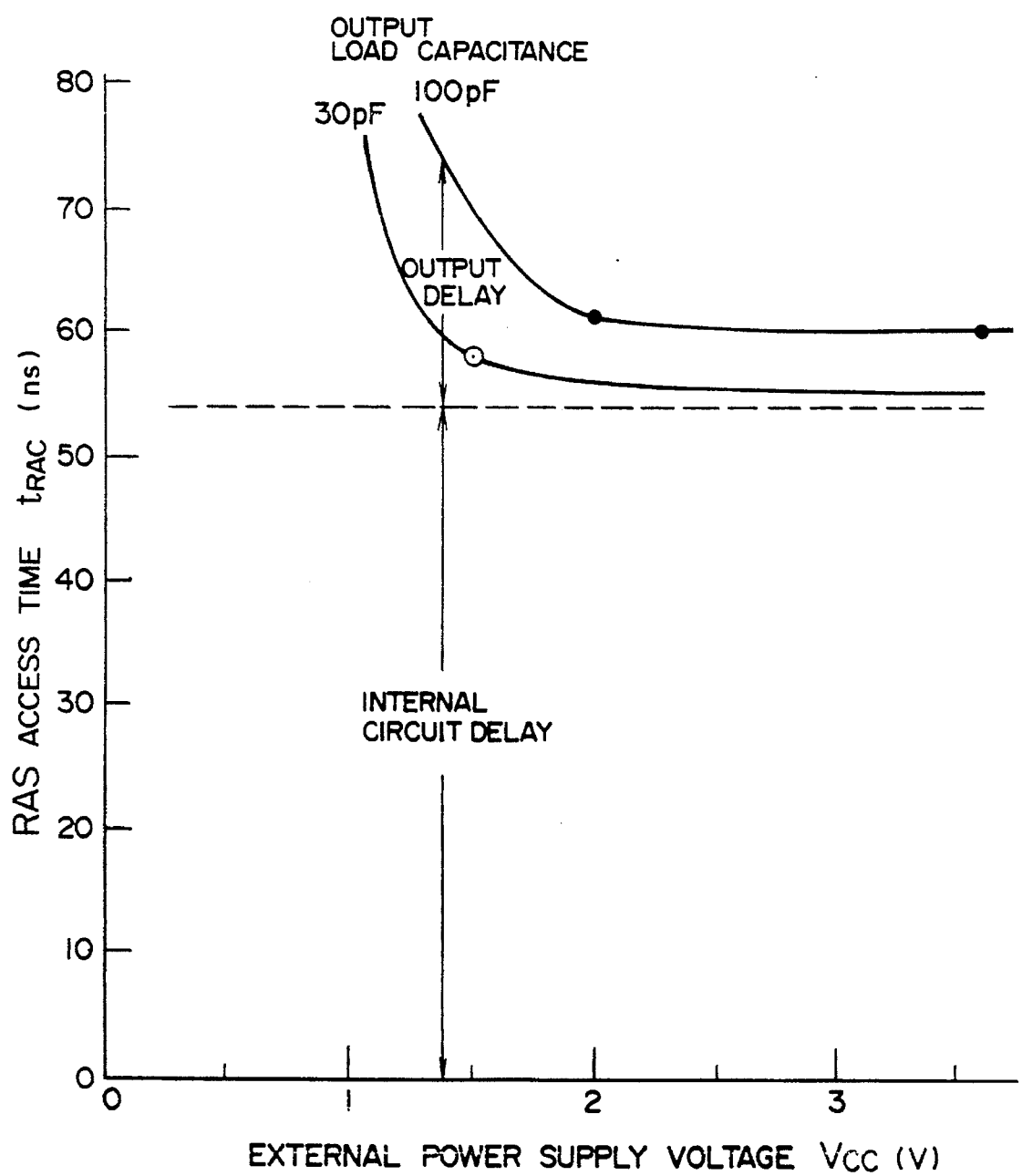

By means of such a circuit, it is possible to provide an LSI which can operate with the operation speed (response speed) even when a power supply voltage varies in a wide range. The operation speed can be represented by an access time for a memory and a maximum clock frequency for a microcomputer (CPU). The memory access time includes an address access time which is a time from an address change to data output, a chip select (or chip enable) access time which is a time from input of a chip select (or chip enable) signal to data output and a RAS (or CAS) access time in the case of DRAM which is a time from input of an address strobe signal RAS (or CAS) to data output. As these access times are shorter, the amount of data transfer per unit time can be increased, thereby improving the processing performance of a system. In accordance with the present invention, these operation speeds can be made substantially constant and also elements used in the system can operate at a higher speed than the conventional low voltage operating elements through circuit contrivance and contrivance in element designing (e.g. setting of a threshold voltage) so that the performance of the system can be greatly improved. FIG. 1C shows the RAS access time measured when the present invention is applied to a 64 Mbit DRAM. The abscissa represents an external power supply voltage $V_{cc}$ whereas the ordinate represents a RAS access time. In the case of an output load capacitance of 30 pF, the RAS access time does not almost vary in the range of $V_{cc}$ to the lowest $V_{cc}$ of about 1.5 V. Also, in the case of an output load capacitance of 100 pF, it does not almost vary in the range of the lowest $V_{cc}$ of 2.0 V. Any conventional LSI does not have such a characteristic (also for the other SRAM or microcomputer although FIG. 1C relates to DRAM).

Figure 2A:
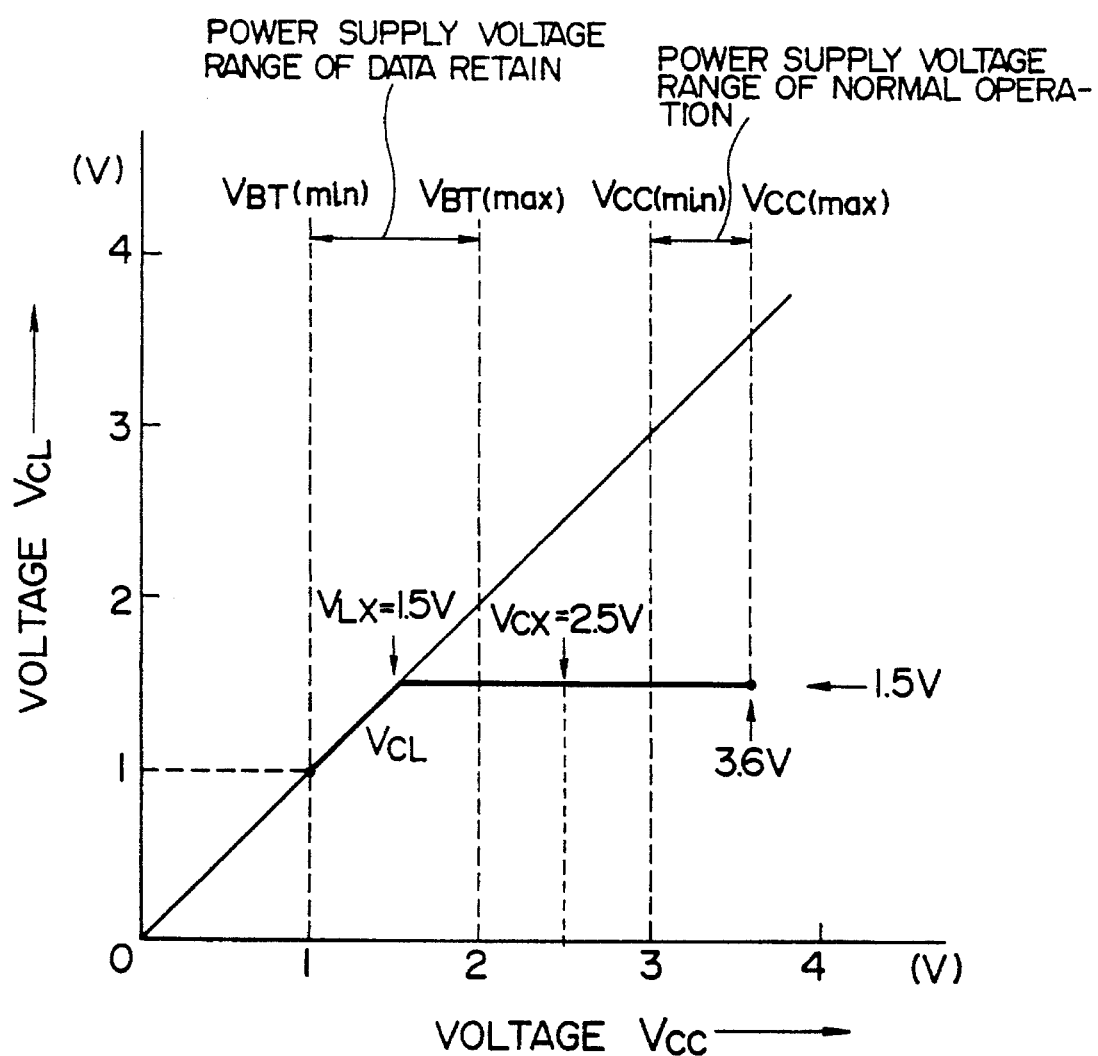

FIG. 2A is a graph showing the relation between the power supply voltage $V_{cc}$ and the internal power supply voltage $V_{CL}$. In this figure, the abscissa represents the power supply voltage $V_{cc}$ and the ordinate represents the internal power supply voltage $V_{CL}$. The power supply voltage for normal operation is set at the range of 3 to 3.6 V; the power supply voltage for data retention is set at the range of 1 to 2 V; and the reference voltage $V_{cx}$ for switching between the normal operation and the data retention is set at 2.5 V. However, the other setting values may be adopted under the condition:

$$V_{BT}(max) < V_{cx} - V_{cc}(min)$$

where $V_{cc}$ (min) is a minimum value of the power supply voltage for normal operation, $V_{BT}$(max) is a maximum value of the power supply voltage for data retention, and $V_{cx}$ is the reference voltage. Further, although the internal power supply voltage $V_{cL}$ is set at 1.5 V, it may be set at a suitable value corresponding to the operation characteristic of the circuit within a range not exceeding the power supply voltage $V_{cc}$. Moreover, in this example, in order to directly supply the power supply voltage $V_{cc}$ which is 1.5 V or less to the internal circuit, $V_{LX}$ is set at 1.5 V.

Figure 2B:
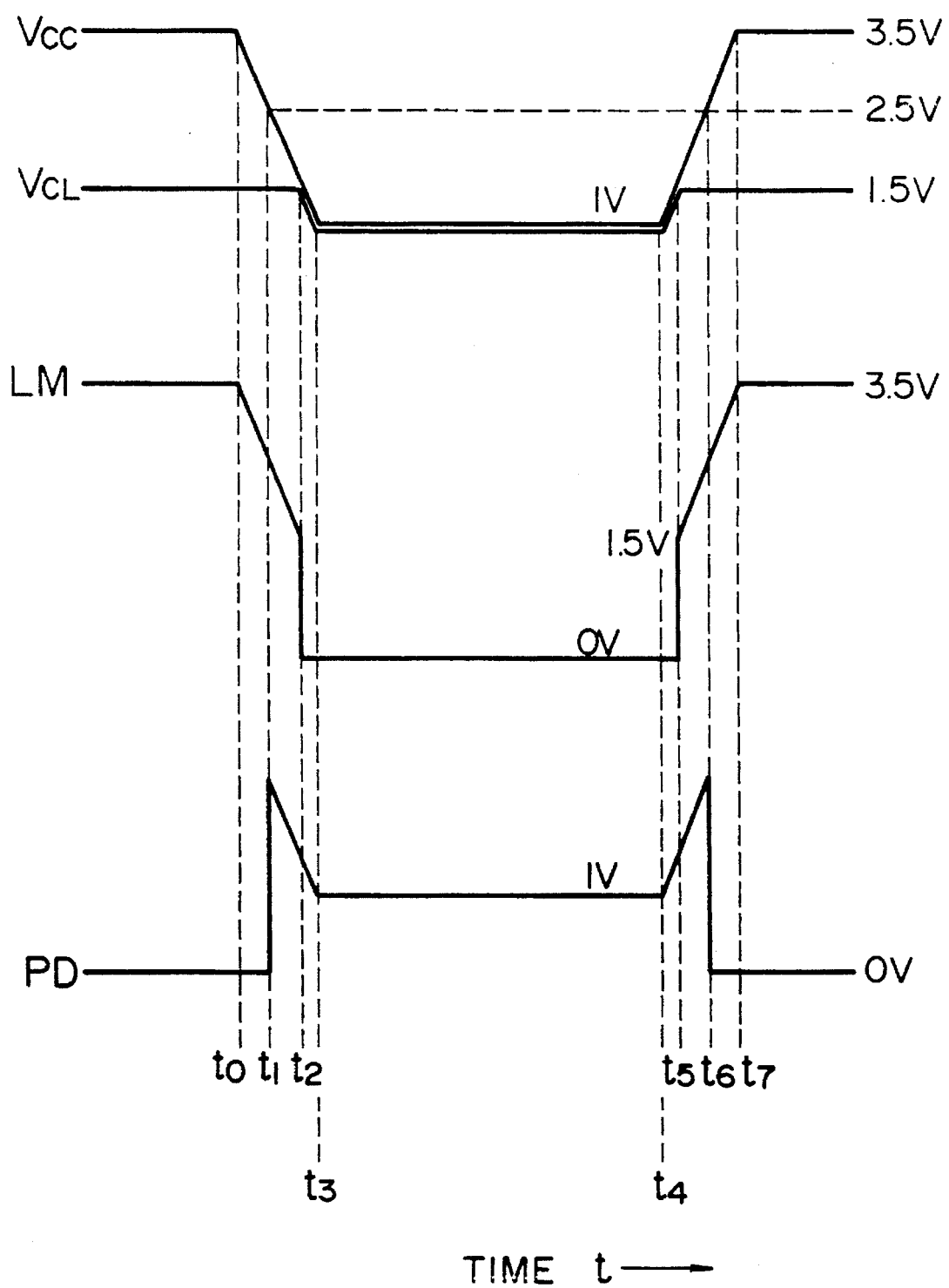

FIG. 2B shows an example of the secular change (time-dependent fluctuation) of the internal power supply voltage $V_{cL}$, and two control signals LM and PD in the case where the power supply voltage $V_{cc}$ is changed in time lapse in the LSI chip. Now, consideration is made on the case where $V_{cc}$ is decreased from 3.5 to 1 V in the period of t1 to t3 and thereafter is increased from 1 to 3.5 V in the period of t4 to t7. In the period of t1 to t6 when $V_{cc}$ is lower than $V_{cx}$=2.5 V, the signal PD becomes a high voltage state ("1"), thereby placing the chip into the data retention state. In the period of t2 to t6 when $V_{cc}$ is lower than $V_{cx}$, the signal LM becomes a low voltage state ("0"), thereby directly supplying the power supply voltage $V_{cc}$ to the chip. The voltage values identified here are exemplary, and combination of the other voltages may be adapted in the same manner.

Figure 2C:
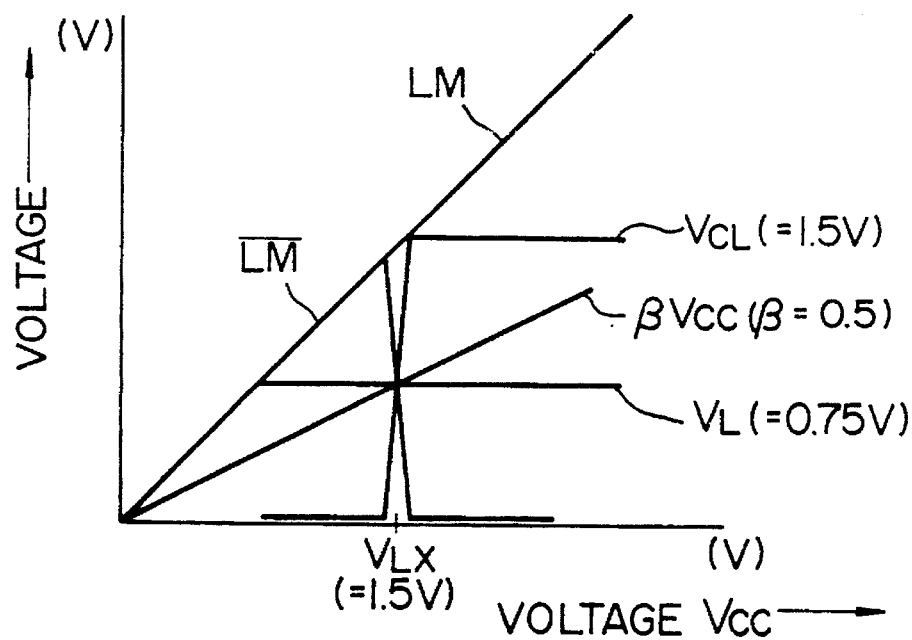
Figure 2D:
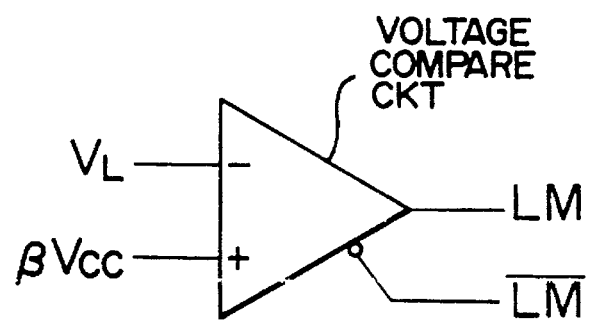

FIGS. 2C and 2D show an example of the method of generating the limiter enable signal LM and the circuit configuration therefor, respectively. The signal LM may be shifted from the high voltage state ("1") to the low voltage state ("0") at the point where it becomes first equal to the internal power supply voltage $V_{cL}$ when the power supply voltage is decreased. In this example, the voltage×$V_{cc}$ ($0 \leq \beta \leq 1$) which is proportional to $V_{cc}$ and the reference voltage $V_L$ are compared in a comparison circuit. And if the former is larger than the latter, the high voltage ("1") is generated and if the former is larger than the latter, the low voltage ("1") is generated. In this way, using the voltage proportional to $V_{cc}$ as an input voltage between the high voltage and the low voltage provides an advantage in circuit operation of e.g. of being capable of taking a large voltage amplification factor of the comparison circuit. For example, with β=0.5 and $V_L$=0.75, $V_{LX}$=1.5 V. Then, if $V_{cc}$ is 1.5 V or more, the limiter enable signal LM becomes the high voltage state ("1") thereby operating the power supply voltage converter circuit. Incidentally, the voltage proportional to $V_{cc}$ can be generated using resistors.

Figure 2E:
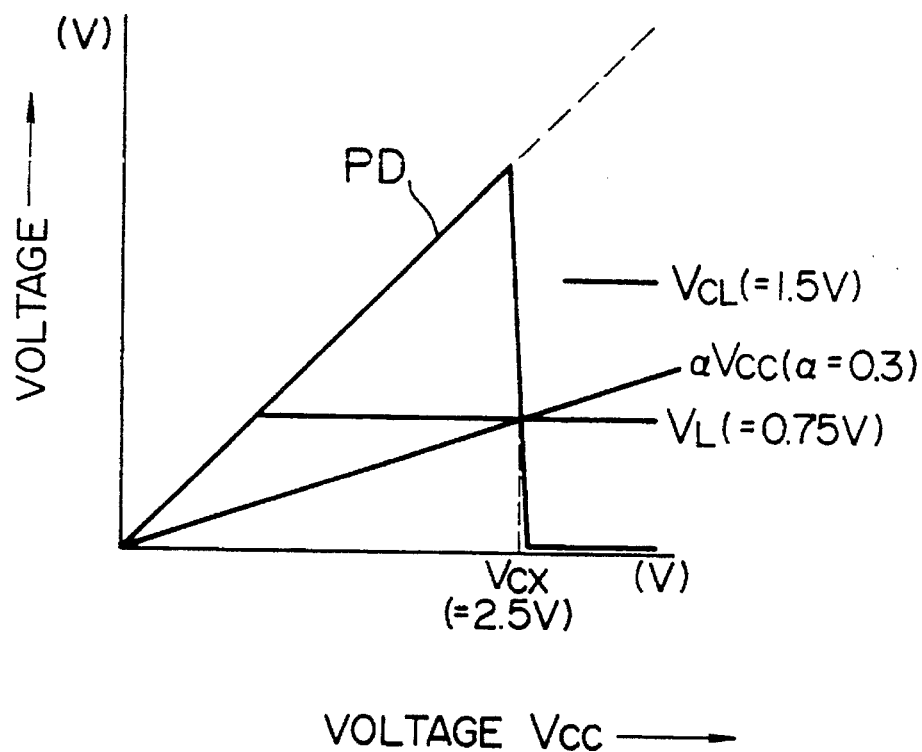
Figure 2F:
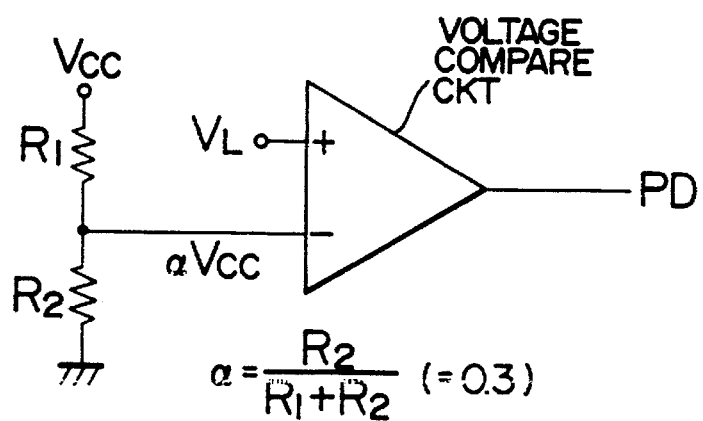

FIGS. 2E and 2F show an example of the method of generating the data retention state signal PD and the circuit configuration therefor. This circuit configuration can be constituted in the same manner as the above LM generating circuit. In this case, the voltage α×$V_{cc}$ (0≦α≦1) proportional to $V_{cc}$ is applied to an inverting input terminal. For example, with α=0.5 and $V_L$=0.75 V, $V_{cx}$=2.5 V. Then, if $V_{cc}$ is 2.5 V or less, the data retention state signal PD becomes the high voltage state ("1"), thereby placing the chip into the data retention state. Incidentally, the voltage proportional to $V_{cc}$ is generated by resistor division of R1 and R2. These resistors may be constituted by any of an impurity diffused layer formed in a semiconductor substrate, poly-silicon and a channel resistor of a MIS-FET.

Figure 3A:
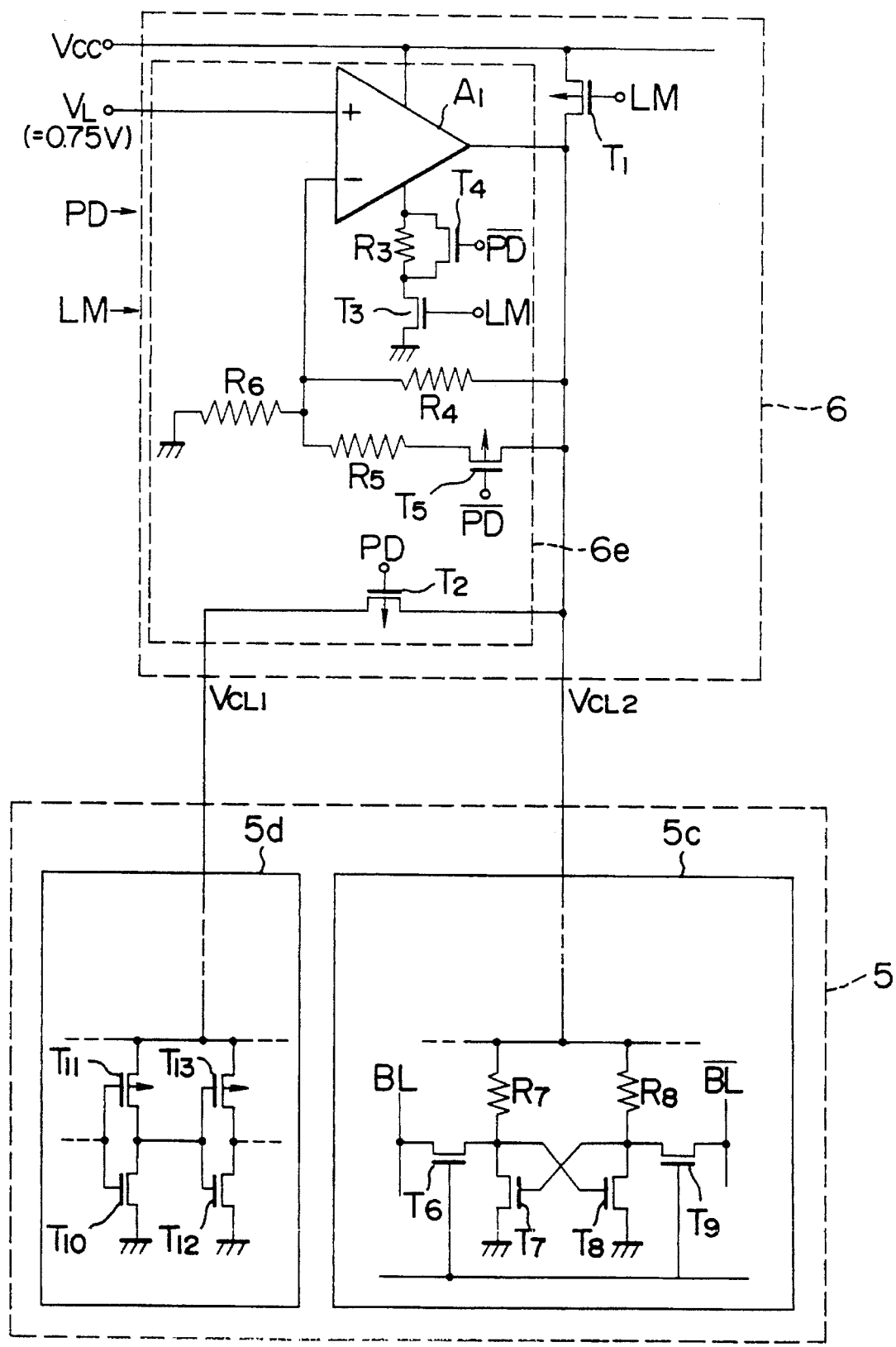
Figure 3B:
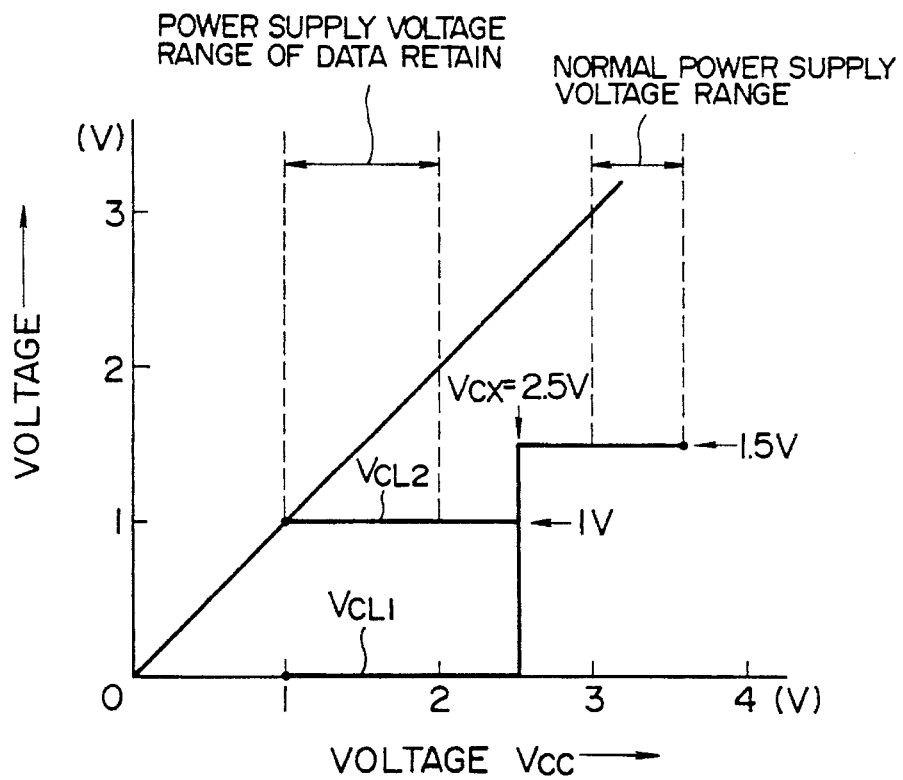

FIG. 3A shows one embodiment in which the present invention is applied to an LSI locally incorporating a static memory. In this figure, 5c is a memory cell array of the static memory and 5d is a circuit block such as a logic circuit which does not require data retention. The power supply voltage required for 5c and 5d is $V_{CL2}$ and $V_{CL1}$, respectively. The memory cell array 5c is constituted by four n-channel MOS-FETs T6 to T9, and two resistor elements R7 and R8. Assuming that the resistance value thereof is R, the current value flowing for one memory cell is $V_{CL2}$/R. Therefore, it is desired that the voltage value is made as low as possible within a range of being capable of assuring noise margin. In this embodiment, as shown in FIG. 3B, $V_{CL2}$ for normal operation is set at 1.5 V and $V_{CL2}$ for data retention is set at 1 V. The logic block 4d is constituted by inverters, logic gates, etc. $T_{11}$ and $T_{13}$ with an arrow are p-channel MOS-FET, respectively and $T_{10}$ and $T_{12}$ are n-channel MOS-FET, respectively. During the data retention, it is not necessary to supply the power supply voltage since these logic circuits are not required to be operated. Therefore, $V_{CL1}$ for normal operation is set at 1.5 V and $V_{CL2}$ for data retention is set at 0 V. These internal power supply voltages $V_{CL1}$ and $V_{CL2}$ are supplied from a power supply voltage converter circuit 6e or a p-channel MOS-FET which serves as a switch (FIG. 1A SW6a). The power supply voltage converter circuit 6a is constituted by a differential amplifier circuit A1; a resistor R3 and two n-channel MOS-FETs T3 and T4 which serve to control the operating current of the differential amplifier circuit; three resistors R4 to R6 and a p-channel MOS-FET T5 which serve to control the feed-back amount to an inverting input of the differential amplifier circuit; and a p-channel MOS-FET T2 which serves as a switch.

In operation, in the case where $V_{cc}$ is high and so is to be decreased to the internal power supply voltage, the limiter enable signal LM becomes a high voltage ("1"). Then, T1 is cut off and also T3 is made conductive, thereby supplying a bias current to the differential amplifier circuit A1. Thus, the voltage proportional to $V_L$ at a non-inverting input of A1 is output. On the contrary, when the signal LM is a low voltage ("1"), T3 is cut off and the bias current is not supplied. Then, $V_{cc}$ is directly output as the internal power supply voltage.

During the data retention operation, the data retention signal PD becomes a high voltage ("1"). Then, T2 is cut off, thereby stopping the current supply to the circuit block 5d. On the other hand, T4 is cut off and so the value of the bias current to the differential amplifier circuit A1 is defined. The current consumed by the memory cell array in the data retention state is very small and can be regarded as a substantially constant D.C. current in time lapse. Therefore, the load driving capability of the differential amplifier circuit may be much smaller than that in the normal operation so that even if the bias current is remarkably decreased, any difficulty in operation does not occur. Also by making T5 conductive to increase the feed-back amount in the differential amplifier circuit, the internal power supply voltage for the data retention is decreased. Thus, the consumed current in the entire LSI chip during the data retention can be remarkably decreased. Incidentally, in this embodiment, $V_L$=0.75 V, and R4=R6=3R5. Then, $V_{CL2}$ is 1.5 V for the normal operation and 1.0 V for data retention.

FIG. 3B shows an example of the relation between the power supply voltage $V_{cc}$ and internal power supply voltages $V_{CL2}$ and $V_{CL1}$. In this figure, the abscissa represents $V_{cc}$ and the ordinate represents $V_{CL}$. As in the embodiment of FIG. 2A, the power supply voltage for normal operation is set at the range of 3 to 3.6 V; the power supply voltage for data retention is set at the range of 1 to 2 V; and the reference voltage $V_{cx}$ for switching between the normal operation and data retention is set at 2.5 V. Further, the internal power supply voltages $V_{CL2}$ and $V_{CL1}$ for the normal operation are 1.5 V and $V_{CL2}$ for the data retention is 1 V. However, these voltage values may be set at a suitable value corresponding to the operation characteristic of the circuit within a range not exceeding the power supply voltage $V_{cc}$.

Figure 3C:
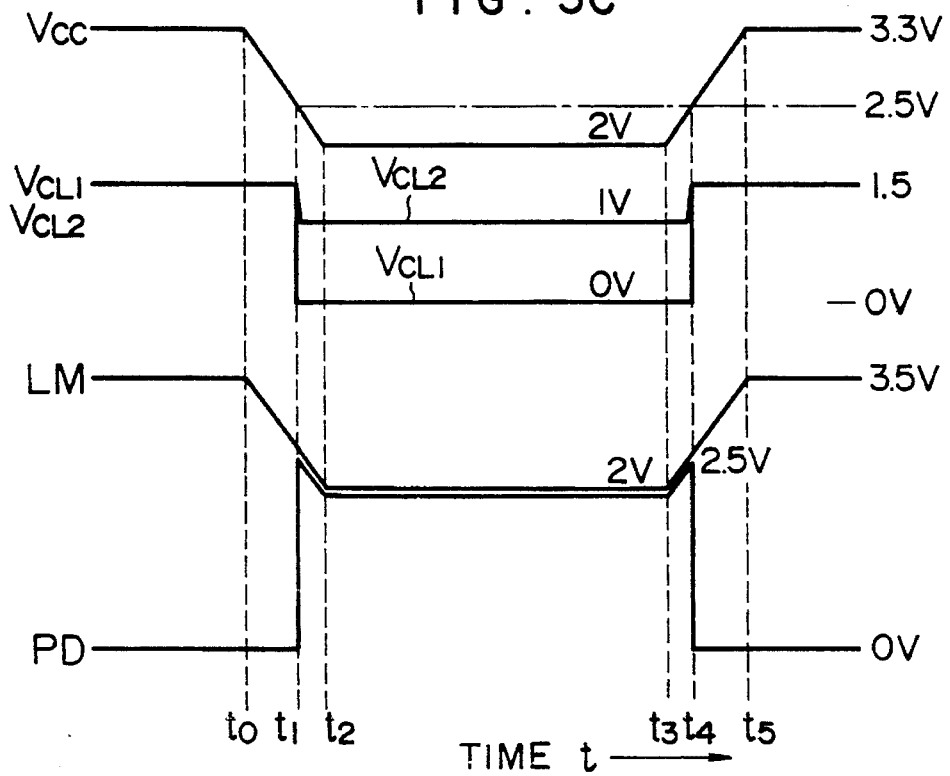

FIG. 3C shows an example of the secular change (time-dependent fluctuation) of the internal power supply voltage $V_{cc}$, and two control signals LM and PD in the case where the power supply voltage $V_{cc}$ is changed in time lapse in the LSI chip. Now, consideration is made on the case where $V_{cc}$ is decreased from 3.3 to 2 V in the period of t0 to t2 and thereafter is increased from 2 to 3.3 V in the period of t3 to t5. In the period of t1 to t4 when $V_{cc}$ is lower than $V_{cx}$=2.5 V, the signal PD becomes a high voltage state ("1"), thereby placing the chip into the data retention state. In this period, $V_{cc}$ is not smaller than 1.5 V so that the signal LM remains a high voltage state ("1").

In the embodiment mentioned above, there can be realized a static memory which can operate at a high speed during the normal operation and retain data with necessary minimum power during the data retention operation, and an LSI which locally incorporates such a static memory. Incidentally, in this embodiment, the static memory cells with high resistance load are used. However, the present invention can be also applied to the memory array which is constituted by CMOS memory cells each consisting of two CMOS inverters and two selective transistors, or latch circuits consisting of two NAND gates or two NOR gates.

Figure 4A:
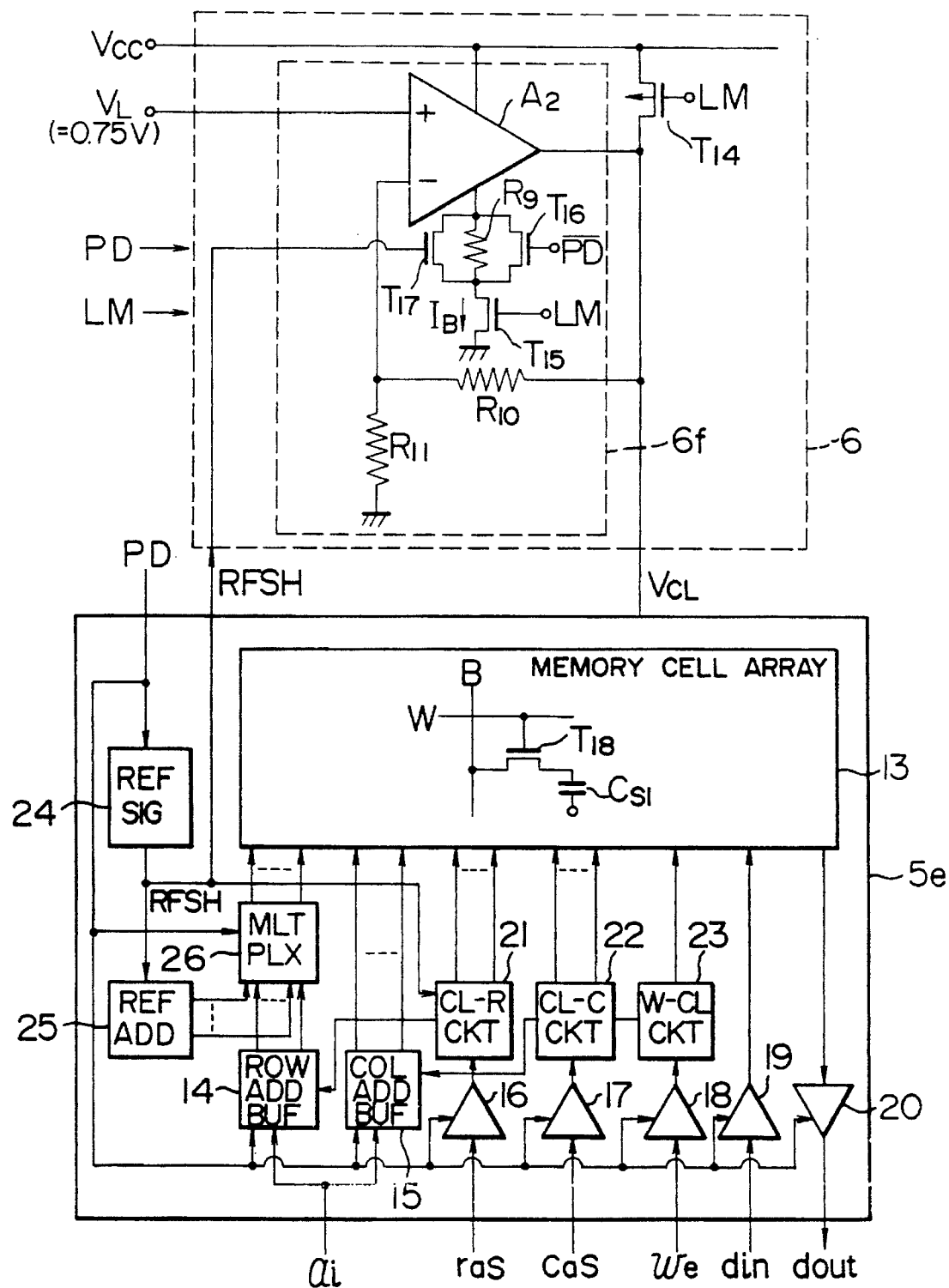

FIG. 4A shows an embodiment in which the present invention is applied to a dynamic memory. In this figure, 5e is a dynamic memory which operates at a power supply voltage of 1.5 V or less and in which one memory cell is constituted by an n-channel MOS-FET T18 and a storage capacitor $C_{S1}$. Numeral 13 is a memory cell array; numeral 14 is a row address buffer; numeral 15 is a column address buffer; numeral 16 is a row address strobe (RAS) input buffer; numeral 17 is a column address strobe (CAS) input buffer; numeral 18 is a write enable (WE) input buffer; numeral 19 is a data input buffer; numeral 20 is a data output buffer; numeral 21 is a clock generator circuit for generating control clocks on the basis of the row address strobe (RAS) signal; numeral 22 is another clock generator circuit for generating control clocks on the basis of the column address strobe (CAS) signal; numeral 23 is a write clock generator circuit; numeral 24 is a refresh (RFSH) signal generator circuit; numeral 25 is refresh address generator circuit; and numeral 26 is a multiplexer for switching the refresh address and an external input address.

Meanwhile, in the dynamic memory, data are stored by storing charges in the storage capacitors $C_{s1}$ so that so-called refresh operation in which signal charges are periodically read out and rewritten is required also in the data retention operation and to this end, a part of the peripheral circuit other than the memory cell array must be operated. Further, in order to assure sufficient noise margin, also in the data retention, the signal charge amount equivalent to in the normal operation must be assured. Then, in this embodiment, the internal power supply voltage is fixed at 1.5 V for both data retention and normal operation.

During the data retention, it is not necessary to perform the input/output of data between the inside and outside of the chip, so that all the input/output buffers are cut off by a data retention signal PD. The multiplexer 26 is controlled by the signal PD to switch the memory addresses into the addresses from the refresh address generator circuit 25 in the data retention operation. During the refresh operation, the refresh signal RFSH is at a high voltage level ("1"). This signal is supplied to the refresh address generator circuit 25 to sequentially increase or decrease the refresh address. Also the signal RFSH activates the clock generator circuit 21 to generate clocks for refresh.

The internal power supply voltage $V_{CL}$ is supplied from a power supply voltage converter circuit 6f or a p-channel MOS-FET T14 serving as a switch (FIG. 1B, SW 6a). The power supply voltage converter circuit 6f is constituted by a differential amplifier circuit A2; a resistor R9 and three n-channel MOS-FET's T15, T16, and T17 which serve to control the operation current of the differential amplifier circuit; and two resistors R10 and R11 which serve to the feed-back amount to an inverting input of the differential amplifier circuit A2.

In operation, in the case where Vcc is high and so is to be decreased to the internal power supply voltage, the limiter enable signal LM becomes a high voltage ("1"). Then, T14 is cut off and also T15 is made conductive, thereby supplying a bias current to the differential amplifier circuit A2. Thus, the voltage proportional to $V_L$ at an non-inverting input of A2 is outputted. On the contrary, when the signal LM is a low voltage ("1"), T15 is cut off and the bias current is not supplied. Then, $V_{cc}$, which is at a low voltage level, is directly outputted as the internal power supply voltage.

During the data retention operation, the data retention signal PD is at the high voltage level ("1"). Then, the transistor T16 is cut off and the bias current for the differential amplifier A2 is defined by the resistor R3. The current consumed in the data retention state and in a period when the peripheral circuit does not operate is small. Therefore, the load driving capability of the differential amplifier circuit may be much smaller than that in the normal operation so that even if the bias current is remarkably decreased, any difficulty in operation does not occur. During the refresh operation, the signal RFSH is fed back to the power supply voltage converter circuit to make the transistor T17 conductive, thereby making the bias current for A2 substantially equivalent to that in the normal operation. In this way, during the refresh operation, the power supply current required for charging/discharging of data lines and operation of the peripheral circuit can be supplied. Therefore, also in the data retention operation, the current consumed in the entire chip can be remarkably decreased without lowering the noise margin. Incidentally, in this embodiment, with $V_L=0.75$ V and R10=R11, the internal power supply voltage $V_{CL}=1.5$ V is obtained, but the other combination of the voltages and resistances may be adopted.

Figure 4B:
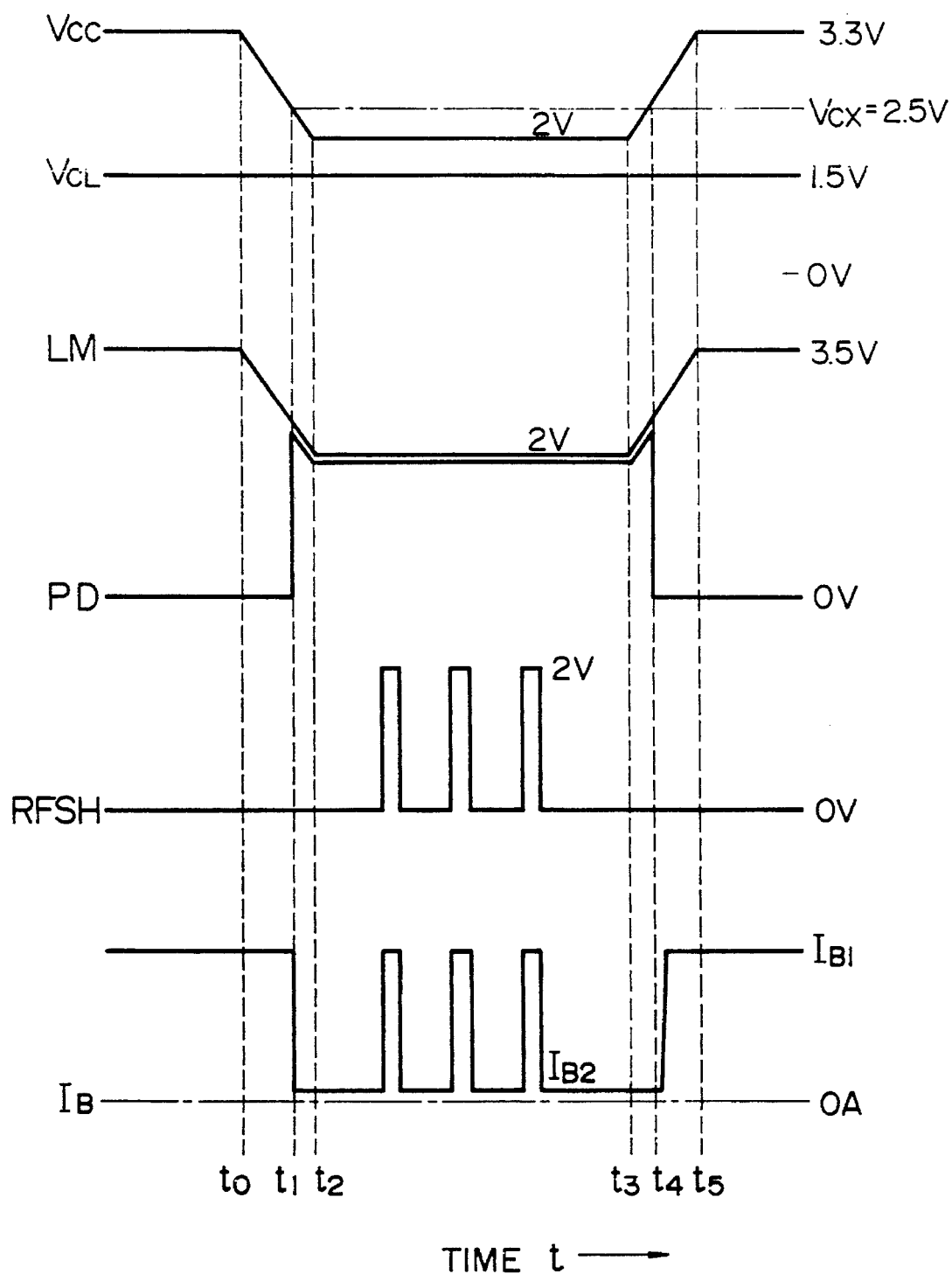

FIG. 4B shows an example of the secular change (time-dependent fluctuation) of the internal power supply voltage $V_{cL}$, two control signals LM and PD, the refresh signal RFSH, and the bias current for the differential amplifier circuit A2 in the case where the power supply voltage $V_{cc}$ is changed in time lapse in the LSI chip. Now, consideration is made on the case where $V_{cc}$ is decreased from 3.3 to 2 V in the period of t0 to t2 and thereafter is increased from 2 to 3.3 V in the period of t3 to T5. In the period of t1 to t4 when $V_{cc}$ is lower than $V_{cx}=2.5$ V, the signal PD becomes a high voltage state ("1"), thereby placing the chip into the data retention state. In this period, $V_{cc}$ is not smaller than 1.5 V so that the signal LM remains a high voltage state ("1"). In the refresh operation within the data retention period, the bias current $I_{B1}$ substantially equal to that in the normal operation is caused to flow and in the other period, a sufficiently small bias current $I_{B2}$ is caused to flow.

In the embodiment mentioned above, a so-called address multiplex system in which a row address and column address are taken in under time exchange is used. However, the present invention can be applied to a general system in which all address are simultaneously taken in. Further, by using a dynamic memory as described later in which the plate is driven to reduce the voltage amplitude in data lines, a memory with further reduced power consumption can be realized.

Figure 5A:
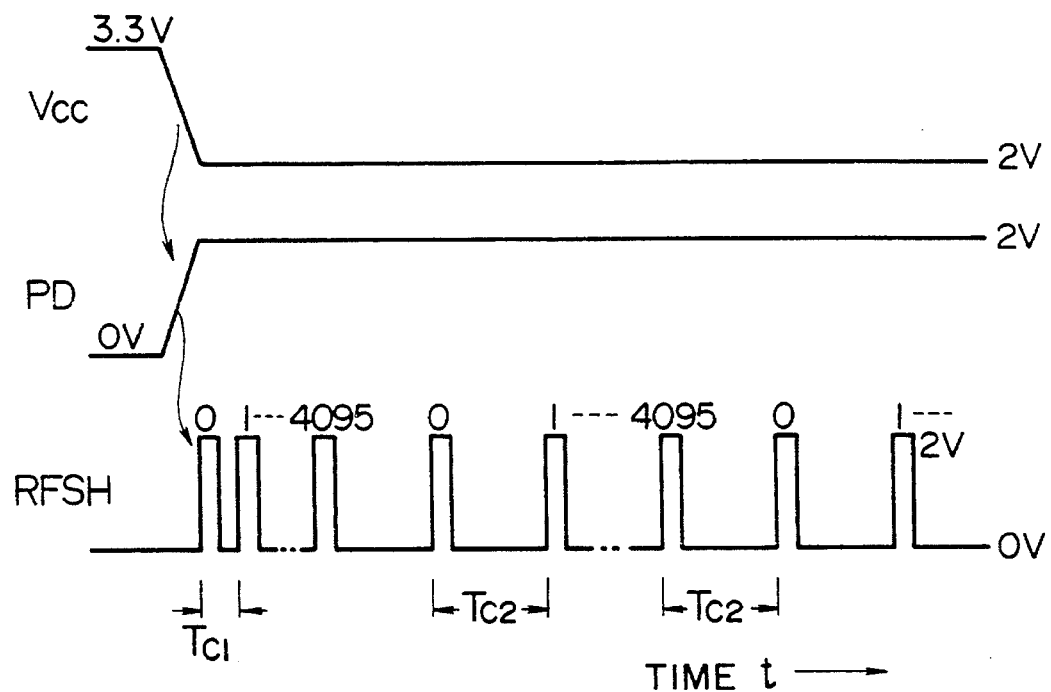
Figure 5B:
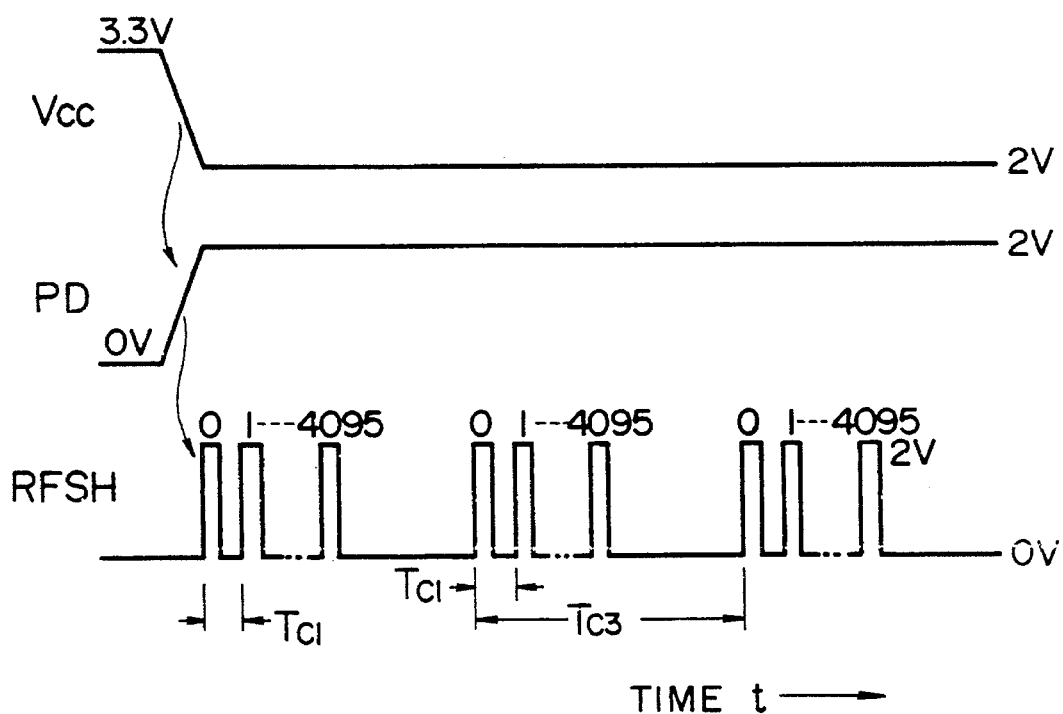

FIGS. 5A and 5B show an example of the timing of the refresh signal RFSH during the data retention state, respectively. In this case, refresh of the entire memory array is intended in 4096 cycles. By reducing the power supply voltage to e.g. 1.5 V or less, power consumed in the entire memory can be greatly decreased so that the memory with large capacity of 64 Mb or so does not require to increase the number of the refresh cycles to the number exceeding 4096, thereby making it easy to construct the system. In initial 4096 cycles from when the date retention state starts, refresh with a short interval i.e. the signal RFSH with a relatively short period $T_{c1}$ is generated. This is because the refresh control in the normal operation is not relative to the internal refresh. Such an initialization can obviate danger that the condition of the refresh period will not be satisfied before and after the state shift. In FIG. 5A, the signal RFSH is generated at a fixed period $T_{c2}$ after the short interval refresh. On the other hand, in FIG. 4B, the short interval refresh is repeated at a period of $T_{c3}$. The period of the signal RFSH is set at the same period $T_{c1}$ as the initial short interval refresh. Although the other period may be used, use of the same period is convenient in the construction of the signal generator circuit.

Figure 6:
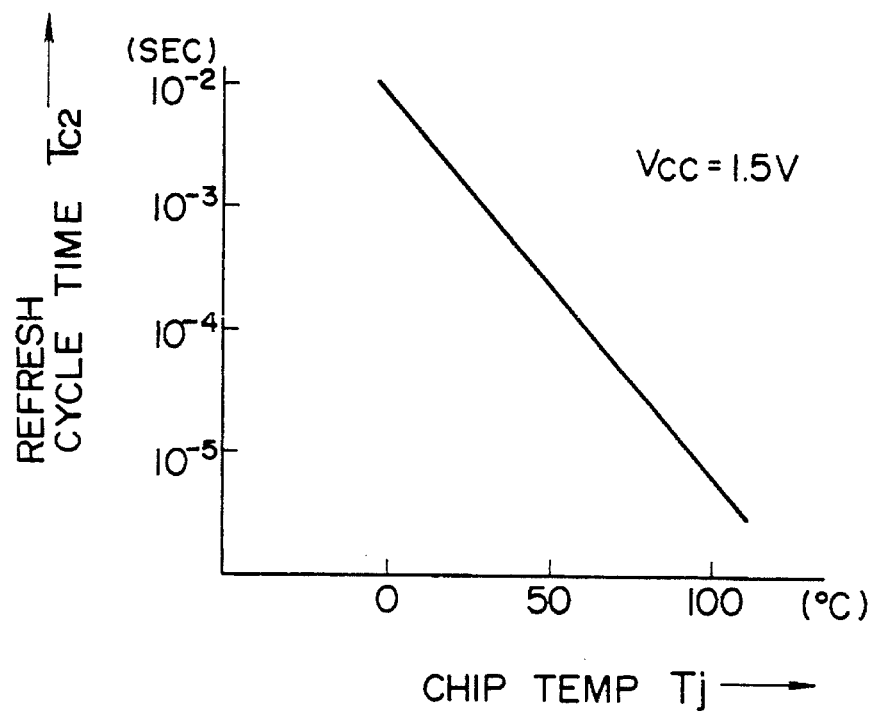

FIG. 6 is a graph showing an example of dependency of the refresh period (cycle time) $T_{c2}$ upon the chip temperature in the example of FIG. 5A. The relation between the chip temperature and data retention time is discussed in e.g. IEEE Transactions on Electron Devices, Vol. 35, No. 8, pp. 1257–1263, August 1987. According to this article, the data retention time varies in about three orders of magnitude when the chip temperature changes in the range of 0° to 100° C. Therefore, if the refresh period $T_{c2}$ is varied as shown in FIG. 6, it can accord with the actual data retention characteristic. The power consumed in a chip in a data retention state is very low so that there is not almost a difference between the atmospheric temperature and the chip temperature. Thus, by using the chip in low atmospheric temperature, the refresh period can be extended thereby further reducing the power consumed in the chip. In this way, a dynamic memory which can be suitably incorporated in a portable electronic device using a battery as a power supply source can be realized. Incidentally, an oscillator circuit having the temperature dependency as shown in FIG. 6 is disclosed in U.S. Pat. No. 4,661,929.

Figure 7:
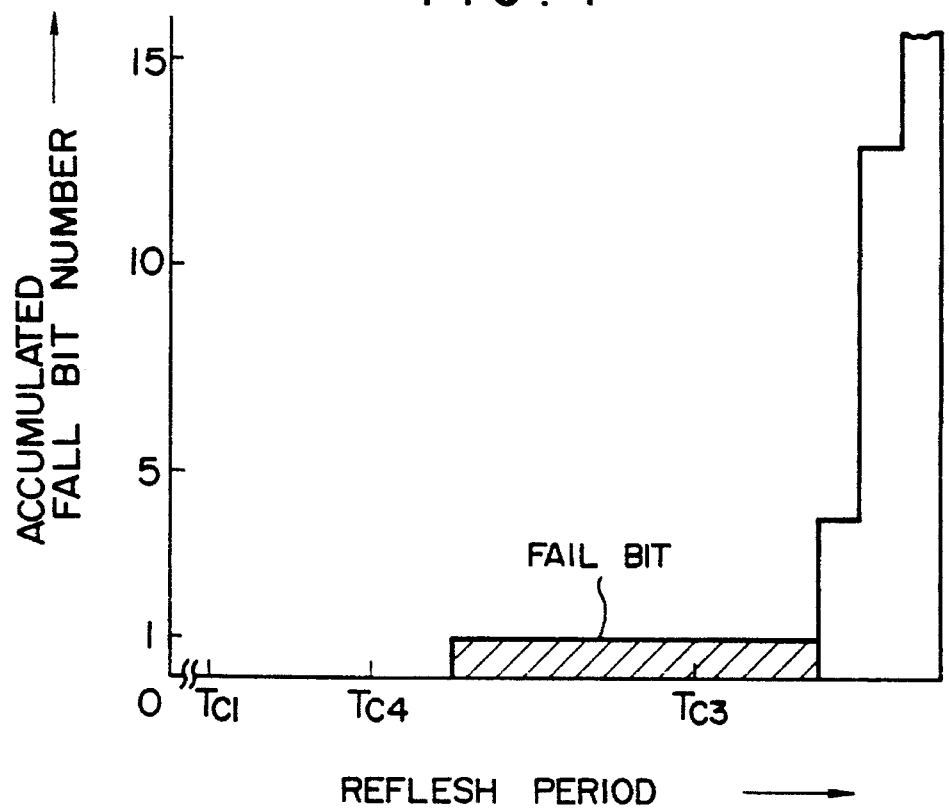

FIG. 7 is a graph showing an example of the occurrence of refresh failure in the example of FIG. 5B. In this figure, the abscissa represents the refresh period and the ordinate represents the number of accumulated fall bits. As seen from the figure, only one bit failure occurs for the refresh period $T_{c3}$. If a very small part of the memory is damaged, the damaged memory cells can be restored by means of a so-called redundancy technique in which they are replaced by redundant memory cells previously provided on the chip. This technique is discussed in IEEE Journal of Solid-State Circuit, Vol. 16, No. 5, pp. 479–487, 1981. This technique can be also applied to the refresh failure as shown in FIG. 7. The conventional redundancy technique, however, a disadvantage of increasing the chip area since it requires redundant memory cells.

Figure 8A:
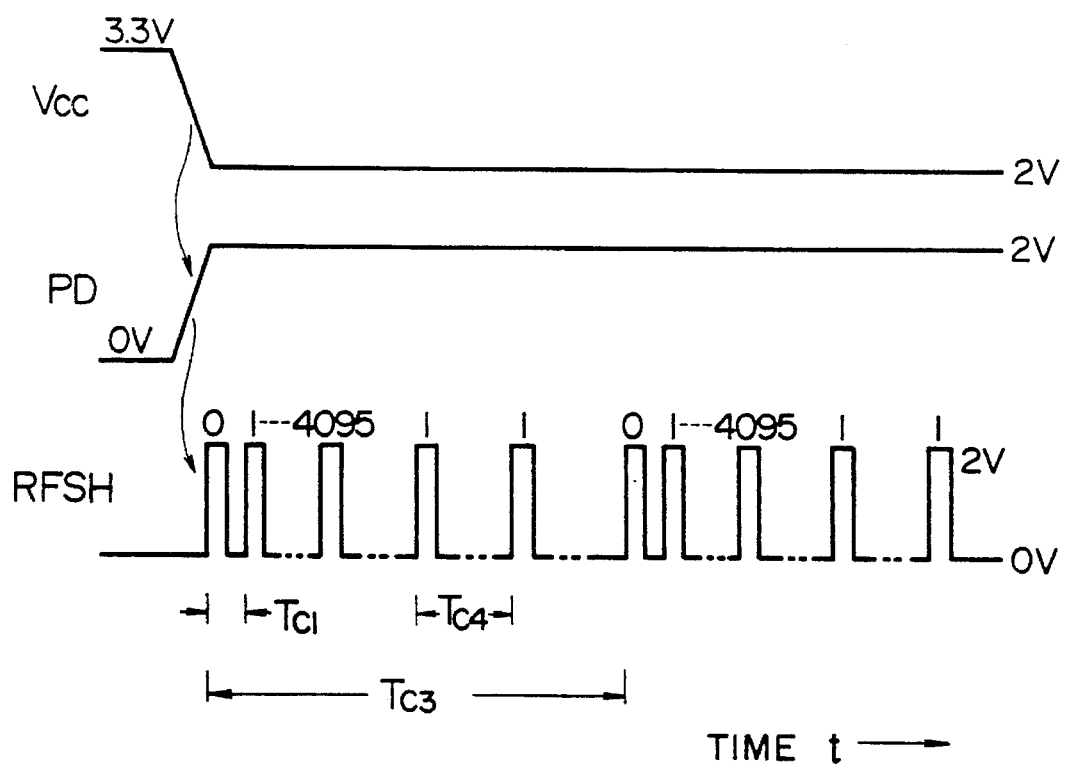
Figure 8B:
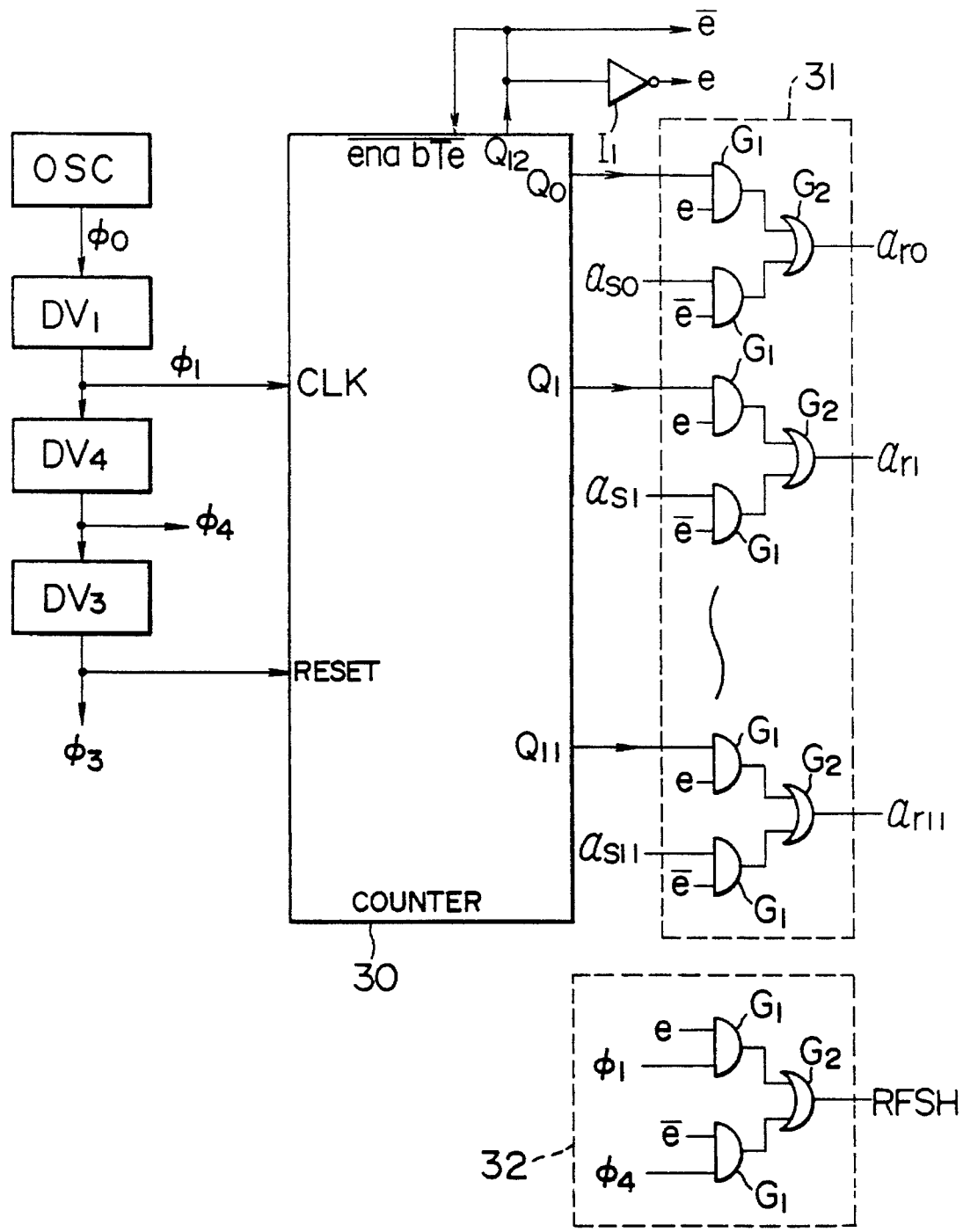
Figure 8C:
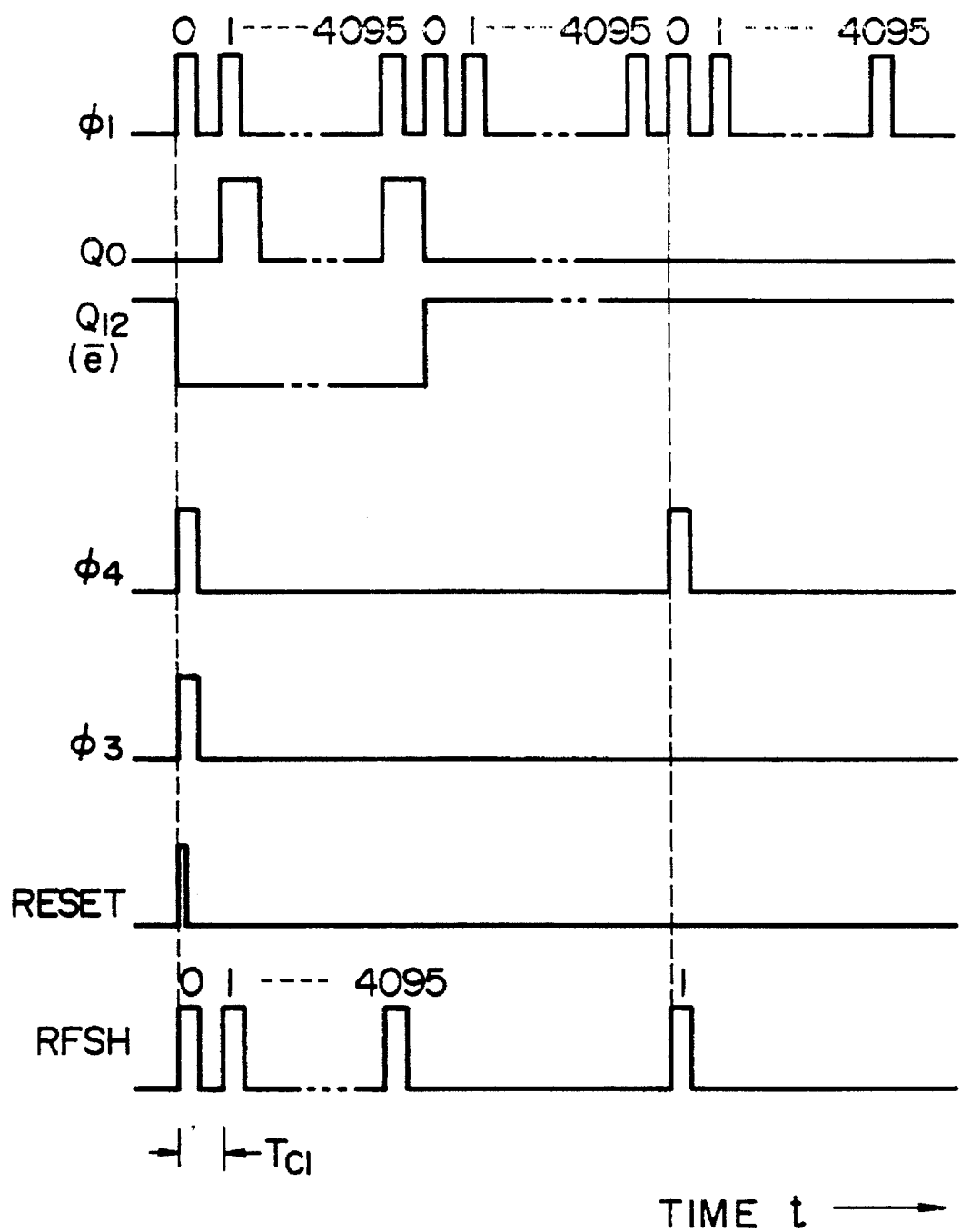

FIGS. 8A, 8B, and 8C are views for explaining a refresh failure relief technique which does not use redundant memory cells. This technique intends to refresh only the memory cell, which result in failure at the refresh period $T_{c3}$ in FIG. 7, at the refresh period e.g. $T_{c4}$ which is shorter than $T_{c3}$. This technique will be explained below with reference to FIGS. 8A, 8B, and 8C.

FIG. 8A shows an example of the timing of the refresh signal RFSH during data retention state when using this failure relief technique. Now it is assumed that an address 1 is in refresh failure. As seen from the figure, the address 1 is refreshed at the period $T_{c4}$ between one short interval refresh and the subsequent short interval refresh. The current consumed in this case can be remarkably reduced as compared with the case where entire addresses are refreshed at the short period $T_{c4}$. Incidentally, the condition of 4096× $T_{c1} \leq T_{c4} \leq T_{c3}$ among the respective refresh periods.

FIG. 8B shows an exemplary circuit arrangement for generating the refresh address and the refresh signal RFSH. FIG. 8C shows the operation timing thereof. In FIG. 8B, OSC is an oscillator for generating a clock $\phi_0$; DV1, DV4, and DV3 are a frequency divider for generating a clock $\phi_1$, $\phi_4$ and $\phi_3$ having the period that is integer-time as long as the clock $\phi_0$, respectively; 30 is a synchronous counter with 13 bits; 31 is refresh address generator circuit; 32 is a refresh signal (RFSH) generator circuit; $I_1$ is an inverter; $G_1$ is an AND gate; and $G_2$ is an OR gate.

In operation, the counter 30 is operated by the clock $\phi_1$ and starts count from the state where a high voltage ("1") is applied to a reset terminal to reset all of the counter outputs at a low voltage ("0"). When the count becomes 4097, the counter output Q12 becomes a high voltage ("1"), the counting is stopped. In FIG. 8B, e is a counter enable signal. Since e is at the high voltage level ("1") while the counter operates, the outputs $Q_0$ to $Q_{11}$ of the counter are outputted at the outputs $a_{r0}$ to $a_{r11}$ of the refresh address generator circuit 31. When the counter stops the count, e becomes the low voltage ("0") so that failure addresses $a_{s0}$ to $a_{s11}$ are output at $a_{r0}$ to $a_{r11}$. In the same manner, the clock $\phi_1$ is outputted from the refresh generator circuit 31 while the counter operates and the clock $\phi_4$ is output therefrom after the counter has stopped the count. Thus, while the counter operates, the short interval refresh is performed 4096 times at the period T, and after the counter has stopped the count, only the failure address is refreshed at the period $T_{c4}$. Incidentally, although in the above example, the relief of only one failure address was explained, the present invention can be applied to the case a plurality of failure addresses are to be relieved.

In the embodiment mentioned above, there can be realized a dynamic memory which can operate at a high speed during the normal operation and retain data with necessary minimum power during the data retention operation, and an LSI which locally incorporates such a dynamic memory. Further, even if the external power supply voltage greatly fluctuates, which is problematic for the conventional dynamic memory, the dynamic memory in accordance with this embodiment can stably operated by operating the internal circuit at a low voltage of e.g. 1.5 V.

Figure 9:
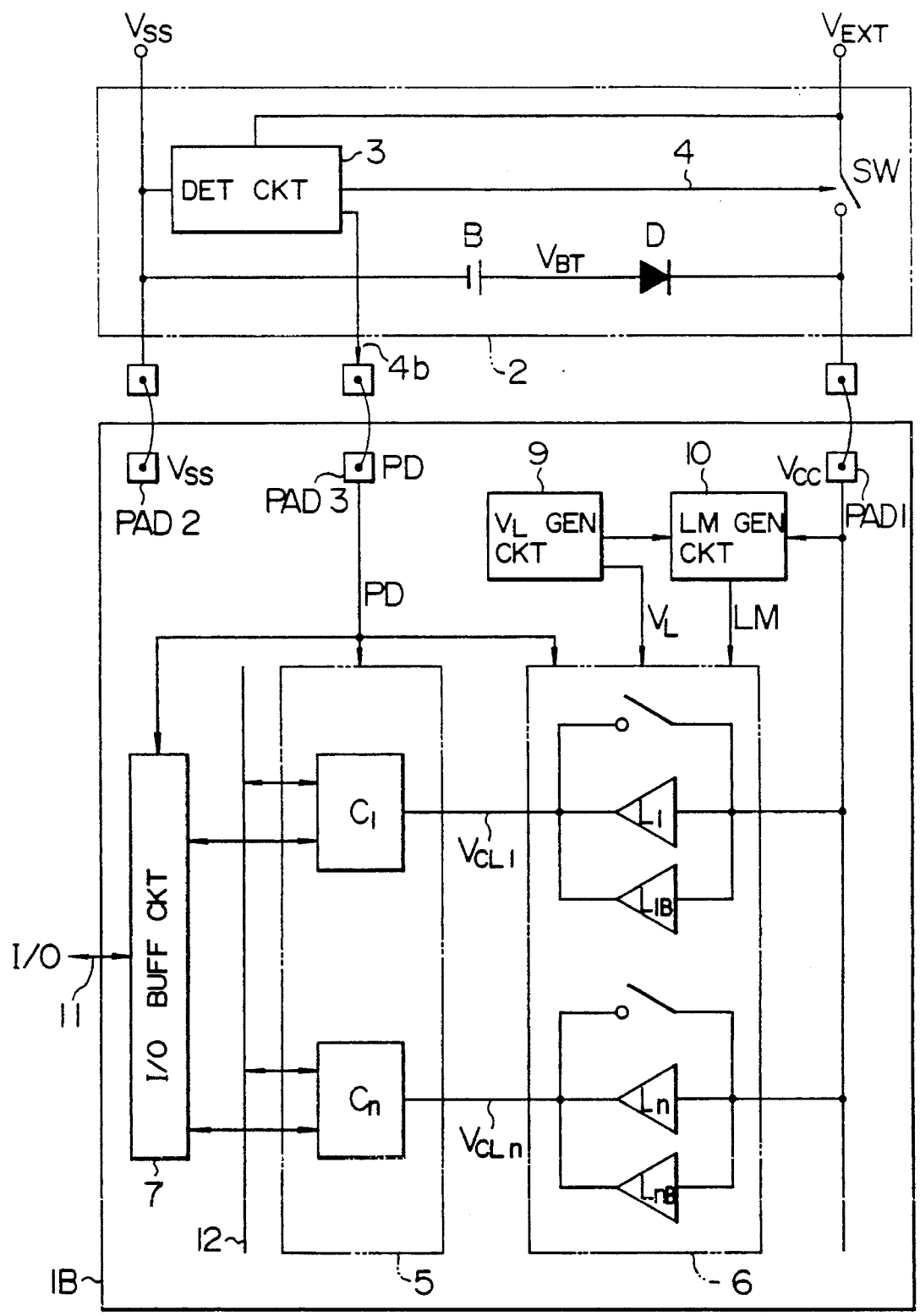

Although in the embodiments hereinbefore, a difference between the normal operation state and the data retention state is detected by the detection means provided on the LSI chip, the operation state may be controlled from the exterior of the chip FIG. 9 shows the other embodiment of the present invention in which shift to the data retention state is controlled by a detection circuit provided outside the chip. In this figure, 4b is a data retention state signal which is generated by a detection circuit 3 and supplied to an LSI chip; 1B is the LSI chip which has functions of data storage or data processing like the LSI chip of FIG. 1B; and PAD3 is a bounding pad for receiving the data retention state signal. The LSI chip of FIG. 9 is different from the LSI chip of FIG. 1 in that it is not necessary to provide detection means and means for generating the data retention state signal. This chip may be designed individually from the LSI chip of FIG. 1, otherwise one chip, after having been designed, may be divided through exchange of bondings or master slice of aluminum wirings.

Figure 10A:
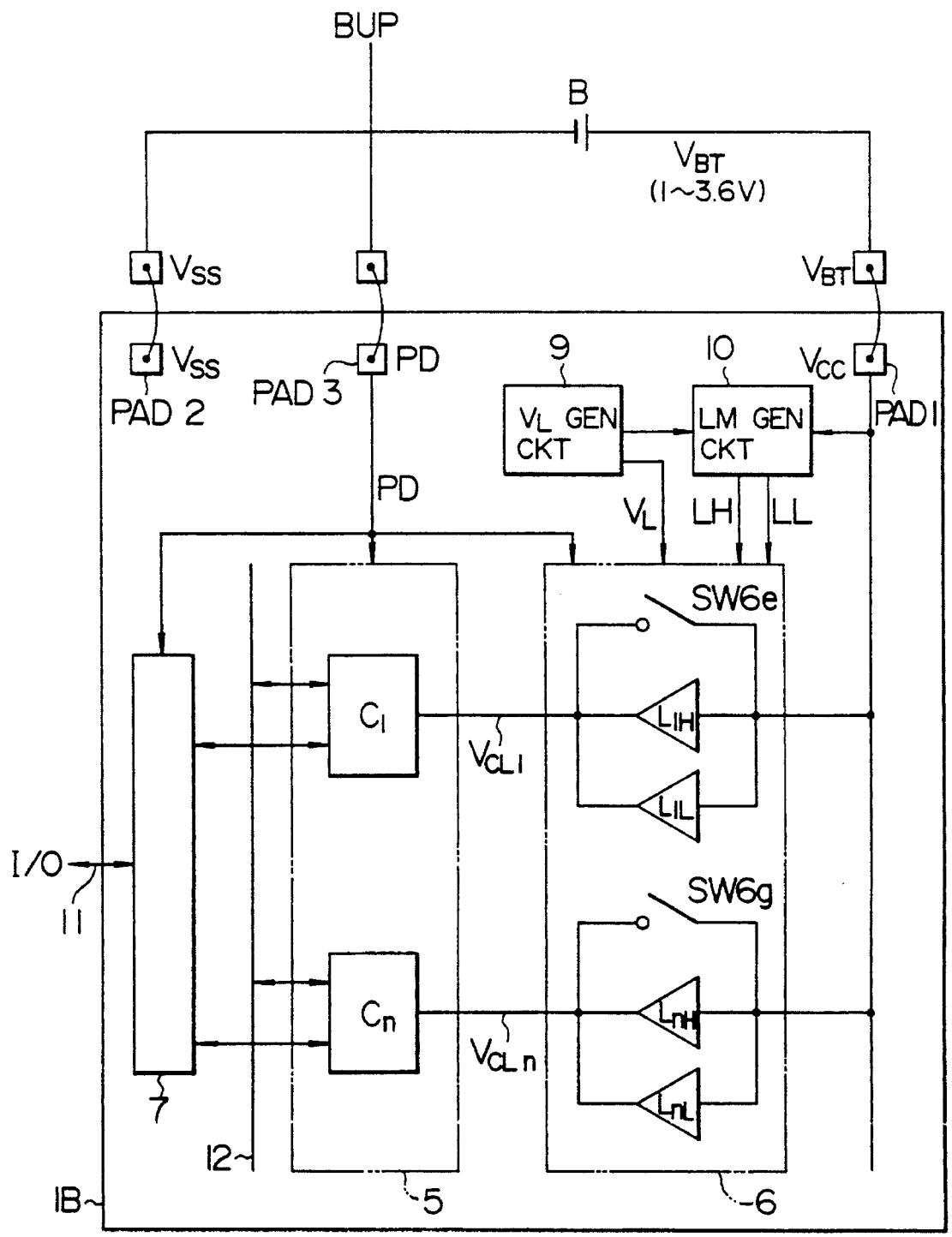

FIG. 10 shows the case where the LSI chip of FIG. 9 is operated using a battery as a power supply source and the signal PD is inputted from outside of the LSI chip. The voltage value of the battery is distributed in a wide range of 1 to 3.6 V in accordance with its kind. Thus, this technique, in which the system can be controlled externally, is more convenient than the method in which shift to the data retention state is detected by voltage change.

Figure 10B:
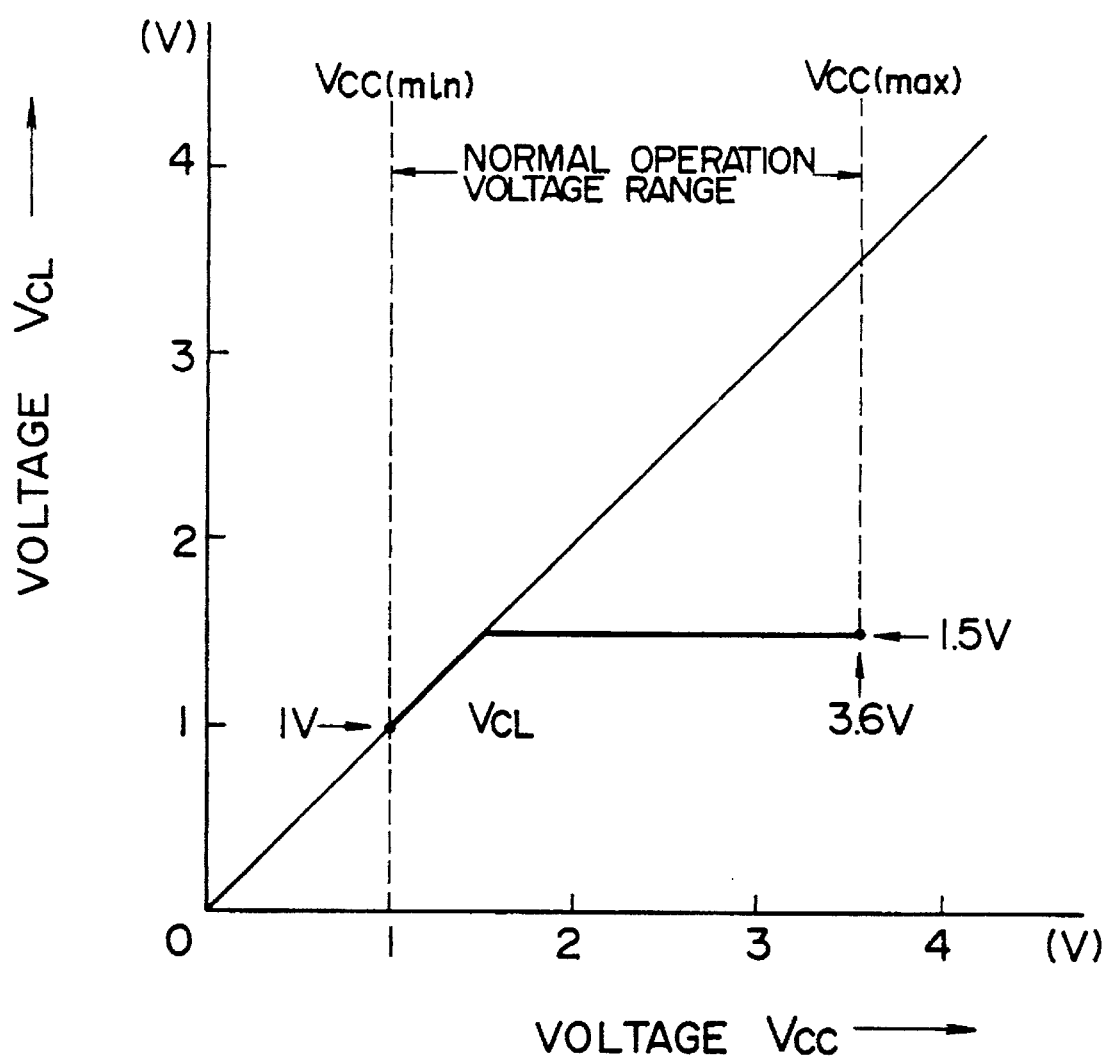

FIG. 10B shows dependency of the internal power supply voltage $V_{cL}$ upon the power supply voltage $V_{cc}$. In this example, over the normal operation range of 1 to 3.6 V, $V_{cL}$=1.5 V for $V_{cL}$ of 1.5 V and $V_{cL}=V_{cc}$ for $V_{cc}$ of 1 to 1.5 V. In this way, a change of the internal power supply voltage can be restrained over a wide range of 1 to 3.6 V. Accordingly, an LSI the operation performance (e.g. operation speed, consumed current, operation margin, etc.) of which does not almost depend on the power supply voltage can be realized. Further, shift to the data retention state can be made as required without varying the power supply voltage so that unnecessary power consumption can be restrained in accordance with the state of the system. Thus, the operation time of an electronic device which operates by a battery can be lengthened.

Figure 10C:
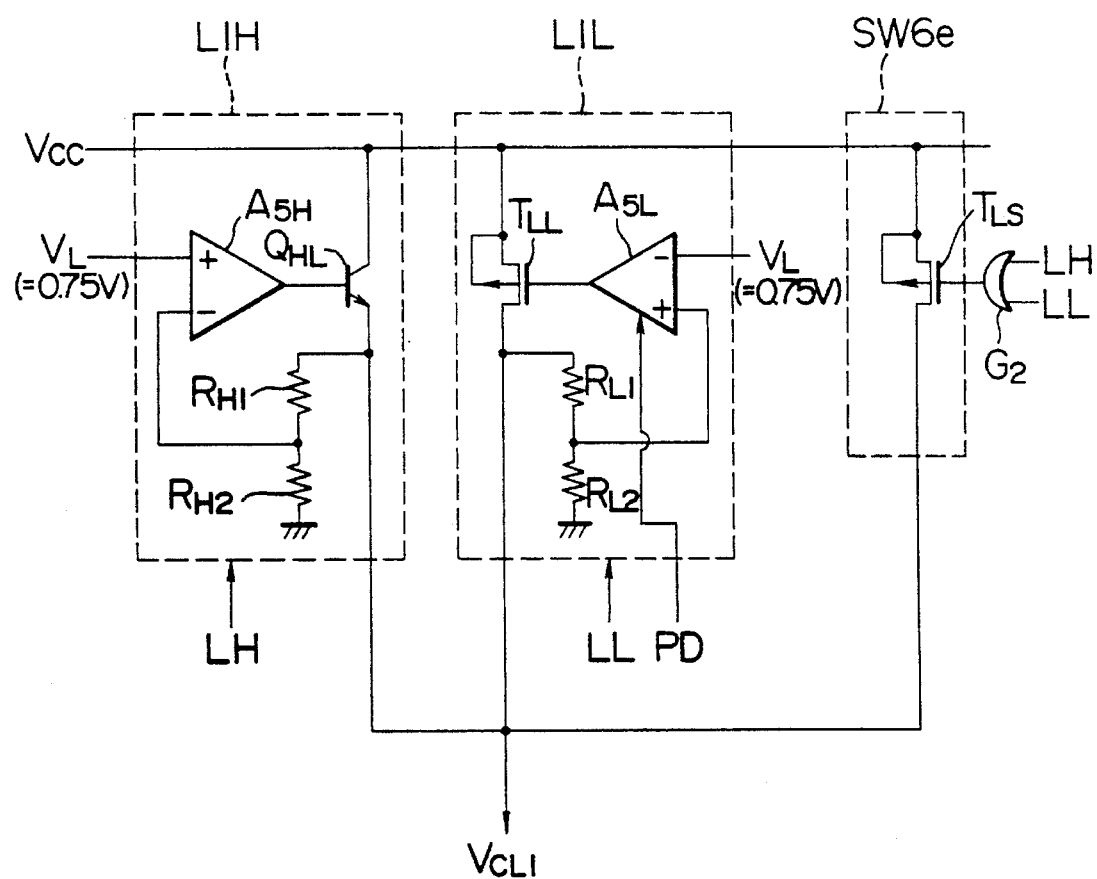

FIG. 10C shows an exemplary concrete construction of the power supply voltage converter. As in the embodiment of FIG. 1, L1H is designed to perform an optimum operation at a relatively high power supply voltage (e.g. 2.5 to 3.6 V), and L1L is designed to perform an optimum operation at a relatively low power supply voltage (1.5 to 2.5 V). The respective voltage converter circuits are controlled to be in an operation state when control signals LH and LL are at a high level. When the data retention state signal PD becomes a high voltage state to place the chip in the data retention state, the bias current for the differential amplifier circuit is reduced to a low level, thereby reducing the current consumed in the voltage converter circuit and so reducing the power consumed in the LSI chip. In the case where both LH and LL are at a low voltage level (external power supply voltage<1.5 V), both voltage converter circuits are turned off and also a switch SW 6a is switched on, thereby supplying the external power supply voltage to the internal circuit.

In such an arrangement, even when the external power supply voltage varies in a wide range of 1 to 3.6 V, an LSI which can operate at several power supply voltages can be provided without sacrificing the operation performance of the main circuit. Further, the chip can be switched into a low power consumption mode such as data retention mode as required through external control, thereby reducing the power required during the operation using a battery.

Figure 11A:
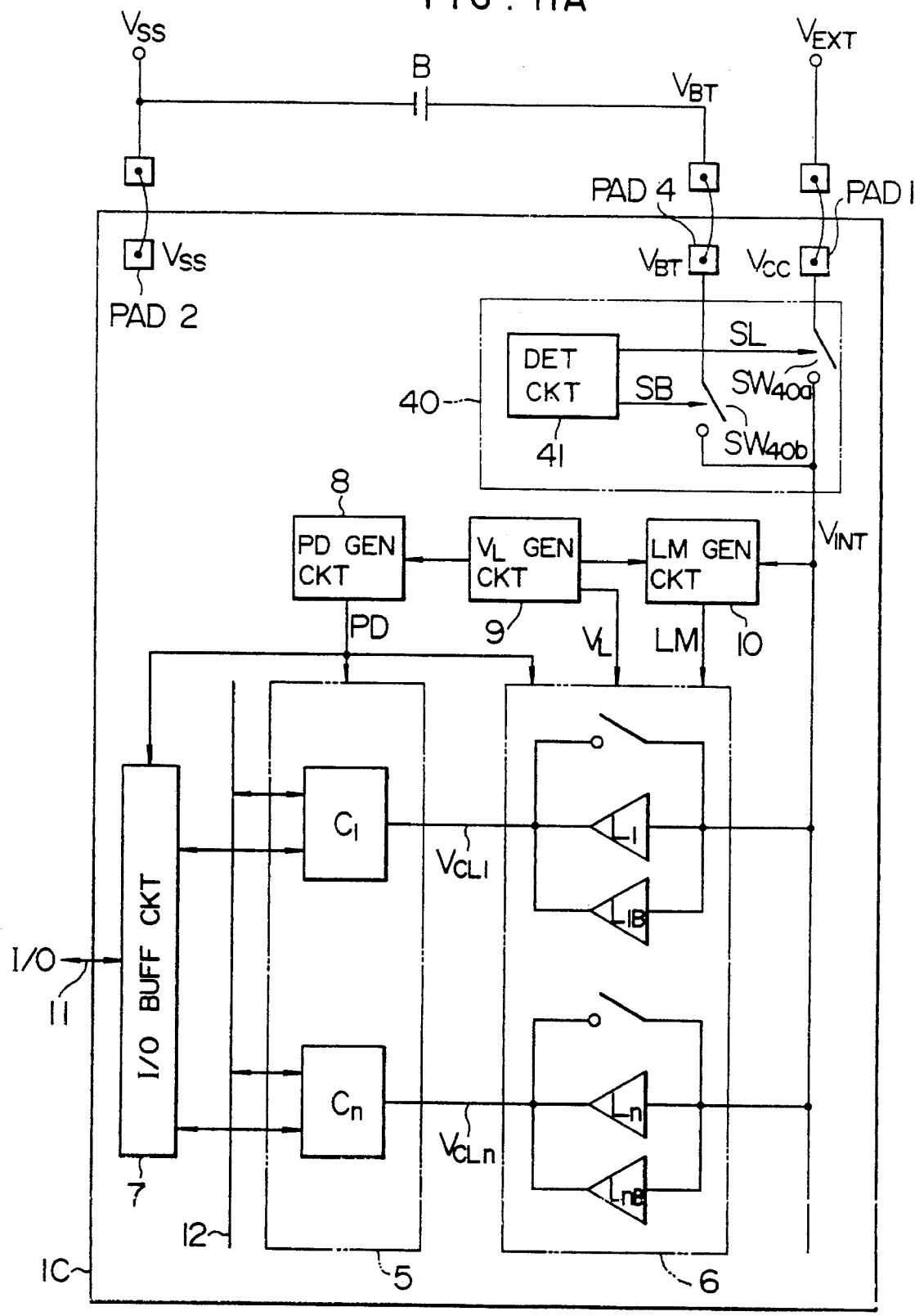

FIG. 11A shows an exemplary construction of an LSI which the battery back-up circuits as shown in FIGS. 1A and FIG. 9 are integrated on a chip and switching of power supply sources are performed on the chip. In this figure, 1C is an LSI chip which has a function of data storage or data processing like the LSI chip of FIG. 1A; numeral 40 is a power supply switching circuit; numeral 41 is a voltage drop detector circuit; $S_L$ and $S_B$ are a switching signal generated by the voltage drop detector circuit, respectively; $SW_{40a}$ and $SW_{40b}$ are switch for switching the power supply sources by the switching signal $S_L$ or $S_B$, respectively; and PAD4 is a bonding pad to which the voltage of a battery is applied. By performing the switching of the power supply voltages on the chip in this way, it is necessary to package a battery back-up circuit on a system (board), thereby reducing the number of components and so improving the production cost and the packaging density. Further, a power supply switching circuit in accordance with the characteristic of the LSI can be incorporated so that a user is not required to think of the voltage fluctuation caused by switching of the power supply sources, thereby providing a very convenient chip.

Figure 11B:
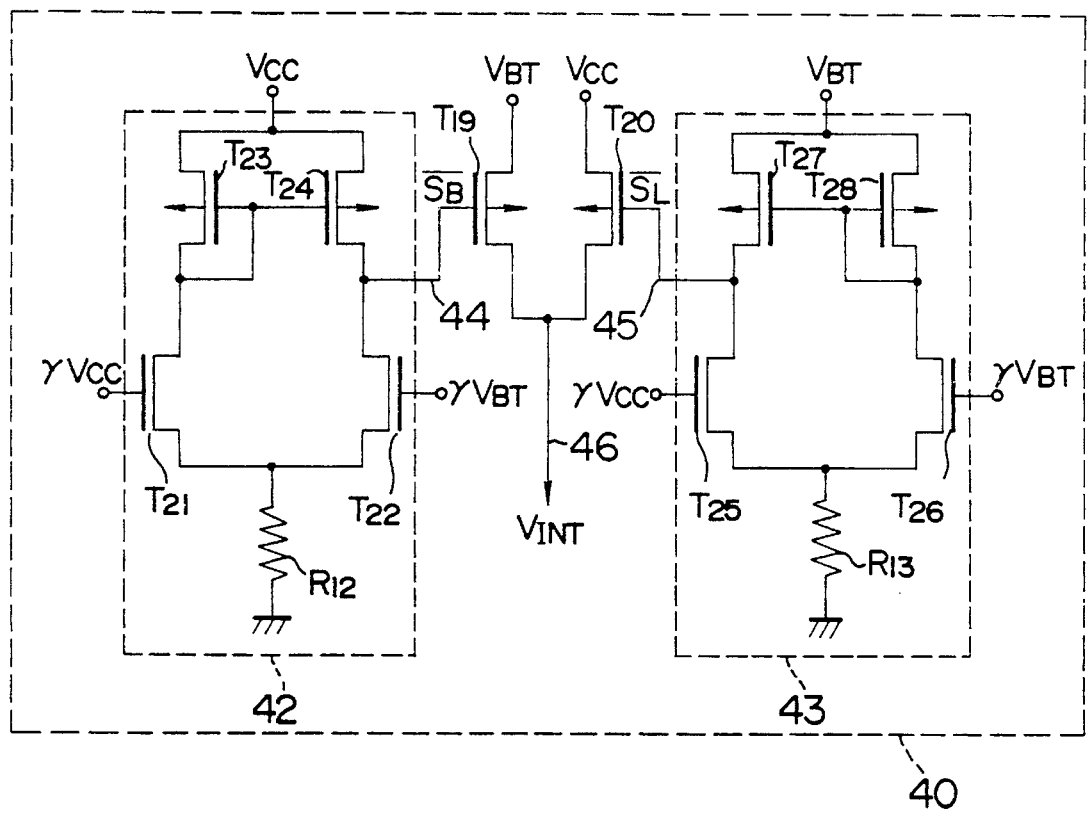

FIG. 11B shows an exemplary concrete construction of the power supply switching circuit 40. In this figure, numerals 42 and 43 are a differential amplifier circuit, respectively; numerals 44 and 45 are an output therefor; T19 and T20 are P-channel MOS-FETs corresponding to a switch for switching the power supply sources, respectively; and numeral 46 is an output of the power supply switching circuit 40. Explanation will be given for the operation of this power supply switching circuit 40. Voltages $\gamma V_{cc}$ and $\gamma V_{BT}$ in proportion to $V_{cc}$ (power supply voltage) and $V_{BT}$ (battery voltage) are applied to the non-inverting input and the inverting input of the differential amplifier circuit 42 respectively. Likewise, voltages $\gamma V_{BT}$ and $\gamma V_{CC}$ in proportion to $V_{BT}$ and $V_{CC}$ are applied to the non-inverting input and the inverting input of the differential amplifier circuit 43. Which is a proportion constant satisfying the condition $0 \leq \gamma \leq 1$ is to be desired to be a value capable of providing a sufficient voltage gain and output amplitude in the differential amplifier circuit. The above proportional voltages can be generated using resistors. The outputs 44 and 45 of the differential amplifier circuits 42 and 43 are applied to the gates of the transistors T19 and T20. When $V_{cc} > V_{BT}$, a high voltage ($V_{cc}$) appears at the output 44 and a low voltage ($-\gamma V_{cc} - V_T$) appears at the output 45 so that the transistor T19 is made conductive and the transistor T20 is non-conductive. Thus, $V_{cc}$ is output as an internal power supply voltage $V_{INT}$. Likewise, when $V_{cc} < V_{BT}$, the low voltage ($-\gamma V - V_T$) appears at the output 44 and the high voltage ($V_{BT}$) appears at the output 45 so that the transistor T19 is made conductive and the transistor T20 is made non-conductive. Thus, $V_{BT}$ is output as $V_{INT}$. This circuit operates in the same manner even when either one of $V_{cc}$ and $V_{BT}$ is 0 V so that even when only one of $V_{cc}$ and $V_{BT}$ is supplied, the supplied voltage is output as it is as a power supply voltage for the internal circuit.

Figure 11C:
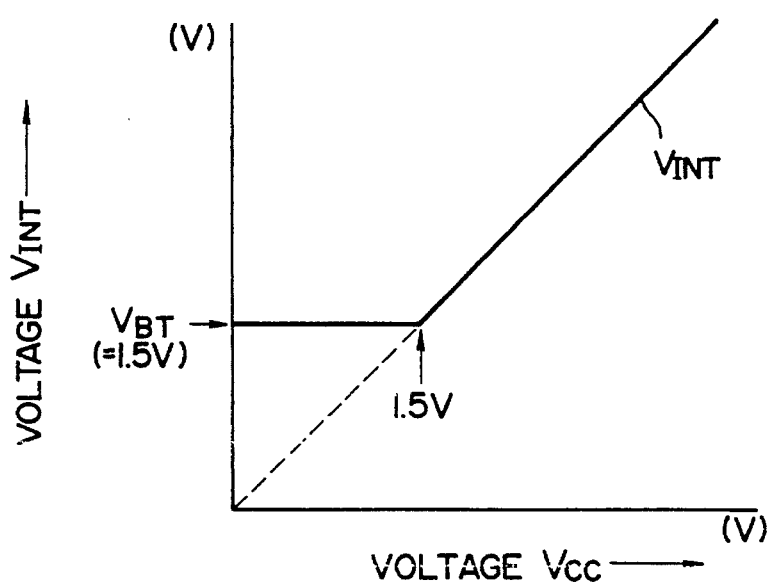

FIG. 11C shows a example of the dependency of $V_{INT}$ upon $V_{cc}$ with $V_{BT} = 1.5$ V. As seen from the figure, when $V_{cc} > 1.5$ V, $V_{INT} = V_{cc}$, and when $V_{cc} < 1.5$ V, $V_{INT} = 1.5$ V. Since $V_{INT}$ varies continuously, kink which has adverse effect on the operation of the LSI is not generated. In this way, the voltage switching circuit can be constructed in a relatively simplified circuit so that even when incorporated on an LSI chip, it does not almost increase the chip area. Although MOS-FET's are used in this example, the other devices e.g. bipolar transistors may be used.

With reference to the embodiments mentioned above, the basic idea of the LSI chip in which the main circuit block operates at the voltage of 1.5 V or less has been explained. In the following description, more detailed embodiments will be explained mainly in relation to a dynamic memory. It has been considered generally that the dynamic memory is difficult to operate at a low voltage as compared with a logic LSI or a static memory. The first reason is that the signal charge amount defined by a product of a storage voltage and storage capacitance is reduced due to voltage lowering, thereby decreasing the S/N. Therefore, it has been considered difficult to assure the noise margin for noise charge generated due to irradiation of rays emitted from a small amount of radioelements which are contained in a package and metallic wirings or noise charge due to leakage current, induced by thermal (or non-thermal) carrier generation, flowing into memory cells. These problems can be solved by one of the following two techniques.

(1) Using of a circuit which can provide the memory cell storage signal voltage (e.g. low voltage=0 V and high voltage=3 V) substantially equivalent to the conventional technique also at a low voltage power supply voltage (e.g. 1.5 V). In this case, the storage capacitance of the memory cells may be a value (e.g. 30 to 40 fF) substantially equivalent to the conventional technique.

(2) Increasing the storage capacitance of the memory cells in substantial inverse proportion to a power supply voltage in compensation for using the conventional circuit system. For example, when the power supply voltage is 1.5 V, the memory cell storage capacitance is set at 60 to 80 fF.

In connection with the technique of (1), disclosed in an embodiment described later is a technique in which by driving the plate of the memory cells as well as word lines and data lines, the signal amplitude larger than that in the data lines is stored in the memory cells. And, in connection with the technique of (2), a technique of remarkably increasing the storage capacitance as compared with the conventional technique is disclosed in JP-A-60-26711 and 1988 Symposium on VLSI Technology, Digest of Technical Papers, pp. 29–30, 1988. By means of these techniques, the storage signal charge required for stabilized operation can be assured.

The second problem to be solved for the low voltage operation is to simultaneously realize a high speed operation and low current consumption. The third problem is to realize a device or circuit which permits a low voltage operation circuit and a high voltage operation circuit to be integrated on the same chip. The third problem is particularly problematic when the voltage ratio of a high voltage source to a low voltage source is 2 or more. A technique in which the third problem can be solved by two kinds of devices for low and high voltages are formed on the same chip is disclosed in U.S. Pat. No. 4,482,985. This technique permits the circuits for both the low and high voltage power sources to be constructed using optimized devices but a disadvantage that the production process of an LSI is made complicated. In connection with the embodiment explained below, explanation will be given for means for solving the second problem and operating at a minimum power supply voltage of 1 V and a method for solving the third problem without complicating the production process. By means of these techniques, the operation power supply voltage of the dynamic memory is reduced to 1 to 1.5 V or so, and the high integration degree, high speed, and low power consumption of the dynamic memory or the LSI chip locally incorporating it can be realized simultaneously. Also, the condition required for battery operation or battery back-up operation can be satisfied.

First, the means for solving the second problem will be explained. Although in the following example, a Complementary MOS-FET (CMOS-FET) is used, a bipolar transistor, junction transistor or device of material other than silicon may be used as long as the same effect is obtained.

Figure 12A:
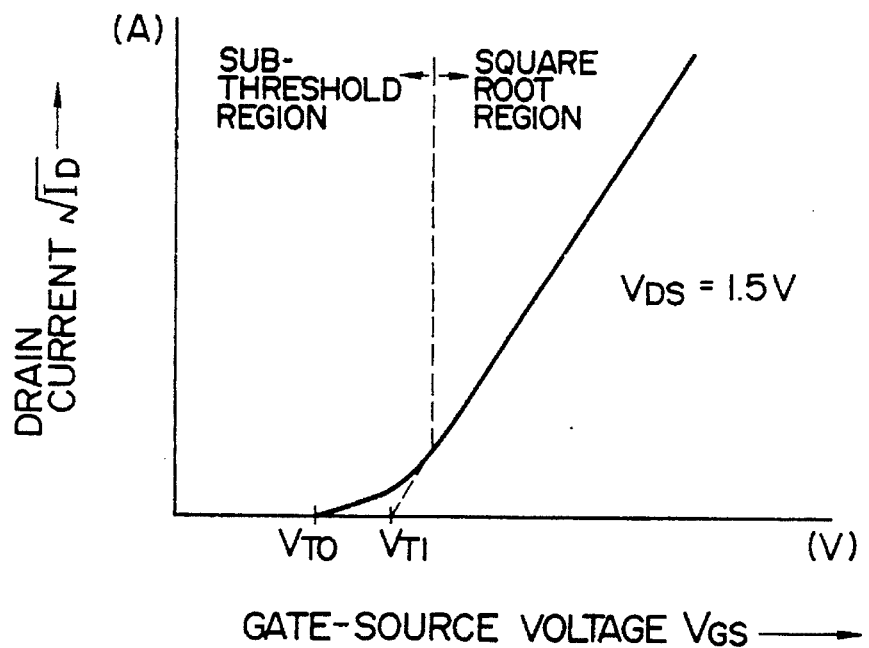

FIG. 12A shows a relation between the gate-source voltage $V_{GS}$ of an n-channel MOS-FET and the drain current $I_O$. This relation is classified into (i) a square root region where the square root of $I_O$ is substantially proportional to $V_{GS}$, and (ii) a sub-threshold region where $I_O$ is proportional to the exponential function of $V_{GS}$ in a region with a lower $V_{GT}$. In FIG. 12A, $V_{T1}$ is a so-called gate threshold voltage at which the drain current start to flow when it is assumed that the current-voltage characteristic can be approximated by the square root disregarding the region of (ii). $V_{T0}$ is the other definition of the gate threshold voltage at which the drain current can be regarded approximately zero in the circuit operation. With the gate width of 10 μm, the drain current at $V_{GS}=V_{T0}$ is about 10 nA and the drain current at $V_{GS}=V_{T1}$ is about 1 μA. The difference between $V_{T1}$ and $V_{T0}$ is about 0.2 V ($V_{T1}>V_{T0}$). The current driving capability of an actual MOS-FET is related with $V_{GS}-V_{T1}$ and the static current in a stand-by state is related with $V_{T0}$. In the following example, the threshold voltage of the devices used in the main circuit of LSI is set at $V_{T1}$=0.3 V (and so $V_{T0}$ is about 0.1 V). Thus, a CMOS sense amplifier or differential amplifier in which MOS-FET must be operated by a voltage (e.g. 0.5 V) half the power supply voltage can be operated, permitting the entire circuits in a range of the power supply voltage to 1 V to be operated. Further, the stand-by current of the entire chip can be limited to about 10 μA. Even if the threshold voltage fluctuates by −0.1 V due to unevenness of several production processes, the circuit operation at the power supply voltage of 1 V can be realized and also the stand-by current of the entire chip can be limited to 100 μA or less. Incidentally, the channel length is set at 0.3 μm so that a sufficient operation speed can be obtained at the power supply voltage of 1 V.

Figure 12B:
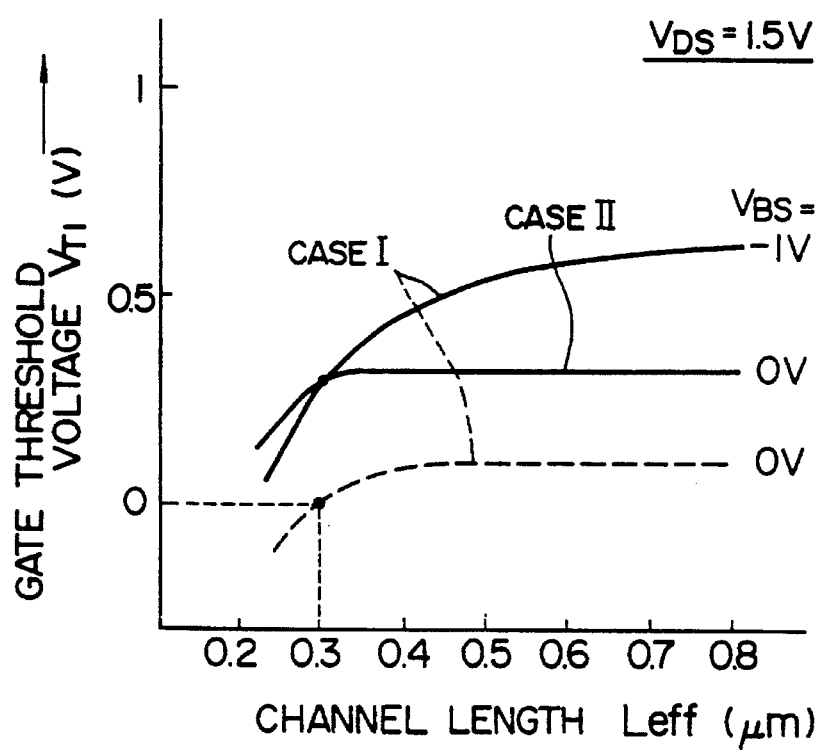

FIG. 12B shows dependency of the gate threshold voltage $V_{T1}$ upon the channel length in two n-channel MOS-FET's (case 1 and case 2). Case 1 is the characteristic of the device fabricated in accordance with the condition in the case where a substrate bias voltage is applied which is common in the dynamic memory (DRAM) based on the conventional concept, and case 2 is the characteristic of the device fabricated in accordance with the condition in the case where the substrate voltage is applied which is used. Since in the present invention, the low voltage operation is a basic premise, the experiment of the case 1 is carried out with $V_{cc}$=1.5 V and $V_{BB}$=−1 V considering the ratio of the conventional $V_{cc}$=5 V and $V_{BB}$=−3 V. The cases 1 and 2 are adapted so that the gate threshold voltage $V_{T1}$ is 0.3 V when $V_{BS}$=−1 V (case 1) and $V_{BS}$=0 V (case 2).

The device of the case 1 has the following three problems.

(1) Fluctuation of the gate threshold voltage for variation of the channel length is large so that the case 1 is inferior in the controllability as compared with the case 2, thus making it difficult to provide a short channel. This is because the substrate voltage is set at −1 V.

(2) The substrate bias voltage, which is generated by a substrate bias voltage generator circuit provided on a chip, fluctuates due to production unevenness and also greatly varies in time lapse depending on the number of operating circuits. Therefore, the gate threshold voltage, which is strongly modulated by the substrate bias voltage, can not satisfy the condition required for the low voltage operation with high accuracy.

(3) Since the substrate voltage is 0 V while the power supply is active, the gate threshold voltage is placed at a value lower than 0.3 V (e.g. 0 V) due to the body effect (see the broken line in FIG. 12B). Also, the substrate is substantially in a floating state so that the substrate voltage is transiently increased due to capacitive coupling with $V_{cc}$, thereby making the gate threshold voltage minus. Thus, the MOS-FET in a peripheral circuit is made conductive so that a large transient current flows.

On the other hand, the present invention, in which the substrate voltage is set at $V_{ss}$=0 V, can provide an LSI chip with excellent controllability of the gate threshold voltage and with a small transient current during closure of the power supply source. Further, by externally supplying the ground voltage, variation of the substrate voltage during the circuit operation can be made approximately zero so that capacitive coupling noise from the substrate voltage can be greatly decreased.

The reason why the substrate voltage fluctuates is that the conventional substrate bias generator circuit is formed on the chip and so does not have sufficient driving capability.

The reason why the substrate voltage (−3 V) is conventionally applied is that the case where the input voltage of a signal is decreased is considered. More specifically, when the input voltage is decreased from 0 V, if the substrate voltage is 0 V, the p-n junction is forward-biased, thus injecting minority carriers. The minority carriers, which destroy data stored in the memory, are not very preferable. Then, it has been conventionally permitted that the signal input voltage is decreased.

The embodiment in the present invention, which does not have such margin, requires an improvement as explained with reference to FIGS. 14A and 14B.

FIG. 13 shows the gate oxide film thickness $t_{ox}$, electric channel length (effective channel length) $L_{eff}$ and gate threshold voltages $V_{T1}$ and $V_{T0}$ of the device used in the main circuit of a dynamic memory which is capable of operating at a minimum voltage of 1 V. The values in parentheses mean the range of fluctuation due to production evenness, etc.

Figure 14A:
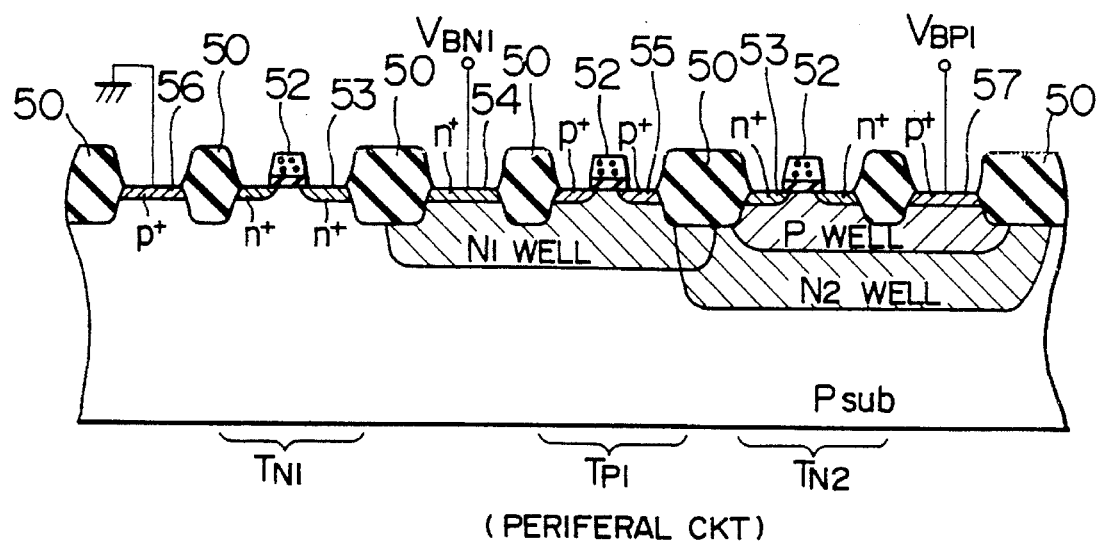
Figure 14B:
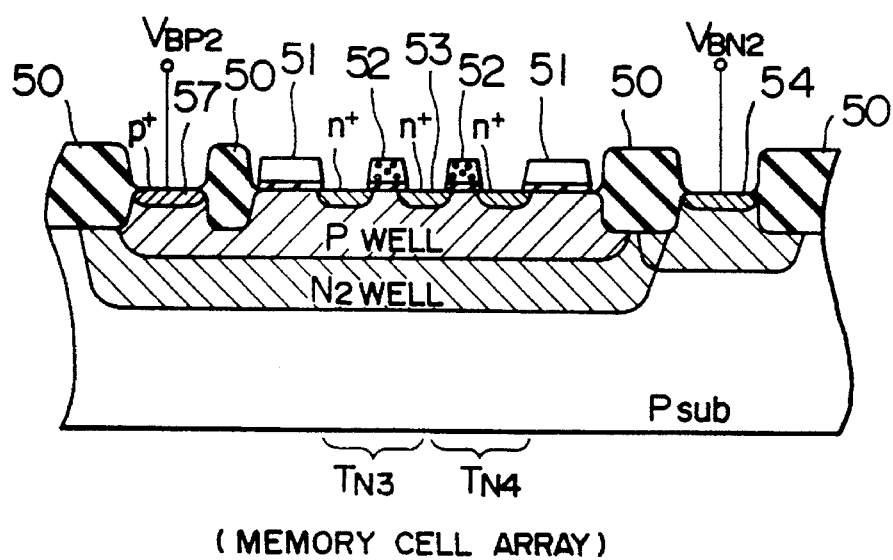

FIGS. 14A and 14B show parts of the sectional structure of the dynamic memory in accordance with the present invention. In the conventional dynamic memory, a minus voltage is applied to the substrate for the following three reasons:

(1) If a minus voltage is externally applied to the input or output due to ringing, etc., electrons which are minority carriers are injected into the substrate. The electrons diffuse through the substrate and a part thereof reaches the charge storage portion of the memory cell, thereby deteriorating the refresh characteristic. This injection of minority carriers into the substrate is intended.

(2) By applying a minus voltage to the substrate, the junction capacitance between the n diffused layer and the p substrate is reduced thereby to reduce the load capacitance. This intends the high speed operation and low power consumption of the circuit.

(3) By applying a minus voltage to the substrate, the depletion layer below the channel is extended so that the potential at the channel becomes hard to be dependent on the substrate voltage. Thus, the gate threshold voltage is not almost affected by fluctuation of the substrate voltage. In other words, the body effect coefficient of the gate threshold voltage becomes small. This is convenient in the operation of a partial circuit of the memory.

Among these reasons, the reason of (3) has become weak with tendency of the twin-well structure of CMOS-LSI. Therefore, it is important to solve the problems of (1) and (2). A substrate structure which permits a plurality of substrate voltages to be applied in CMOS-LSI is disclosed in JP-A-62-119958 (corresponding to U.S. patent application Ser. No. 87256). By combining this structure and the low voltage LSI in accordance with the present invention, a low voltage LSI with the performances of high noise resistance, high operation speed and low power consumption can be constructed. An example of such a low voltage LSI using the substrate structure shown in FIGS. 14A and 14B will be explained.

In FIGS. 14A and 14B, the impurity concentration of a p-type Si substrate is about $1\times10^{15}$ cm$^{-3}$. Formed in the substrate are two kinds of n-wells (N1 and N2) which are provided through two different steps and one kind of p-well. The impurity concentration of each well is for example about $1\times10^{16}$ cm$^{-3}$ for N2 well, and $5\times10^{16}$ cm$^{-3}$ for N1 well and P well (these values may be changed in accordance with the device size). In the figures, numerals 50 are thick oxide films about 500 nm for making electric isolation between active regions, respectively; numerals 51 are first polysilicon electrodes for forming storage capacitors, respectively; 52's are second polysilicon electrodes serving as gate electrodes of MOS-FET, respectively; numerals 53 and 54 are n-impurity diffused layers having impurity concentration of about $2\times10^{20}$ cm$^{-3}$ which are formed in a self-aligned manner using as a mask these thick oxide film and poly-silicon electrodes, respectively; and numerals 55, 56 and 57 are p-impurity diffused layers in the same manner. The p-substrate is fixed to ground potential ($V_{ss}$) through the diffused layer 56. The storage capacitor of the memory cell and selecting transistors $T_{N3}$ and $T_{N4}$ are formed within the P-well electrically isolated from the substrate through the N2 well. Applied to the P-well is a second substrate potential $V_{BN2}$ through the diffused layer 57. Applied to the N2 well is a second well potential $V_{BN2}$ through the N1 well electrically adjacent to the N2 well and the diffused layer 54. In a peripheral circuit operating at $V_{BS}=0$ V, an N-channel MOS-FET $T_{N1}$ is formed in the P-substrate and a P-channel MOS-FET $T_{P1}$ is formed in the N1 well. Also, an N-channel MOS-FET $T_{N2}$ in the peripheral circuit is formed in the P-well which is distinct from a memory cell array and electrically isolated from the P-substrate. In this way, in the case where a minus voltage in an input/output voltage, etc. or a voltage higher than the voltage in the N-wells may be externally applied, an individual substrate voltage in accordance with the overshoot or undershoot can be applied. To electrically isolate the P-well where the memory cell array is formed from the P-substrate has the other following advantages.

(1) By biasing the P-well of the memory cell array at a minus voltage, the data line capacitance can be reduced to improve the S/N.

(2) The N2 well covering the memory cell serves as a barrier for the minority carriers diffusing through the substrate. This restrains collection of noise charges into the storage capacitor, thus improving the noise resistance.

As mentioned above, by using the substrate structure as shown in FIGS. 14A and 14B, the stabilized operation of the memory cell array and the high speed operation and low power consumption in the peripheral circuit can be simultaneously realized. Incidentally, although the case of using the P-substrate was explained, using an N-substrate can provide the same effect. However, the battery operation and battery back-up operation to which the present invention is directed must consider use of the apparatus in an atmosphere where the power supply voltage greatly varies. If the N-substrate is used, a maximum voltage ($V_{cc}$) of the system is applied to the N-substrate. Therefore, when the power supply voltage greatly varies, the potential of the N-substrate also varies, and noise is induced in respective circuits due to capacitive coupling with the N-substrate. For this reason, a P-substrate as shown in FIGS. 14A and 14B is suitable for the present invention.

Figure 15A:
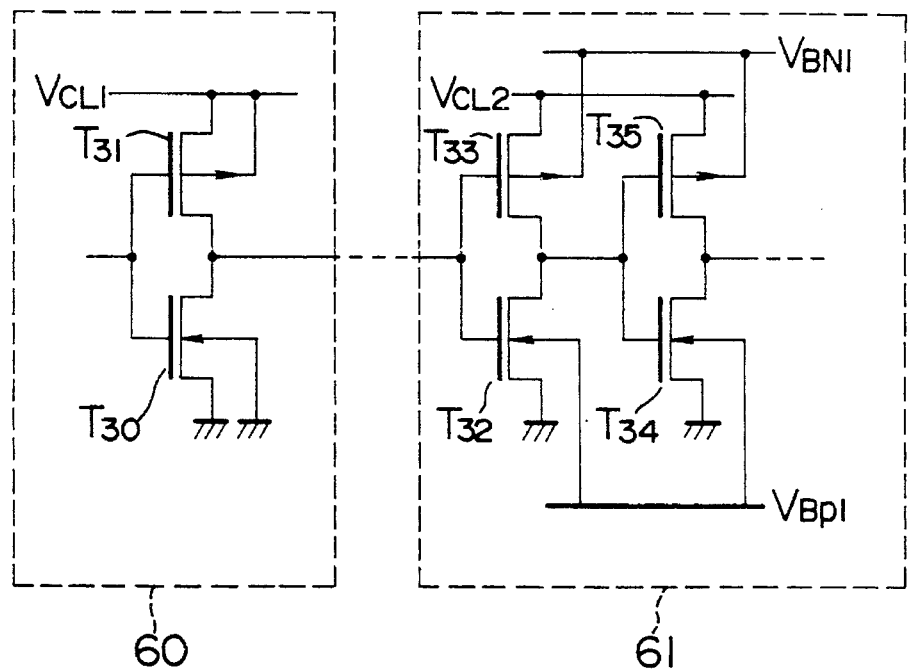
Figure 15B:
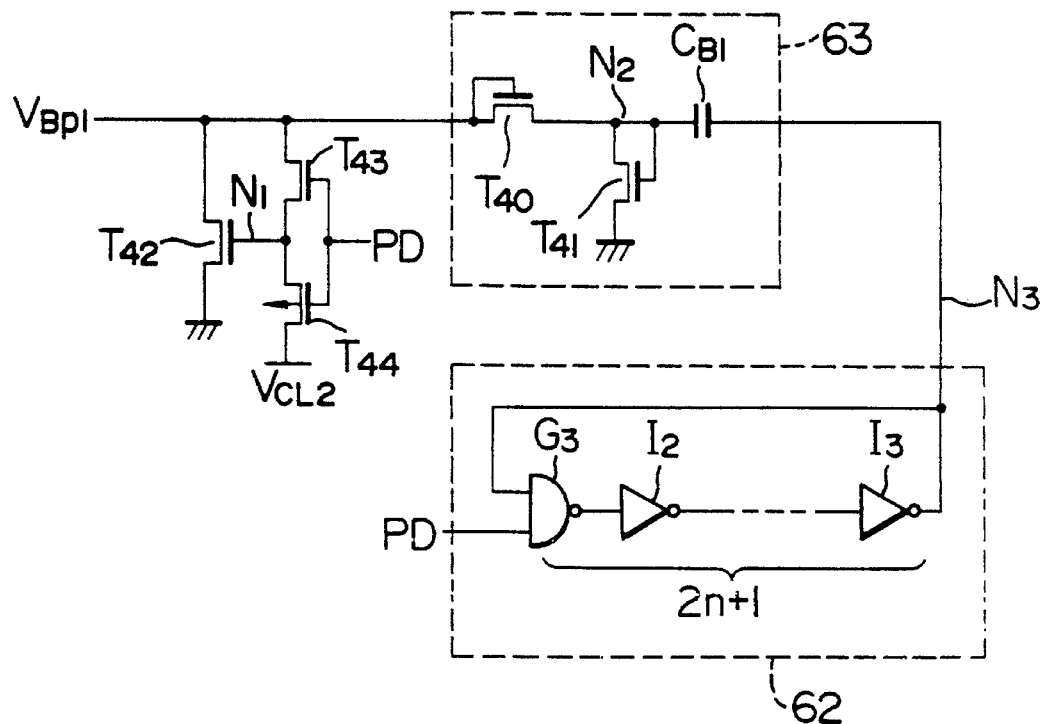

FIGS. 15A and 15B show an example of the LSI circuit which has a function of data retention and the voltage lowering of which can be further advanced in accordance with the present invention. FIG. 15A shows an example of the peripheral circuit. In FIG. 15A, numeral 60 is a circuit block operating at a power supply voltage of $V_{cL1}$; numeral 61 is a circuit block operating at a voltage of $V_{CL2}$; $V_{BP1}$ is a substrate bias voltage for N-channel MOS-FETs in the circuit block 61; and $V_{BP2}$ is a substrate voltage for P-channel MOS-FETs in the circuit block 61. The circuit block 60 is not required to operate during data retention and so $V_{CL1}=0$ during the data retention. On the other hand, the circuit block 61 is required to operate also during the data retention and the value of $V_{CL2}$ is fixed regardless of the operation state. In order to operate the circuit at a range of the power supply voltage to 0.5 V or so, threshold voltage V must be set at a range of 0 to 0.1 V or so. Then, the circuit does not operate and even with the gate-source voltage of 0 V, a current of 1 μA or so flows through MOS-FET. And a large current of 10 mA flows through the entire chip. In order to reduce the current consumed during the data retention, this static current must be reduced. Generally, the operating speed may be slower during the data retention than during the normal operation. Therefore, in this example, by controlling the substrate voltage, the threshold voltage of MOS-FETs during the data retention is changed toward the direction in which the device is hard to be conductive (the threshold voltage of the N-channel MOS-FET is made high and that of the P-channel MOS-FET is made low) as compared with that during the normal operation.

Figure 15C:
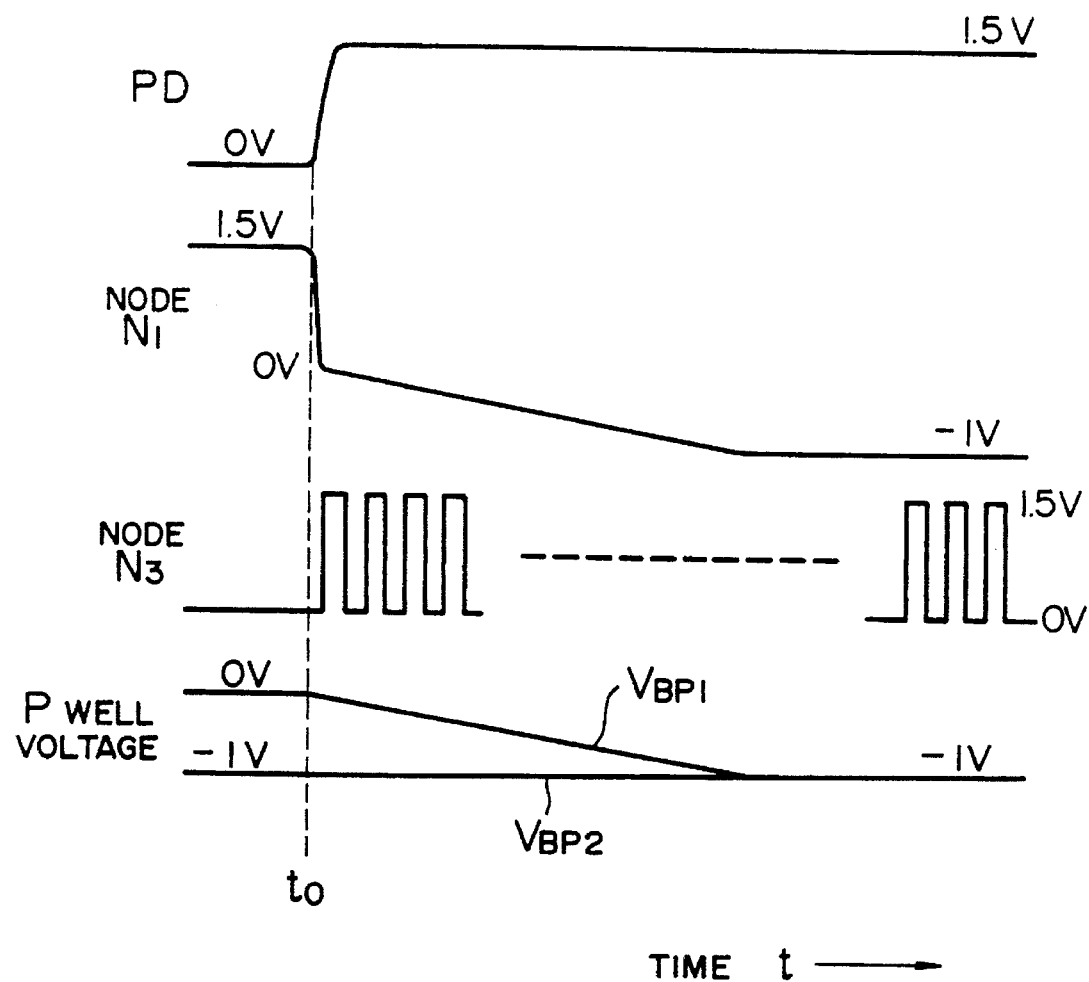

FIG. 15B shows an example of a circuit for generating the substrate voltage $V_{BP1}$ of the N-channel MOS-FET, and FIG. 15C shows the operation timing thereof. Although this circuit will be explained in the case of $V_{CL2}=1.5$ V will be explained, it is particularly efficient for the case of a low power supply voltage of 0.5 to 1 V or so. In FIG. 15B, numeral 62 is a ring oscillator constituted by inverters I2 to I3 and an NAND gate; numeral 63 is a charge pumping circuit constituted by two MOS-FETs T40 and T41 and a capacitor C; T42 and T43 are N-channel MOS-FETs, respectively; and T44 is a P-channel MOS-FET.

In the normal operation, i.e. when PD is at a low voltage ("1") level, the ring oscillator and the charge pumping circuit do not operate. Also, MOS-FET T44 is made conductive and anode N1 is at a high voltage level ("1") so that MOS-FET T42 is made conductive and $V_{BP1}$ becomes ground potential. On the other hand, in the data retention operation, i.e. when PD is a high voltage ("1") level, MOS-FET T43 is made conductive and the node N1 becomes the same level as $V_{BP1}$ so that MOS-FET T42 is cut off. Also, the ring oscillator 62 and the charge pumping circuit 63 operate, thus producing a minus $V_{BP1}$. Incidentally, the substrate bias voltage is always applied to the memory cell array. As mentioned above, by controlling the substrate bias voltage in operating the memory by a low voltage power supply of 1 V or less, the high speed operation for the normal operation and low power consumption for the data retention can be realized. It should be noted that the idea mentioned above can be adapted to a circuit for generating $V_{BN1}$.

Explanation will be given for a concrete construction of the low voltage operation dynamic memory using the substrate structure as previously mentioned.

Figure 16A:
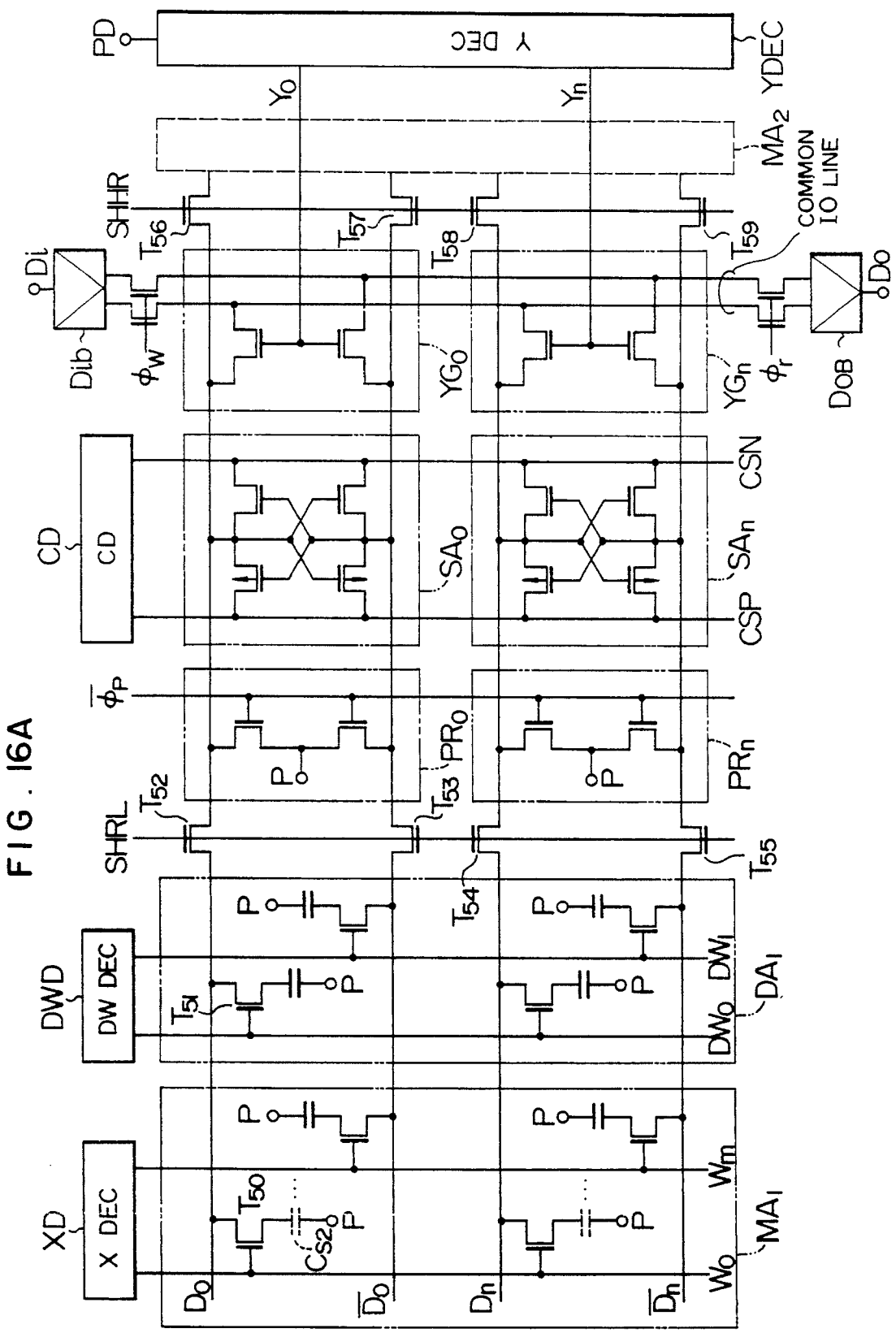

FIG. 16A shows the circuit construction of the dynamic memory. In FIG. 16A, MA1 and MA2 are memory cell arrays; DA1 is a dummy cell array; W0 to Wm are a word line; D0, $\overline{D0}$, Dn and $\overline{Dn}$ are data lines; DW0 and DW1 are dummy word lines; XD is a word line selecting circuit; DWD is a dummy word line selecting circuit; T52 to T55 are left mat selecting transistors for controlling the connection of a left mat MA1 with sense amplifiers; SHRL is a selective signal therefor; T56 to T59 are right mat selecting transistors for controlling the connection of a right mat MA2 with the sense amplifiers; SHRR is a selective signal therefor; PR0 to PRn are precharge circuits for setting the voltage of data lines during non-selection at a potential P; $\overline{\phi_p}$ is a precharge signal; SA0 to SAn are sense amplifiers for amplifying the minute signal voltage on the data lines; CSN and CSP are common source driving signals; CD is common source driving circuit; YG0 to YGn are Y gates for connecting the data lines with common I/O lines; YDEC is a Y address selecting circuit; Y0 to Yn are Y selecting circuits; DiB is a data input buffer for driving the common I/O lines in accordance with an input data; and DoB is a data output buffer for amplifying the signal current on the common I/O lines to be outputted. The value of the storage capacitance C is set at 50 to 80 fF or so as previously mentioned, and the value of the data line capacitance is set at 250 to 300 fF. Thus, with the data amplitude of 1.5 V on the data lines, the read-out signal voltage is about 150 mV which is enough to operate the sense amplifiers.

Figure 16B:
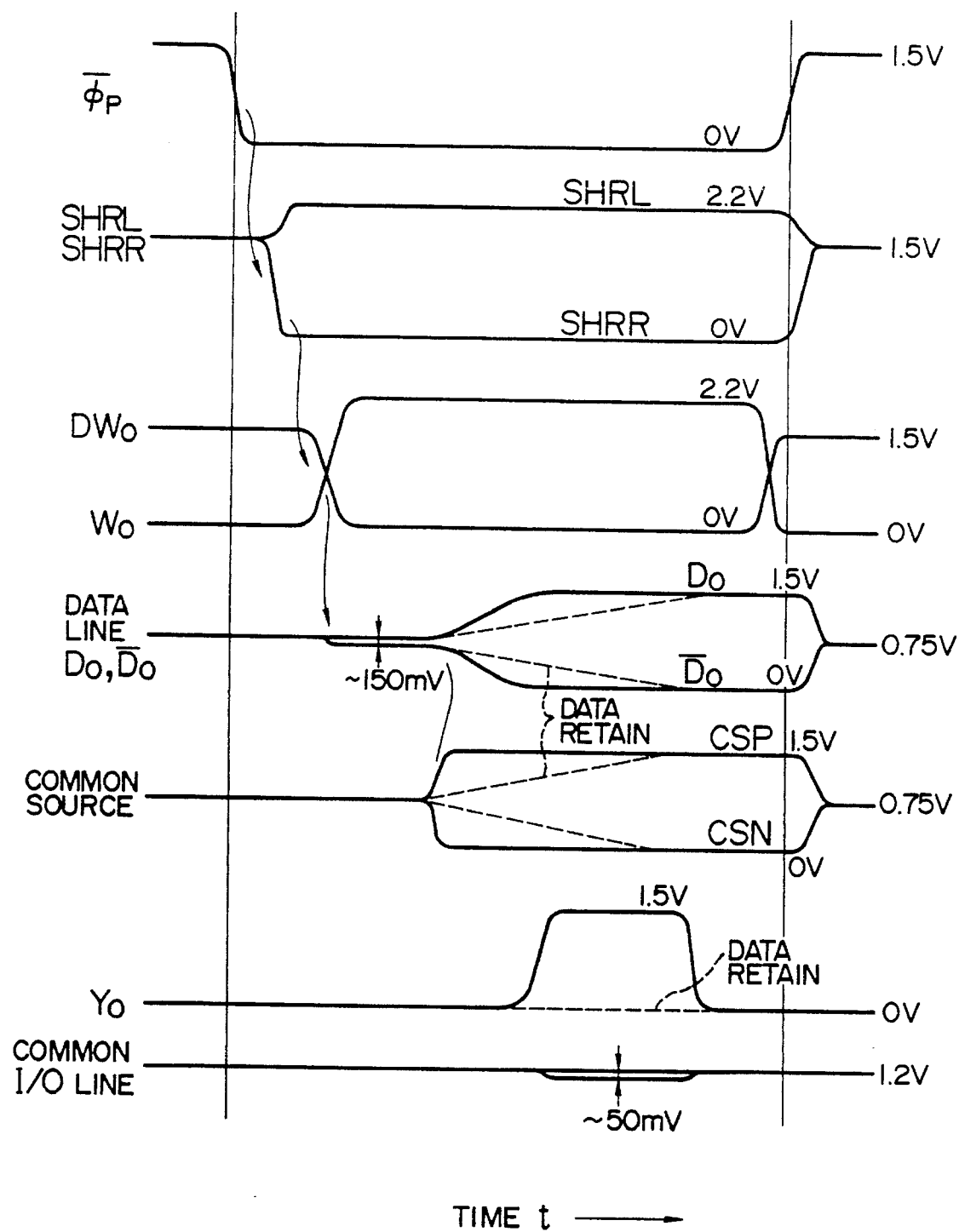
Figure 17A:
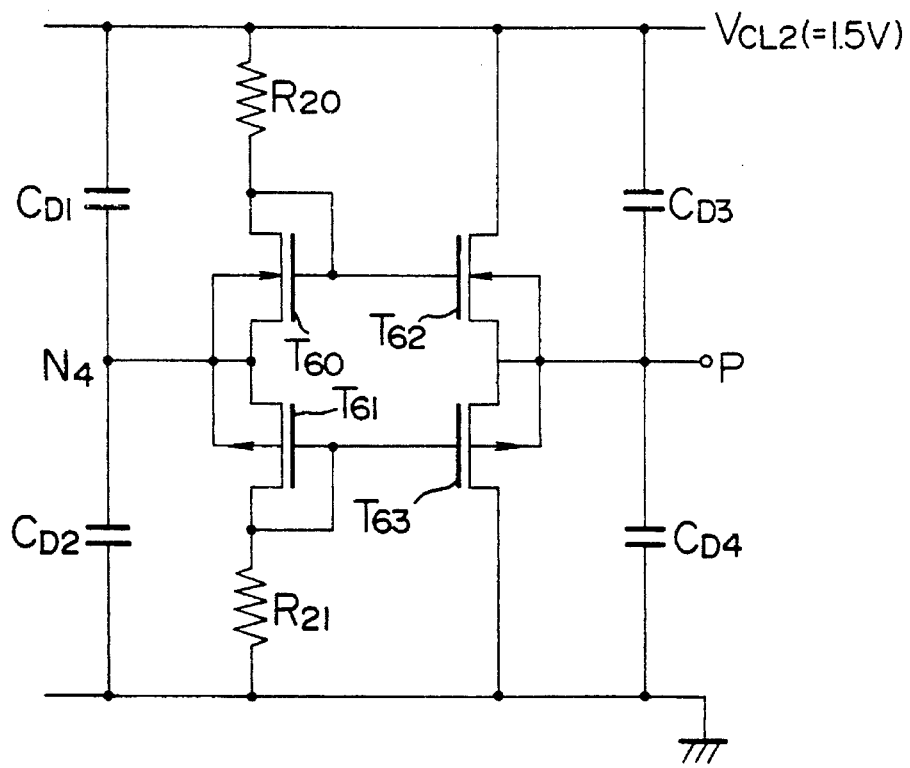

FIG. 16B shows the voltage waveforms at the respective parts at the time of data read-out with the power supply voltage of 1.5 V. The following description relates to the case where the read-out operation from the memory cells is intended and also the word line W0 is selected. The precharge voltage of the data lines and the voltage at an opposite electrode (plate) of the cell storage capacitor are set at 0.75 V which is half the power supply voltage. In this way, (1) the capacitive coupling noise which is generated in charging/discharging or precharging the data lines is minimized and also (2) with the voltage applied to an insulating film serving as the storage capacitor being minimized, making the insulating thin film realizes to increase the storage capacitance. In order to store a high voltage (1.5 V) in the memory cells, 2.2 V is applied to the word line W0 and the left mat selecting signal SHRL so that the transistors T50 and T52 operate in their non-saturation region. Also, 1.2 V is applied to the common I/O lines so that MOS-FETs in the Y gates operate in their saturation region. As an amplifier for amplifying the signal on the common I/O lines operating at such a low power supply voltage, a current detection type amplifier as disclosed in U.S. patent application Ser. No. 88/201015 is suitable. If such a type of amplifier is used, (1) the voltage level of the common I/O lines can be increased to the neighborhood of the power supply voltage, and (2) the signal amplitude of the common I/O lines can be decreased (e.g. 50 mV) so that the operation margin in applying the Y selecting signal Y0 to read a signal can be increased. The write for the memory can be performed by driving the I/O lines with the data input buffer DiB as usual. During data retention, data are not required to be externally so that the Y selecting signal Y0 remains at a low voltage level ("1") as indicated by a broken line (FIG. 16B). Also, the Y address selecting circuit, the data input buffer, the data output buffer, etc. are not required to be operated. Further, the driving capability of the common source driving circuit CD for the sense amplifiers is decreased to decrease the time change coefficient of the data line voltage. Thus, during the data retention, the peak current due to charging/discharging of the data lines is reduced. By means of such control, even when a power source with a high internal impedance such as a battery is used, malfunction of LSI can be prevented through transient reduction of the power supply voltage. In the following description, explanation will be given for the following three circuits which are indispensable to realize the low voltage operation dynamic memory:

(1) a ½ $V_{CL}$ generating circuit
(2) a word line driving circuit and
(3) a common source driving source FIG. 17A shows a circuit arrangement of the ½ $V_{CL}$ generating circuit. In FIG. 17A, T60 and T62 are N-channel MOS-FETs; T61 and T63 are P-channel MOS-FETs; and R20 and R21 are resistors for setting the bias current. The ratio of R20 to R21 in their resistance value is selected so that the voltage at a node N4 and a node P is substantially half as large as $V_{CL2}$. $C_{D1}$ to $C_{D4}$ are a speed-up capacitor adapted to follow fluctuation of the power supply voltage. Among these values, the condition of $C_{D1} \approx C_{D2}$ and $C_{D3} \approx C_{D4}$ is satisfied. The substrate and source of each transistor are connected so that its threshold voltage is not increased through the body effect. Then, the absolute value of the threshold value of each transistor is about 0.3 V. If the substrate is connected with the maximum voltage of a system but not the source, the absolute value of the threshold value $V_{T1}$ exceeds 0.5 V so that the operation at the power supply voltage $V_{CL2}=1$ V can not be obtained. In this way, in the circuit operating at a low voltage, the permissible minimum voltage is defined by the manner of providing the substrate voltage. Incidentally, the connection of the substrate with the source can be easily made using the substrate structure as shown in FIGS. 14A and 14B.

Figure 17B:
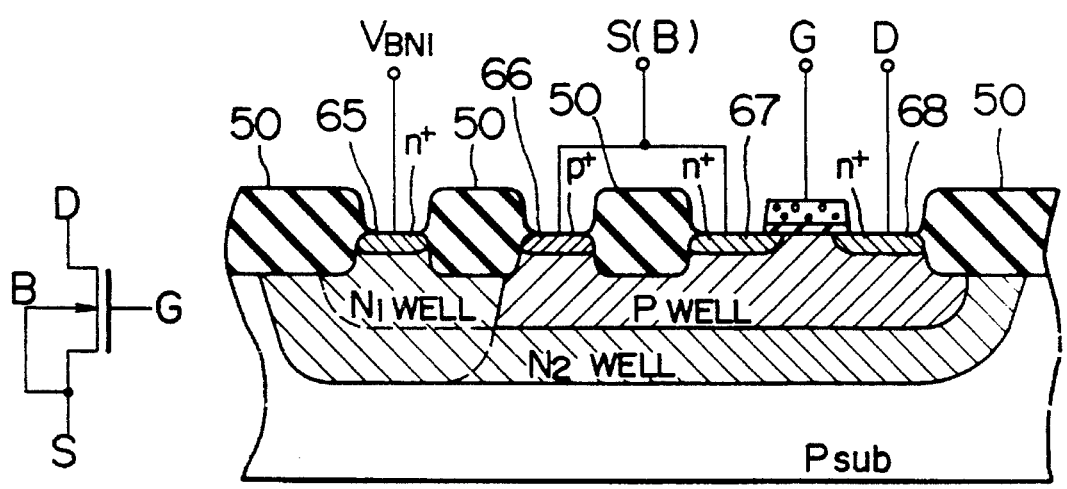

FIG. 17B shows a section structure of the N-channel MOS-FETs T60 and T62. In FIG. 17B, numeral 65 is an n-diffused layer for providing the potential at an N2 well; numeral 66 is a p-diffused layer for providing the potential at a P well; and numerals 67 and 68 are n-diffused layers serving as a source and drain of the N-channel MOS-FETs. The p-diffused layer 66 which provides the substrate voltage of the MOS-FET is connected with the source thereof through external wiring. Applied to the N2 well is the maximum voltage of the system i.e. $V_{CL2}$. As understood from the above example, the MOS-FET can be formed in the P well electrically isolated from the substrate so that the circuit suited for low voltage operation in which the threshold voltage is not affected by the body effect can be constructed. This example can be applied to a differential amplifier, etc. in which the source is operated at a higher voltage than ground potential.

Figure 18A:
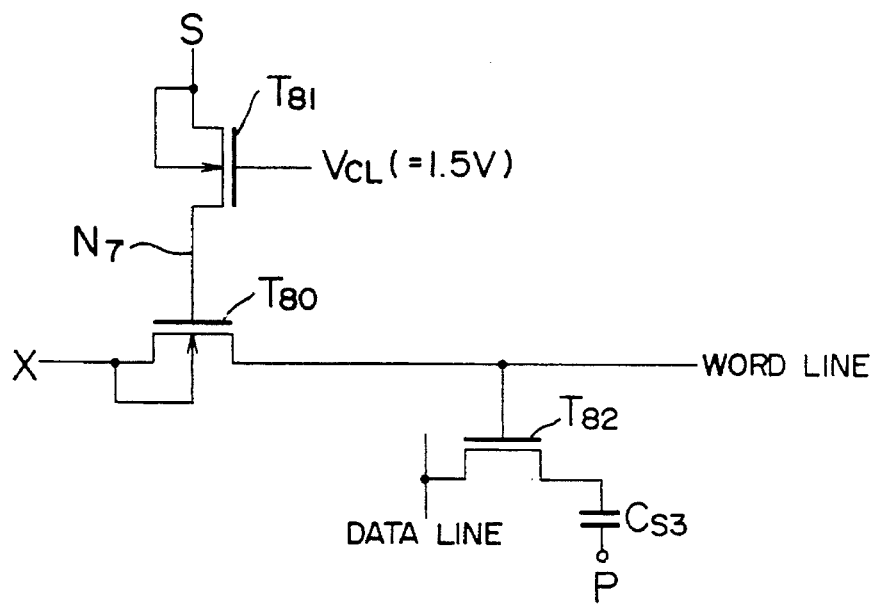
Figure 18B:
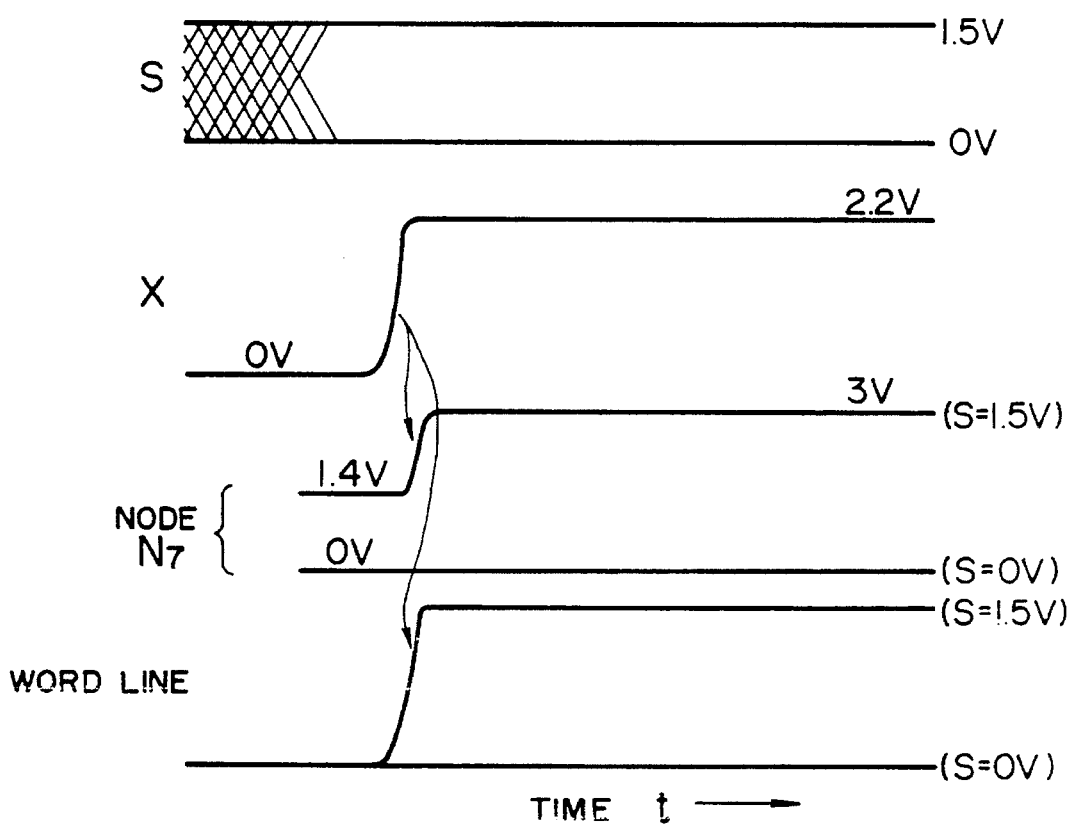

FIG. 18A shows a circuit arrangement of the word line driving circuit and FIG. 18B shows an operation timing chart thereof. In FIG. 18A, T82 is a memory cell transistor; $C_{S3}$ is a storage capacitor; and T80 and T81 are N-channel MOS-FETs. The circuit shown in FIG. 18A is generally referred to a self-boost circuit. A selection signal for the word line selecting circuit XD of FIG. 16A is applied to a terminal S. This signal is at a high voltage level (e.g. 1.5 V) during selection and is at a low voltage level (0 V) during non-selection. Therefore, $V_{CL}-V_{T0}$ ($V_{T0}$ is the threshold voltage of T81) is applied to a node N7 during the selection and 0 V is applied to the node N7 during non-selection. After the selection signal has been decided, a higher pulse voltage (e.g. 2.2 V) than the power supply voltage is applied to a terminal X so that the memory transistor can be sufficiently turned on. Although during the non-selection, the MOS-FET T80 is not conductive, during the selection the node N7 is boosted to a high voltage through coupling with the gate capacitance of the transistor T80. In order for the pulse voltage applied to the terminal X to be outputted to the word line as it is, the voltage at the node N7 must be boosted to a higher voltage than the pulse voltage applied to the terminal x, e.g. 2.2 V+$V_{T1}$ ($V_{T1}$ is the threshold voltage of T80). If the substrate potential of MOS-FET is set at the ground potential, it is difficult to provide a predetermined amplitude in the word line for a low voltage power source with $V_{CL}$=1.5 V or less since the threshold voltage is increased due to the body effect. In this example, in order to set the threshold voltage of MOS-FET at a sufficiently low value, the substrate voltage is connected the drain on the side of signal driving (by the selection signal S and the pulse voltage X in this example) (for convenience of explanation, the drain is defined as a terminal to which the driving signals are applied).

Figure 18C:
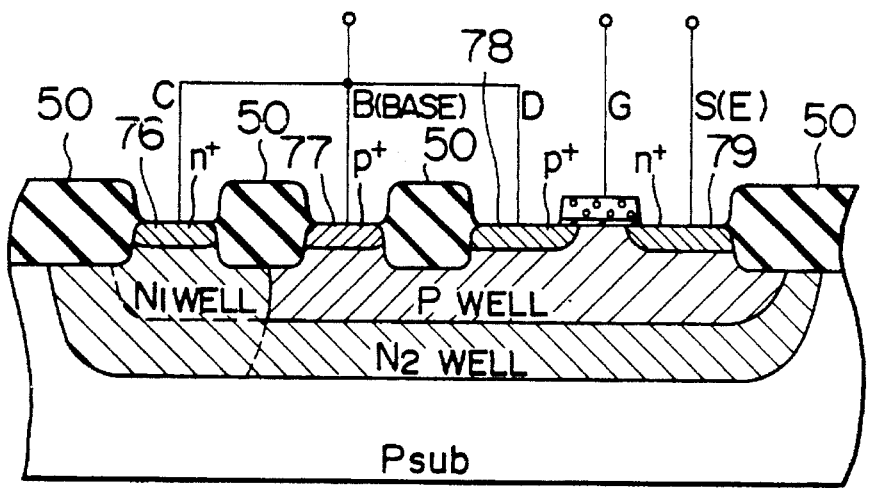
Figure 18D:
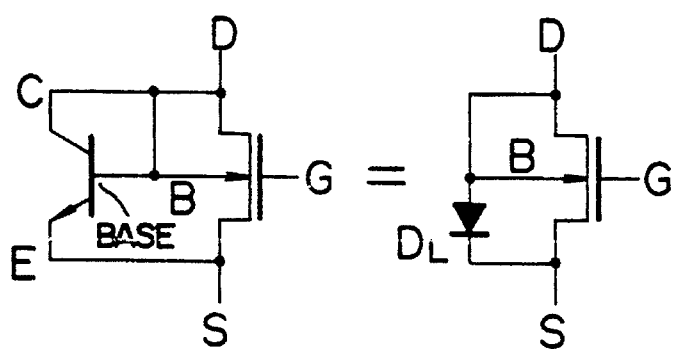

FIG. 18C shows a sectional structure of such a MOS-FET and FIG. 18D shows the equivalent circuit thereof. Although the sectional structure is the same as that of FIG. 17B, wiring thereof is different from the latter. Since the potential at the P well coincides with the potential at the drain, the wiring is equivalent to that as shown on the left side of FIG. 18D, there is provided a bipolar transistor having a collector and a base connected with the drain and having an emitter connected with the source. The bipolar transistor, in which its collector and base are connected, actually serves as a diode, and the wiring can be expressed as an equivalent circuit as shown on the right side in FIG. 18D. Thus, if the drain voltage is higher than the source voltage, the MOS-FET in which the substrate voltage is forward-biased for the source and the diode $D_L$ are connected in parallel. On the contrary, if the drain voltage is lower than the source voltage, the diode $D_L$ is reverse-biased to be cut-off and so only the MOS-FET, in which the substrate voltage is connected with the drain on the low voltage side, operates. Therefore, the threshold voltage in the former case is lower than that in the latter case, so that in the former case, the MOS-FET is likely to be conductive. Also, when the voltage difference is equal to 0.7 V or more, the diode is conductive so that in the former case, current is further likely to flow. Accordingly, the threshold voltage of the MOS-FETs T80 and T81 in driving the word line can be set at a low voltage so that also at a low power supply voltage the driving signal X can be outputted to the word line as it is. Such asymmetrical characteristic is efficient particularly for a self-boost circuit or the like but permits the low voltage operation to be improved also when it is applied to a rectifier circuit used in a charge pumping circuit for e.g. a pass-gate or a substrate bias voltage circuit.

Figure 19A:
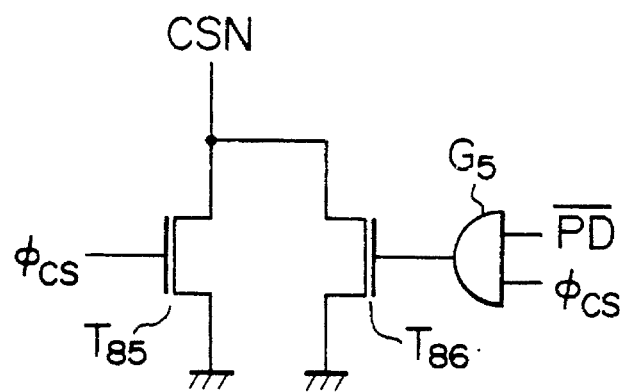
Figure 19B:
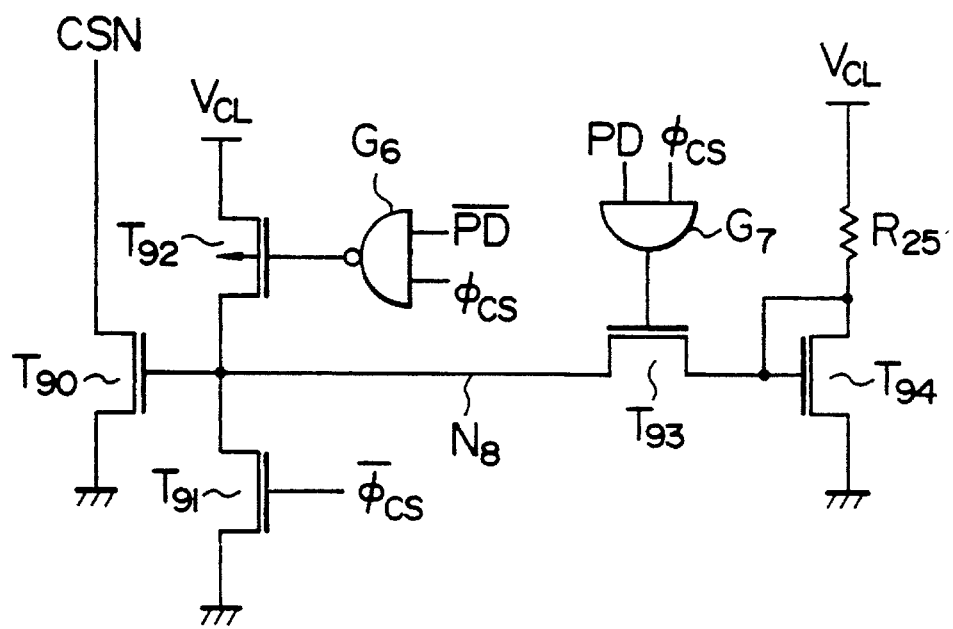

FIGS. 19A and 19B show an exemplary circuit arrangement of the common source driving circuit, respectively. In FIG. 19A, T85 and T86 are N-channel MOS-FETs for driving the common source; and G5 is an AND gate. During the normal operation, a signal $\overline{PD}$ is at a high voltage level ("1") and is synchronized with an input common source driving signal $\phi_{cs}$ so that both T85 and T86 become conductive. On the other hand, during data retention, $\overline{PD}$ is at a low voltage level ("0") so that only T85 becomes conductive in response to an input $\phi_{cs}$. Thus, by suitably selecting the conductance of T85 and T86, the operation speed can be preferred during the normal operation whereas the peak current can be reduced in compensation for sacrificing the operation speed.

In FIG. 19B, T90 is an N-channel MOS-FET for driving the common source; T91, T93 and T94 are P-channel MOS-FETs; T92 is a P-channel MOS-FET; G5 is a NAND gate; G7 is an AND gate; and R25 is a resistor for supplying a bias current to T94. During the normal operation, a signal PD is at a low voltage level ("0"), thus cutting off T93. During the normal operation, a signal PD is at a low voltage level ("0") and so T93 is cut off. The voltage at a node 8 becomes $V_{CL}$ in synchronization with the input of $\phi_{cs}$, thus driving T90. During the data retention, the signal PD is at a high voltage ("1") and so T93 is cut off. In synchronization with the input of $\phi_{cs}$, T93 becomes conductive so that the voltage at the node 8 coincides with the gate voltage of T94. Then, a current mirror circuit is constituted by T90 and T94 so that the driving current for the common source is proportional to ($V_{CL}-V_{T1}$)/R25 where the proportional coefficient is defined by the ratio of T90 and T94 in their channel conductance. By using the driving circuit mentioned above, the common source is driven during the data retention with a constant controlled current so that the transient decrease in the power supply voltage due to the internal impedance of a battery does not occur, thus realizing the stabilized operation. Incidentally, the means other than the above current mirror circuit may be used as long as it can control the driving current during the data retention.

By means of the substrate structure, device constant and circuit arrangement in the embodiments as explained above, a dynamic memory assuring its operation at a minimum power supply voltage of 1 V can be realized. Further, in place of the circuit arrangement of the I/O lines and the Y-gates as shown in FIG. 16A, a technique of individually providing common I/O lines for both read and write whereby the operation margin during the read and write can be further improved may be adopted which is disclosed in JP-A-61-142549 and JA-A-61-170992. This technique permits the memory to be stably operated at a low power supply voltage of 1 V or so without being affected by variations of the devices.

Several arrangement examples of the main LSI circuit block which can operate a low internal power supply voltage of 1.5 V or less have been explained in relation to memories. However, in order to realize the LSI chip as shown in FIG. 1A, the circuits which can operate at a relatively high external voltage are also indispensable. These circuits at least include the following circuit:

(1) a reference voltage generating circuit, (2) a voltage converting (dropping) circuit,
(3) an input circuit and
(4) an output circuit.

As indicated in the table of FIG. 13, used in the main circuit block operating at a low internal power supply voltage of 1.5 V or less for the purpose of assuring its operation speed are device (having e.g. the gate length of 0.3 µm or less) fabricated by the up-to-date processing technique. However, these scaled-down devices are reduced in their gate withstand voltage and drain withstand voltage, thus making it difficult to operate the circuit block at a relatively high external voltage (e.g. 3 to 5 V). This is disclosed in IEDM Technical Digest, pp. 386 to 389, 1988. Considering the reliability for a long time, the voltage that can be applied to the gate oxide film having a thickness of 10 nm is about 4 V. Therefore, the maximum electric field intensity $E_{max}$ that can be applied to the gate oxide film is on the order of 4 MV/cm. It may be assumed that the value of $E_{max}$ does not approximately depend on the thickness of the gate oxide film and does not almost vary (actually has a tendency of slightly increasing with the decrease of the thickness of the gate oxide film). If this value is applied to device (gate oxide film thickness $t_{ox}$=6.5 nm) identified in FIG. 13, the maximum voltage that is permitted to apply is 2.7 V. Thus, this device can not be operated at a relatively high external voltage (e.g. 3 to 5 V). In order to solve this problem, the following two techniques can be proposed.

(1) As mentioned previously, on the same chip integrated in addition to the devices operated by the internal power supply voltage are the devices, with a relatively thick gate oxide film, operated by the external power supply voltage.
(2) The circuit block is constituted by only the devices operated by the internal power supply voltage. In this case, circuit contrivance is made so that the external power supply voltage is not directly applied to the devices.

The technique of (1) is disclosed in U.S. Pat. No. 4,820,85. This technique, however, complicates the fabricating process of LSI and so increases the production cost. Also this technique includes manly steps in forming gate oxide films which is most important in fabricating the devices so that it provides high possibility of introducing impurities and defects, thus reducing the reliability of the devices. Explanation will be given for the circuit block at a high power supply voltage realized by the technique of (2). Although in the following example, complementary MOS-FETs are used, the other devices e.g. bipolar transistors or junction transistors, combination thereof with MOS-FET and devices made of semiconductor material (e.g. GaAs) other than silicon may be used.

Figure 20A:
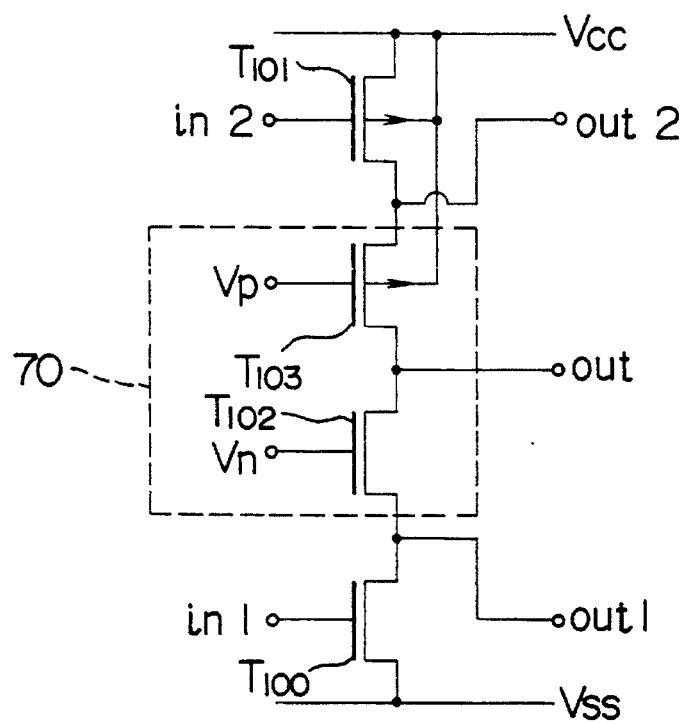
Figure 20B:
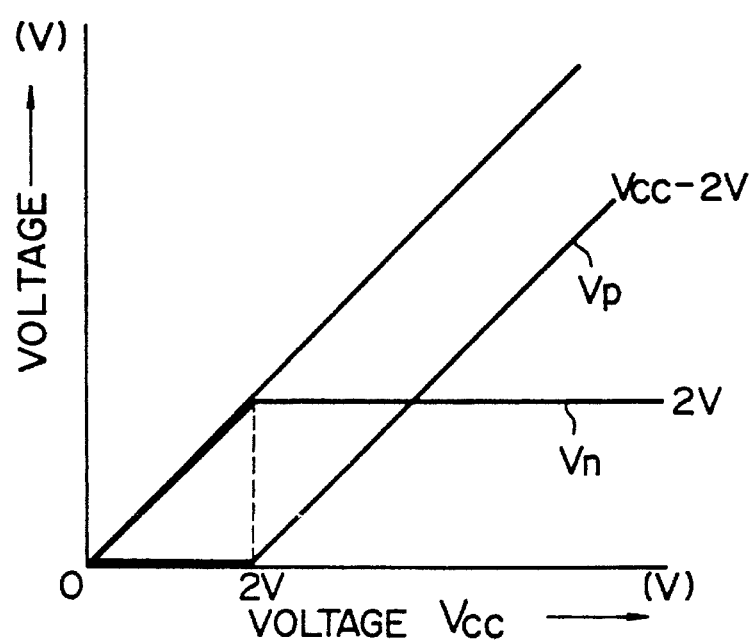

FIG. 20A shows an examplary arrangement of the inverter circuit in accordance with the present invention. In FIG. 20A, T100 and T102 is an N-channel MOS-FET; T101 and T103 is a P-channel MOS-FET; in1 and in2 are a first and a second in-phase input terminal, respectively; out1 and out2 are a first and a second in-phase output terminal, respectively; Out is a third output terminal; and Vn and Vp are bias power supply voltages for the N-channel and the P-channel MOS-FET, respectively. Vn and Vp have dependency on the power supply voltage as shown in FIG. 20B. In this example, when $V_{cc} \geq 2$ V, Vn=2 V and Vp=$V_{cc}$−2 V. Thus the voltage at the output terminal out1 is Vn−$V_{TN}$ at the maximum so that the maximum voltage applied to the gate oxide film of the transistor T100 is limited to $V_n$−$V_{TN}$. Likewise, the maximum voltage applied to the gate oxide film of the transistor T101 is limited to $V_{cc}$−$V_p$+|$V_{TP}$|. $V_{TN}$ is a gate threshold voltage of T102 and $V_{TP}$ is a gate threshold voltage of T103. The signal levels at two output terminals out1 and out2 become 0~$V_n$−$V_{PN}$ and $V_{cc}$−$V_p$+|$V_{TP}$|~$V_{cc}$, which drive inputs of the subsequent inverter. 0~$V_{cc}$, i.e. full-amplitude can be outputted to the third output.

Figures 20C, 20D:
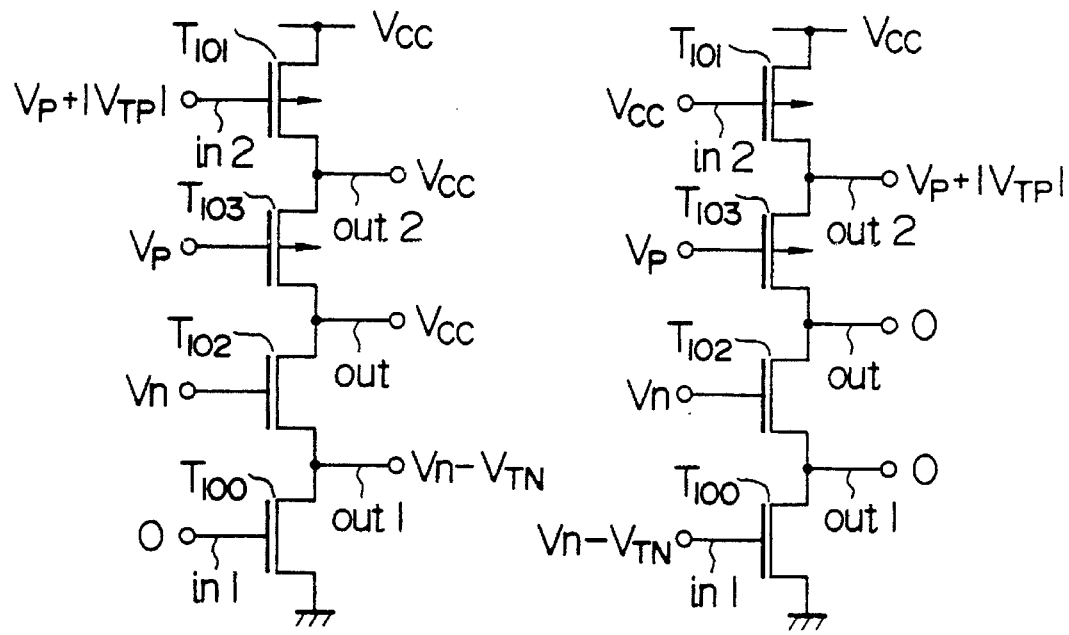

When an inverter array is constructed using the above inverter (FIG. 20C), the voltage at each node is as shown in FIG. 20C. In FIG. 20C, the left side array relates to the case where an input is at an low level and the right side array relates to the case where an input is at a high level. As seen from the figure, when the input is at a low level, the voltage at in1 is 0 V and the voltage at in2 is $V_p$+|$V_{TP}$| so that the transistor T100 is cut off and the transistor T101 is turned on. Thus, the high level voltage is produced at the outputs, more specifically, $V_n$−$V_{TN}$ is outputted at out1 and $V_{cc}$ is outputted at out2. Likewise, is $V_n$−$V_{TN}$ and the voltage at in2 is $V_{cc}$ so that when an input is at a high level, the voltage at in1 the transistor T100 is turned on and the transistor T101 is cut off. Thus, the low level voltage is produced at the outputs, more specifically, 0 V is output at out1 and $V_p$+|$V_{TP}$| is output at out2. In both cases the maximum voltage applied to the gate oxide film of each transistor is listed on the table of FIG. 20D.

In accordance with the above arrangement, for example, when $V_n$=$V_p$=½ $V_{cc}$, in any transistor, the maximum voltage applied to the gate oxide film is limited to ½ $V_{cc}$ and the maximum voltage applied between the drain and the source thereof i limited to ½ $V_{cc}$+$V_{TN}$ or to ½ $V_{cc}$+|$V_{TP}$|. Actually, in order to assure sufficient operation margin of the inverter, $V_n$ and $V_{cc}$−$V_p$ are desired to be constant at a low power supply voltage. Further, in order that a large voltage is not applied between the drain and source, the channel conductance of T102 and T103 is desired to be larger than that of T100 an T101, respectively. In this way, realized is a circuit which can operate, without deteriorating the device characteristic, at a power supply voltage range reaching about twice as large as the maximum voltage applied to the devices.

Further, in the example shown in FIG. 20A, the substrate potential of the N channel MOS-FET is connected with the minimum voltage of the system, i.e. $V_{ss}$ while the substrate potential of the P channel MOS-FET is connected with the maximum voltage of the system, i.e. $V_{cc}$. However, if the substrate structure previously mentioned is used to connect the substrate of each transistor with the source, fluctuation of the threshold voltage due to the body effect can be restrained, thus realizing the circuit operating at a lower power supply voltage. Therefore, in accordance with the present invention, using only MOS-FET's with a thin oxide film of 6.5 nm or so can provide an LSI which can stably operate at a power supply voltage of 5 V.

Figure 21A:
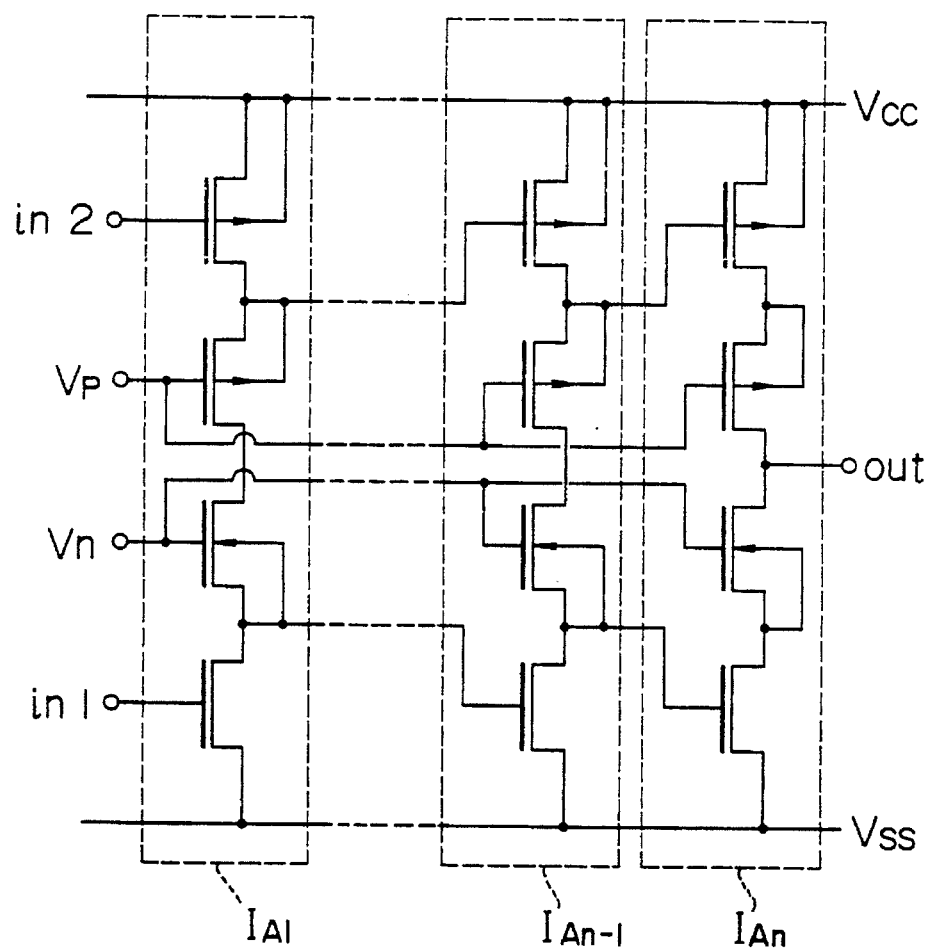
Figure 21B:
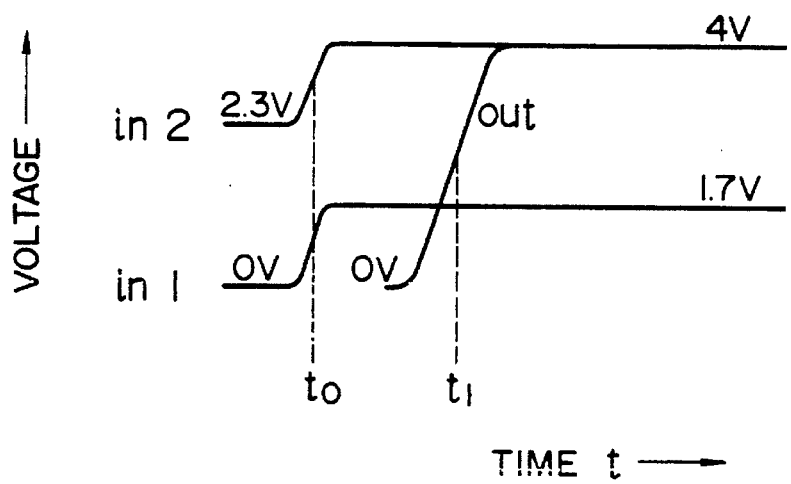

FIG. 21A shows an exemplary arrangement of the inverter array (inverter chain) in which a plurality of stages of the inverters, each with an improved operation characteristic for a low power supply voltage through the connection of the substrate with the source, are connected. Like the conventional C-MOS inverter array, these inverters can be connected without inserting a level converting circuit as they are. Thus, a driver circuit which requires a large load driving capability like an output buffer can be constructed. Assuming that the number of the stages is an even number, the waveforms at the input and output are as shown in FIG. 21B. In this example, the settings of $V_{cc}$=4 V, $V_n$=2 V and $V_p$=2 V are made. In this array, the amplitude of the output signal for driving the subsequent inverter stage is almost constant (1.7 V) regardless of the power supply voltage. Therefore, the driving capability of MOS-FET for charging/discharging the gate capacitance of the subsequent inverter stage does not depend on the power supply voltage so that the delay time ($t_1$–$t_6$) from the input to the output is substantially constant regardless of the power supply voltage. Thus, the access time of e.g. a memory LSI does not almost vary even in a wide power supply voltage range of 1.5 to 5 V, thus providing an LSI chip which is convenient for constructing a system.

Figure 22A:
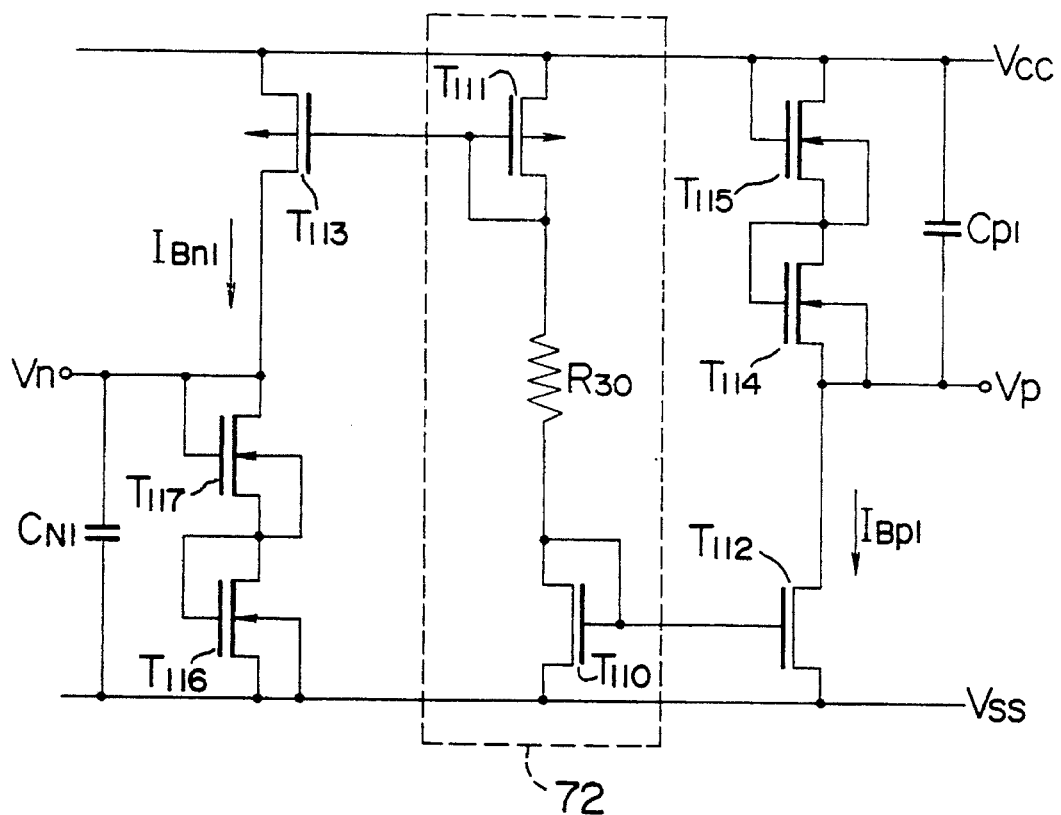
Figure 22B:
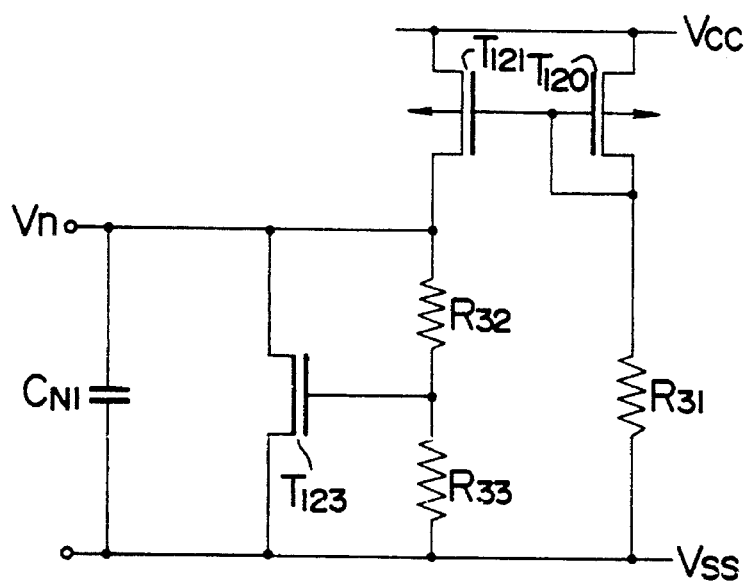

FIGS. 22A and 22B are exemplary arrangements of the circuit for generating the bias voltages $V_n$ and $V_p$ shown in FIG. 20A. In the figures, T114 to T117 the channel portion of which are indicated by thick solid lines are N channel MOS-FETs having a high threshold voltage; T112 and T113 are MOS-FETs for supplying a bias voltage; numeral 72 is a bias generating circuit for generating the gate voltage for T112 and T113 to set an optimum bias current; and $C_{N1}$ and $C_{P1}$ are decoupling capacitors. The value of the bias current is set by the resistance of a resistor R30 and the ratio between T113 and T112 in their channel conductance. The N channel MOS-FET's having a high threshold voltage are, after their gate oxide film has been formed, for example, by introducing P type impurities through the ion injection using resist as mask. In this example, threshold voltage is set at 1 V. Further, by using the substrate structure as previously mentioned and connecting the substrate with the source, fluctuation of threshold voltage due to the body effect is removed to enchance the setting accuracy. The MOS-FETs T112 and T113 serve as a power supply voltage. In accordance with the above arrangement, when the power supply voltage $V_{cc}$ is 2 V or more, the value of $V_n$ is about twice (about 2 V) as large as the above high threshold voltage and when $V_{cc}$ is lower than 2 V, $V_n$ is substantially equal to $V_{cc}$. Likewise, when $V_{cc}$ is 2 V or more, the value of $V_p$ is about $V_{cc}$–2 V and when $V_{cc}$ is lower than 2 V, $V_p$ is substantially equal to 0 V.

FIG. 22B shows the other arrangement example of the bias voltage generating circuit. Although only the $V_n$ generating circuit is shown, $V_p$ generating circuit can be constructed in the same manner. In FIG. 22B, T123 is an N channel MOS-FET having a high threshold voltage; T121 is a P channel MOS-FET for supplying a bias current; T120 and R31 constitute a bias generating circuit for generating the gate voltage for T121 to set an optimum bias current; $C_{N1}$ is a decoupling capacitor; and R32 and R33 are resistors. Assuming that the threshold voltage of T123 is $V_{PE}$, $V_n$ is $V_{TE} \times (R32+R33)/R33$. By varying the ratio of R32 to R33, $V_n$ can be set at any optional value which is equal to $V_{PE}$ or more. Thus, the bias voltage having the characteristic as shown in FIG. 20B can be generated. Incidentally, the resistors in this example may be constituted by any of the channel of MOS-FET, the impurity diffused layer and the wiring layer of polysilicon, etc.

Figure 23A:
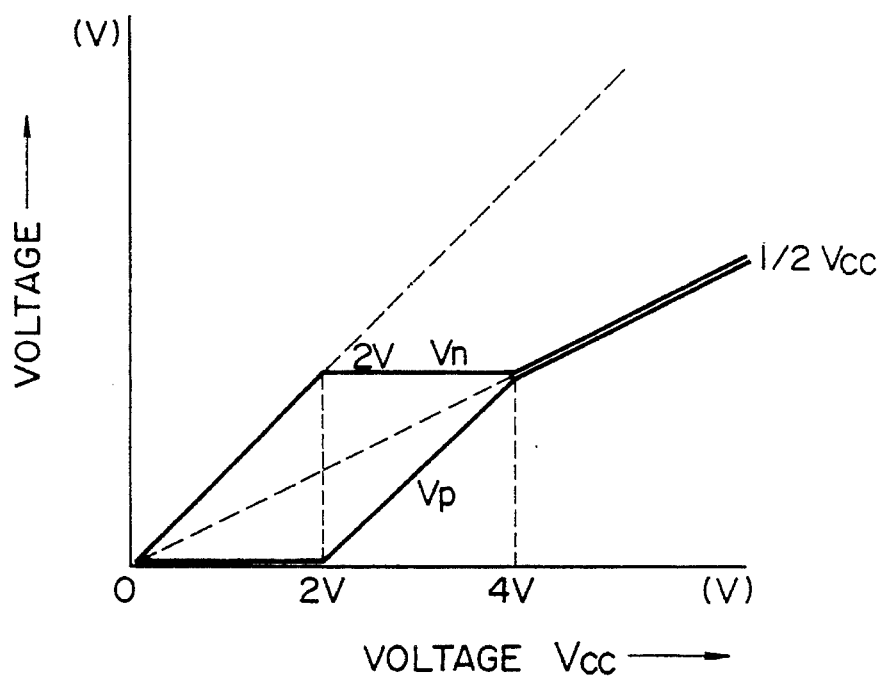

Meanwhile, an aging test is performed for the normal LSI circuit to assure the reliability thereof. Namely, after the final fabrication step, a higher voltage than the voltage used for the normal operation is intentionally applied to each transistor in the circuit thereby to early find out the transistor(s) which is likely to be damaged by nature due to failure of the gate oxide film, etc. FIG. 23A shows an example of the manner of providing the bias voltages $V_n$ and $V_p$ suitable to the aging test. In this example, in the power supply voltage range exceeding the point (4 V in this example) where the value relation between $V_n$ and $V_p$ is reversed, the setting $V_n = V_p = \frac{1}{2} V_{cc}$ is made. Thus, during aging test, $V_p$ and $V_n$ are adapted to increase in porportion to the power supply voltage $V_{cc}$. Further, by setting the value of $V_n$ and $V_p$ at a half value of the power supply voltage in this way, the maximum voltages applied to the respective transistors in e.g. FIG. 22C are substantially equal to each other so that stress is prevented from being concentrated to partial transistors.

Figure 23B:
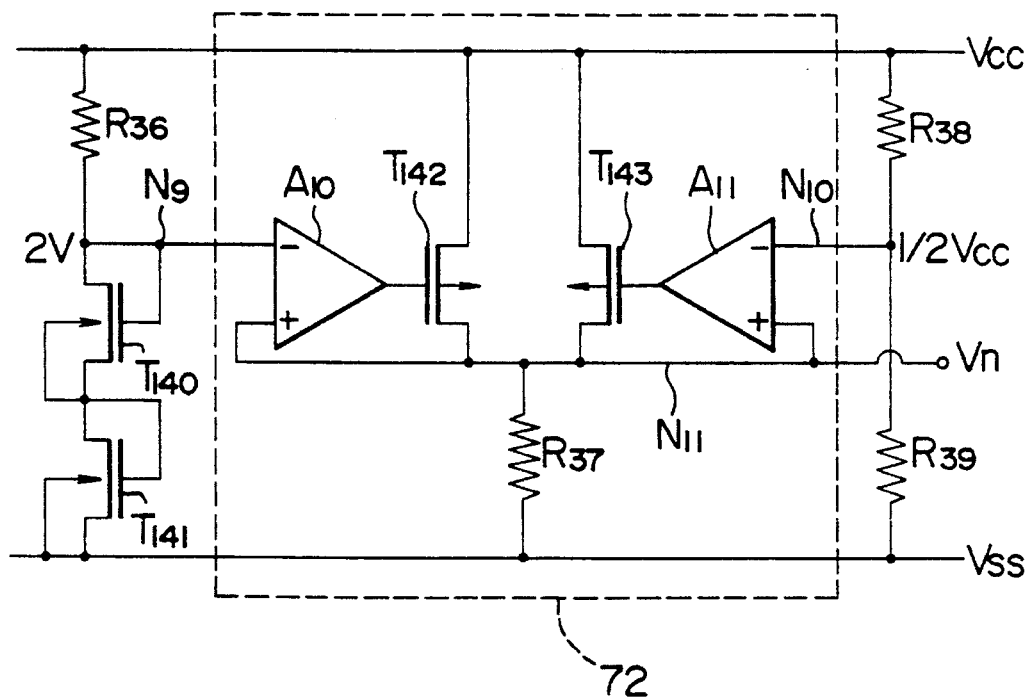

FIG. 23B shows one embodiment of a circuit arrangement for generating the bias voltages $V_n$ and $V_p$. In FIG. 23B, numeral 72 is a maximum value output circuit for comparing the voltages at two nodes N9 and N10 to output the maximum voltage; T140 and T141 are N channel MOS-FETs having a high threshold voltage; R36 is a resistor for supplying a bias current to MOS-FETs; and R38 and R39 are resistors for dividing the power supply voltage $V_{cc}$ to provide $\frac{1}{2} V_{cc}$ and R38≈R39. The maximum value output circuit is constituted by differential amplifier circuits A10 and A11, P channel MOS-FETs T142 and T143, and R37 which is provided for preventing the impedance of a node N11 for ground side from being infinite. The operation of the maximum value output circuit is discussed in IEEE Journal of Solid-State Circuits, Vol. 23, No. 5, pp. 1128–1132, October 1988. In operation, a substantially constant voltage (2 V in this embodiment) regardless of the power supply voltage is applied to the node N9 whereas a voltage half as large as the power supply voltage is applied to the node N10. Therefore, when the power supply voltage is lower than 4 V, the maximum value i.e. 2 V between both voltages is outputted to the node N11 whereas when the power supply voltage is higher than 4 V, $\frac{1}{2} V_{cc}$ is outputted there. The circuit for generating $V_p$ can be constructed in the same manner. Incidentally, Although in this embodiment, the voltage at the node 9 has been set at 2 V, it may be set at an optional value in accordance with the maximum applicable voltage for the gate oxide film.

Japanese Patent Application No. 63-125742 discloses a constant voltage generating circuit using a difference between MOS-FETs in their threshold voltage. FIG. 24 shows an exemplary improved arrangement of the constant voltage generating circuit, which is adapted to operate at a higher external power supply voltage than the voltage applicable to the gate oxide film. In FIG. 24, numeral 75 is a newly provided section to that end. T151 is an N channel MOS-FET and T152 is a P channel MOS-FET. In accordance with this arrangement, as in the inverter previously explained, the maximum applicable voltage in any transistor in the circuit can be reduced to about half of the external power supply voltage. The value of the constant voltage generated in this circuit is, as explained in the above Japanese Patent Application No. 63-125742, $V_{T1}$ (T149)– $V_{T1}$ (T150) which is a difference the threshold voltages of two N channel MOS-FETs T149 and T150. T149 is a transistor having a high threshold voltage as in FIGS. 22A and 22B. In this example, with $V_{T1}$ (T149)=1.05 V and $V_{T1}$(T150)=0.03 V, an output voltage $V_{ref}$=0.75 V is provided.

Figure 25A:
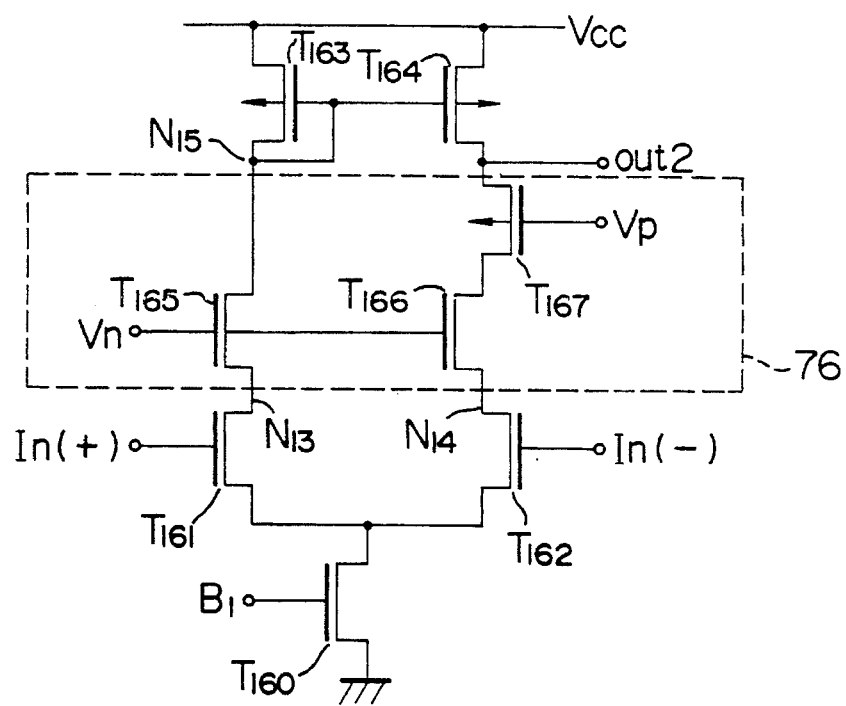
Figure 25B:
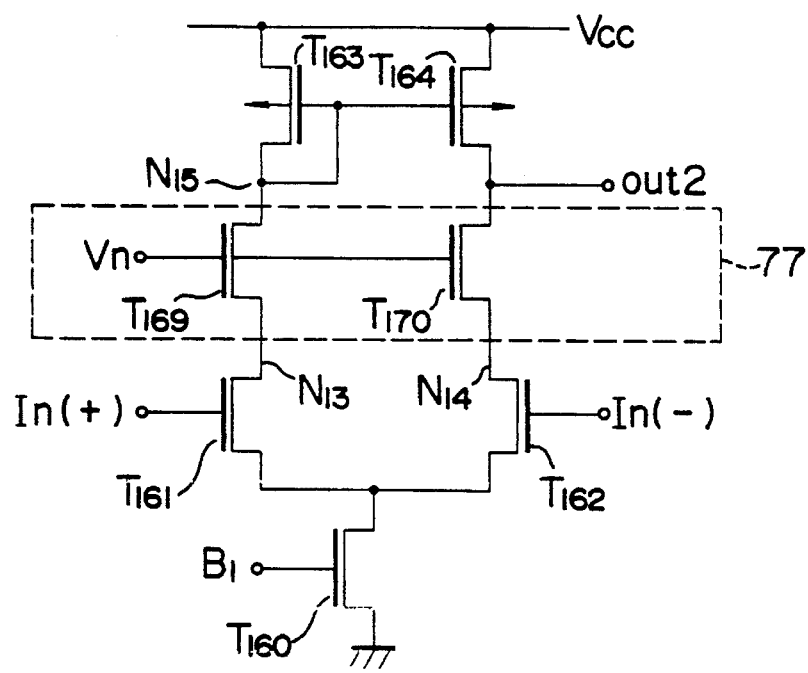

FIGS. 25A and 25B show an arrangement example of the differential amplifier circuit in accordance with the present invention. In the figures, T161 and T162 are an n channel MOS-FET to which a differential signal is supplied; T160 is an N channel MOS-FET for supplying a bias current to the differential amplifier circuit; B1 is a signal for setting the bias current; and T163 and T164 are P channel MOS-FETs, which constitute current mirror type load. In an ordinary differential amplifier circuit, nodes N13 and N15 are connected with each other and a node N14 is connected with an output out2 whereas in the differential amplifier circuit in accordance with the present example, circuit blocks indicated by 76 and 77 are provided so that it can also operate at a higher external power supply voltage than the voltage applicable to the gate oxide film. In FIG. 25A, the circuit block 76 is constituted by two N channel MOS-FETs T165 and T166 and a P channel MOS-FET T167. Thus, the maximum voltage applied to the drains (N13 and N14) of T161 and T162 is limited to $V_n-V_{TN1}$, and the minimum voltage applied to the drain (out2) T164 is limited to $V_p+|V_{TP1}|$. $V_{TN1}$ and $V_{TP1}$ are the threshold voltage of the N channel MOS-FET and P channel MOS-FET, respectively. Incidentally, as $V_p$ and $V_n$, the bias voltages having the dependency on the power supply voltage as shown in FIGS. 20B and 23B may be used as they are.

Meanwhile, in the case where the differential amplifier circuit of FIG. 25A operates as a small signal amplifier circuit, i.e. there is not a large difference between two input levels and both T161 and T162 operate in their saturation region. The voltage at the node 14 is approximately $V_n-V_{TN1}$. Therefore, even if the transistor T167 is omitted as shown in FIG. 25B, there is not a large voltage difference between the gate and drain of T164. If the differential amplifier circuit is used only as a small signal amplifier, the circuit system of FIG. 26B is suitable because of its simplified construction. The signal level at the output out2 in the differential amplifiers is equal to the signal level at the output out2 shown in FIG. 20A and the input in2 can be directly driven by the output of the differential amplifier circuit so that they are conveniently combined to construct a circuit. More specifically, in the differential amplifier circuit of FIGS. 25A and 25B, if the voltage level at the inputs In(+) and In(−) is $V_n-V_{TN1}$ or less, a large voltage gain can be obtained. On the contrary, if the differential amplified circuit is to be operated at an input voltage higher than $V_p+|V_{TP1}|$, the P channel MOS-FETs and N channel MOS-FETs may be replaced by N channel MOS-FETs and P channel MOS-FETs, respectively so as to provide an output at a low voltage level (the signal level at the output out1 of the inverter shown in FIG. 20A). In this case also, the same effect can be obtained. An application of the differential amplifier circuit to an LSI chip will be explained below.

Figure 26A:
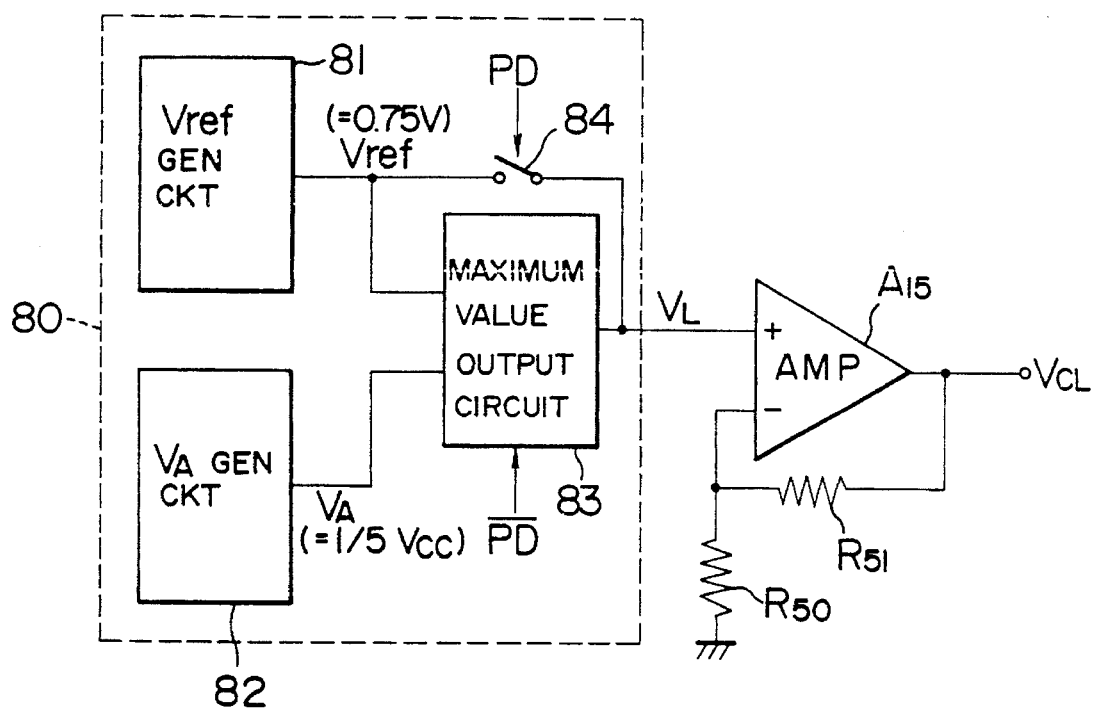
Figure 26B:
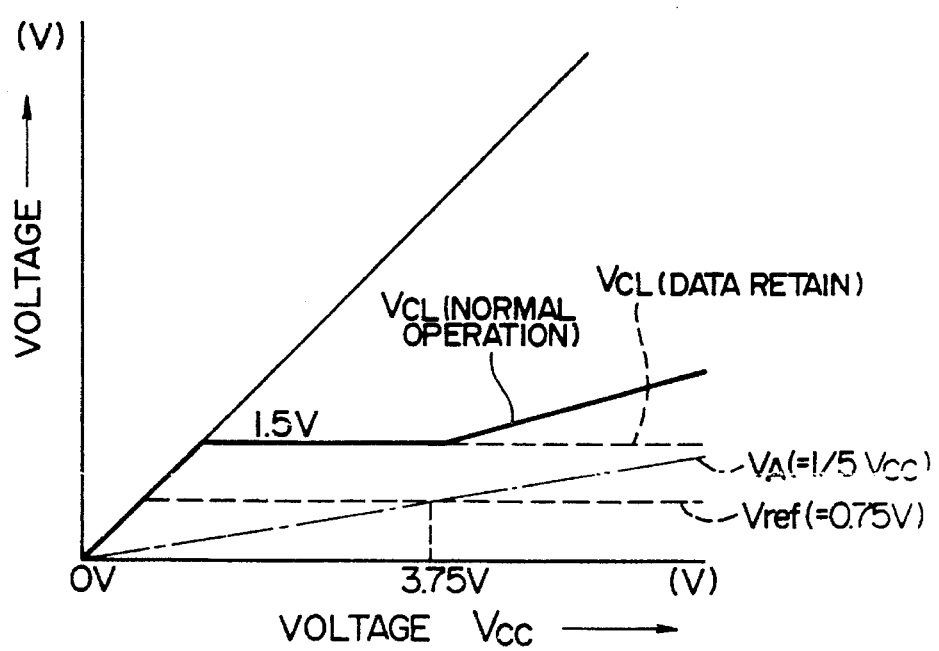

FIGS. 26A and 26B are views for explaining an application of the present invention to a circuit for generating $V_L$ (reference voltage) which is a reference for an internal power supply voltage $V_{CL}$. In FIG. 26A, numeral 80 is a $V_L$ (reference voltage) generating circuit corresponding to numeral 9 in FIG. 1; A15 is a differential amplifier circuit; and R50 and R51 are resistors for setting the amplification factor thereof. The $V_L$ generating circuit is constituted by a constant voltage ($V_{ref}$) generating circuit 81 as shown in FIG. 24, an aging voltage ($V_A$) generating circuit for generating a higher voltage during an aging test than the voltage during normal operation, a maximum value output circuit 83 for comparing $V_{ref}$ and $V_A$ to output a larger voltage, and a switch 84. During data retention, the voltage characteristic for the aging test is not required so that the maximum value output circuit is placed in the non-operation state and also the switch is closed to directly output $V_{ref}$. In this example, with $V_{ref}=0.75$ V and $V_A=\frac{1}{5} V_{cc}$, the state for aging test is adapted to be provided when the power supply voltage is not lower than 3.75 V. More specifically, when the power supply voltage is lower than 3.75 V, $V_L=0.75$ V is outputted and when it is not lower than 3.75 V, $V_L=\frac{1}{5} V_{cc}$ is outputted. Further, with R50=R52, the amplification factor is set at 2 so that when $V_{cc}$ is lower than 3.75 V, $V_{CL}=1.5$ V is applied as an internal power supply voltage and when $V_{cc}$ is not lower than 3.75 V, $V_{CL}=\frac{2}{5} V_{cc}$ is applied as an internal power supply voltage.

FIG. 26B shows the dependency of the respective voltages upon the external power supply voltage $V_{cc}$. In this way, as an internal power supply voltage, 1.5 V is provided for the normal operation state (e.g. $V_{cc}$ of 3 to 3.6 V) and 2.1 V is provided for the aging test state (e.g. $V_{cc}$ of 5.3 V).

Figure 26C:
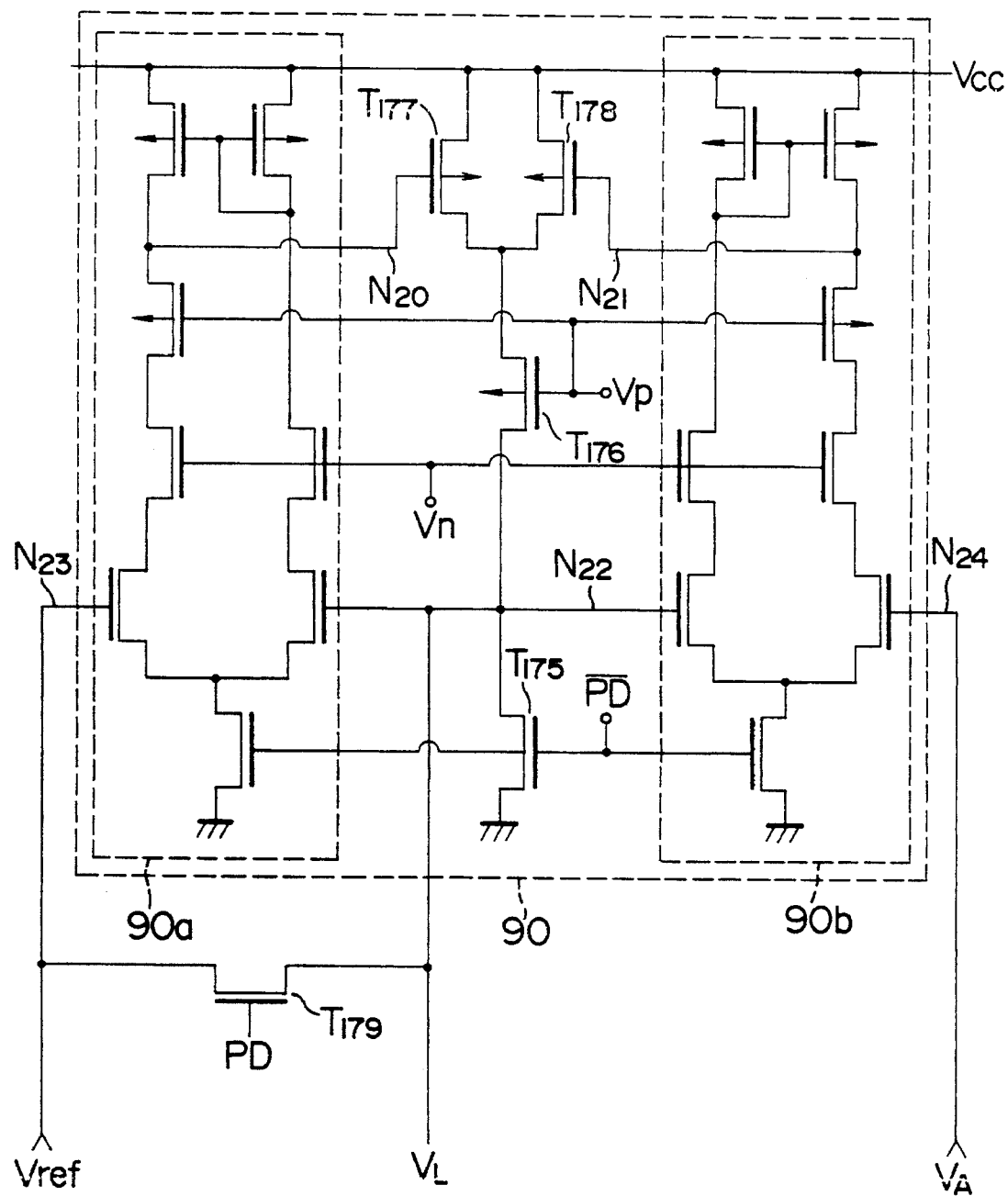

FIG. 26C shows an further detailed arrangement of the $V_L$ (reference voltage) generating circuit. In FIG. 26C, numeral 90 is a maximum value output circuit and T179 is an N channel MOS-FET serving as a switch. The maximum value output circuit 90 is constituted by two differential amplifier circuits 90a and 90b; P channel MOS-FETs T177 and T178 which are driven by the outputs of the respective amplifiers; a P channel MOS-FET T1 for relaxing the voltage applied to the gate oxide film of T177 and T178; and an N channel MOS-FET for reducing the impednace of an output terminal for the ground. The amplifier circuits 90a and 90b are the same as that shown in FIG. 25A. The maximum value output circuit is also basically the same as that shown in FIG. 23B. This arrangement provides a maximum value output circuit which operates at a higher power supply voltage than the voltage applicable to the gate oxide film. In the data retention state, the transistor T179 is rendered conductive so that $V_{ref}$ is output as $V_L$ as it is, and the maximum value output circuit is placed in non-operation state to reduce consumed current.

Figure 27A:
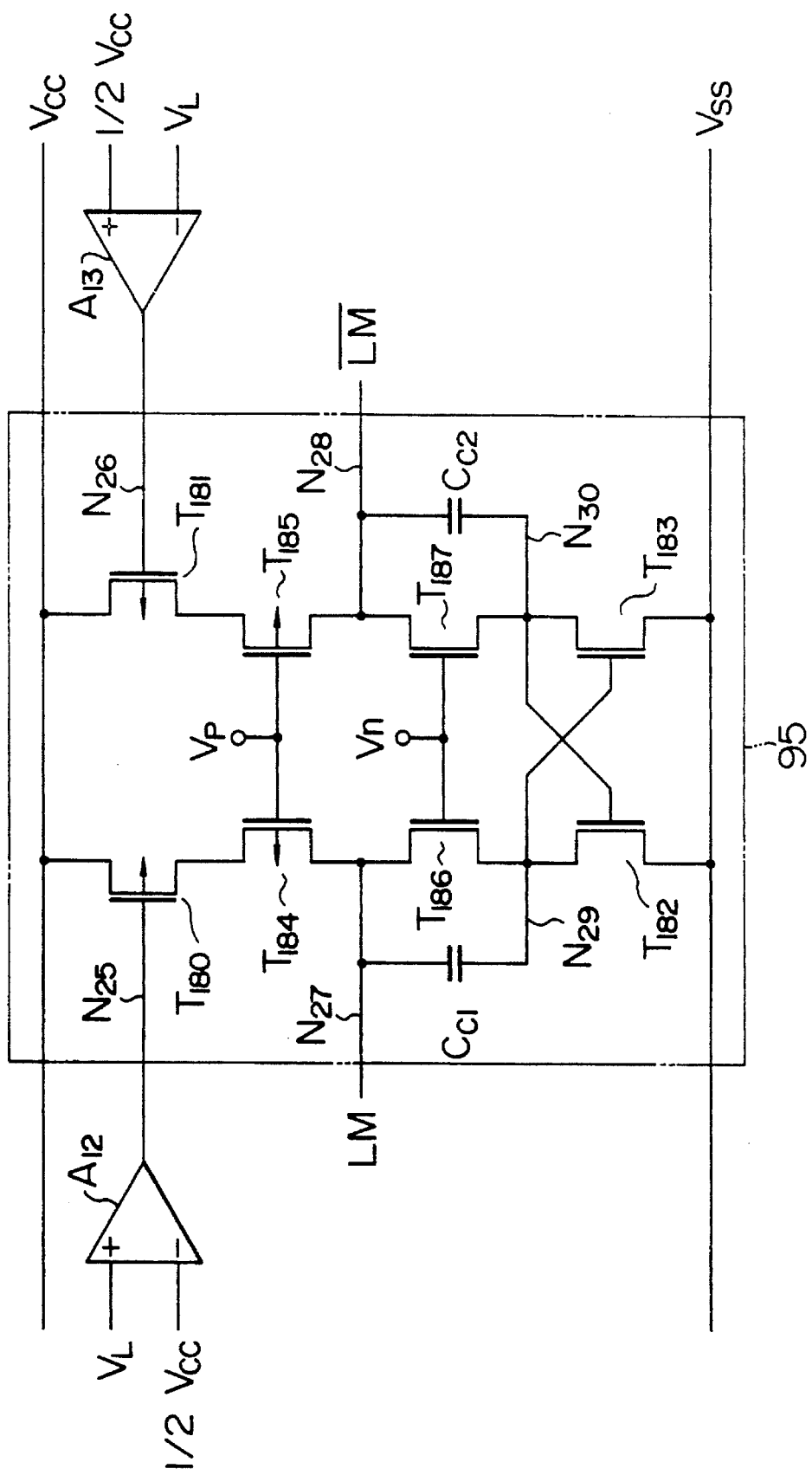

FIG. 27A shows an arrangement of the limiter enable signal (LM) generating circuit 10 shown in FIG. 1A. In FIG. 27A, A12 and A13 are single end type differential amplifiers having the same construction as that shown in FIG. 25A; and numeral 95 is a double end type differential amplifier which has two inputs of the outputs from the differential amplifier circuits and outputs a large signal equal to a power supply voltage difference. The double end type differential amplifier circuit 95 is constituted by P channel MOS-FETs T180 and T181 which are driven by two inputs, respectively; P channel MOS-FETs T184 and T185 for relaxing the voltage applied to the gate oxide film of T180 and T181; two N channel MOS-FETs T182 and T183 which are cross-coupled with each other; N channel MOS-FETs T186 and T187 for relaxing the voltage applied to the gate oxide film of T182 and T183; and speed-up capacitors $C_{c1}$ and $C_{c2}$ for accelerating the inverting speed of outputs. The speed-up capacitors, which decide the response speed of the circuit, may be omitted in accordance with an application whereby the basic operation of the circuit is not injured.

Figure 27B:
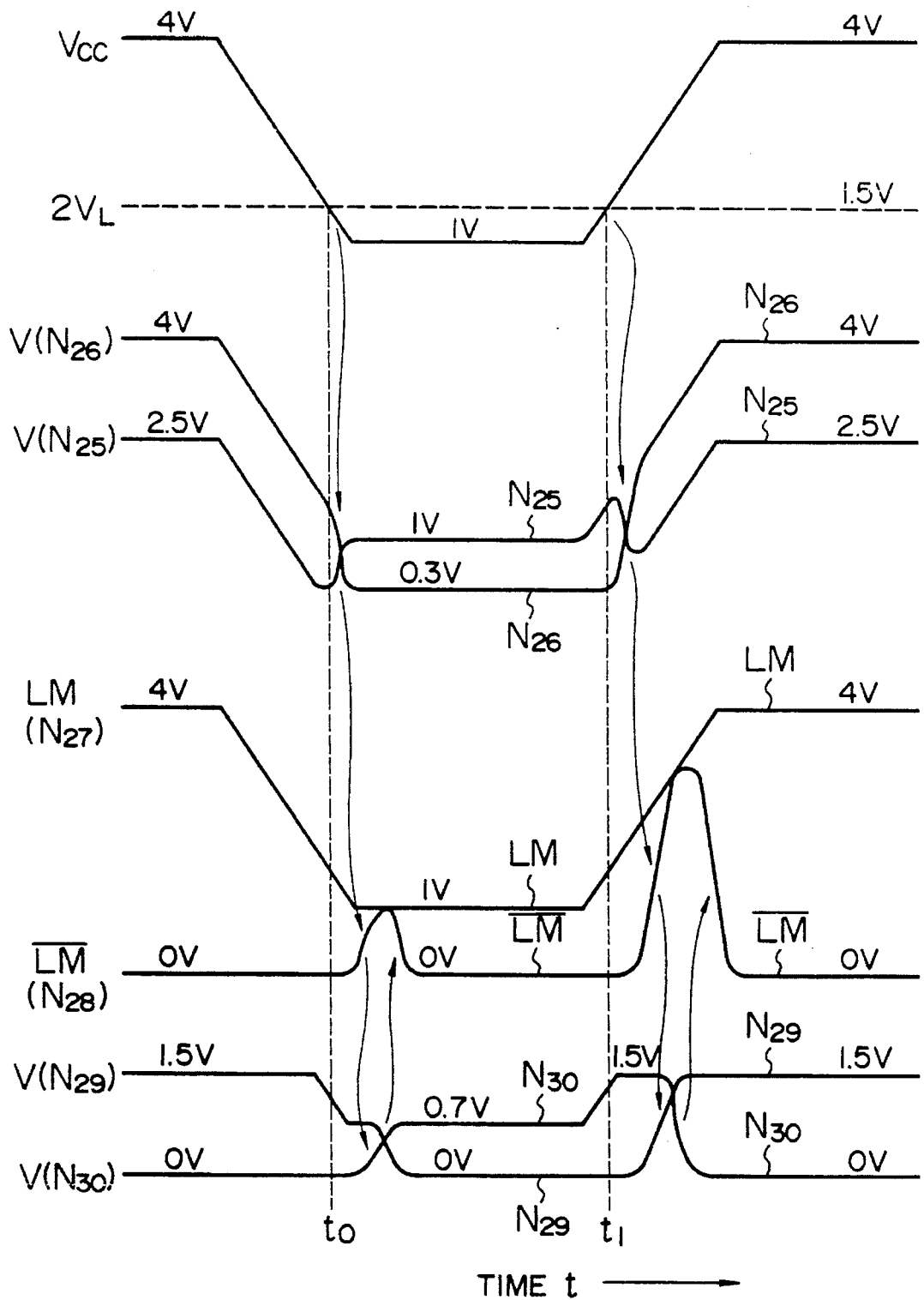

The operation will be explained with reference to an operation timing chart shown in FIG. 27B. In the following explanation, it is assumed that the internal power supply voltage $V_{CL}$ during normal operation is 1.5 V ($V_L=0.75$ V). As seen from FIG. 27B, the external power supply voltage $V_{cc}$ is lowered from 4 V to 1 V, at the time to when half voltage of $V_{cc}$ crosses 0.75 V, the voltages at the outputs (nodes N25 and N26) of the differential amplifiers A12 and A13 are reversed. Thus, T180 is cut off and T181 is turned on and so the voltage at a node N28 is increased to $V_{cc}$. In synchronization with this, the potential at a node N30 is increased to $V_n-V_{TN1}$ ($V_{TN1}$ is the threshold voltage of T187) and the potential at a node N29 and further at a node 30 is dropped to the ground potential. Thus, the voltages at the outputs (nodes N27 and N28) in the double end type differential amplifier 95 are inverted i.e. become 0 V and $V_{cc}=1$ V, respectively. Although FIG. 27B shows the operation schematically, these series of operations are actually performed in a sufficiently shorter time than the change of the power supply voltage. Therefore, the circuit operation is not badly affected by the change of the power supply voltage. Further, by intentionally providing a capacitor in the wiring of the power supply voltage, the change of the power supply voltage is controlled so that its effect on the circuit operation can be further restrained. Although the above explanation relates to the case where the external power supply voltage is decreased, the same operation is performed also in the case where it is increased.

Meanwhile, in the case where a system is to be constructed using the LSI chip in accordance with the present invention as well as the other LSI's and semiconductor devices, the input/output levels of the signals to be communicated among these components are required to be aligned with each other. The standard input/output level in the LSI operating at a single power supply (generally 5 V) includes the following two items:

(a) a TTL level, and
(b) a CMOS level.

In the case of using the TTL level, the value of a high voltage ("1") output ($V_{OH}$) is required to be 2.4 V or more. Therefore, if the system is to be operated at the power supply voltage of 2.4 V or less, it is necessary to use the CMOS level or newly set a standard of the input/output level. If a system is to be constructed by the conventional LSI and TTL logic circuits, it is important to assure compatibility with the above input/output level. To assure the compatibility makes it unnecessary to provide level converter circuits thereby to reduce the number of components, thus leading to reduction of the production cost. Further, this improves the circuit performance such as noise resistance, operation speed, etc. and provides the most excellent performance of the system. Then, in the following description, explanation will be given for an embodiment of the present invention having an input/output circuit arrangement which can assure compatibility with the conventional input/output level. In accordance with the present invention, the following three product specifications can be realized using a single chip without changing the circuit design.

(1) In the normal operation (e.g. the power supply voltage $V_{cc}$ of 4.5 V–5.5 V or 3–3.6 V), an input/output is made at the TTL level. The reduction of $V_{cc}$ (e.g. 1.0–2.5 V) is detected as required in the chip to carry out the data retention (battery back-up).

(2) The power supply voltage $V_{cc}$ of e.g. 1.0–5.5 V is used and an input/output is made at the CMOS level. The reduction of $V_{cc}$ (e.g. 1.0–5.5 V) is detected as required in the chip or an external control signal, etc. is used to carry out the data retention (battery back-up).

(3) The power supply voltage $V_{cc}$ of e.g. 1.0–5.5 V is used and the chip changes the input/output level in accordance with the value of the power supply voltage. For example, when $V_{cc}$ is 2.5–5.5 V, the input/output is made at the TTL level and when $V_{cc}$ is 1.0–2.5 V, the input/output is made at the CMOS level.

Figure 28A:
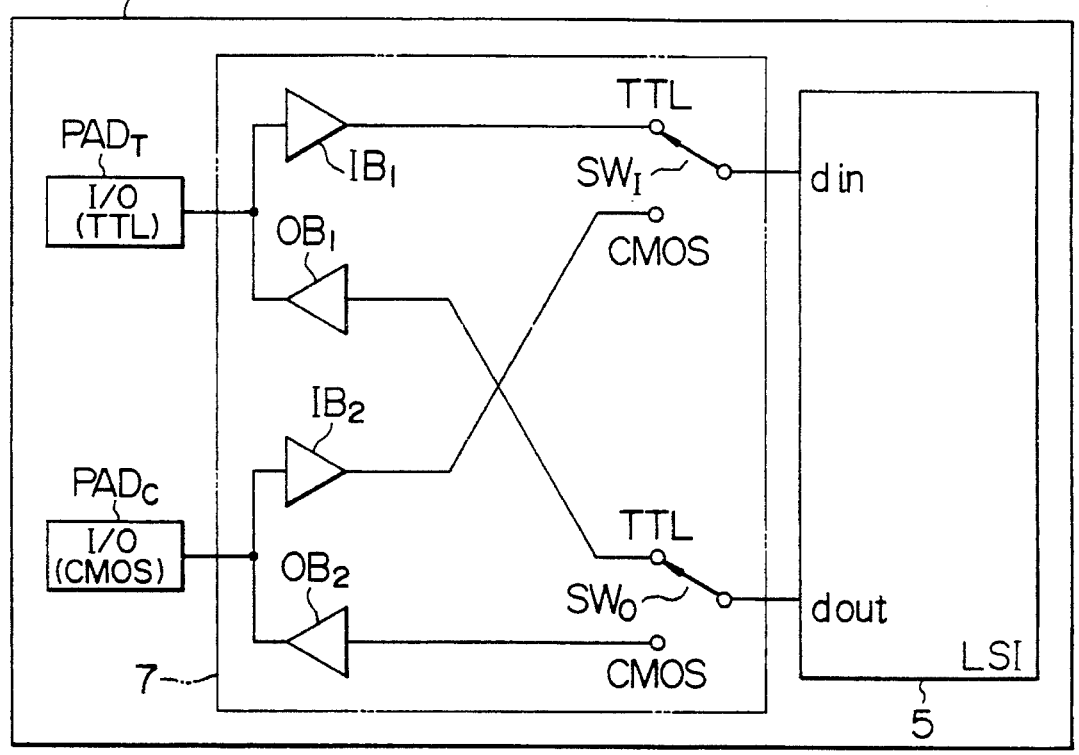
Figure 28B:
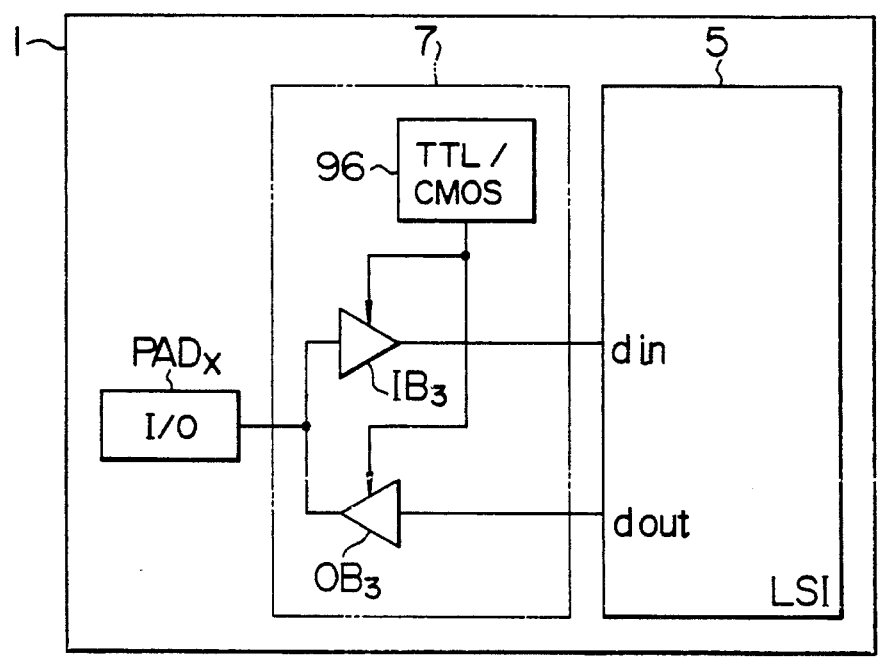

FIG. 28A shows an embodiment of two products of (1) and (2) in which the wirings and bondings are exchanged in a single chip and FIG. 28B shows an embodiment of the product in which the value of the power supply voltage is automatically detected to exchange the input/output level. In FIG. 28A, numeral 1 is an LSI chip; numeral 5 is an LSI circuit block operating at an internal power supply voltage (e.g. 1.5 V); PAD is an input/output pad for the TTL level; PAD is an input/output pad for the CMOS level; IB1 and OB1 are an input buffer and an output buffer for the TTL level, respectively; IB2 and OB2 are an input buffer and output buffer for the CMOS level, respectively; SW1 is a switch for selecting which one of the outputs from the two input buffers is to be outputted to a low voltage operating LSI circuit block; and SW2 is a switch for selecting to which one of the two output buffers an output from the low voltage operating LSI circuit block is to be inputted.

As a technique of making these selections in an actual LSI, there is a "master slice" using wirings of aluminum, etc. In this technique, in forming wiring layers of aluminum, etc. two kinds of masks for duplicating a wiring pattern are prepared in accordance with the above switches and these masks are adopted in accordance with the product to be made. Further, with two kinds of bonding pads in accordance with the input/output levels provided on the LSI chip, the product to be made may be bonded to one of these bonding pads. Otherwise, with one bonding pad provide on the chip, the connection of the product with the input/output buffer may be changed by means of the master slice using the wiring of aluminum, etc.

FIG. 28B shows a technique of changing the input/output level of the input/output buffer in accordance with the value of a power supply voltage in which an input buffer and output buffer are provided. In FIG. 28B, PADx is an input/output pad; IB3 and OB3 are an input buffer and an output buffer, respectively; numeral 96 is an input/output level setting circuit for control ling the input/output level in accordance with the power supply voltage. A more concrete arrangement thereof will be described later.

By means of the arrangements mentioned above, the three product specifications can be realized on one chip. This is convenient from the point of view of the production cost and also using convenience for a user. Incidentally, although the above arrangements are directed to a so-called I/O common system in which an input and an output are made at the same terminal, the present invention may be applied to the case of only the input or output of the input/output level. In the following description, a concrete arrangement of each of the output buffer, the input buffer, and an input protection circuit will be explained. Although in the embodiments mentioned below, the circuit is constructed by MOS-FETs having a thin gate oxide film (e.g. 6.5 nm) to be used in an internal circuit, the present invention may be applied to the case where the MOS-FETs having two kinds of gate oxide films in accordance with the operating voltage are provided in a single chip.

In constructing the output buffer, it is necessary to convert a signal amplitude from an internal low signal amplitude (e.g. 1.5 V) to an external high signal amplitude (e.g. 2.4 V at the TTL level and 5 V at the CMOS level when $V_{cc}$ is 5 V). First, a circuit arrangement providing for an output signal at the CMOS level will be explained.

Figure 29A:
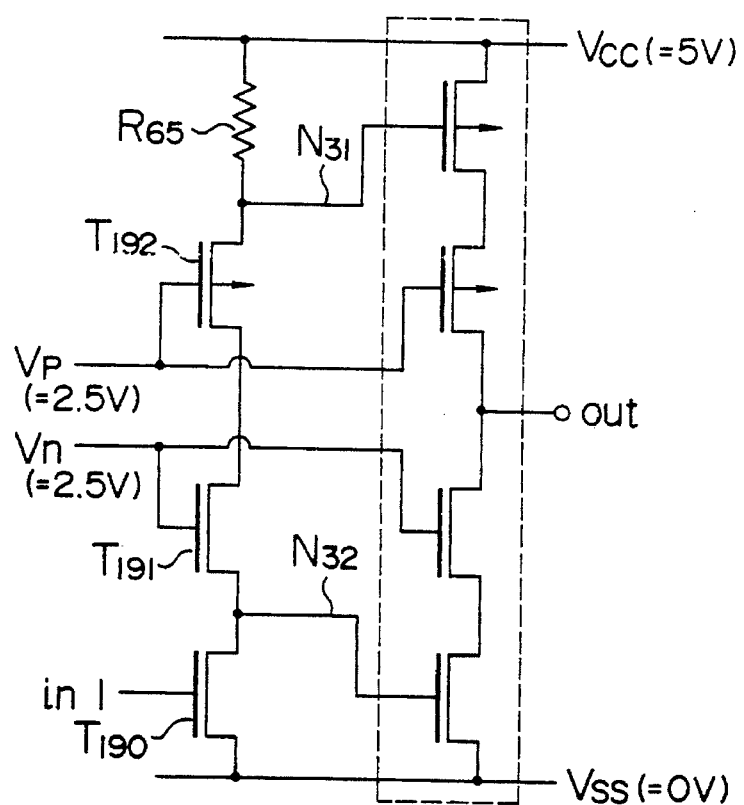

FIG. 29A shows an arrangement of an amplitude converter circuit for converting an input of a low signal amplitude in1 in an internal circuit to an output of a high signal amplitude Out. In FIG. 29A, numeral 98 is an inverter circuit as shown in FIG. 20A; N31 and N32 are two inputs corresponding to in2 and in1 in FIG. 20A, respectively; Out is an output on inverter; T190 is an N channel MOS-FET for driving N32; T191 is an N channel MOS-FET for limiting the maximum voltage at the node N32 to relax the voltage applied to the gate oxide film of T190; T192 is also a P channel MOS-FET for limiting the minimum voltage at the node N31; and R65 is a resistor. The transistor T190 and the resistor R65 provide the inverter circuit with resistor load. Thus, an input on the low voltage side can provide two outputs on the low voltage side and on the high voltage side.

Figure 29B:
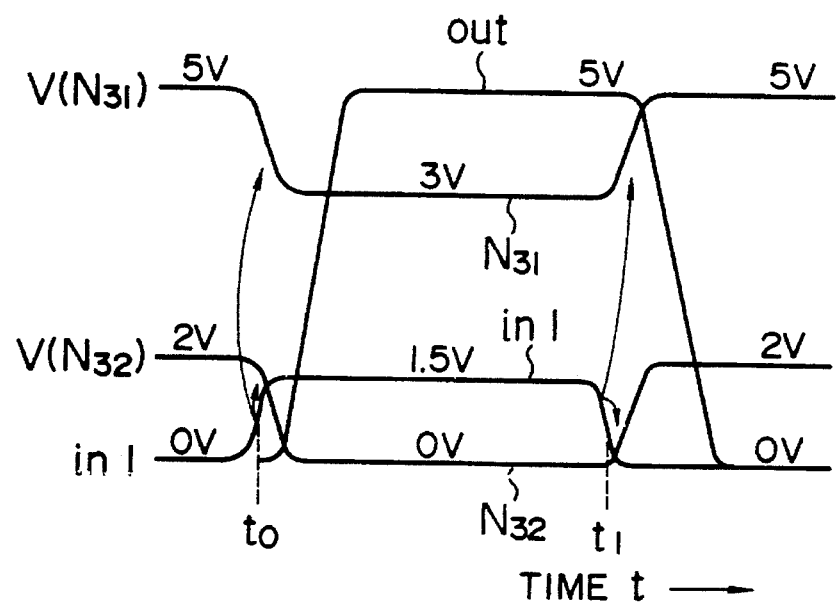

The operation of the circuit of FIG. 29A will be explained with reference to FIG. 29B. Now it is assumed that $V_{cc}$ is 5 V and both bias voltages $V_n$ and $V_p$ are 2.5 V. When the input in1 is 0 V, the transistor T190 is cut off and the node N31 is at a voltage level increased to $V_{cc}$ 5 V by the resistor R65. And the node N32 is at a voltage level (2 V) lowered from $V_n$ (2.5 V) by threshold value (e.g. 0.5 V) of the transistor T191. Therefore, the voltage at the output of Out of the inverter 98 is 0 V. When the input in1 is increased from 0 V to 1.5 V at the time of t0, the transistor T190 becomes conductive so that the voltage level at the node N31 is dropped to the level (3 V) higher than $V_p$ (2.5 V) by the absolute value (0.5 V) of the threshold voltage of T192 and the voltage level at the node N32 is dropped to 0 V. Thus, the output Out is increased to 5 V. When the input in1 is decreased 1.5 V to 0 V at the time of t1, the output Out is changed 5 V to 0 V in the same manner. In this way, by means of the above circuit arrangement, an output signal amplitude of 5 V required for the output buffer can be obtained for an input signal amplitude of 1.5 V. Further, this circuit arrangement, in which a low voltage of 2.5 V or so at the maximum is applied to any transistor, performs a stabilized operation at $V_{cc}$ of 5 V although it is constructed by MOS-FET's with a thin gate film (e.g. 6.5 nm).

Figure 30A:
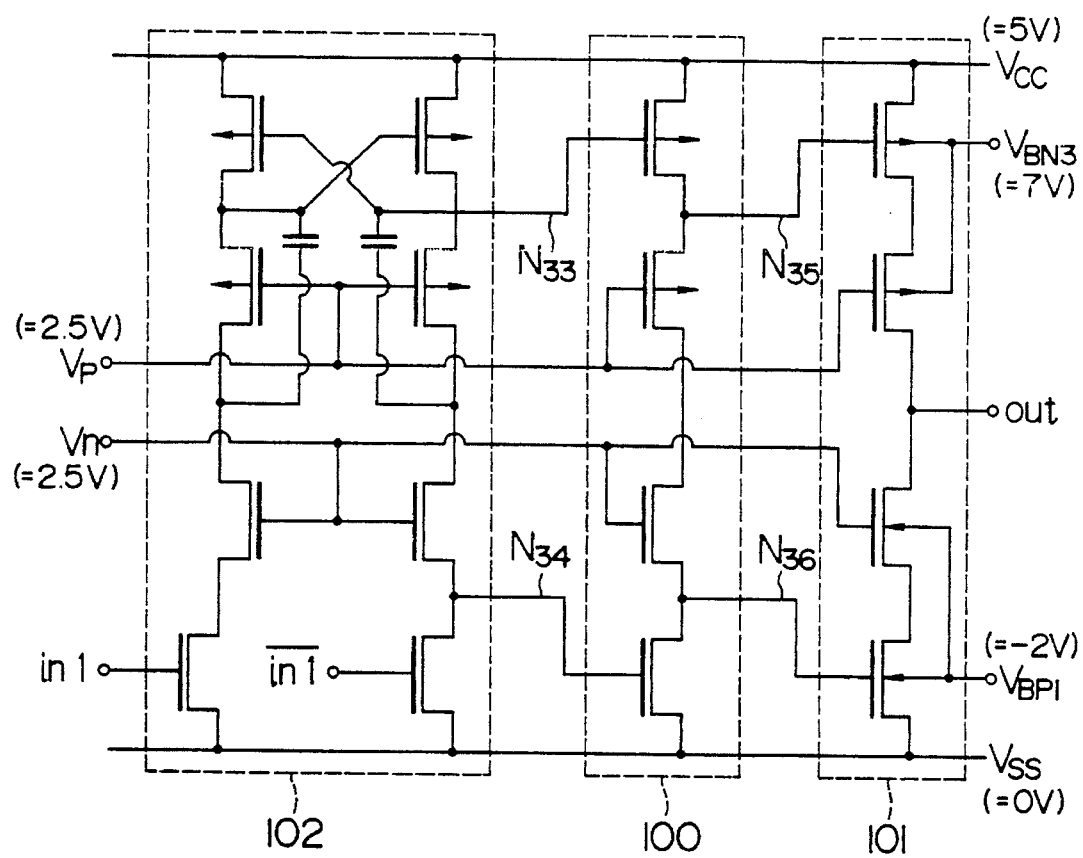
Figure 30B:
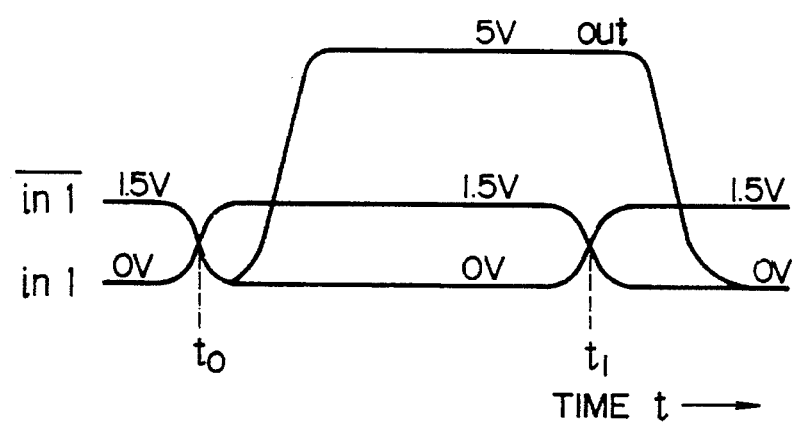

FIG. 30A shows the other arrangement of the amplitude converting circuit for converting low signal amplitudes in1 and in2, which are complementary to each other, into a high signal amplitude Out, and FIG. 30B shows the operation timing thereof. In FIG. 30A, numeral 102 is a differential amplifier circuit with double end inputs and double end outputs as shown in FIG. 27A; and numerals 100 and 101 are the same inverter as shown in FIG. 20A. Since in the differential amplifier circuit with double end outputs, current does not flow in a normal operation state, a circuit with further reduced power consumption as compared with the circuit of FIG. 29A can be realized. Further, the substrate (back gate) of the respective transistors constituting an inverter at a final stage is biased minus (–2 V) for the N channel MOS-FETs and plus (7 V) for $V_{cc}$ for the P channel MOS-FETs. Thus, for example, even when an undershoot or overshoot due to impedance mismatching appears at the output, the PN junctions can be prevented from being forward biased. Therefore, prevented are the injection of minority carriers into the substrate (diffusing the minority carriers into the charge storage nodes of memory cells will deteriorate the refresh characteristic), latch-up due to turn-on of parasitic thyristors, etc. Accordingly, in accordance with the present invention, a circuit for converting a low amplitude signal (e.g. 1.5 V) in an internal circuit into a high amplitude signal (e.g. 5 V) at the CMOS level.

Generally, in constructing a system, the outputs of a plurality of LSIs are connected with a data bus and only the outputs of the selected LSIs are adapted to drive the data bus. In order to carry out such a control, the output impedance of the not-selected are desired to be infinite. The conventional LSI was given by a three-output (tri-state) characteristic of driving the output level into a high voltage, a low voltage or not driving it into either voltage (the output impednace is infinite). In order to provide such a characteristic, it is necessary to perform the control of driving the output (low impednace) or not driving it (infinite impedance). The signal for this control is provided by either one of an output enable (OE) signal, a chip select (CS) signal, etc. which are externally inputted. In the output circuit, the tri-state characteristic was realized in the manner of taking a logic between that signal and an output data and driving the transistors at a final stage by the resultant signal. In the case where the same output circuit is to be constructed in accordance with the present invention, there may be proposed an arrangement in which a logic circuit is operated by a low power supply voltage and the circuit does not include the logic circuit. However, in this case, the following inconveniences will occur. The number of the stages of the amplitude converting circuits and the inverters placed between the logic circuit and the output is increased, thus for example increasing the delay time from the OE signal to the output, and generating a difference between the timing of driving the transistor on the high voltage side and the transistor on the low voltage side to cause a large current to transiently flow. On the other hand, if the logic circuit can be constructed by an external power supply voltage, freedom degree of design is increased, which is preferable from the viewpoint of circuit performance. One embodiment of constructing the logic circuit by the external power supply voltage will be explained below. This logic circuit can be efficiently used as means of generating a control signal for several kinds of circuits operated by the external power supply voltage as well as the output buffer.

Figure 31A:
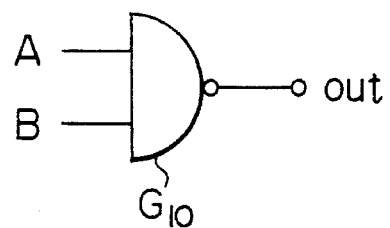
Figure 31B:
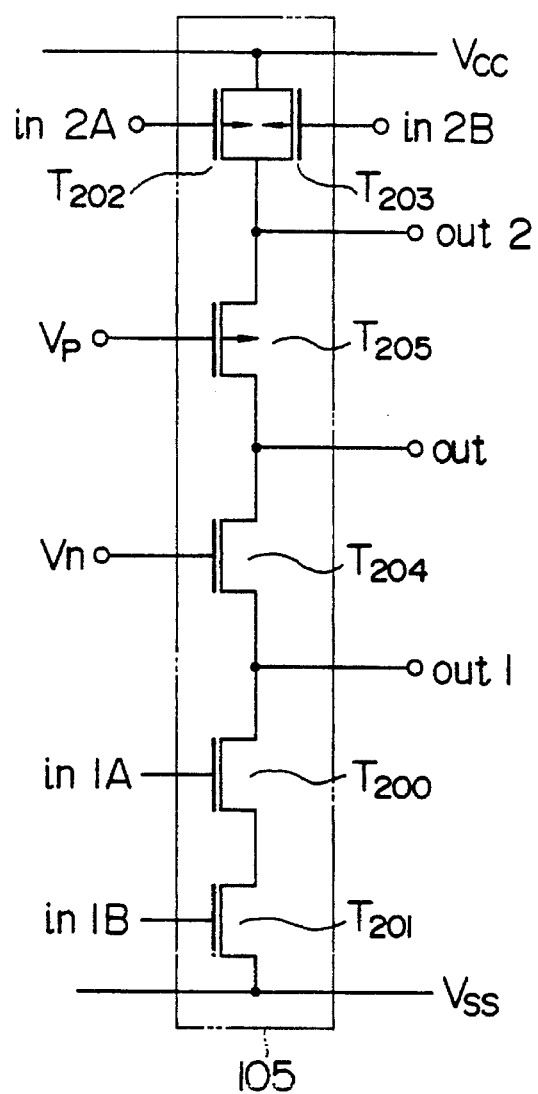

FIGS. 31A and 31B show an arrangement of a two-input NAND circuit in accordance with the present invention. An A input in FIG. 31A corresponds to in1A and in2A in FIG. 31B and a B input in FIG. 31A corresponds to in1B and in2B. As in in1 and in2 in FIG. 20A, in1A and in2A, and in1B and in2B change in their in-phase, respectively. In FIG. 31B, transistors T200 and T201 are driven by the input signals in1A and in1B on the low voltage side, respectively and transistors T202 and T203 are driven by the input signals in2A and in2B on the high voltage side, respectively. Transistors T204 and T205 are provided, like T202 and T203 in FIG. 20A, to allow the operation at a higher voltage than the voltage applicable to the gate oxide film. By means of this arrangement, a function of the NAND gate, in which only when both inputs are at a high level, the output is at a low level, is obtained. In this way, only providing two transistors in addition to the ordinary CMOS NAND circuit permits the scaled-down transistors to be operated at a high power supply voltage. Although a two-input NAND circuit has been taken as an example, the above idea of the present invention can be also applied to, for example, an NOR circuit, an exclusive OR circuit, a composite gate in which several composite logics are outputted using outputs from plural logic circuits as inputs, and further a sequential circuit such as a latch circuit and a flip-flop circuit.

Figure 32A:
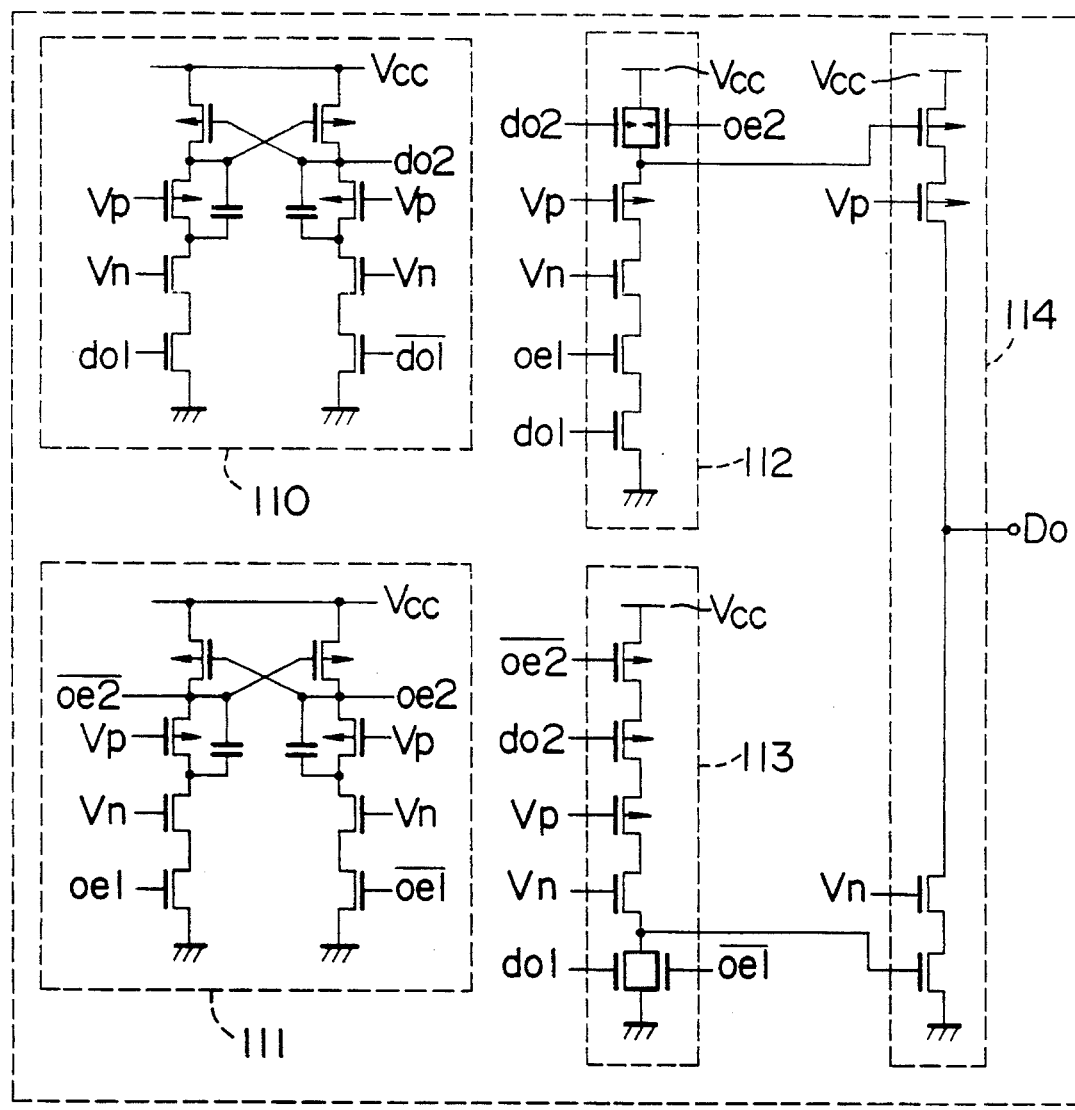
Figure 32B:
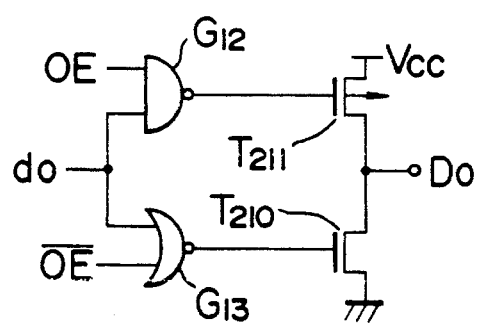

FIG. 32A shows an arrangement of a tri-state output buffer using the above logic circuit. FIG. 32B shows a simplified arrangement thereof using logic symbols. In FIG. 32B, G12 is a two-input NAND circuit; G13 is a two-input NOR circuit; and T210 and T211 are an N channel MOS-FET and a P channel MOS-FET, respectively. When an output enable signal OE is at a high voltage level, the same data as an input do is provided at an output Do from the buffer, and when OE is at a low voltage level, the output Do becomes floating (substantially infinite impedance) since the gate of T210 is fixed to a low voltage level and the gate of T210 is fixed to a high voltage level irrespectively of the input data. FIG. 32A shows a concrete circuit arrangement having the same function as the circuit of FIG. 32B, which is constructed by the scaled-down devices (element) having a breakdown voltage lower than the external power supply voltage. In FIG. 32A, numeral 112 is a NAND circuit; numeral 113 is a NOR circuit; numeral 114 is an output circuit; and numeral 110 and 111 are the same amplitude converting circuit as numeral 102 in FIG. 30A. The amplitude converting circuits generate signals do2, oe2 and $\overline{oe2}$ on the high power supply voltage side, which are required to operate the circuits 112 and 113, on the basis of low amplitude signals do1, oe1 and $\overline{oe1}$ on the low power supply voltage side from an internal circuit. In this way, in accordance with the present invention, a logic circuit using scaled-down devices which operates at the external power supply voltage exceeding their breakdown voltage can be constructed, thus reducing the delay time and transient current of the tri-state output circuit, etc.

Figure 33:
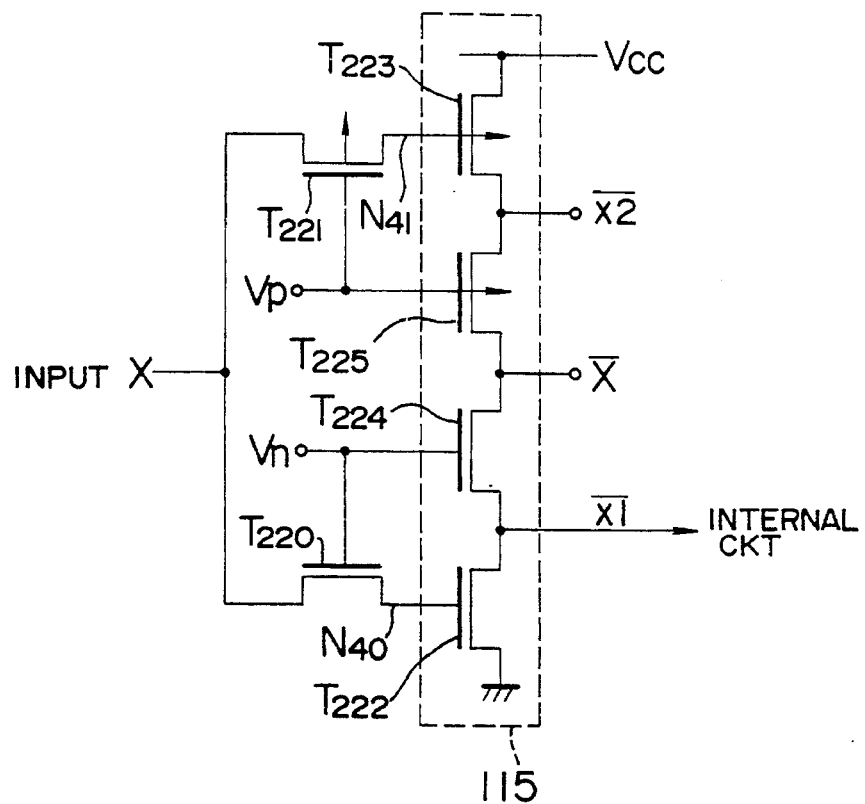

An exemplary input circuit for the CMOS level will be explained with reference to FIG. 33. In FIG. 33, numeral 115 is the same inverter as that shown in FIG. 20A; T220 and T221 are transistors for limiting the voltage applied to the gate oxide film of transistors T220 and T221 to its breakdown voltage or less even when a large amplitude signal is applied to an input of the input circuit; and X is an input signal. In FIG. 33A, even when a high voltage (e.g. 5 V) is applied to the input, the voltage at a node 40 is limited to $V_n-V_{T1}$ (T220), i.e. 2 V or so. Also, even when a low voltage is applied to the input (e.g. 0 V), the minimum voltage at a node 41 is 3 V or so. Thus, the voltage applied to the respective transistors can be decreased to approximately half of the power supply voltage. Further, one $\overline{x1}$ of the outputs of this input circuit, the signal amplitude of which is about 2 V, can be used as it is as an internal circuit operating at a low power supply voltage.

Thus, examples of the output circuit and input circuit for CMOS level have been explained. FIG. 34A shows an example of the input circuit and output circuit in which the TTL level and CMOS level are exchanged in accordance with the value of a power supply voltage. In FIG. 34A, $PAD_I$ is an input pad; $PAD_O$ is an output pad; IPD is an input protection device for preventing a junction and a gate from being broken due to static electricity; IB5 is an input buffer; and OB5 is an output buffer. The input protection device will be explained in detail later. The input buffer IB5 is constituted by two MOS-FETs $T_{IN1}$ and $T_{IP1}$ serving as a CMOS inverter, an N channel MOS-FET $T_{IN2}$ for limiting the power supply voltage for the CMOS inverter to a predetermined value decided by a bias voltage $V_{n1}$ or less, and an N channel MOS-FET $T_{IN0}$ for limiting the input voltage for the CMOS inverter to a predetermined value or less. The output buffer OB5 is constituted by an inverter 116 as shown in FIG. 20A, an amplitude conversion circuit 117 for generating driving signals d1 and d2 for the inverter 116 on the basis of a low amplitude signal dout, and an N channel MOS-FET $T_{ON2}$ for limiting the output voltage to the predetermined value decided by the bias voltage $V_{n1}$ or less. It is needless to say that as in FIGS. 32A and 32B, by taking a logic with the output enable signal, the buffer having a tri-state output characteristic can be constructed.

Figure 34B:
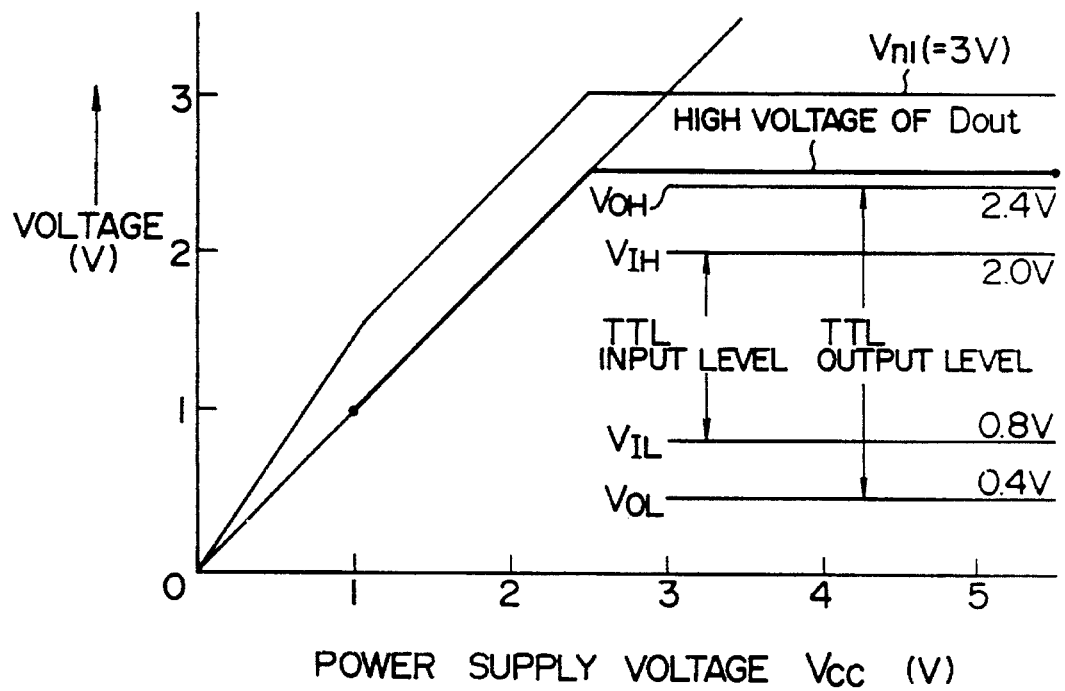

Meanwhile, if the value of the bias voltage $V_{n1}$ is suitably varied in accordance with the power supply voltage in these circuits, input/output at the TTL level can be made for a high power supply voltage and input/output at the CMOS level can be made for a low power supply voltage. FIG. 34B shows an example of the dependency of the bias voltage $V_{n1}$ on the power supply voltage $V_{cc}$. In FIG. 34B, $V_{OL}$ and $V_{OH}$ are TTL output levels corresponding to "0" and "1", respectively, and $V_{IL}$ and $V_{IH}$ are TTL input levels corresponding to "0" and "1" respectively In an ordinary TTL logic gate, $V_{OL}$=0.4 V, $V_{OH}$=2.4 V, $V_{IL}$=0.8 V and $V_{IH}$=2.0 V. The value of the bias voltage $V_n$ is controlled to be 3 V when the power supply voltage $V_{cc}$ is 2.5 V or more, and controlled so that $T_{IN0}$ operates in its non-saturated region when $V_{cc}$ is lower than 2.5 V, e.g. $V_{cc}$+0.5 V.

First, the operation of the output buffer circuit OB5 will be explained. The voltage at a node N48 is 0 V when a low voltage ("0") is outputted and $V_{cc}$ when a high voltage ("1") is outputted. Therefore, when the low voltage is output, 0 V is output at a Dout irrespectively of $V_{cc}$. On the other hand, when the high voltage is outputted, the voltage level at Dout depends on $V_{cc}$ as seen from FIG. 34B. Namely, when $V_{cc}$≧3 V, it is $V_{n1}-V_{T1}$ ($T_{ON2}$) and when $V_{cc}$<3 V, it is $V_{cc}$.

Thus, when $V_{cc}$>3 V, the output voltage amplitude satisfying the output characteristic at the TTL level can be obtained. Incidentally, by limiting the output voltage to 2.5 V or less, the power supply current in charging/discharging large load capacitance can be minimized.

The operation of the input buffer circuit IB5 will be explained. The power supply voltage for the CMOS inverter constituted by $T_{IN1}$ and $T_{IP1}$ is supplied from the source terminal of $T_{IN2}$. The value thereof is 2.5 V when the power supply voltage $V_{cc}$≧3 V and it is 0 V when $V_{cc}$<3 V. On the other hand, an input voltage for the inverter is limited to 2.5 V or less when $V_{cc}$≧3 V and the voltage input to Din is applied to the inverter as it is when $V_{cc}$<3 V. By means of the circuit arrangement mentioned above, even when the power supply voltage $V_{cc}$ is greatly changed in a range of e.g. 1 V to 5 V, the power supply voltage for the inverter and the input signal have a substantially equal amplitude. If the channel conductances of the transistors constituting the inverter are set at a substantially equal value, the logic threshold voltage of the inverter is ½ of the power supply voltage therefor. Therefore, the logic threshold voltage when $V_{cc}$≧3 V is about 1.25 V and it is $V_{cc}/2$ when $V_{cc}$<3 V Thus, with the boundary of a certain voltage (3 V in this example), there can be provided an input buffer which operates at the TTL level for $V_{cc}$ of the certain voltage or more and operates at the CMOS level for $V_{cc}$ lower than that voltage.

In accordance with the present invention, LSI having a wide range of operation power supply voltage can operate an optimum input/output level for the power supply voltage used, thus realizing the maximum noise margin by minimum power consumption. Further, in the output buffer OB5, the three transistors $T_{ON0}$, $T_{ON1}$ and $T_{ON2}$ have a common substrate (back-gate). Thus, when a high voltage surge is applied to the output terminal, the charges can be swiftly discharged through a large current. This is, like the operation of a clamping MOS-FET in the input protection device described later, because when the substrate potential is increased due to breakdown, a parasitic bipolar transistor between the substrate potential and the ground potential is likely to be turned on. As a result, even when scaled-down devices are used, the static breakdown voltage can be enhanced. Moreover, although in the above embodiment, the substrate voltage $V_{BP1}$ of the N channel MOS-FETs is generally set at a minus value (e.g. −3 V) so that the input voltage becomes minus (undershoot), the PN junctions are not forward biased, it may be 0 V as long as the forward current is permited to flow. Furthermore, the N channel MOS-FETs may be formed in a P substrate or may be formed in a P well electrically isolated from the P substrate as shown in FIGS. 14A and 14B. In the latter case, the resistance of the P well is lower than that of the substrate so that the parasitic bipolar transistor is likely to be turned on, thereby enhancing the static breakdown voltage.

Figure 35A:
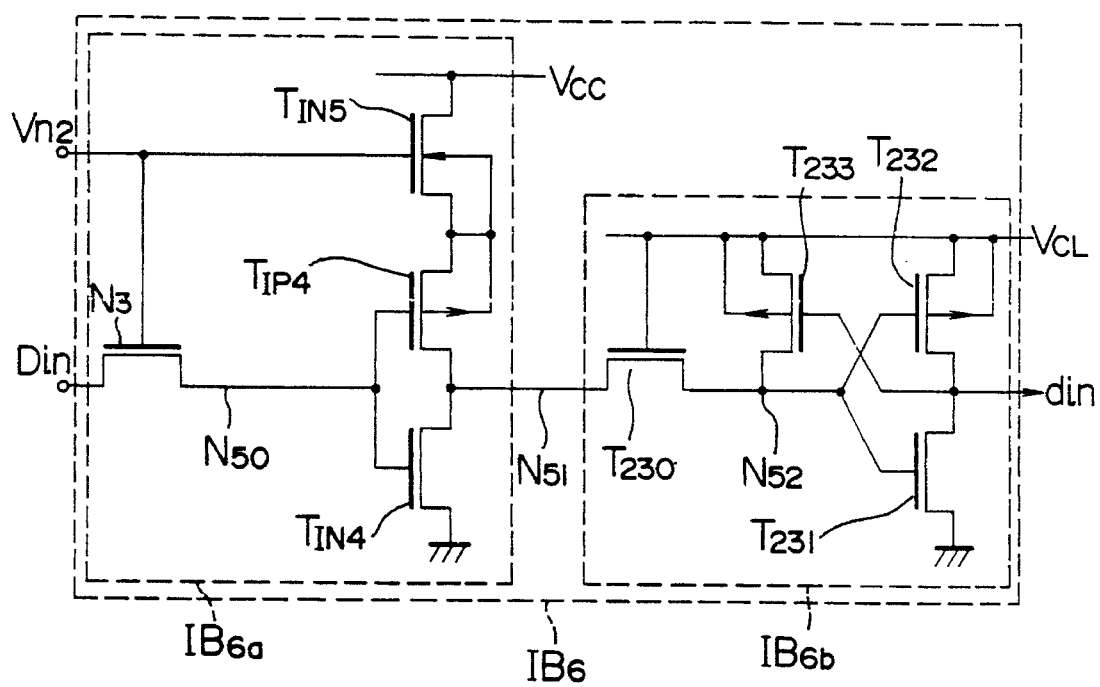
Figure 35B:
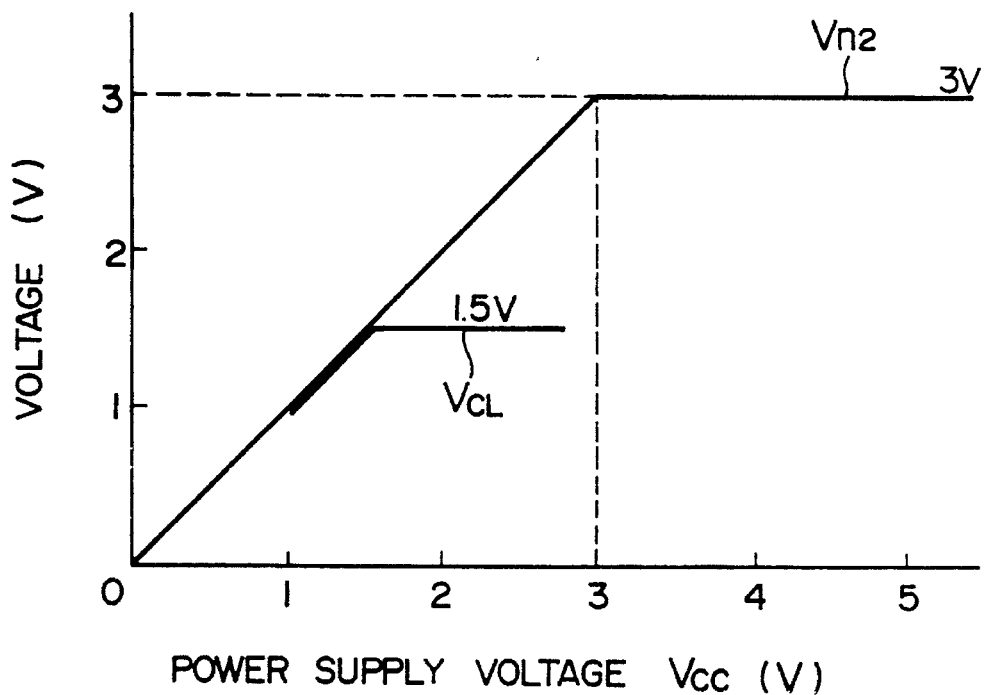

In the embodiment mentioned above, it is necessary to generate a bias voltage $V_n$ higher than the power supply voltage. FIG. 35A shows an exemplary arrangement of the input buffer constructed without using such a bias voltage. In FIG. 35A, an input buffer IB6 is constructed by two circuit blocks, i.e. IB6a and IB6b. IB6a has the same circuit arrangement as the input buffer IB5 in FIG. 34A. IB6b serves to convert the output of IB6a into a voltage level which is convenient to drive the internal circuit. In IB6b, T231 and T232 are MOS-FETs constituting a CMOS inverter; T233 is a P channel MOS-FET for enhancing the potential at a node N52 to an internal power supply voltage $V_{CL}$ when din is at a low voltage level; and T230 is an N channel MOS-FET for preventing the current from flowing backward from the node N52 to a node N51 when the potential at the node N52 has been increased to a high voltage level. FIG. 35B shows the dependency of the bias voltage $V_{n2}$ in this circuit arrangement on the power supply voltage $V_{cc}$. As seen from the figure, the bias voltage V is adapted to be 3 V (constant) when $V_{cc} \geq 3$ V and to be equal to $V_{cc}$ when $V_{cc} < 3$ V.

Figure 35C:
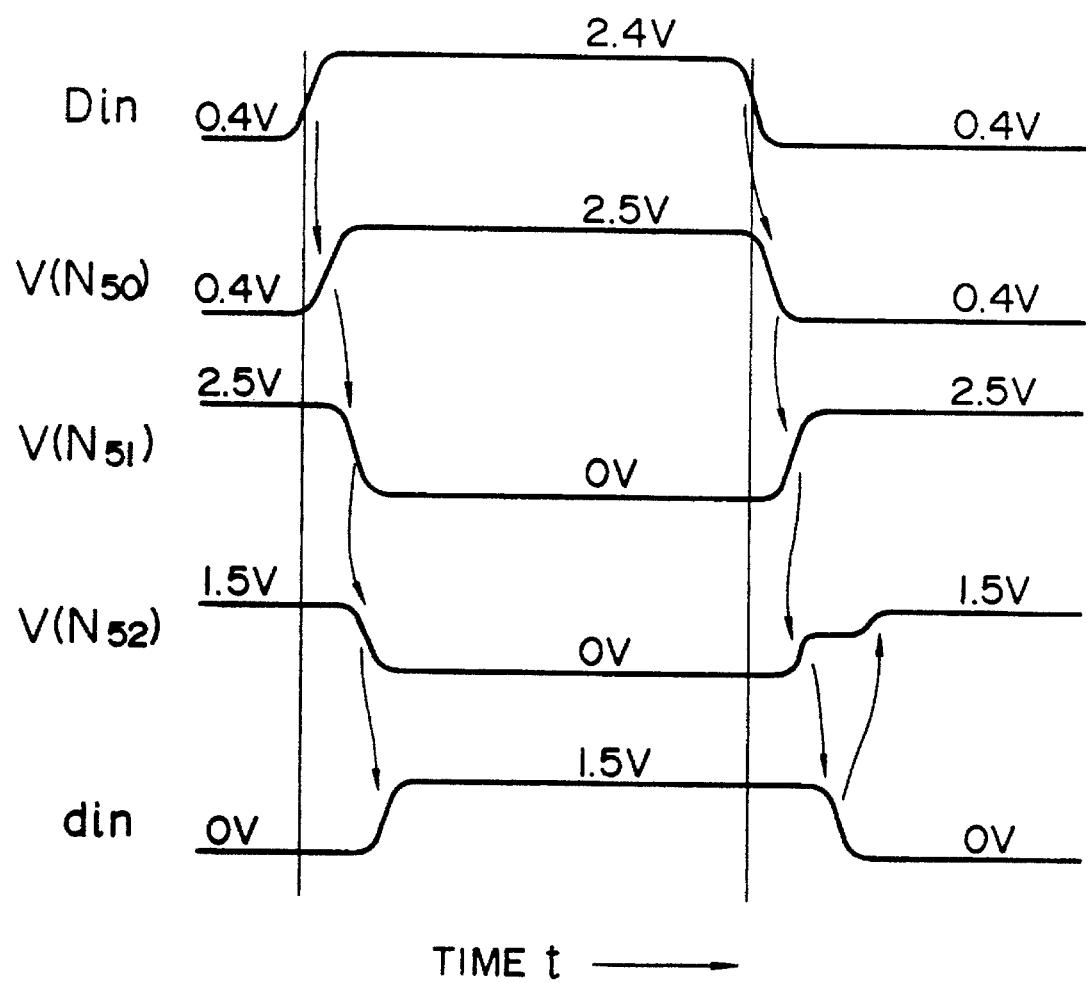

The operation of this circuit arrangement will be explained in two cases. FIG. 35C shows waveforms at the respective parts in the case where $V_{cc}$ is 5 V and the internal power supply voltage $V_{CL}$ is 1.5 V. When an input voltage Din is a low voltage (e.g. 0.4 V), the voltage at a node N51 is $V_{n2} - N_{T1}$ ($T_{INS}$) (e.g. 2.5 V) and the voltage at a node N52 is $V_{CL}$ (1.5 V). Thus, a low voltage (0 V) is outputted to Din. When the input voltage Din is increased from the low voltage (e.g. 0.4 V) to a high voltage (e.g. 2.4 V), the voltage at a node N50 follows to increase, thus dropping the voltage at the node N51 to 0 V. The channel conductance of T231 is set at a larger value than that of T233 so that the voltage at the node N52 is dropped to substantially 0 V and the value of din is increased to $V_{CL}$ (1.5 V). On the other hand, when the input voltage Din is decreased from the high voltage (e.g. 2.4 V) to the low voltage (e.g. 0.4 V), the voltage at the node N50 follows to drop, thus enhancing the voltage at the node N51 to $V_{n2} - V_{T1}$ ($T_{INS}$) (e.g. 2.5 V). Thus, the voltage at the node N52 is enhanced to $V_{CL} - V_{T1}$ (T230) (e.g. 1.2 V), thus dropping din to 0 V. Accordingly, T233 turns on and so the voltage at the node N52 is enhanced from $V_{CL} - V_{T1}$ (T230) to $V_{CL}$ (1.5 V). In this way, because of the feedback to the node N52 through T233, the voltage amplitude at the node N52 is equal to that of the power supply voltage $V_{cc}$ so that a current does not flow through the CMOS inverter constituted by T231 and T232.

Figure 35D:
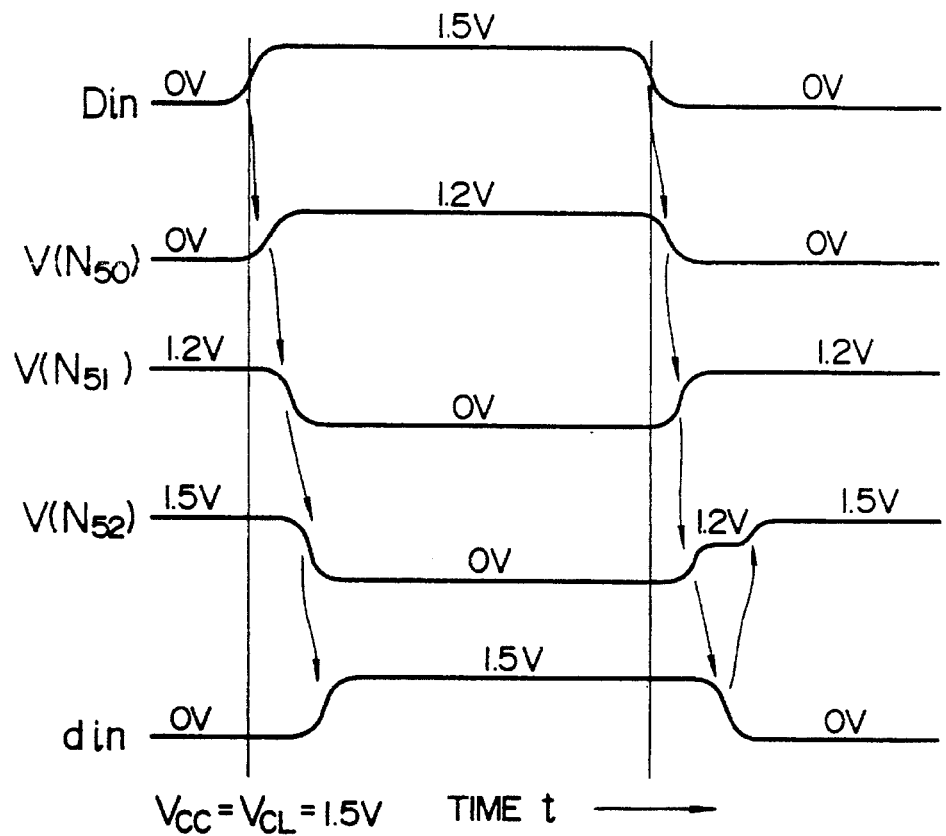

FIG. 35D shows waveforms at the respective parts in the case where both $V_{cc}$ and $V_{CL}$ are 1.5 V. When an input voltage Din is a low voltage (e.g. 0 V), the voltage at a node N51 is $V_{n2} - V_{T1}$ ($T_{INS}$) (e.g. 1.2 V) and the voltage at a node N52 is $V_{CL}$ (1.5 V). Thus, a low voltage (0 V) is outputted to din. When the input voltage Din is increased from the low voltage (e.g. 0 V) to a high voltage (e.g. 1.5 V), the voltage at a node N50 follows to increase to $V_{n2} - V_{T1}$ ($T_{INS}$) (e.g. 1.2 V), thus dropping the voltage at the node N51 to 0 V. The channel conductance of T231 is set at a larger value than that of T233 so that the voltage at the node N52 is dropped to substantially 0 V and the value of din is increased to $V_{CL}$ (1.5 V). On the other hand, when the input voltage Din is decreased from the high voltage (e.g. 1.5 V) to the low voltage (e.g. 0 V), the voltage at the node N50 follows to drop to 0 V, thus enhancing the voltage at the node N51 to $V_{n2} - V_{T1}$ ($T_{INS}$) (e.g. 1.2 V). Thus, the voltage at the node N52 is enhanced to $V_{CL} - V_{T1}$ (T230) (e.g. 1.2 V), thus dropping din to 0 V. Accordingly, T233 turns on and so the voltage at the node N52 is enhanced from from $V_{CL} - V_{T1}$ (T230) to $V_{CL}$ (1.5 V). In this way, even $V_{cc}$ comparatively low and the output amplitude of IB6a is smaller than that of $V_{cc}$, the voltage amplitude at the node N52 is equal to that of $V_{cc}$. Thus, a current does not flow through the CMOS inverter constituted by T231 and T232. Accordingly, even if the bias voltage which is higher than the power supply voltage $V_{cc}$ is not used, an input/output buffer which changes an input/output level in accordance with the power supply voltage $V_{cc}$ can be realized.

Figure 36A:
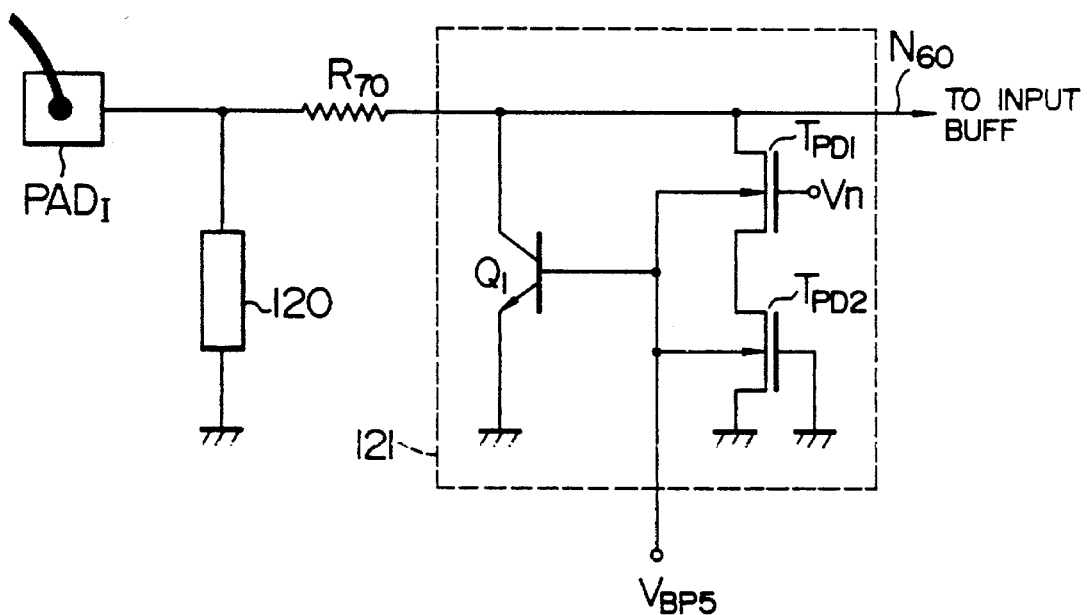

FIG. 36A shows an arrangement of the input protection device for protecting the devices of the internal circuit from input surge in an LSI constructed by scaled-down devices. In FIG. 36A, $PAD_1$ is a signal input pad; numeral 120 is a first protection device for shifting high voltage surge to the ground potential using punch-through between impurity diffused layers formed in a semiconductor substrate; numeral 121 is a gate clamping device for limiting the voltage at a node N60 to predetermined voltage or less; and R70 is a resistor for absorbing a difference between the high voltage applied to the pad and a clamping voltage. The gate clamping device is constructed by two N channel MOS-FETs $T_{PD1}$ and $T_{PD2}$ connected in series and a bipolar transistor Q1 using a parasitic device. As in the previously mentioned circuits, bias voltage $V_n$ is applied to the gate of $T_{PD1}$ to prevent a voltage exceeding the breakdown voltage from being applied to the drain of $T_{PD2}$. The gate of $T_{PD2}$ is connected to ground so that a current does not flow during normal operation.

Figure 36B:
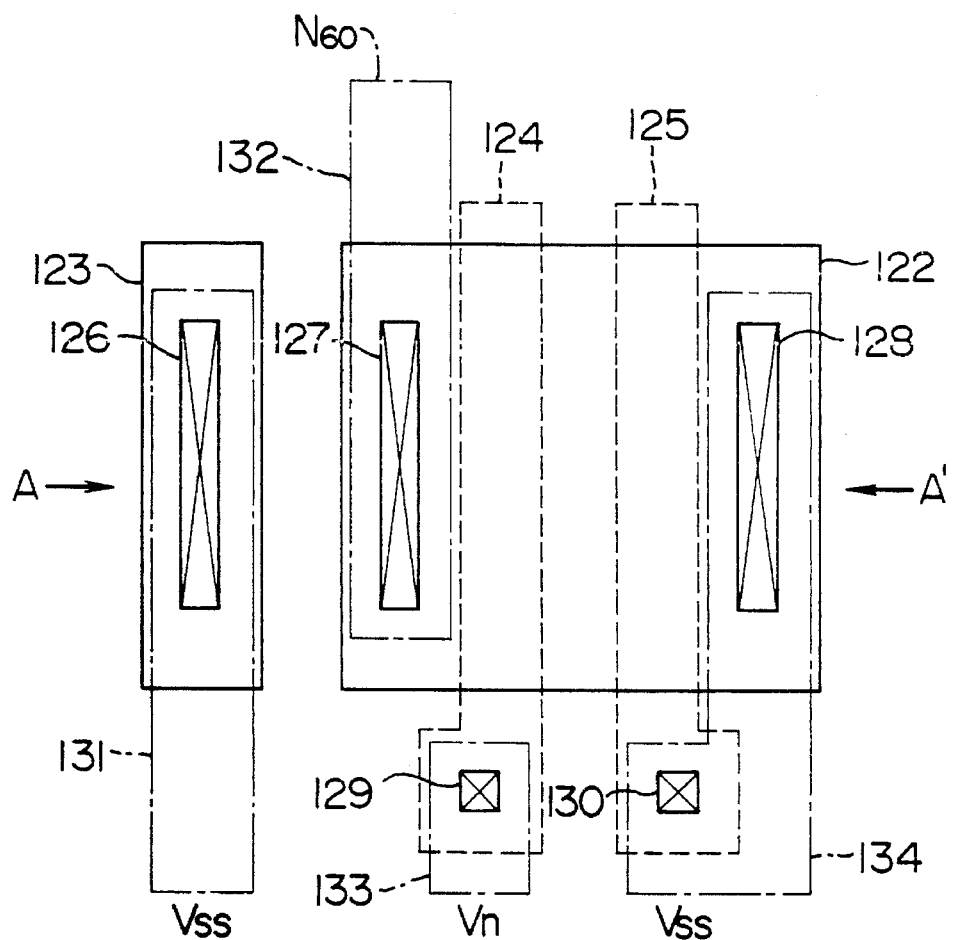
Figure 36C:
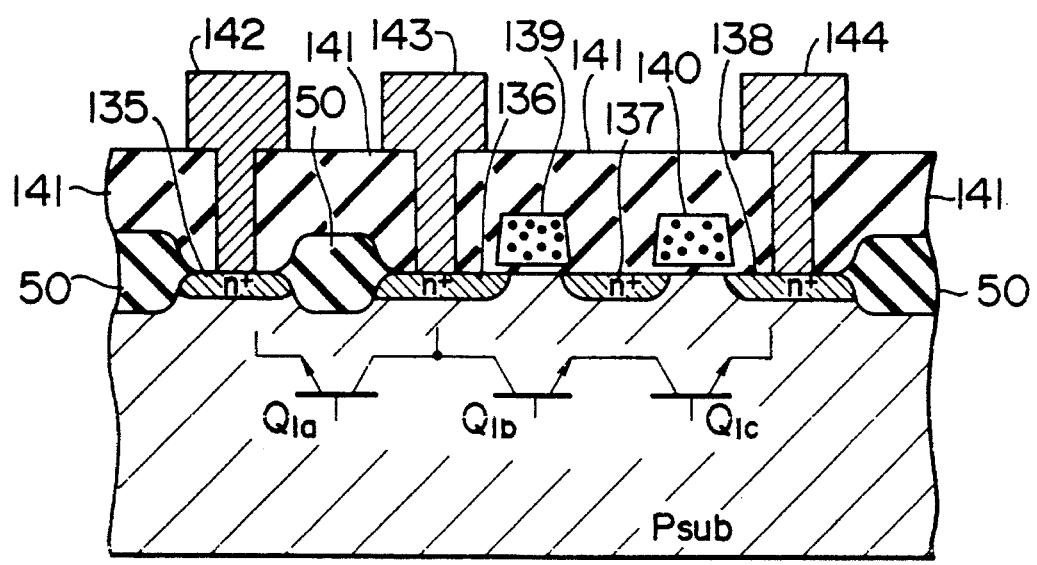

The plan structure of the gate clamping device 121 is shown in FIG. 36B and the sectional structure thereof along line A—A' is shown in FIG. 36C. In FIG. 36B, numerals 122 and 123 are electrically active regions which are electrically insulated from each other and formed in a semiconductor substrate; numerals 124 and 125 are gate electrodes made of silicon, respectively; numerals 126 to 130 are impurity diffused layers formed in the electrically active region or a contact hole, provided through an insulating film, for making electrical connection of the gate electrode with upper metal wiring; and numerals 131 to 134 are metal wirings made of e.g. aluminum. In FIG. 36C, numeral 50 is a thick insulating film, formed through e.g. the oxidation of the substrate, for electrically insulating the electrically active regions in the substrate from each other; numerals 139 and 140 are poly silicon constituting the gate electrode; numerals 135 to 138 are impurity diffused layers formed in the substrate in a self-aligned manner using as a mask the above insulating film or the gate electrode; and numeral 141 is a thick insulating film for electrically insulating the impurity diffused layers and the gate electrodes from the overlying metal wirings. In the structure as shown, a clamped terminal (node N60) is connected with the wiring 132, a ground terminal ($V_{ss}$) is connected with the wirings 131 and 134, and a bias voltage $V_n$ is connected with the wiring 133. In FIG. 36C, there are provided three NPN type parasitic transistors Q1a, Q1b and Q1c which use the substrate as a base. Q1 in FIG. 36A is a representative of these transistors.

The operation of the input protection device will be explained. When the voltage applied to the node N60 exceeds the breakdown voltage of the PN junction formed between the impurity diffused layer 136 and the substrate, the current due to the breakdown enhances the potential at the substrate (P type), thus turning on the above parasitic bipolar transistors. Thus, a large collector current flows between the diffused layers 136 and 135 (or 138) so as to extract charges at the node N60, thus clamping its potential. Since Q1b and Q1c are connected in series, their collector current is smaller than Q1a and so they are first effectively broken down. Therefore, the MOS-FET's turn on the parasitic transistor and thereafter the parasitic bipolar transistor Q1a passes the large current. In this way, if an impurity diffused layer is provided, in the neighborhood of the node N60, independently from the impurity diffused layers of the MOS-FETs and is grounded, the effective length between the collector and emitter of the parasitic bipolar transistor can be shortened so as to cause a large collector current to flow when the parasitic bipolar transistor operates. Also, the above arrangement of placing a grounded impurity diffused layer in the neighborhood of the terminal to be clamped may be used in an output protection device as well as in the input protection device. Further, although in the above embodiment, the gate clamping device is formed in the P substrate, it may be formed in the P well electrically separated from the substrate in such a structure as shown in FIG. 14. Then, the resistance of the base and the P well is increased and the parasitic transistor is further likely to be turned on so that the clamping effect can be further improved. Moreover, the bias voltage of the P substrate or the P well is generally set a minus value (e.g. −3 V), it may be 0 V as long as a forward current is permitted to flow for input undershoot. Furthermore, although a p-type substrate is employed in the above embodiment, an n-type substrate may be employed as long as the clamping device is formed within the P well.

Although the details of the present invention have been explained in relation to several embodiments, the application field of the present invention should not be limited to these embodiments. For example, although the present invention has been explained mainly in relation to a memory circuit, as mentioned in the beginning of the specification, it can be also applied to a memory LSI, a logic LSI, a composite LSI by combination thereof, or the other any LSI. Further, as regards the kind of the devices (elements) to be used, the present invention can be applied to an LSI including both P and N channel MOS-FETs, an LSI including bipolar transistors, an LSI including junction FETs, a BiCMOS type LSI by combination of CMOS transistors and bipolar transistors, and further an LSI in which devices are formed in a substrate of the material other than Si, e.g. GaAs.

In accordance with the embodiments of the present invention as explained above, it is possible to provide an LSI which can use the characteristic of the devices fabricated by the up-to-date scaled-down processing technique, operate with low power consumption and a high speed and also perform normal operation and data retention using a battery through exchange of the operation state.

Explanation will be given for embodiments of the dynamic random access memory (DRAM) in accordance with the present invention which is suited for low voltage operation. In accordance with the embodiments mentioned below, disclosed is the DRAM which can sufficiently assure storage charges of memory cells even when an internal power supply voltage is lowered. The point of these embodiments resides in the following three items:

(1) using a half precharge system,
(2) setting the threshold voltage of the MOS-FETs constituting a CMOS sense amplifier at a value that is about one-third of the potential difference between data lines D and $\bar{D}$ (hereinafter referred to as data line voltage amplitude), and
(3) boosting the potential of a memory cell signal at a higher potential using a terminal of a capacitor constituting the memory cell which is not connected with the MOS-FET for a transfer gate.

Setting the data line voltage amplitude in amplifying the memory cell signal at a small value permits the internal power supply voltage to be lowered and also the data line charging/discharging current to be greatly reduced, thus reducing power consumption. Also, although reducing the data line voltage amplitude decreases the voltage to be written from the data line into the memory cell, the memory cell signal can be increased by boosting that voltage from one terminal of the capacitor constituting the memory cell. Thus, the characteristics of data retention time, α ray-resistance soft error and S/N can be improved.

Figure 37A:
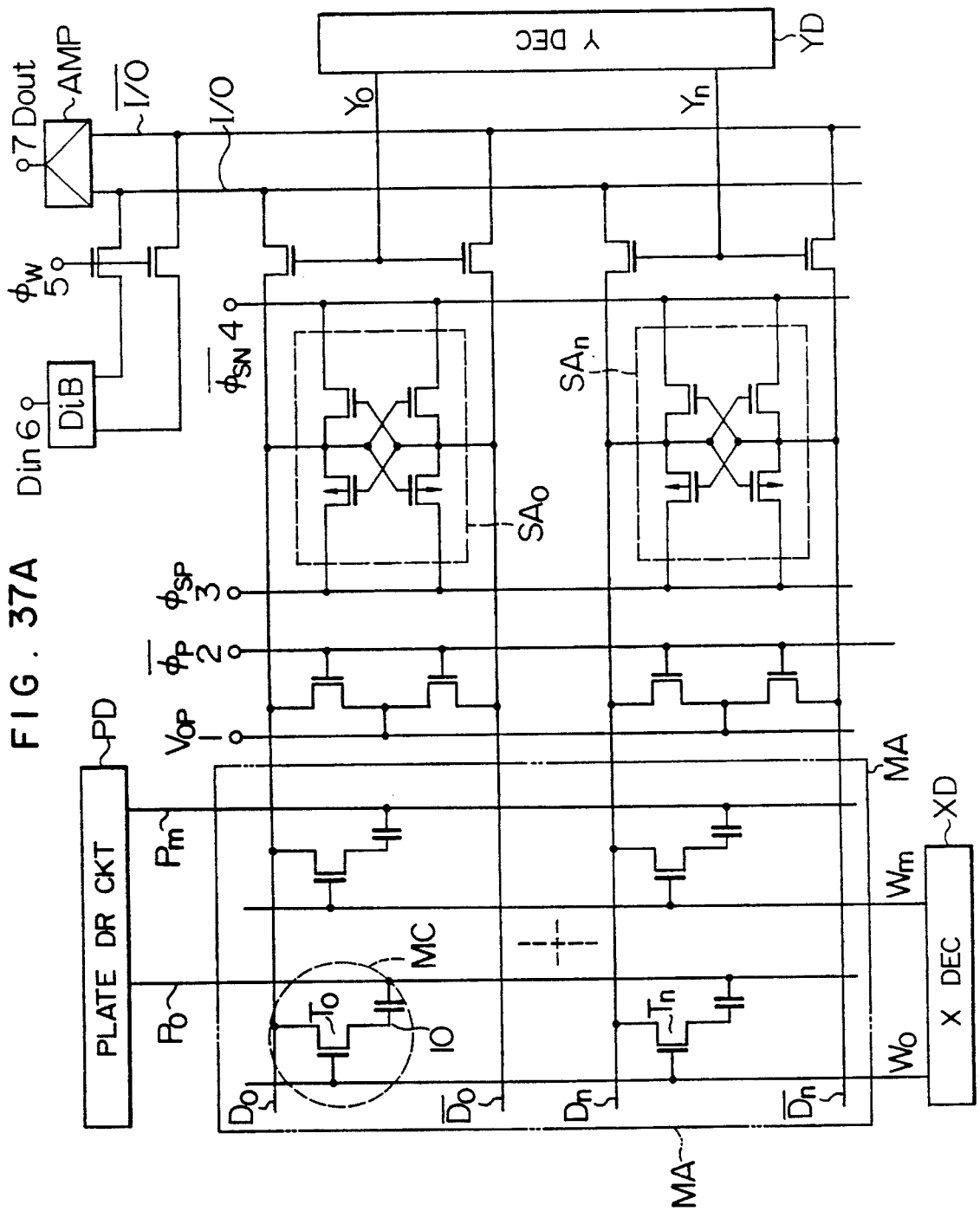
FIGS. 37A to 70D are views showing embodiments relative to improvement of a dynamic RAM, etc. used in the present invention.

In FIG. 37A, a memory cell array MA is composed of plural data line pairs D0, $\overline{D0}$ to Dn, $\overline{Dn}$, word lines W0 to Wn, and memory cells MCs. XD is an X decoder which selects one of the plural word lines. YD is a Y decoder which selects one pair of the plural data line pairs. Y0 is a data line selection signal line which conduct an output from the Y decoder. PD is a plate driving circuit for controlling the voltage at each of the one terminals P0 to Pm (plates) of the capacitors each constituting the memory cell (the plate wirings P0–Pm are arranged correspondingly to the respective the word lines). SA0 to SAn is a sense amplifier which amplifies the signal read from the memory cell, respectively. Numeral 1 is a signal line for conducting a data line precharge signal $V_{DP}$. Numeral 2 is a signal line which conducts a data line precharge signal $\bar{\phi}_P$. Numerals 3 and 4 is a sense amplifier driving line which conducts sense amplifier driving signals $\phi_{SP}$ and $\bar{\phi}_{SN}$, respectively. I/O and $\overline{I/O}$ is a data input/output line which conducts the write signal in the memory cells and the read signal therefrom, respectively. Although not shown here, the data input/output lines are provided with a precharge circuit IOP and a bias circuit IOB as shown in FIG. 37E. AMP is an output amplifier which amplifies the signal read from the memory cell to provide an output signal Dout. Dib is a data input buffer which converts an input signal (write signal) from the exterior into a signal level in the chip is a write control signal.

The read operation of the circuit shown in FIG. 37A will be explained with reference to a waveform chart shown in FIG. 37B. It should be noted that for convenience of explanation, an example of the voltage value of each waveform is illustrated.

While the data line precharge signal $\bar{\phi}_P$ is at a high potential level (4 V), the data lines D0, $\overline{D0}$ (Dn, $\overline{Dn}$) are at a precharge potential (1 V). Then, the sense amplifier driving signals $\phi_{SP}$, $\bar{\phi}_{SN}$ are 1 V and the sense amplifier is in an OFF state. After $\bar{\phi}_P$ has been changed to a low potential level (0 V), one of the word lines is selected. Now it is assumed that the word line W0 has been selected. When W0 is changed from a low potential level (0 V) to a high potential level (4 V), a memory cell signal appears at each data line. Now it is assumed that the memory cells connected with the data lines D0, Dn have stored a signal at a high potential level. Therefore, the potential at the data line Do (Dn) becomes slightly higher than that at the data line $\overline{D0}$ ($\overline{Dn}$). Next, when $\phi_{SP}$ is changed from 1 V to 2 V, and $\phi_{SN}$ is changed from 1 V to 0 V, the sense amplifiers SAo to SAn operate to amplify the memory signals. Thus, the data line D0 becomes 2 V and the data line $\overline{D0}$ becomes 0 V. Thereafter, a pair of the data lines is selected by the Y decoder YD. It is now assumed that D0 and $\overline{D0}$ are selected. Thus, the potential at the data line selection line Y0 becomes high (4 V) so that the memory cell signal is read out to the data input/output lines I/O and $\overline{I/O}$. This signal is amplified by the output amplifier AMP to provide the Dout.

The rewrite operation of a signal into a memory cell will be explained. After the sense amplifier has been operated, the potential at a storage terminal 10, which is one terminal of the capacitor constituting a memory cell, is 2 V like D0 (case where the potential at the terminal is at a high potential). Then, the potential at the plate P0 is changed from 4 V to 0 V. However, the potential on the word line W0 is 4 V so that the potential on the data line and at the storage terminal are held by the sense amplifier. Thereafter, the potential on the word line W0 is lowered from 4 V to 2 V. Then, assuming that the threshold voltage of a transistor constituting the memory cell is 1 V, both potentials of at the storage terminal and on the data line D0 are 2 V so that the transistor T0 is in an OFF state. Therefore, when the potential on the plate P0 is changed from 0 V to 4 V, the potential at the storage terminal is enhanced from 2 V to about 6 V. Thus, 6 V is written in the memory cell.

Figure 37B:
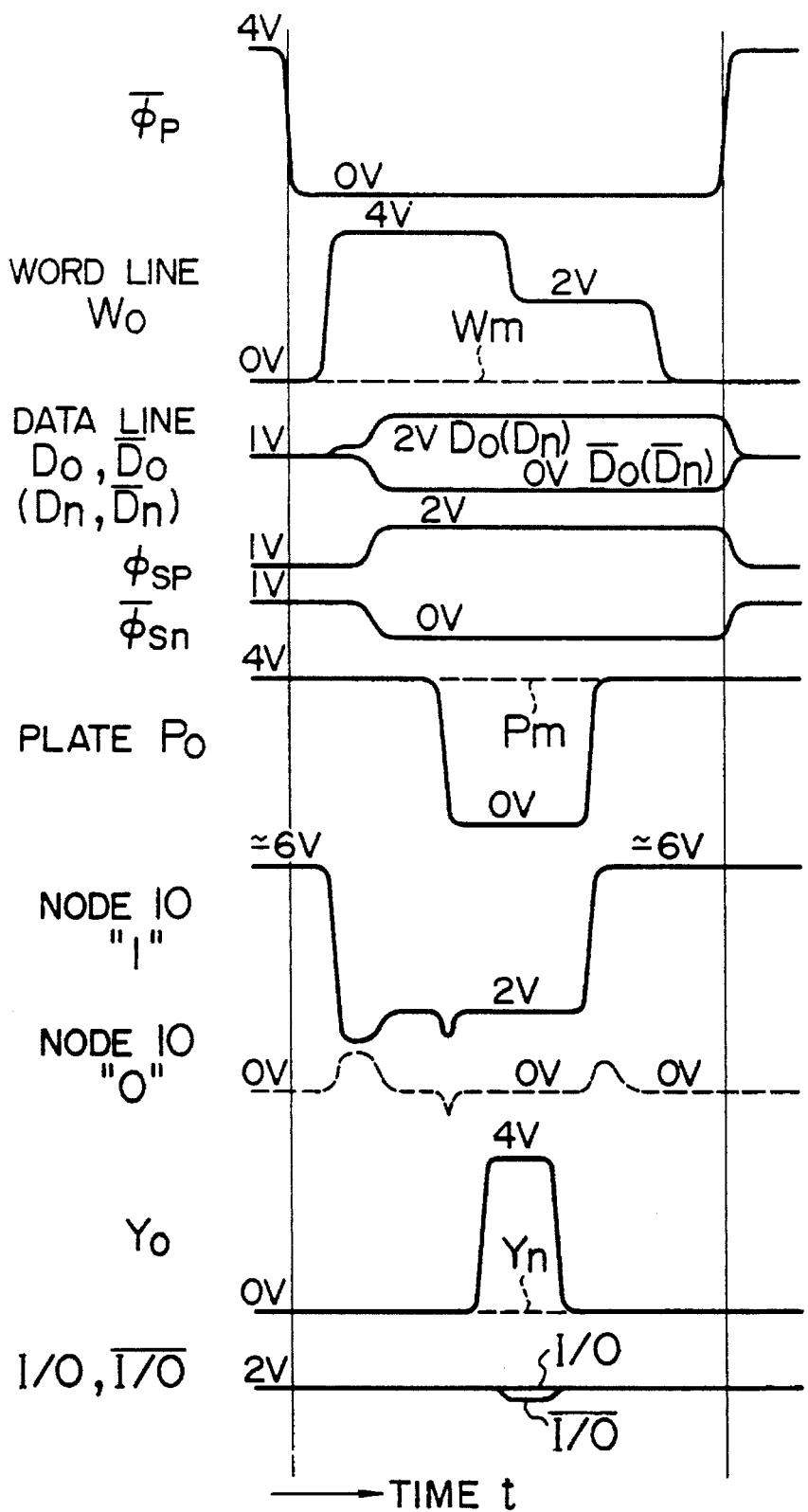

On the other hand, the rewrite operation in the case where a signal at a low potential has been stored in the memory will be explained with reference to the waveform in the case where the terminal 10 in FIG. 37B is at a low potential. After the sense amplifier has been operated, both potentials on the data line D0 and at the storage terminal 10 are 0 V. Therefore, even if the potential on the word line W0 is subsequently lowered from 4 V to 0 V, the transistor T0 constituting the memory cell is an ON state. Thus, even if the potential at the plate P0 is subsequently changed from 0 V to 4 V, the potential at the storage terminal 10 is held 0 V. Accordingly, 0 V is written in the memory cell.

Thereafter, the potential on the word line W0 becomes 0 V to complete the rewrite operation. Subsequently, $\phi_{SP}$ and $\overline{\phi_{SN}}$ become 1 V. Further, $\phi_P$ becomes 4 V to precharge the data line to 1 V.

Figure 37C:
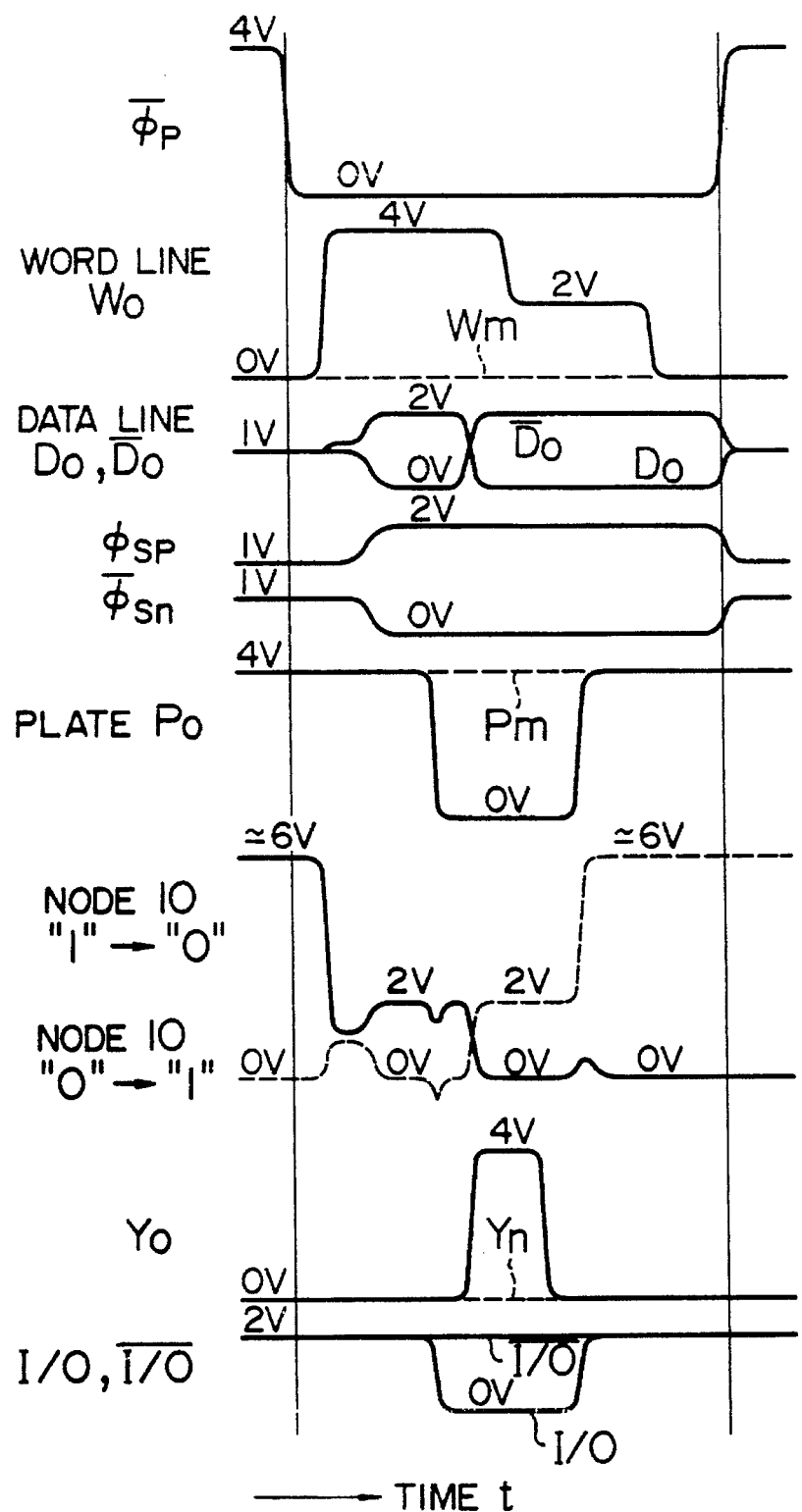

The write operation in the circuit shown in FIG. 37A will be explained with reference to the waveform chart of FIG. 37C. After memory cell signals have been amplified by the sense amplifiers as in the read operation, a write signal Din (not shown in FIG. 37C) is fetched into a data input buffer DiB. When a write control signal $\phi_W$ (not shown in FIG. 37C) becomes 4 V, the potentials on the input/output lines I/O and $\overline{I/O}$ are separated into a high potential and a low potential in accordance with Din. It is now assumed that I/O and $\overline{I/O}$ have become 0 V and 2 V, respectively. Thereafter, a pair of data lines are selected by the Y decoder YD. It is now assumed that D0 and $\overline{D0}$ have been selected. Thus, the potential on the data line selection line $Y_0$ becomes 4 V so that D0 and $\overline{D0}$ become 2 V and 0 V, respectively. Accordingly, a low potential of 0 V is written at the storage terminal 10 of the memory cell (see the waveform in the case where the terminal 10 is rewritten from the high potential to the low potential).

On the other hand, the operation of writing a high potential signal in the memory in which a low potential signal has been stored in the memory is as follows. After the sense amplifier has been operated, the potentials on D0 and $\overline{D0}$ are 0 V and 2 V, respectively. The potentials on I/O and $\overline{I/O}$ are 2 V and 0 V, respectively, in accordance with Din. Thereafter, the potential on Y0 is enhanced to 4 V so that the potentials on D0 and $\overline{D0}$ are 2 V and 0 V. Accordingly, the high potential of 2 V is written at the storage terminal of the memory cell (see the waveform in the case where the terminal 10 is rewritten from the low potential to high potential).

The operation after the signal has been written in the memory cell in the above manner is the same as the read operation as previously mentioned. Namely, the high potential signal in the memory cell is boosted and stored at about 6 V whereas the low potential is stored at 0 V.

As explained above, in accordance with this embodiment, the voltage amplitude of the data lines and that of the voltage to be written into the memory cells can be determined independently from each other. Therefore, by decreasing the voltage amplitude of the data lines, which affects the power consumption of the memory, and also increasing the voltage amplitude of the plates, which is relative to memory cell signals, reduced power consumption and increased S/N of the memory can be simultaneously realized. In this embodiment, the voltage amplitude of the plate is set to be larger than that of the data lines. In this way, most of the memory cell signals can be stored through the plates so that the voltage amplitude of the data lines can be decreased to the neighborhood of the operation limit of the sense amplifiers. Thus, the power consumption can be remarkably reduced while assuring a sufficient signal voltage for the memory cells. In this embodiment, the potential on the data lines during its precharge is set at an intermediate value between the high and low potentials of the voltage amplitude of the data lines. This permits the power consumption to be further reduced.

Figure 37D:
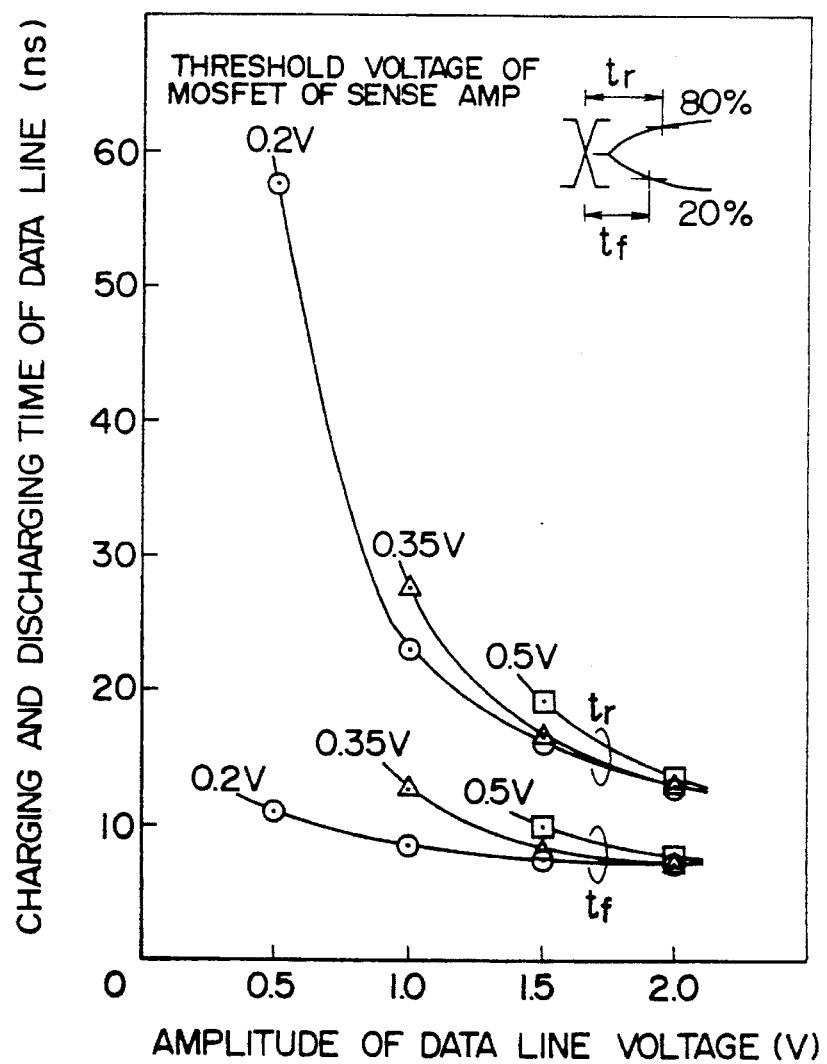
Figure 37E:
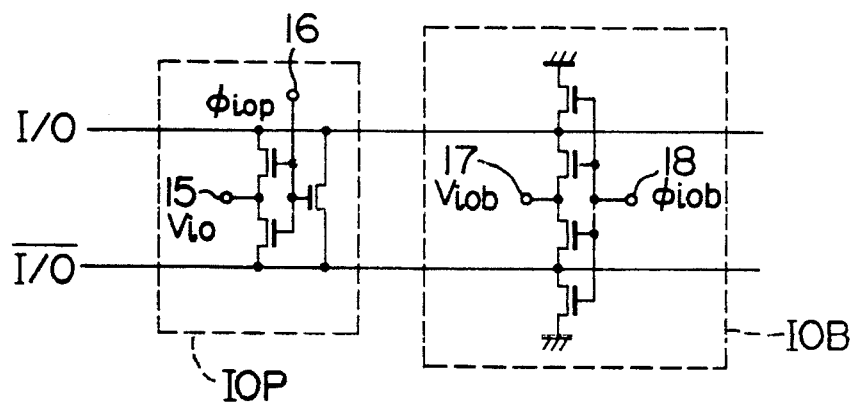

Further, although the amplitude of the data line voltage can be decreased to the neighborhood of the threshold voltage of the MOS-FETs constituting the sense amplifier, it is desired to be slightly larger than a sum of the absolute values of the respective threshold values of N channel MOS-FETs and P channel MOS-FETs which constitute the sense amplifier. This will be explained with reference to FIG. 37D. FIG. 37D shows the charging/discharging time of the sense amplifier when the amplitude of the data line voltage is set at 0.5 V, 1.0 V, 1.5 V and 2.0 V. Three kinds of threshold voltages of 0.2 V, 0.35 V and 0.5 V in the MOS-FETs are used as parameter. $t_r$ represents a charging time (raising-up time) and $t_f$ represents a discharging time (falling-down time). As seen from the figure, unless the threshold voltage is one-third of the voltage amplitude of the data line or less, excess time is required for charging/discharging. Particularly, the charging time in the case of the data line voltage amplitude of 0.5 V and the threshold voltage of 0.2 V, which is close to 60 ns, is considered to a limit to be actually adopted in the DRAM.

With respect to power consumption, the charging/discharging current in the case of the data line voltage amplitude of 2 V can be decreased to $\frac{1}{2.5}$ of the case of 5 V assuming that the respective threshold voltage of the N channel MOS-FETs and the P channel MOS-FETs are 0.7 V and −0.7 V. Incidentally, the power consumption may be increased due to driving the plates. But, in an array of 256 word lines * 1024 data pair lines, the capacitance charged at one time is 15 to 30 pF for plates, which is negligibly small whereas it is 200 to 300 pF for the data lines.

In accordance with this embodiment, the voltage amplitude of the data lines can be decreased while assuring a sufficient voltage to be written into the memory cells so that low power consumption and high S/N in the memory can be simultaneously realized. Additionally, if the plate potential is set at an intermediate value between two potentials of the memory cells during the stand-by of the memory as shown in FIGS. 37B and 37C, an electric field applied to the capacitor constituting the memory cell can be decreased, thus improving the reliability of the capacitor.

Further, in accordance with this embodiment, the signal stored in the memory cell is larger on the high potential side than on the low potential side. Since the memory cell signal on the high potential side is required to be large in order to increase the margin for data retention time and ray soft error, in accordance with this embodiment, a memory with large margin for them can be provided.

Figure 38A:
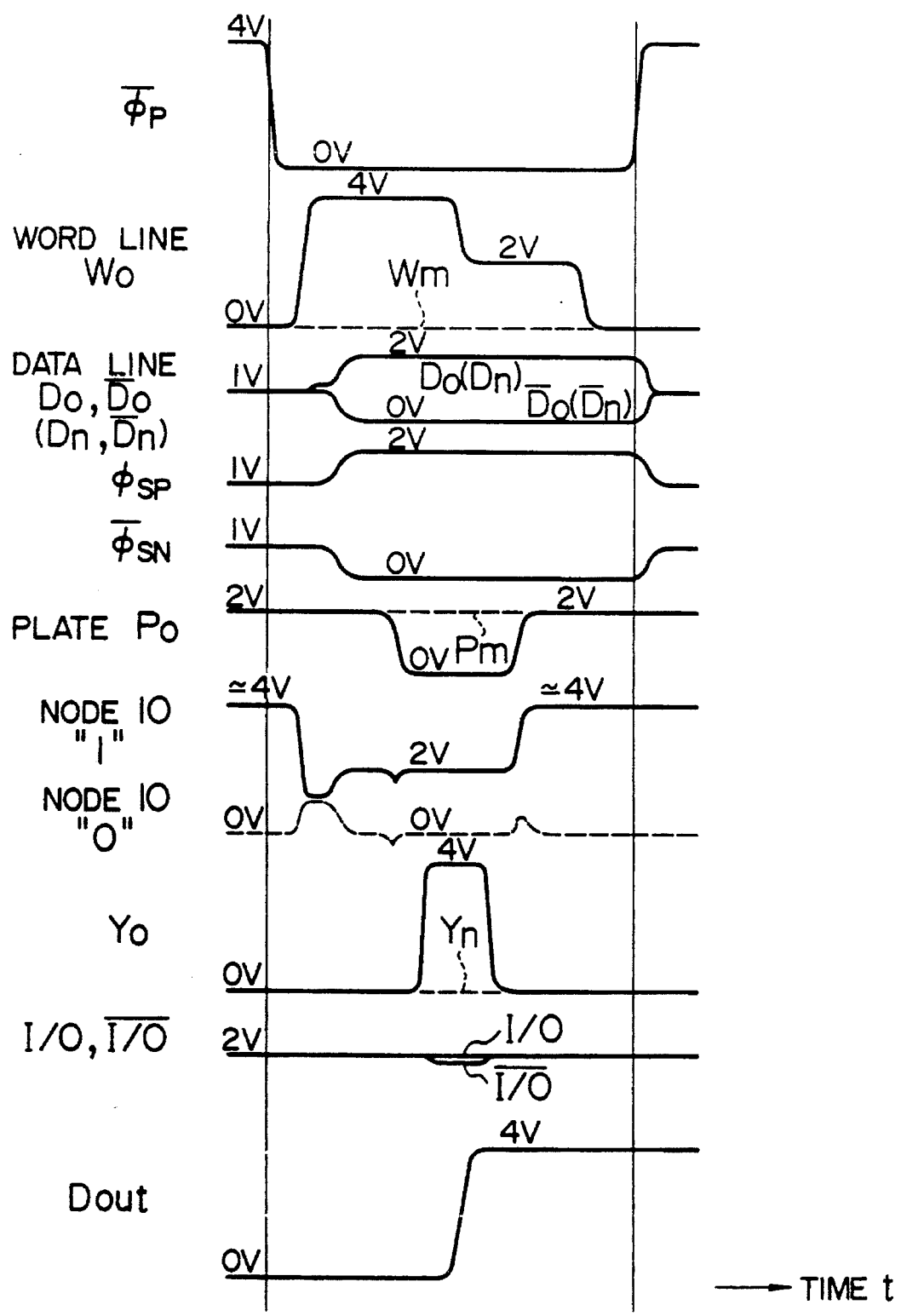
Figure 38B:
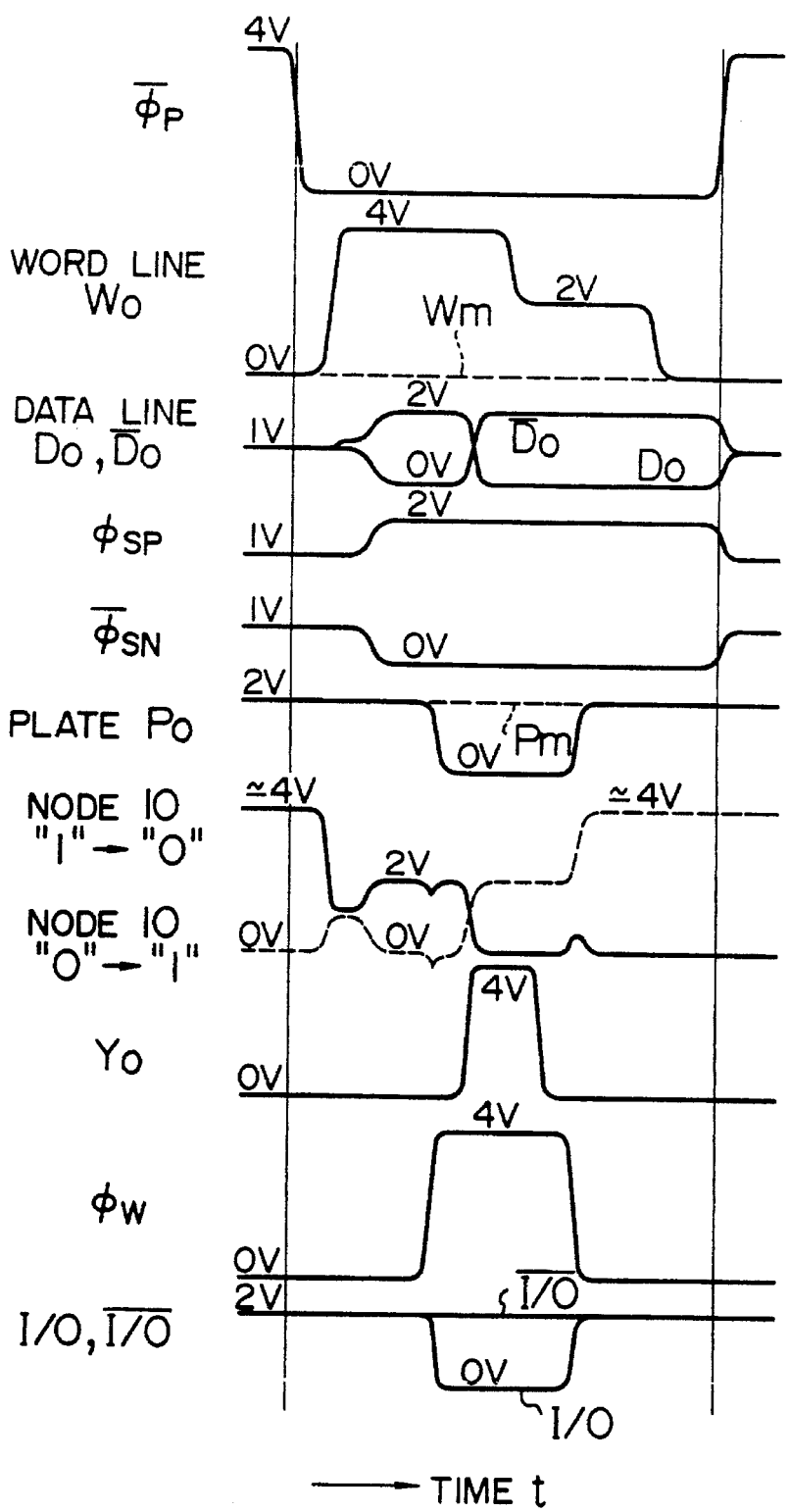

Another embodiment of the present invention will be explained with reference to FIGS. 39A and 38B. In this embodiment, the voltage amplitudes of both data line and plate are set at the same value. The other operation and circuit arrangement are the same as the embodiment shown in FIG. 37A. FIG. 38A shows the read operation of the memory and FIG. 39B shows the write operation thereof. In this embodiment, the voltage amplitudes of both data line and plate are set at the same value and the plate potential during the stand-by time of the memory is set at an intermediate value two storage potentials in the memory cell. Therefore, the voltage applied to the capacitor of the memory cell is the same in both cases where the potential of the signal to be stored in the memory cell is a high level and a low level, which can improve the reliability of the capacitor.

Figure 39A:
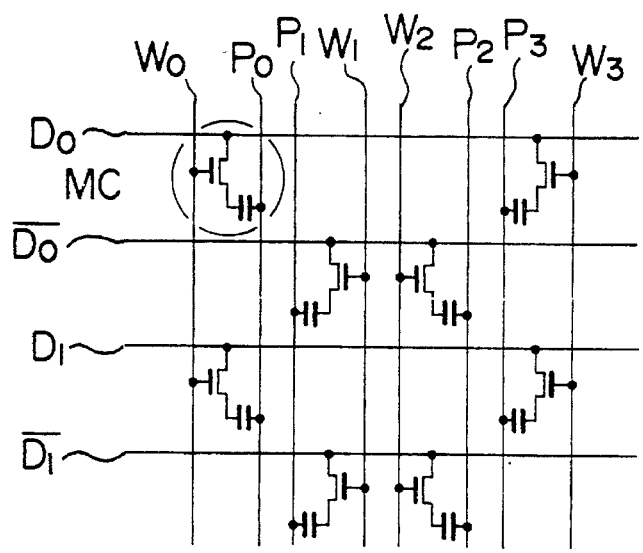
Figure 39B:
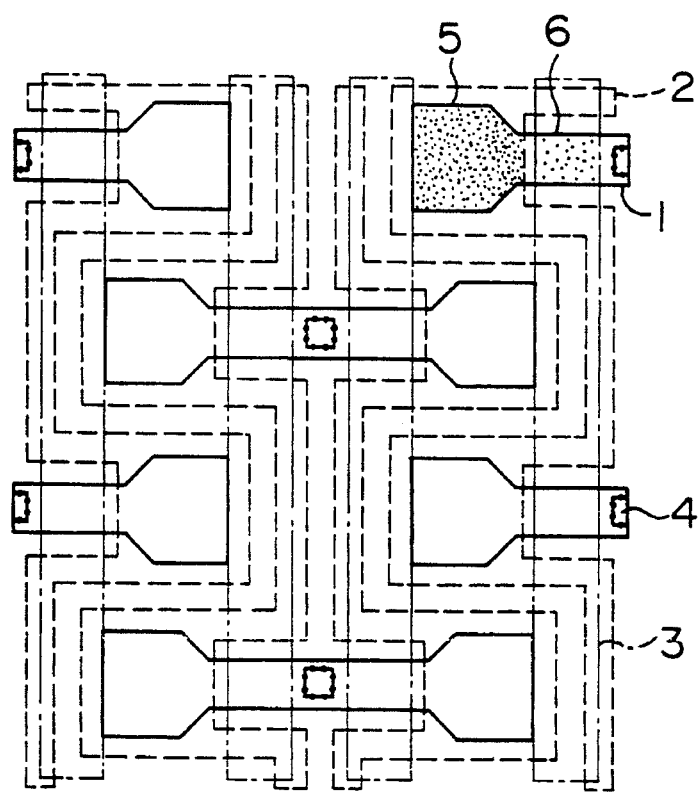

FIGS. 39A and 39B show an embodiment of the memory cell array in the case where a plate wiring is arranged for each word line. FIG. 39A shows the equivalent circuit thereof and FIG. 39B shows the plan structure thereof. The conventional memory cell is disclosed in e.g. ISSCC86, Digest of Technical Papers, p. 263 and ISSCC85, Digest of Technical Papers, P. 245. In the memory cell array using these memory cells, the plate is not separated for each word line. On the other hand, in this embodiment, as seen from FIG. 39B, the plate is separated for each word line on the basis of the conventional memory cell. In FIG. 39B, numeral 1 is an $n^+$ diffused layer which serves as the source (drain) terminal of the transistor of a memory cell and is connected with a data line through a through-hole 4 (although the data line is not shown here for simplicity of the illustration, using an aluminum layer, it may be provided perpendicularly to a word line). Numeral 2 is a plate of a first poly-silicon layer which is separated for each word line as seen from the figure. 5 is a capacitor portion. Numeral 3 is a word line of second poly-silicon layer. Numeral 6 is a transistor portion. As seen from the arrangement shown in FIG. 39B, if the plate is provided for each word line, certain space is required between the plates, thereby increasing the memory chip size. Next, a system of commonly using a plate for plural word lines will be explained.

Figure 40A:
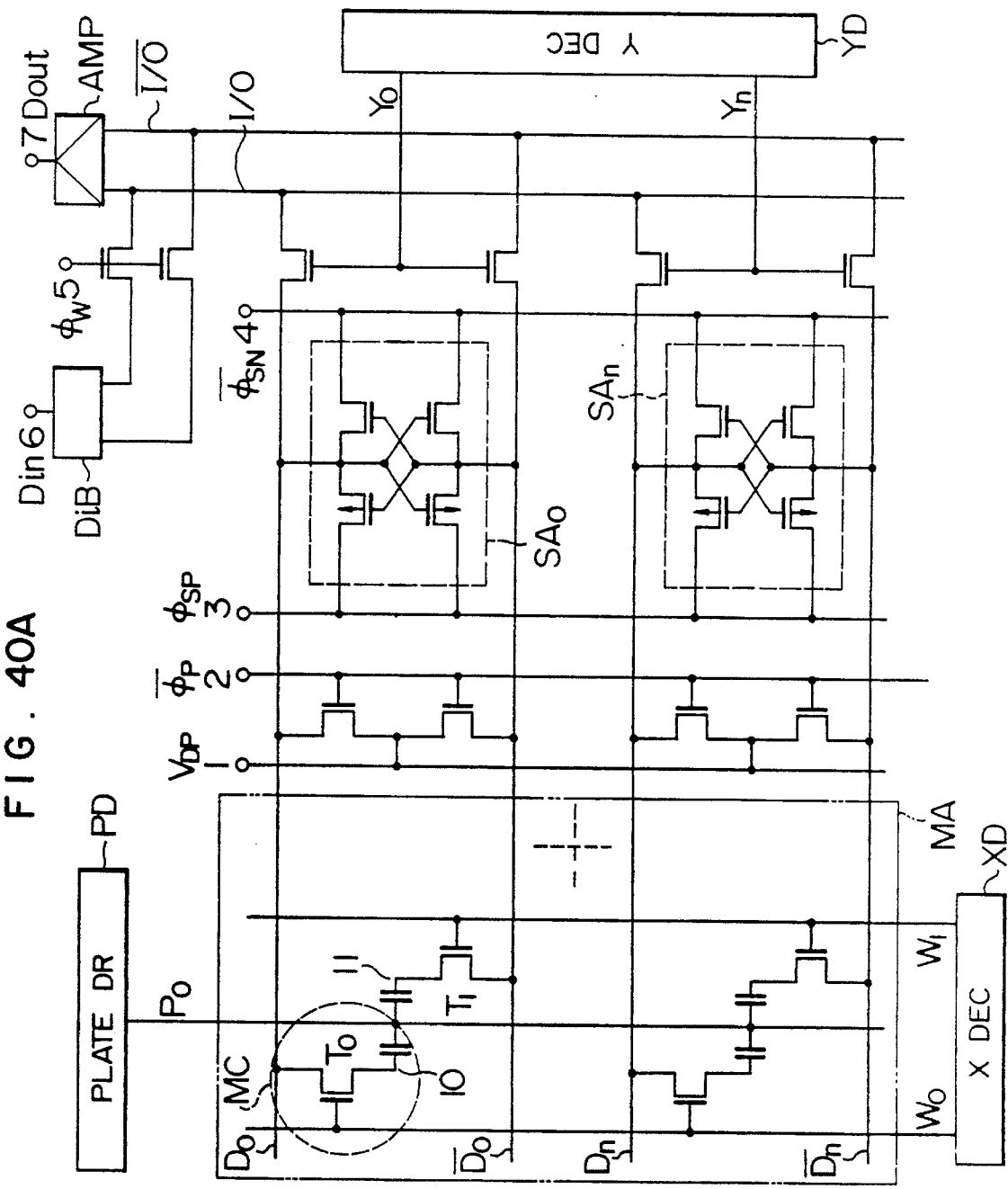

Another embodiment of the present invention will be explained with reference to FIGS. 40A, 40B and 40C. The memory constitution shown in FIG. 40A is the same as that of FIG. 37A except the plate line constitution. Whereas in the embodiment of FIG. 37A, a plate is provided for each word line, in this embodiment, one plate is commonly provided for two word lines. Then, there are some memory cells in which the plate potential varies among the memory cells connected with the non-selected word line so that contrivance will be made for potential relations.

The read operation of the circuit shown in FIG. 40A will be explained with reference to a waveform chart shown in FIG. 40B.

While the data line precharge signal $\overline{\phi_P}$ (not shown in FIG. 40B) is at a high potential level, the data lines D0, $\overline{D0}$ (Dn, $\overline{Dn}$) are precharged at 4 V. Then, the sense amplifier driving signals $\phi_{SP}$, $\overline{\phi_{SN}}$ are 4 V and so the sense amplifier is in an OFF state. After $\overline{\phi_P}$ has ben changed to 0 V, one of the word lines is selected. Now it is assumed that the word line W0 has been selected. When W0 is changed from 0 V to 7 V, a memory cell signal appears on each data line. Now it is assumed that the memory cells connected with the data lines D0, Dn have stored a signal at a high potential level. Therefore, the potential at the data line D0 (Dn) becomes slightly higher than that at the data line $\overline{D0}$ ($\overline{Dn}$). Next, when $\phi_{SP}$ is changed from 4 V to 5 V, and $\overline{\phi_{SN}}$ is changed from 4 V to 3 V, the sense amplifiers SAo to SAn operate to amplify the memory signals. Thus, the data line D0 becomes 5 V and the data line $\overline{D0}$ becomes 3 V. Thereafter, a pair of the data lines is selected by the Y decoder YD. It is now assumed that D0 and $\overline{D0}$ are selected. Thus, the potential at the data line selection line Y0 (not shown in FIG. 40B) becomes high so that the memory cell signal is read out on the data input/output lines I/O and $\overline{I/O}$ (not shown in FIG. 40B). This signal is amplified by the output amplifier AMP to provide the Dout (not shown in FIG. 40B).

The rewrite operation of a signal into a memory cell will be explained. After the sense amplifier has been operated, D0 is at a high potential of 5 V and $\overline{D0}$ is a low potential of 3 V. Then, the storage terminal 10 of the memory cell is at the high-potential of 5 V like D0 (case where the potential at the terminal is at a high potential in FIG. 40B). Then, the potential at the plate P0' is changed from 6 V to 3 V. However, the potential on the word line W0 is 4 V so that the potential on the data line and at the storage terminal are held by the sense amplifier and not varied. Thereafter, the potential on the word line W0 is lowered from 7 V to 5 V. Then, assuming that the threshold voltage of a transistor constituting the memory cell is 1 V, both potentials of at the storage terminal 10 and on the data line D0 are 5 V so that the transistor T0 is in an OFF state. Therefore, when the potential on the plate P0' is changed from 3 V to 6 V, the potential at the storage terminal is enhanced from 5 V to about 8 V. Thus, the high potential about 8 V is written in the memory cell.

Figure 40B:
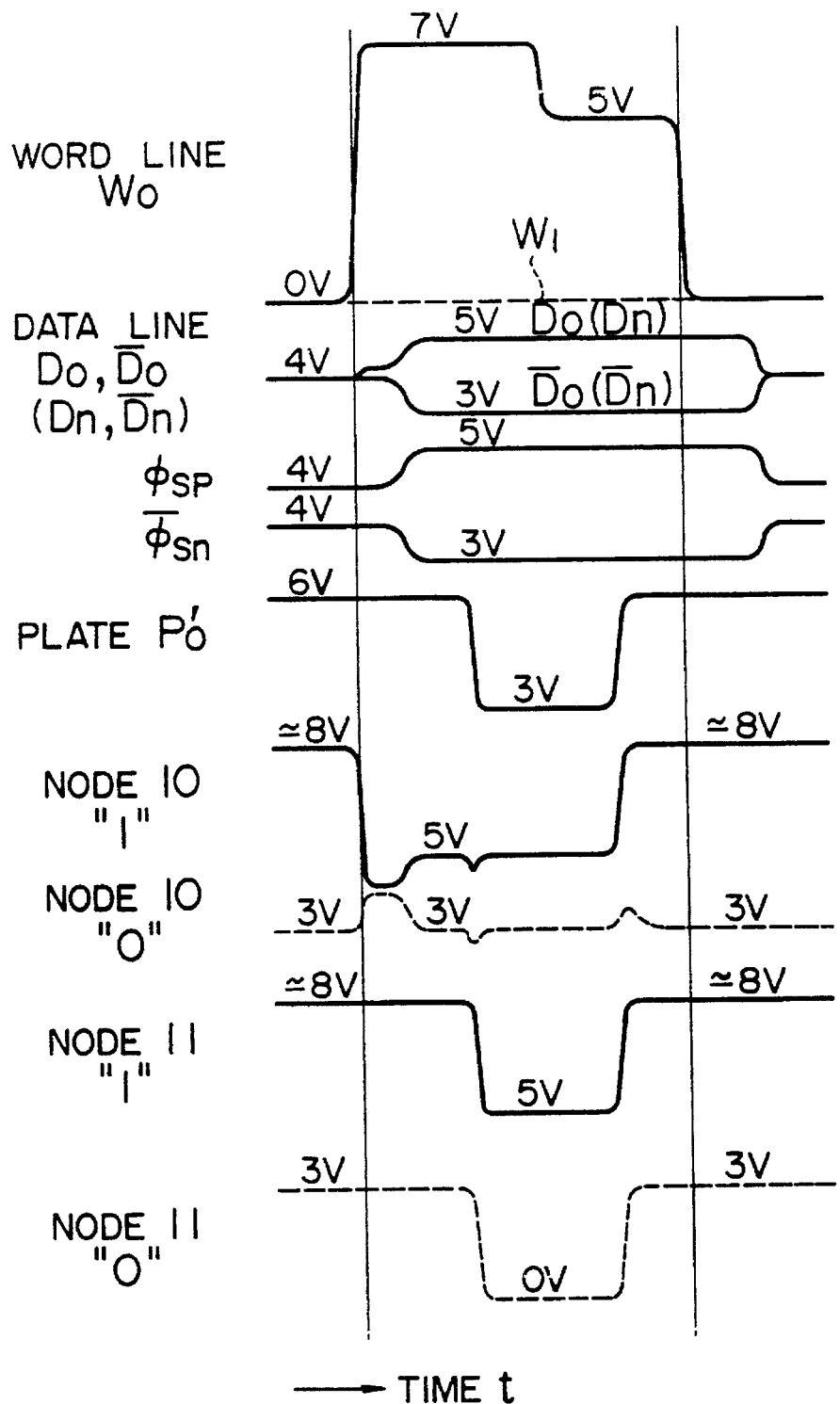
Figure 40C:
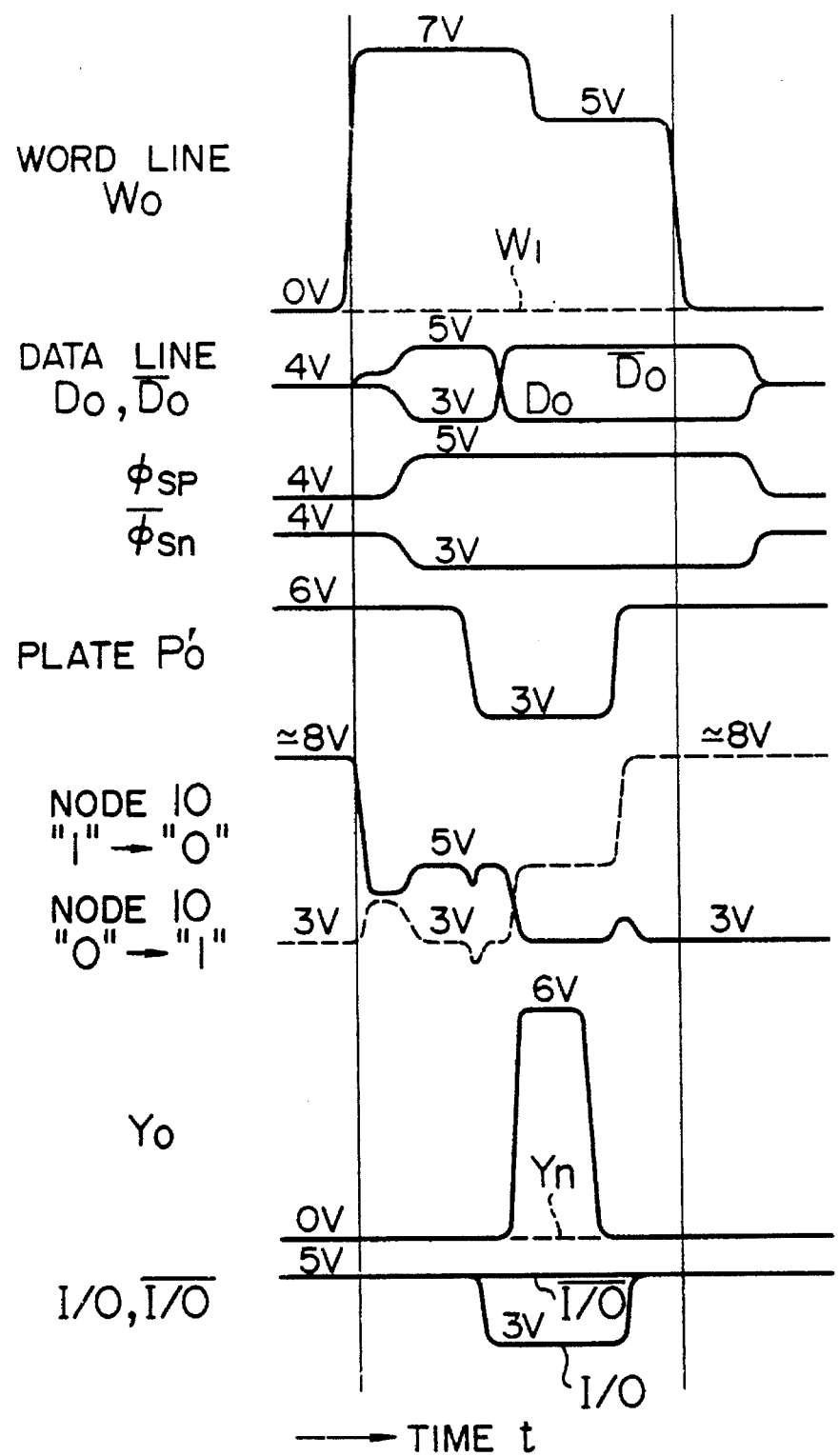

On the other hand, the rewrite operation in the case where a signal at a low potential has been stored in the memory will be explained with reference to the waveform in the case where the terminal 10 in FIG. 40B is at a low potential. After the sense amplifier has been operated, both potentials on the data line D0 and at the storage terminal 10 are 3 V. Therefore, even if the potential on the word line W0 is subsequently lowered from 7 V to 5 V, the transistor T0 constituting the memory cell is an ON state. Thus, even if the potential at the plate P0' is subsequently changed from 3 V to 6 V, the potential at the storage terminal 10 is held 3 V. Accordingly, the low potential of 3 V is rewritten in the memory cell.

Meanwhile, in this embodiment, the plate of the memory cell connected with a non-selected word line is varied in its potential. Then, the behavior of a storage terminal 11 of the memory cells connected with a non-selected word line W1 will be explained. The operation in the case where a high potential has been stored at the storage terminal 11 is as follows. During the stand-by time of the memory; the plate P0' is at 6 V and the storage terminal 11 is at 8 V. After the sense amplifier has amplified the memory signal, P0 becomes 3 V and then the storage terminal becomes 5 V. Then, the word line W1 becomes 0 V and the data line $\overline{O0}$ becomes 3 V or 5 V so that a transistor T1 is never in the ON state and so the signal in the memory cell is not destroyed. Thereafter, the plate P0' becomes 0 V and the storage terminal 11 returns to 8 V.

The operation in the case where a low potential has been stored at the storage terminal 11 is as follows. During the stand-by time of the memory, the plate P0' is at 6 V and the storage terminal 11 is at 3 V. After the sense amplifier has amplified the memory signal, P0' becomes 3 and then the storage terminal 11 becomes 0 V. Then, the word line W1 becomes 0 V and the data line $\overline{O0}$ becomes 3 V or 5 V so that a transistor T1 is never in the ON state and so the signal in the memory cell is not destroyed. Thereafter, the plate P0 becomes 6 V and the storage terminal 11 returns to 3 V.

Thereafter, the potential on the word line W0 becomes 0 V to complete the rewrite operation. Subsequently, $\phi_{SP}$ and $\overline{\phi_{SN}}$ become 4 V. $\overline{\phi_P}$ becomes the high potential to precharge the data line to 4 V.

In this way, if the plate voltage amplitude (6–3=3 V) is equal to the low potential level of the data line, the lowest potential of the storage terminal 11 is 0 V. Therefore, the transistor T1 is never turned on.

The write operation in the circuit shown in FIG. 40A will be explained with reference to the waveform chart of FIG. 40C. After memory cell signals have been amplified by the sense amplifiers as in the read operation, a write signal Din is fetched into a data input buffer DiB. When a write control signal $\phi_W$ (not shown in FIG. 40C) becomes a high potential, the potentials on the input/output lines I/O and $\overline{I/O}$ are separated into a high potential and a low potential in accordance with Din. It is now assumed that I/O and $\overline{I/O}$ have become 3 V and 5 V, respectively. Thereafter, a pair of data lines are selected by the Y decoder YD. It is now assumed that D0 and $\overline{D0}$ have been selected. Thus, the potential on the data line selection line Y0 becomes 4 V so that D0 and $\overline{D0}$ become 5 V and 3 V, respectively. Accordingly, a low potential of 3 V is written at the storage terminal 10 of the memory cell (see the waveform in the case where the terminal 10 is rewritten from the high potential to the low potential).

On the other hand, the operation of writing a high potential signal in the memory in which a low potential has been stored in the memory is as follows. After the sense amplifier has been operated, the potentials on D0 and $\overline{D0}$ are 3 V and 5 V, respectively. The potentials on I/O and $\overline{I/O}$ are 5 V and 3 V, respectively, in accordance with Din. Thereafter, the potential on Y0 is enhanced to 6 V so that the potentials on D0 and $\overline{D0}$ are 5 V and 3 V. Accordingly, the high potential of 5 V is written at the storage terminal of the memory cell (see the waveform in the case where the terminal 10 is rewritten from the low potential to high potential.

The operation after the signal has been written in the memory cell in the above manner is the same as the read operation as previously mentioned. Namely, the high potential signal in the memory cell is boosted and stored at about 8 V whereas the low potential is stored at 3 V.

As mentioned above, in accordance with this embodiment, the data line voltage amplitude during the operation of the sense amplifier is decreased so that the charging/discharging current of the data line can be decreased, thus reducing the power consumption. Further, a sufficiently large voltage is written into the memory cell through the plate so that the characteristics of data retention time and α ray soft error resistance can be improved. Moreover, one plate is commonly used for two word lines so that space is not required between the plates, thus reducing the memory chip size. Incidentally, in the case where one plate is commonly used for plural word lines, if the low potential of the data line is set at a higher level than the low potential of the word line by a plate voltage amplitude or more, the signal in the memory cell connected with the non-selected word line is never destroyed.

Figure 41A:
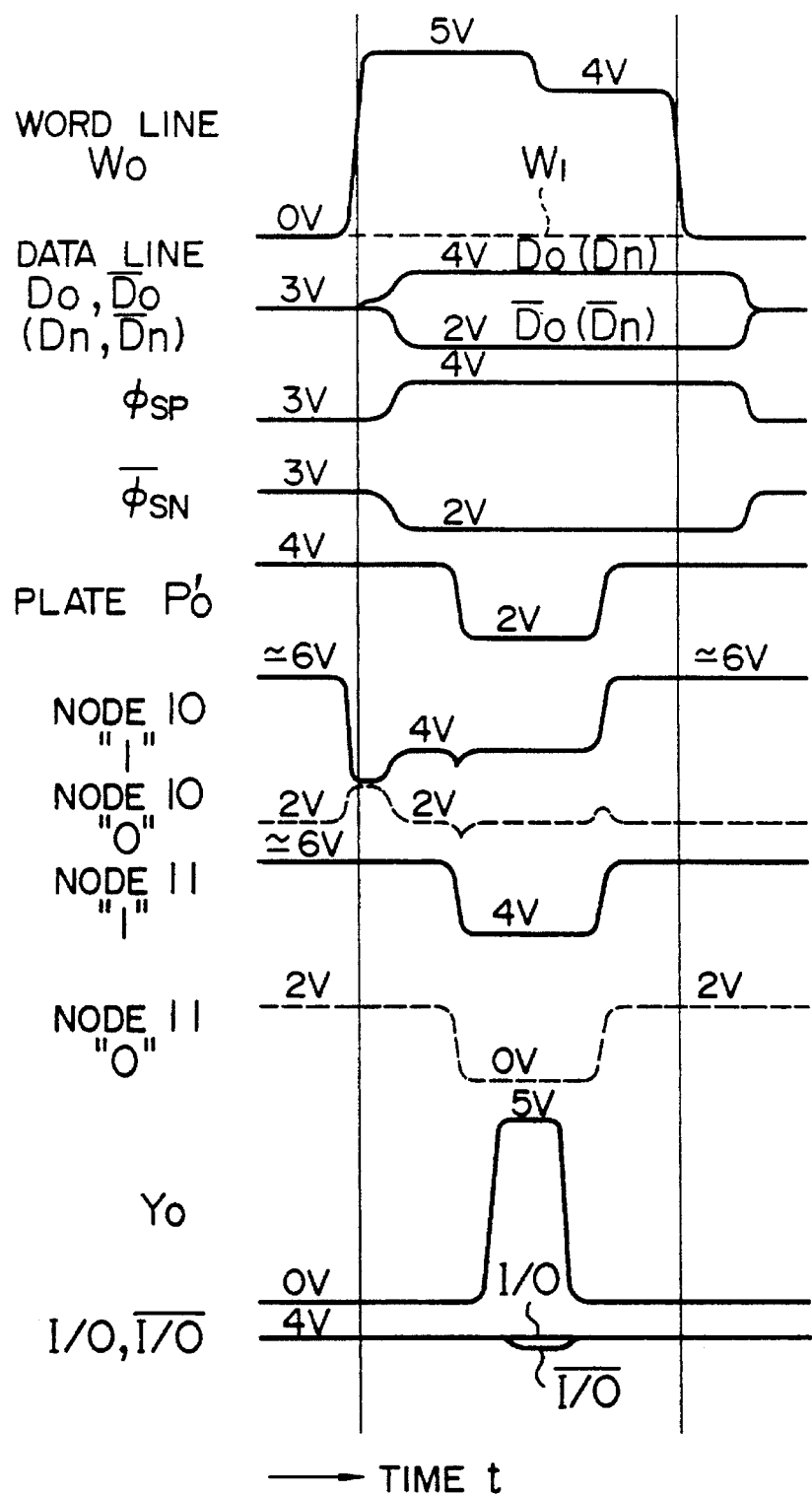
Figure 41B:
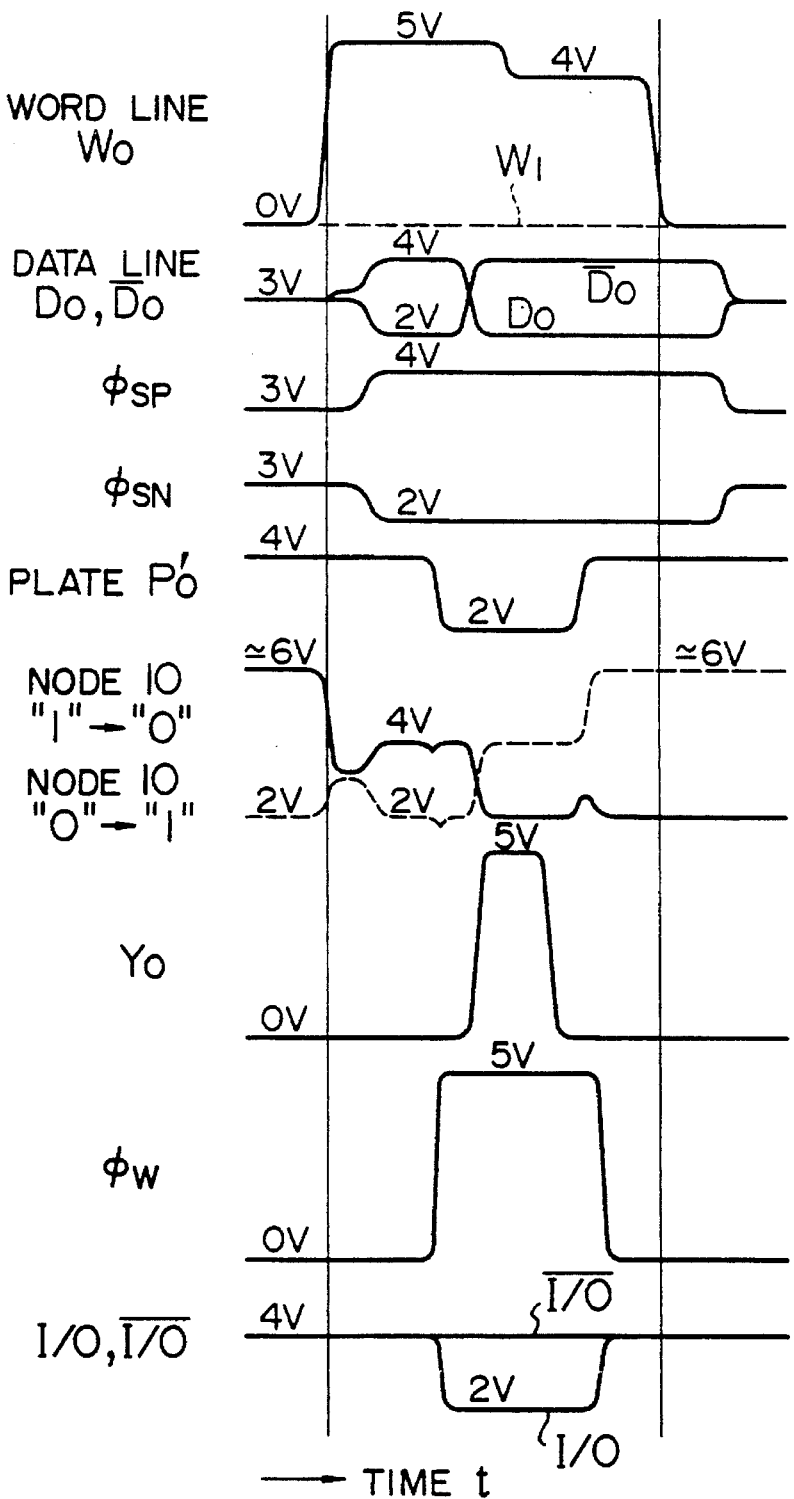

A still another embodiment of the present invention will be explained with reference to FIGS. 41A and 41B.

In this embodiment, the voltage amplitudes of both data line and plate are set at the same value. The other operation and circuit arrangement are the same as the embodiment shown in FIG. 40A. FIG. 41A shows the read operation of the memory and FIG. 41B shows the write operation thereof. In this embodiment, the voltage amplitudes of both data line and plate are set at the same value and the plate potential during the stand-by time of the memory is set at an intermediate value two storage potentials in the memory cell. Therefore, the voltage applied to the capacitor of the memory cell is the same in both cases where the potential of the signal to be stored in the memory cell is a high level and a low level, which can improve the reliability of the capacitor.

Figure 42:
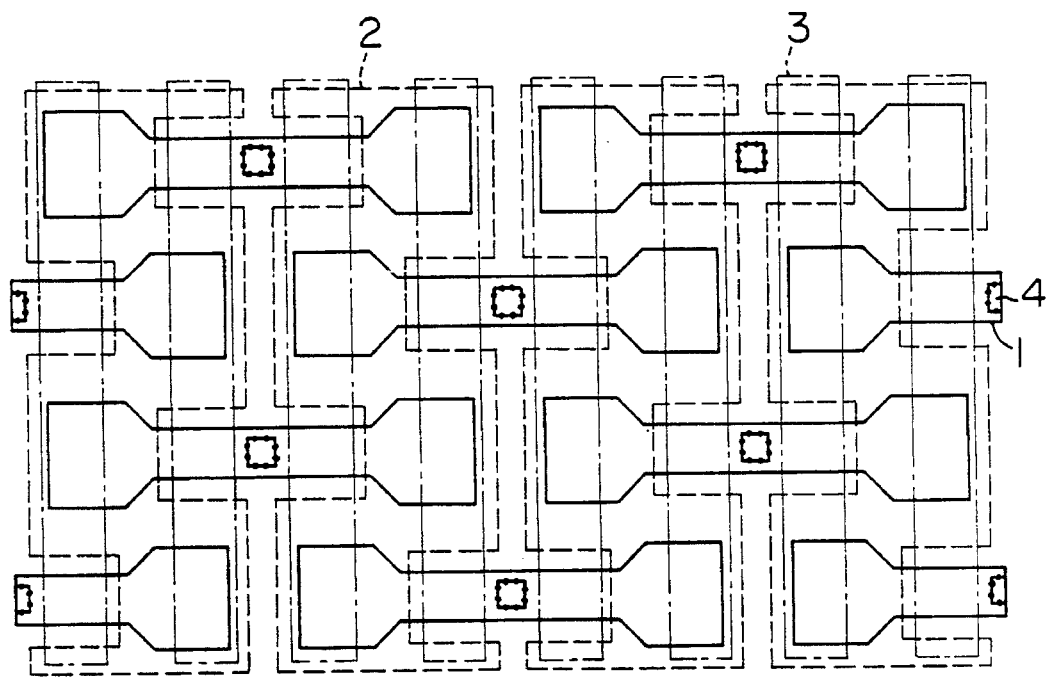

FIG. 42 shows an embodiment of the memory cell arrangement in the case where one plate in commonly provided for two word lines. In FIG. 42, numeral 1 is an n$^+$ diffused layer which serves as the source (drain) terminal of the transistor of a memory cell and is connected with a data line through a through-hole 4 (although the data line is not shown here for simplicity of the illustration, using an aluminium layer, it may be provided perpendicularly to a word line). Numeral 2 is a plate of a first poly-silicon layer which is commonly provided for two word lines as seen from FIG. 42. Numeral 3 is a word line of a second poly-silicon layer. By commonly providing one plate for two word lines in accordance with this embodiment, the number of spaces between the plates can be decreased, thus reducing the memory chip size.

Figure 43:
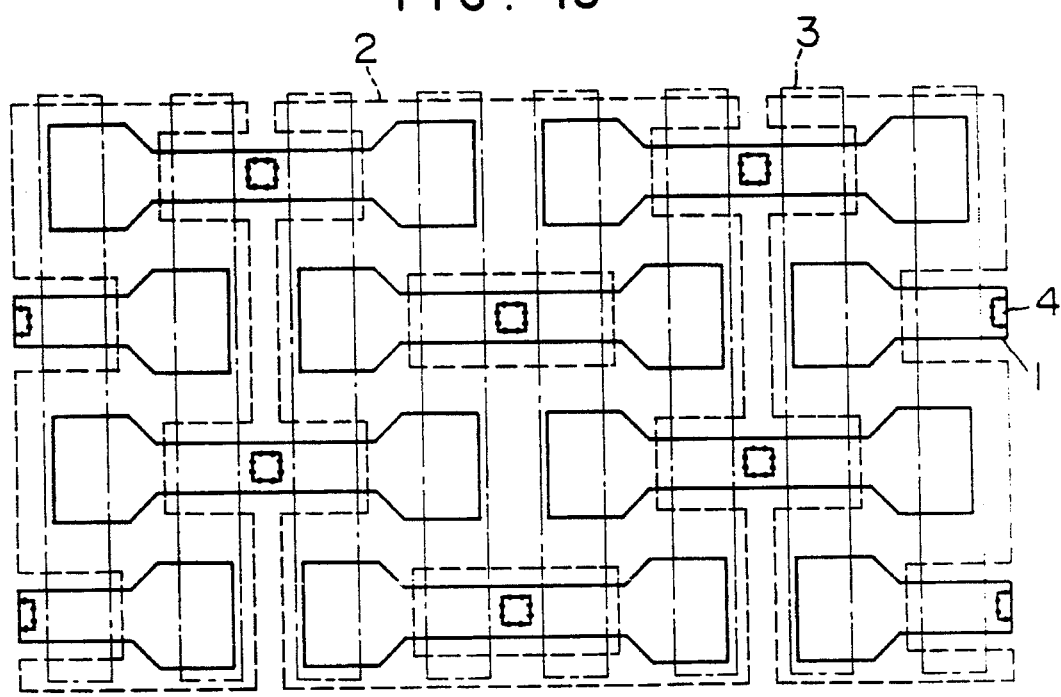

FIG. 43 shows an embodiment of the memory cell arrangement in the case where one plate is commonly provided for four word lines. In accordance with this embodiment, the number of spaces between the plates can be further decreased, thus further reducing the memory chip size. In FIG. 43, like reference numerals refer to like elements in FIG. 42.

Figure 44A:
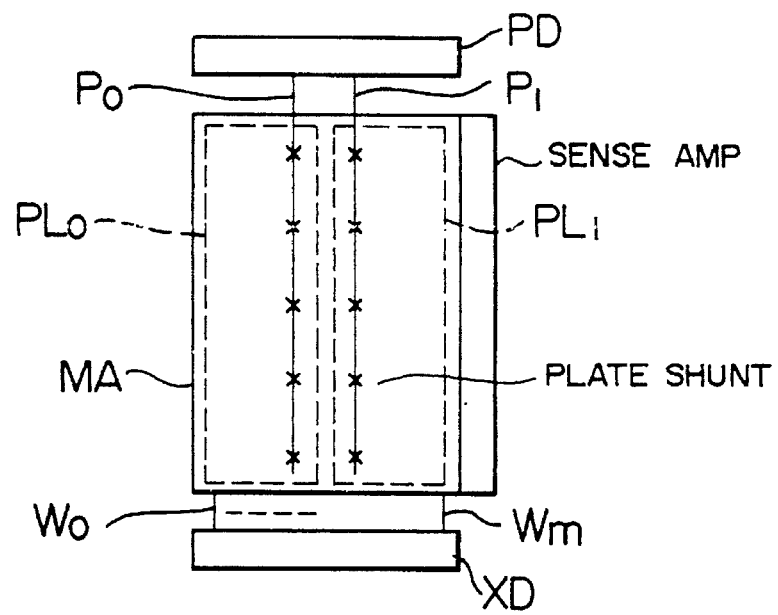
Figure 44B:
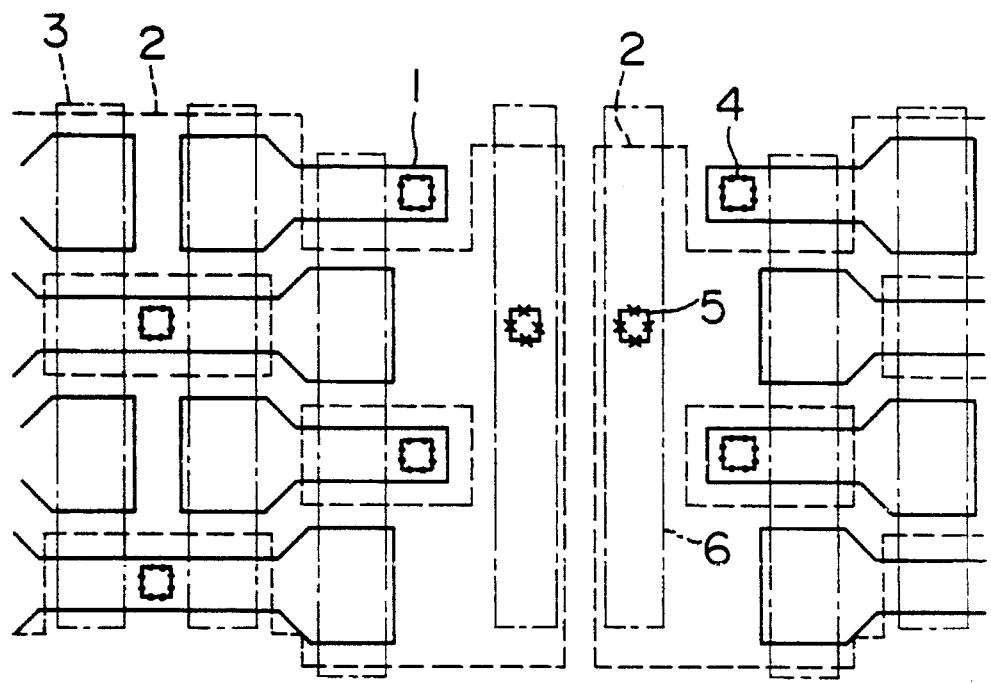

Meanwhile, it should be noted that in the embodiments mentioned above, the plate is made of a poly-silicon layer. The poly-silicon layer has a larger resistance than a metallic layer of e.g. aluminium so that the rising time and falling time in pulse-driving the plate are very long. This increases the operation cycle time of a memory and hence the use efficiency. In order to obviate such a disadvantage, it is proposed to shunt the plate by an aluminium (Al) wiring. This will be explained with reference to FIGS. 44A and 44B. In a memory array MA shown in FIG. 44A, the plate is divided into two plate sections PL1 and PL2, which are shunted by plate wirings P0 and P1 of Al layers, respectively. This shunting is made at the end portions of the plate section as shown in FIG. 44B. In FIG. 44B, numeral 2 is the plate section of a poly-silicon layer and numeral 6 is the plate wiring of an Al layer; they are connected with each other through a through-hole 5. In this way, shunting the plate of a poly-silicon layer by the plate wiring of an Al layer permits the driving speed for the plate to be increased.

FIG. 45 shows an embodiment of the memory cell arrangement in the case where a plate (wiring) is provided for each word line. In FIG. 45, numeral 1 is an n diffused layer which serves as the source (drain) terminal of the transistor of a memory cell and is connected with a data line through a through-hole 4 (although the data line is not shown here for simplicity of the illustration, using an aluminium layer, it may be provided perpendicularly to a word line as in the embodiments mentioned above). Numeral 2 is a plate of a first poly-silicon layer which is provided for each word line. Numeral 3 is a word line of a second poly-silicon layer.

Figure 45A:
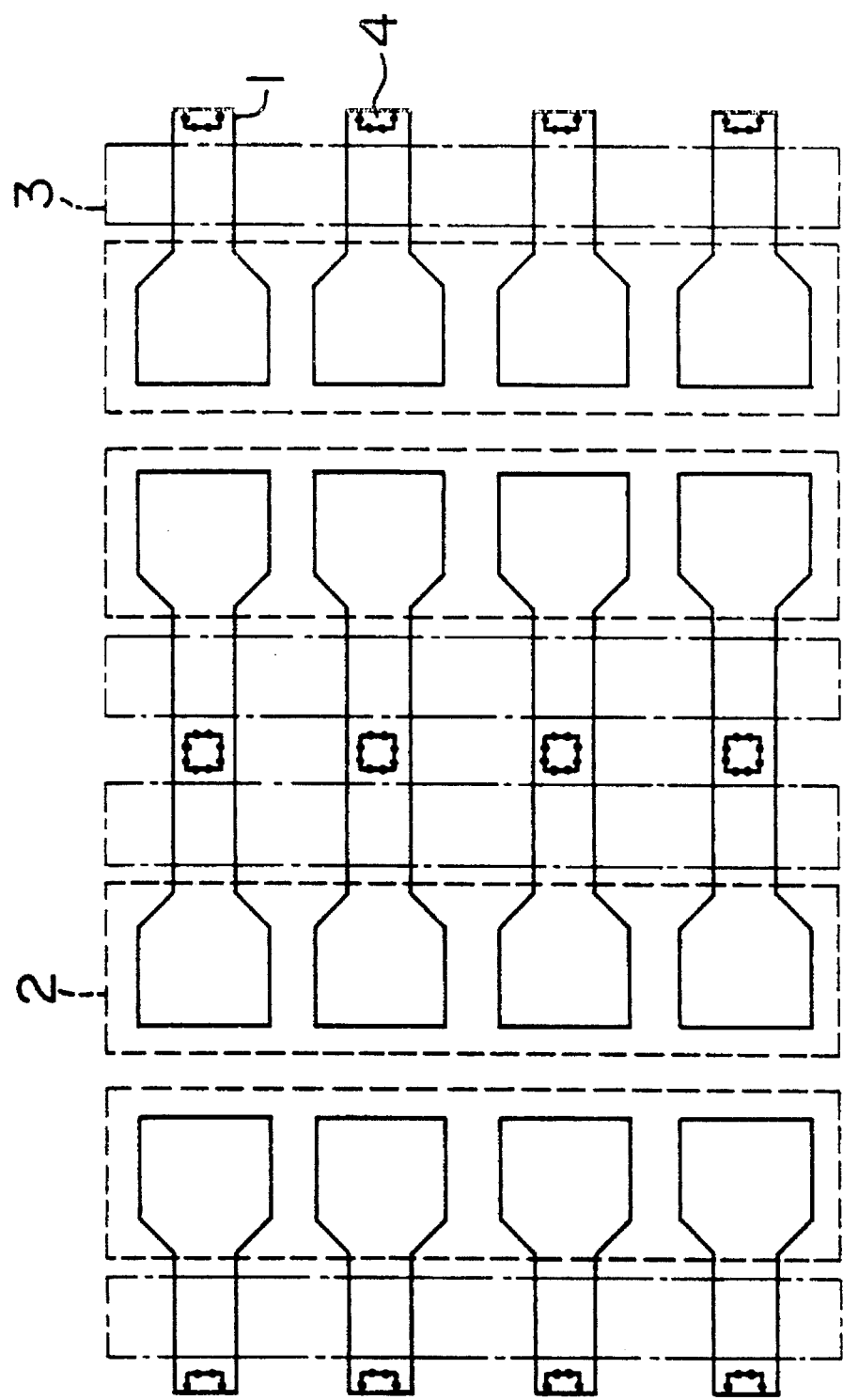
Figure 45B:
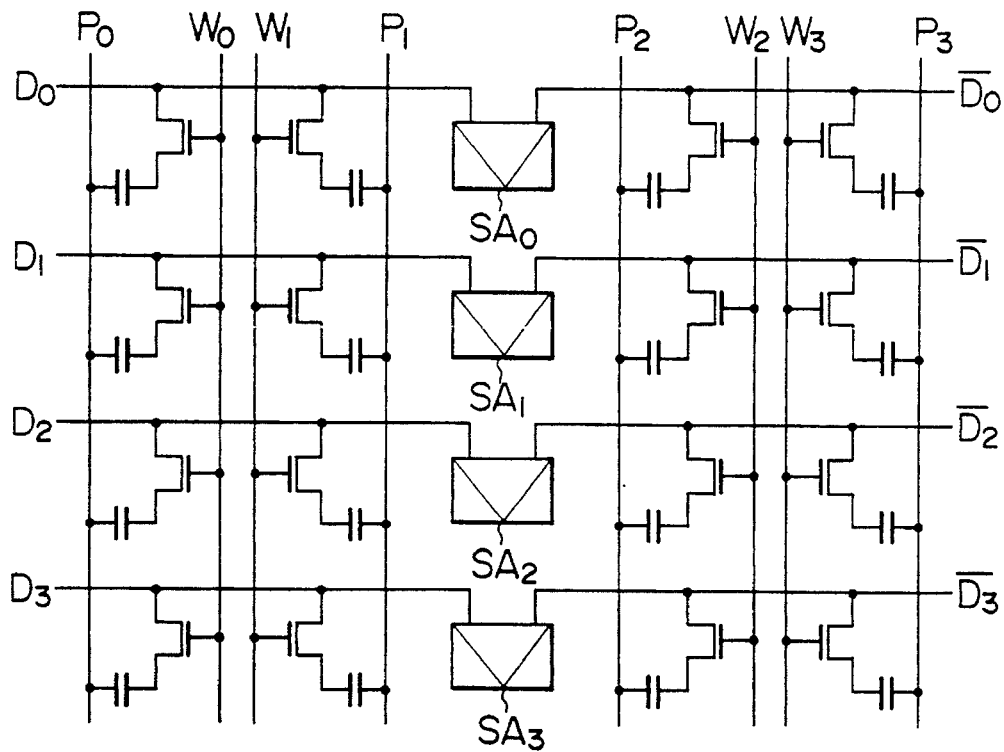
Figure 45C:
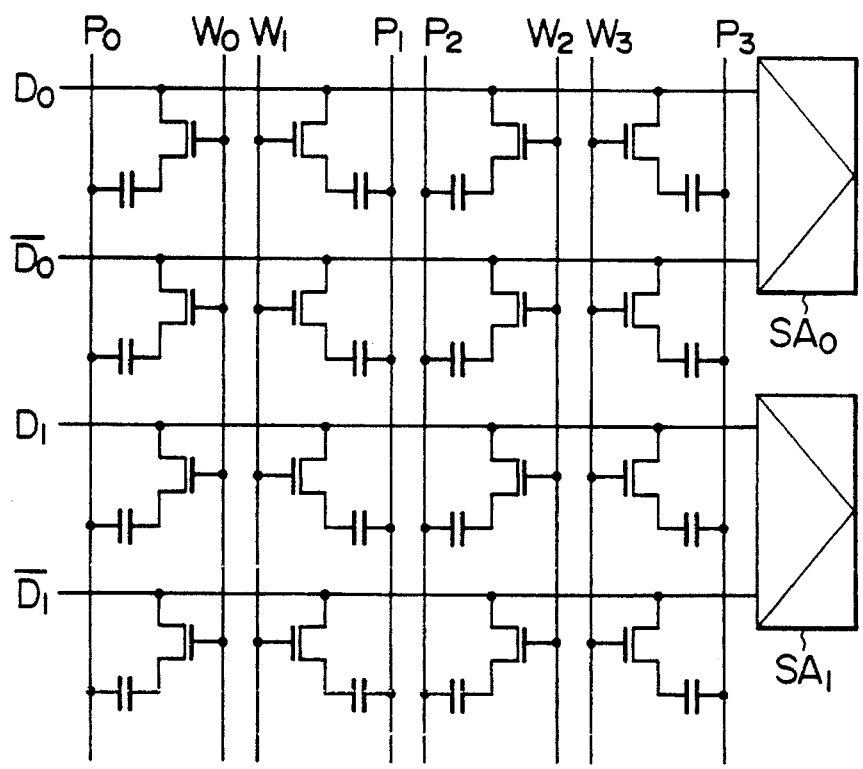

Two data line arrangements are proposed for the memory cell arrangement of FIG. 45A. One is an open-type data line (bit line) arrangement and the other is a two-cell/bit type data line arrangement. FIG. 45B shows the open-type data line arrangement in which neighboring data lines are connected with different sense amplifiers. FIG. 45C shows the two-cell/bit type data line arrangement in which neighboring data lines are connected with the same sense amplifier. In the latter arrangement, if one word line is selected, memory cells connected with the data lines to be a pair are selected. This means a one-bit two-cell memory cell array which provides memory cell signals, at the data lines, twice those in the one-bit one-cell memory cell array of FIG. 45B.

Figure 46:
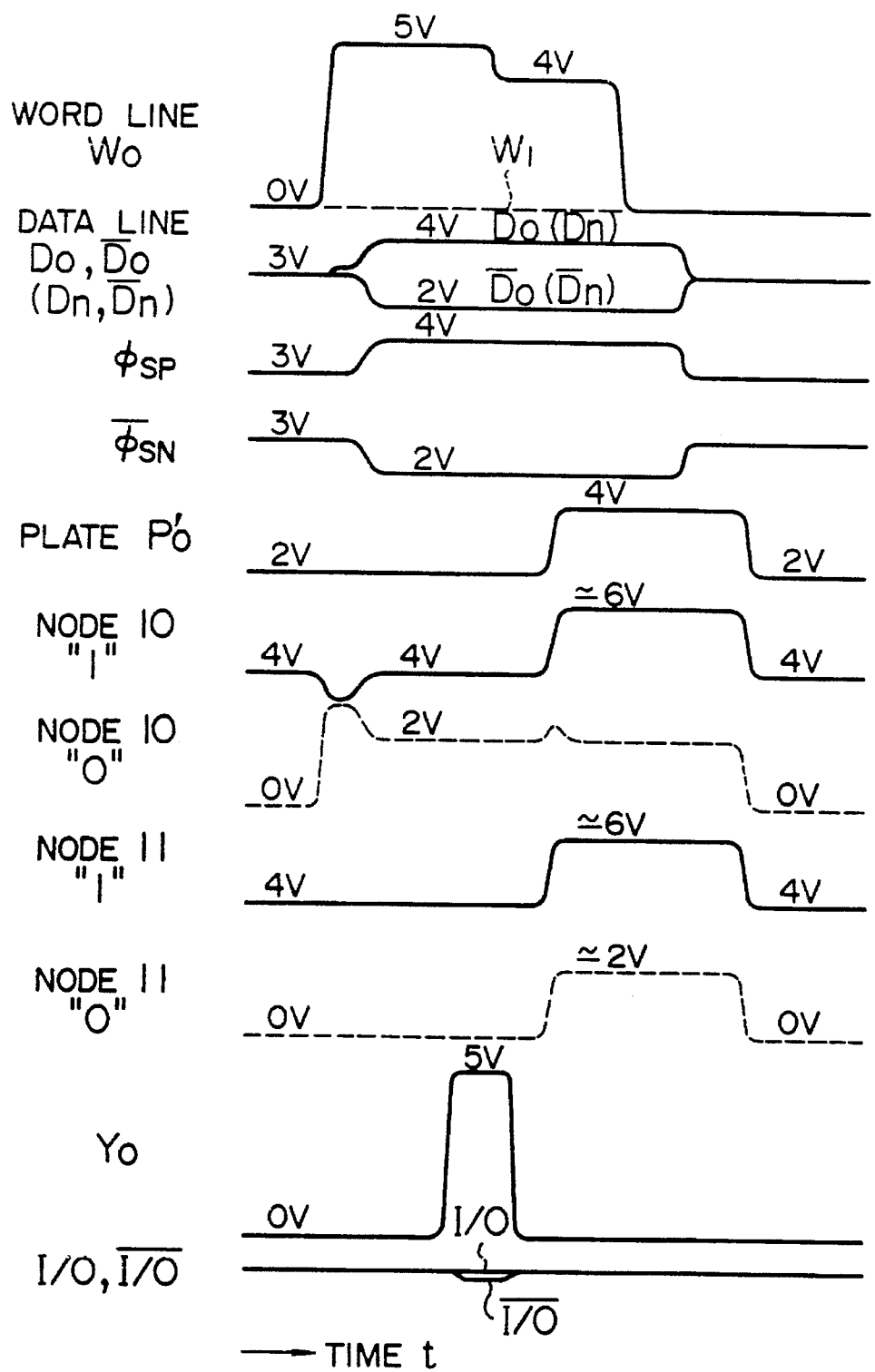

A further embodiment of the present invention will be explained with reference to FIG. 46. FIG. 46 shows the operation waveforms representing a plate driving system which is different from that in the memory circuit shown in FIG. 40A. In FIG. 46A, the read operation of an output signal Dout is the same as that in FIG. 41A but the rewrite operation is different from that in FIG. 41A.

The rewrite operation is performed as follows. After the sense amplifier has been operated, D0 is at a high potential of 4 V and $\overline{D0}$ is a low potential of 2 V. Then, the storage terminal 10 of the memory cell is at the high potential of 4 V like D0 (case where the terminal 10 is at a high potential in FIG. 46). Then, the potential at the plate P0 is changed from 5 V to 4 V. Then, assuming that the threshold voltage of a transistor constituting the memory cell is 1 V, both potentials of at the storage terminal 10 and on the data line D0 are 4 V so that the transistor T0 is in an OFF state. Therefore, when the potential on the plate P0' is changed from 2 V to 4 V, the potential at the storage terminal is enhanced from 4 V to about 6 V.

On the other hand, the rewrite operation in the case where a signal at a low potential has been stored in the memory is as follows. After the sense amplifier has been operated, both potentials on the data line D0 and at the storage terminal 10 are 2 V. Therefore, even if the potential on the word line W0 is subsequently lowered to 5 V, the transistor T0 constituting the memory cell is an ON state. Thus, even if the potential at the plate P0' is subsequently changed from 2 V to 4 V, the potential at the storage terminal 10 is held 2 V. Thereafter, after the word line W0 has become 0 V, the plate P' is changed from 4 V to 2 V. Thus, the potential at the storage terminal 10 is changed from about 6 V to 4 V when a high potential has been stored at the terminal, whereas it is changed from 2 V to 0 V when a low potential has been stored there. Accordingly, stored in the memory cell is 4 V on the high potential side and is 0 V on the low potential side.

Next, the behavior of a storage terminal 11 of the memory cells connected with a non-selected word line W1 will be explained. The operation in the case where a high potential has been stored at the storage terminal 11 is as follows. During the stand-by time of the memory, the plate P0 is at 2 V and the storage terminal 11 is at 4 V. After the sense amplifier has amplified the memory signal, P0' becomes 3 V and then the storage terminal becomes about 6 V. Then, the word line W1 becomes 0 V and the data line becomes 3 V or more so that a transistor T1 is never in the ON state and so the signal in the memory cell is not destroyed. Thereafter, the plate P0' becomes 2 V and the storage terminal 11 returns to 4 V.

The operation in the case where a low potential has been stored at the storage terminal 11 is as follows. During the stand-by time of the memory, the plate P0' is at 2 V and the storage terminal 11 is at 0 V. After the sense amplifier has amplified the memory signal, P0' becomes 4 V and then the storage terminal becomes about 2 V. Then, the word line W1 becomes 2 V and the data line becomes 2 V or more so that a transistor T1 is never in the ON state and so the signal in the memory cell is not destroyed. Thereafter, the plate P0' becomes 2 V and the storage terminal 11 returns to 0 V.

Also in accordance with this embodiment, the voltage amplitude of the data lines can be decreased so that reduced power consumption of a memory chip can be realized. Further, in this embodiment, the memory cell signal on the low potential side can be made larger than that on the high potential side.

Figure 47:
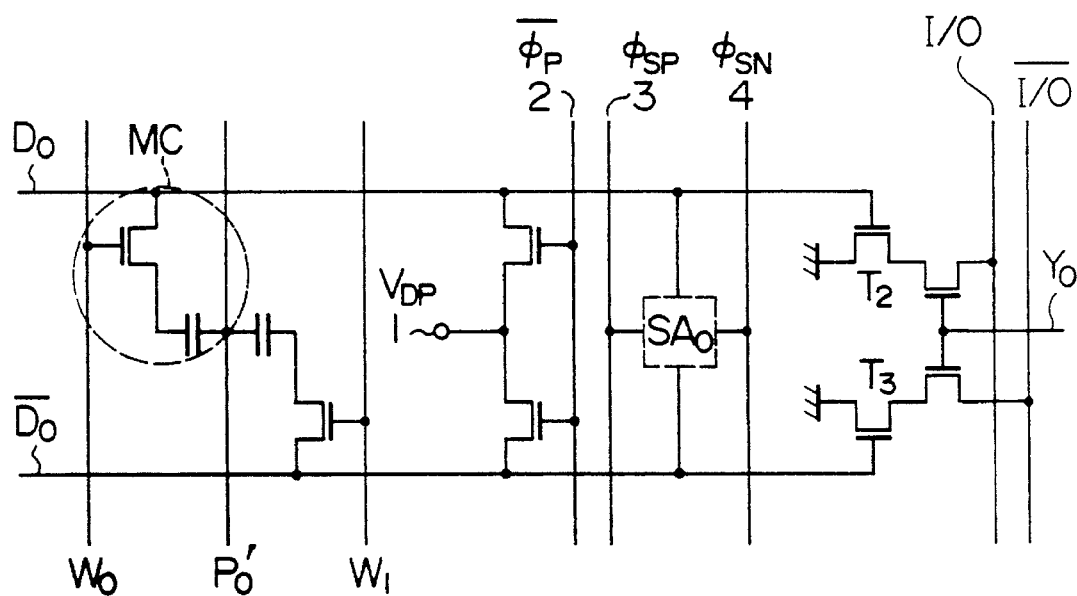

A further embodiment of the present invention will be explained. FIG. 47 shows the connection between the data lines and I/O lines in the memory circuit (the remaining circuit arrangement is the same as that of FIG. 40A). The circuit of FIG. 47 serves to receive the signals on data lines D0, $\overline{D0}$ by the gates of MOS-FETs T2 and T3 and conduct them as drain currents to data input/output lines I/O, $\overline{I/O}$. In order to increase the signals conducted to the data input/output lines, it is important to use T2 and T3 in the range of a large $g_m$. In the embodiment of FIG. 40A and 40B, the potential of the data line is set at a high level so that T2 and T3 are operated in the high $g_m$ range, thus increasing the signals conducted to the input/output lines. Thus, the memory operated with a raised potential of the data lines can realize its high S/N through the circuit of this embodiment.

Figure 48:
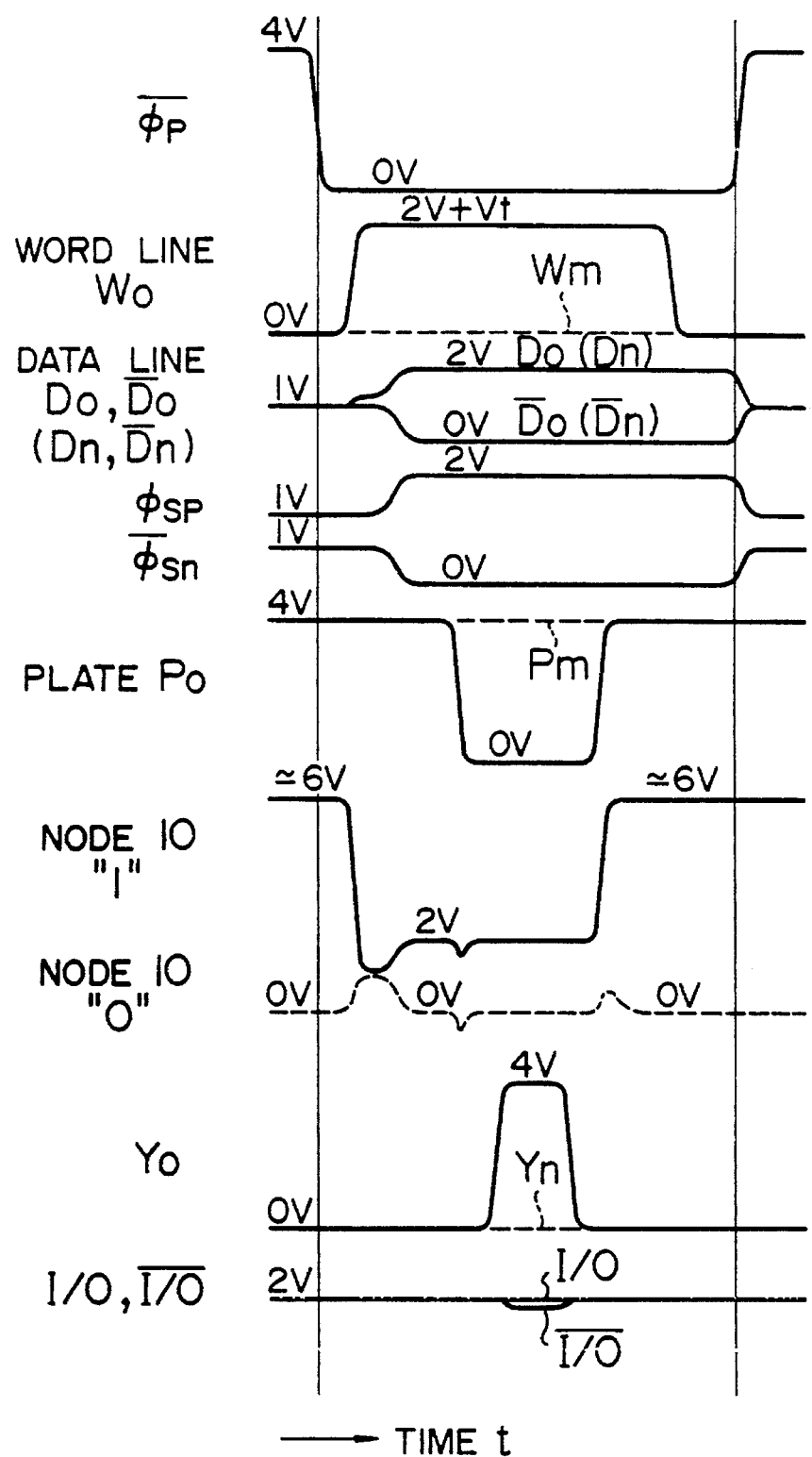

A further embodiment of the present invention will be explained with reference to FIG. 48. In this embodiment, the voltage of the data lines is binary. The other operation and circuit arrangement are the same as those of FIG. 37A. In operation, while a data line precharge signal $\overline{\phi_P}$ is 4 V, the data lines are precharged to 1 V. After p has beome 0 V, the word line W0 is raised to 2 V+Vt (Vt is the threshold voltage of MOS-FET). Thus, a memory cell signal is read out to the data lines. Next, the sense amplifier driving signal $\phi_{sp}$ varies from 1 V to 2 V and the sense amplifier signal $\overline{\phi_{SN}}$ varies from 1 V to 0 V, thus amplifying the memory signal read out. Now it is assumed that the signal at a high potential has been stored in the memory cells connected with the word line W0. Then, the data line D0 (Dn) becomes 2 V and the data line D0 (Dn) becomes 0 V. Also, the word line W0 is 2 V+Vt, the data line D0 is 2 V and the storage terminal 10 so that the transistor T0 constituting the memory cell connected with the data line D0 is turned off. Next, when the potential at the plate P0 is lowered from 4 V to 0 V, the potential at the terminal 10 is slightly lowered, thus turning on the transistor T0. The potential of 2 V at the terminal 10 is held in the sense amplifier. Thereafter, when the potential at the plate P0 is boosted from 0 V to 4 V, the transistor T0 is turned off, thus raising the potential at the terminal to about 6 V.

On the other hand, the operation in the case where a signal at a low potential has been stored in the memory cells is as follows (see the waveform in the case where the terminal 10 is at a low potential in FIG. 48). After the memory cell signal has been amplified by the sense amplifier, the data line D0 is at 0 V, the storage terminal 10 is at 0 V and the word line W0 is at 2 V+Vt so that the transistor T0 constituting the memory cell is turned on. Therefore, even when the potential at the plate P0 varies from 4 V to 0 V or from 0 V to 4 V, the potential at the terminal 10 is held 0 V.

After the signal has been stored in the memory cell in the above manner, the word line becomes 0 V. Subsequently, $\phi_p$ becomes 4 V and $\phi_{sp}$ and $\overline{\phi_{SN}}$ become 1 V, thus precharging the data lines to 1 V.

As mentioned above, in accordance with this embodiment, the same operation as the embodiment of FIG. 37A can be performed even when the word voltage is binary. This simplifies the control circuit and so makes easy the designing thereof.

Meanwhile, in the memory in accordance with the present invention, as understood from the embodiment shown in FIGS. 37A and 37B, the voltage in a memory cell is larger on the high potential signal side than on the low potential signal side. For example, assuming that the voltage amplitude of a data line is $V_d$ and that of a plate is $V_p$, the voltage stored in the memory cell is $½ V_d + V_p$ on the high potential signal side and $½ V_d$ on the low potential side. Therefore, if the memory cell signal is read to the data lines with the potential on the word line being high, the low potential signal is too small so that sufficient noise margin may not assured. In order to obviate such a disadvantage, it is proposed to increase the low potential signal using capacitive coupling as explained with reference to FIGS. 47A and 47B.

Figure 49A:
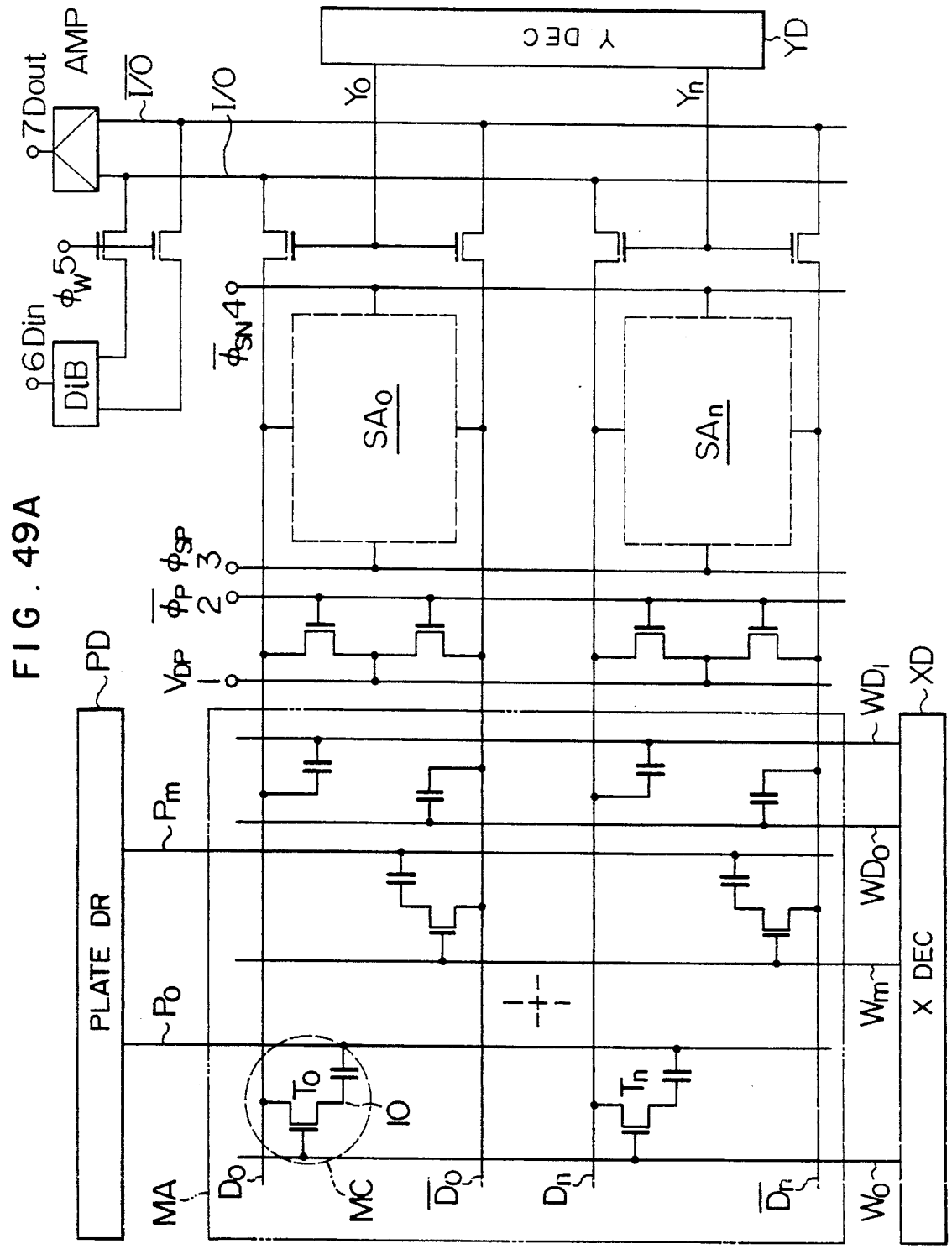
Figure 49B:
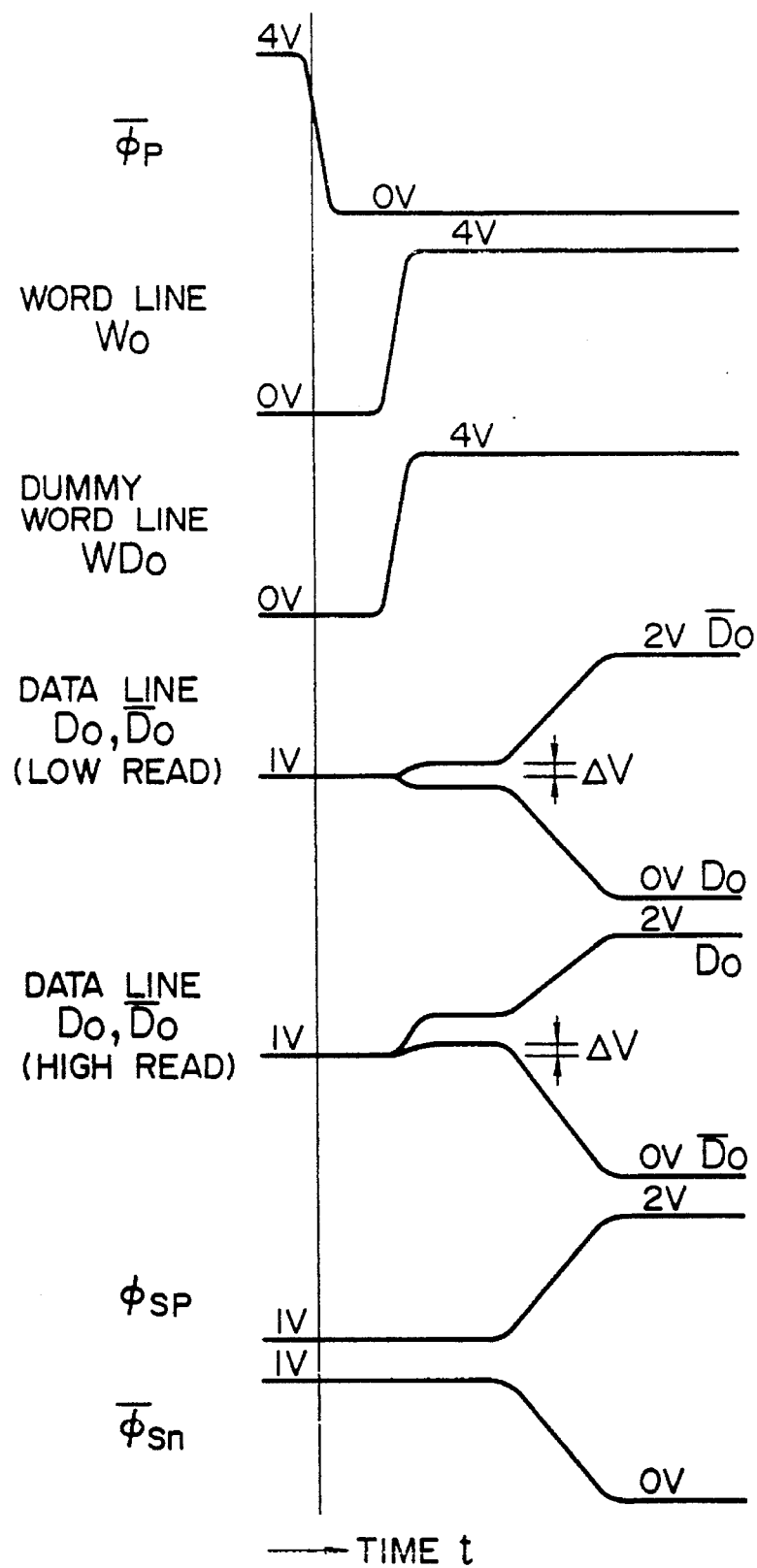

The embodiment shown in FIG. 49A is different from the embodiment shown in FIG. 37A only in that dummy word lines WD0, WD1 are provided and a capacitor is provided between each of the dummy word lines and each of the data lines. Other circuit constitution and operation are the same as those of the embodiment shown in FIG. 37A. The read operation of a memory cell signal in the circuit of FIG. 49A will be explained with reference to the operation waveform shown in FIG. 49B, in which the voltage waveforms on the data line in reading both low potential and high potential are illustrated. The low potential read is performed as follows. When a selected word line W0 is boosted to a high potential of 4 V, the memory cell signal appearing on the data line D0 is slightly lower than the precharge voltage of 1 V. Then, a dummy word line WD0 is boosted from a low potential of 1 V to a high potential of 4 V. This potential change is conducted to the data line D0 through the capacitor. Thus, the potential on the data line becomes higher than the precharge voltage of 1 V by $\Delta V$. In this way, the signal voltage in reading the low potential is increased so that sufficiently large noise margin can be assured. Incidentally, the value of $\Delta V$ can be set at an optional value by adjusting the capacitance of the capacitor and the voltage amplitude of the dummy word line, thus making it easy to control the noise margin. On the other hand, if a high potential has been stored in the memory cell, the read memory cell signal is reduced by $\Delta V$. However, this signal is originally high so that this reduction of $\Delta V$ does not W$_m$ is selected, a dummy word line WD1 is boosted from completely eliminate. Incidentally, when a word line the low potential to the high potential.

Figure 50A:
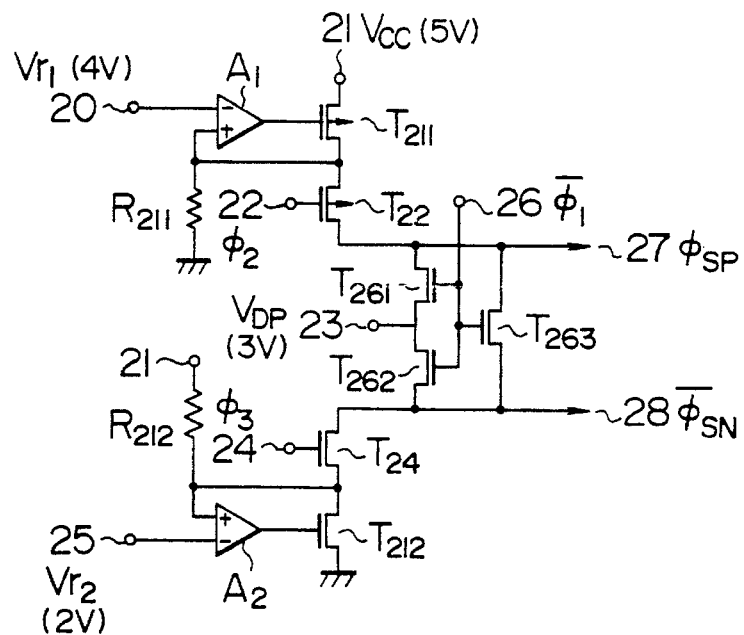
Figure 50B:
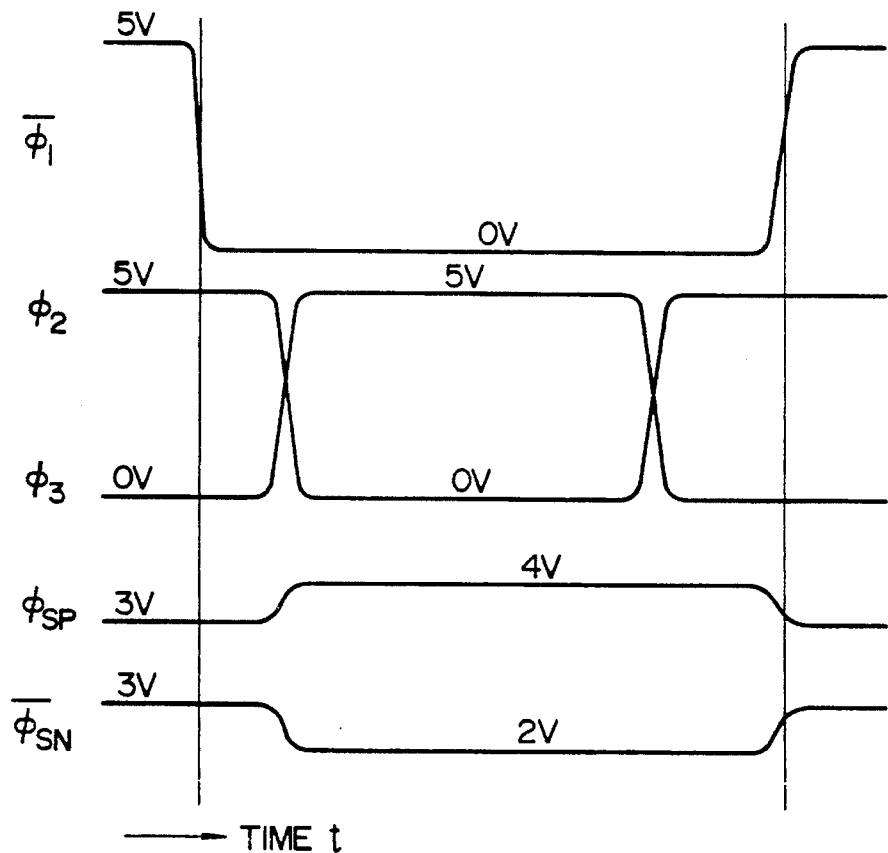

FIG. 50A shows an exemplary circuit for generating sense amplifier driving signals $\phi_{sp}$ and $\overline{\phi_{SN}}$. In FIG. 50A, A1 is a differential amplifier circuit which decides the high potential level of $\phi_{sp}$ together with a transistor T211 and resistors R211 and Vr1. A2 is also a differential amplifier circuit which decides the low potential level of $\overline{\phi_{SN}}$ together with a transistor T212 and resistors R212 and Vr2. The operation of the circuit of FIG. 50B will be explained with reference to the operation waveform shown in FIG. 50. While $\overline{\phi_1}$ is 5 V, transistors T261, T262 and T263 are in the ON state thereby to place $\phi_{sp}$ and $\overline{\phi_{SN}}$ at 3 V. Then, $\phi_2$ is 5 V and $\phi_3$ is 0 V so that transistors T22 and T24 are in the OFF state. After $\overline{\phi_1}$ has become 0 V, $\phi_2$ becomes 0 V and $\phi_3$ becomes 5 V. Thus, $\phi_{sp}$ becomes 4 V which is the same potential as that at the resistor Vr1 and $\overline{\phi_{SN}}$ becomes 2 V which is the same potential as that at the resistor Vr2. Thereafter, $\phi_2$ becomes 5 V and $\phi_3$ becomes 0 V so that the transistors T22 and T24 are turned off. Next, $\overline{\phi_1}$ becomes 5 V so that the transistors T261, T262 and T263 are turned on thereby to place $\phi_{sp}$ and $\overline{\phi_{SN}}$ at 3 V.

As understood from the above description, in accordance with the circuit shown in FIG. 50A, the high potential level of $\phi_{sp}$ and the low potential level of $\overline{\phi_{SN}}$ can be optionally decided.

Figure 51A:
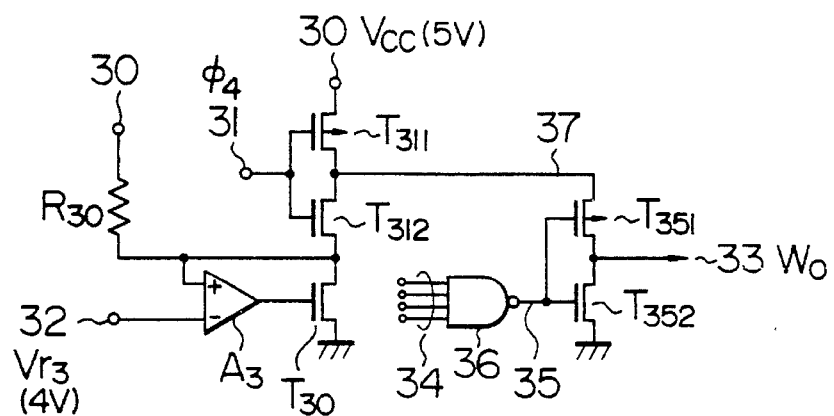
Figure 51B:
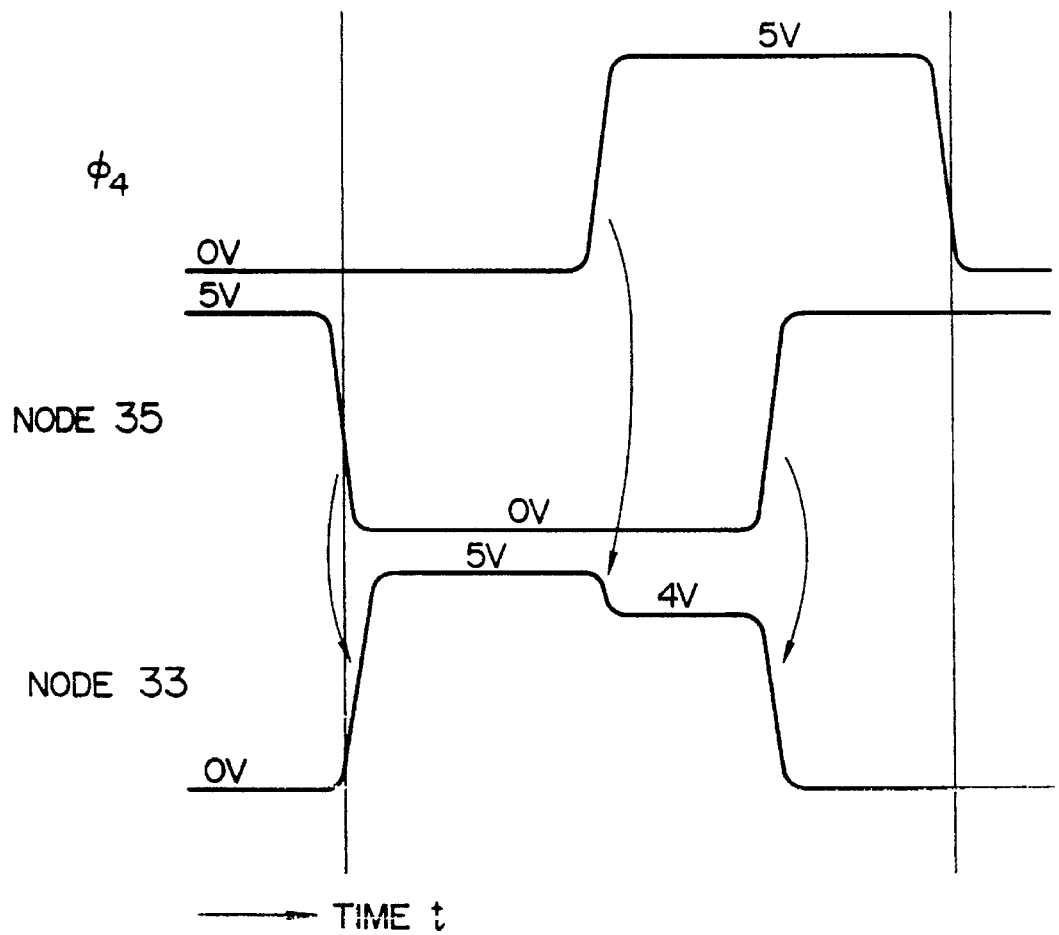

FIG. 51A shows an exemplary circuit for generating a word line voltage. In FIG. 51A, numeral 33 is a word line; numeral 36 is an X decoder; and numeral 34 is an address signal line. A3 is a differential amplifier circuit which serves to decide the intermediate potential level of a word line voltage together with a transistor T30 and resistors R30 and Vr3. The operation of the circuit of FIG. 51A will be explained with reference to the operation waveform shown in FIG. 51B. During the stand-by time of a memory, an output terminal (node) 35 is at a high potential level of 5 V. Then, a signal $\phi_4$ is at a low potential level of 0 V. Therefore, transistors T311 and T352 are in the ON state while transistors T312 and T351 are OFF state. Thus, the voltage of the word line W0 becomes 0 V. When the word line is selected, the potential of the terminal 35 becomes 0 V. Then, the transistor T351 is turned on and the transistor T352 is turned off so that the voltage of the word line is boosted to 5 V. Next, when $\phi_4$ has becomes 5 V, the transistor T311 is turned off and the transistor T312 is turned on so that the voltage of the word line becomes 4 V like the resistor Vr3. Thereafter, when the potential at the terminal 35 has become 5 V, the voltage of the word line becomes 0 V.

In this way, three value levels of the word line voltage can be provided by means of the circuit as shown in FIG. 51A.

Figure 52A:
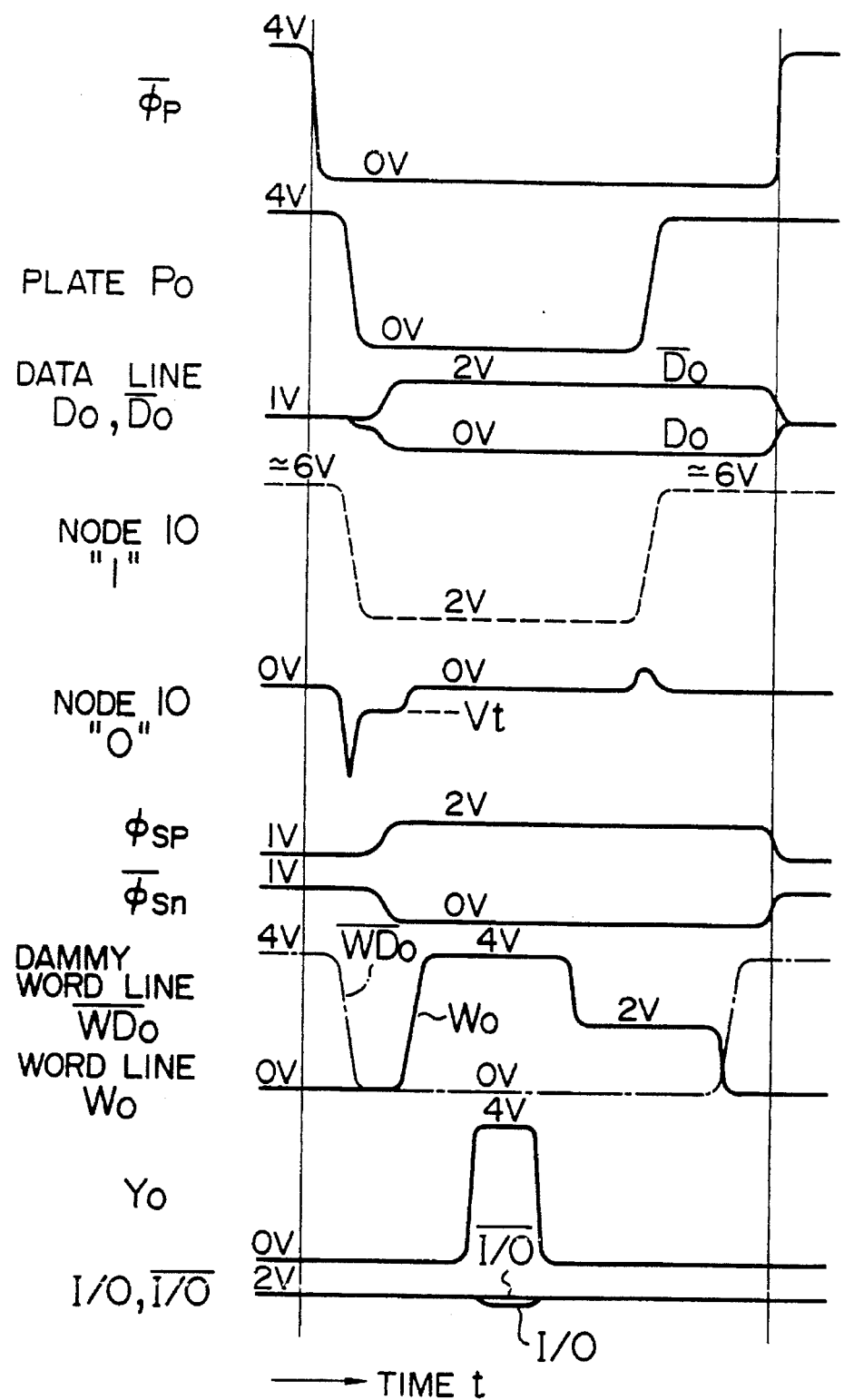

An embodiment of another read operation for the circuit shown in FIG. 37A will be explained with reference to the operation waveforms as shown in FIG. 52A in which only one example of the voltage of each of the operation waveforms is illustrated for convenience of explanation.

While the data precharge signal $\overline{\phi_D}$ is 4 V, the data lines D0, $\overline{D0}$ (Dn, $\overline{Dn}$) are at a precharge potential level of 1 V. Then, the sense amplifier driving signals $\phi_{sp}$ and $\overline{\phi_{SN}}$, are 1 V and the sense amplifiers SA0 to SAn are in the OFF state. It is assumed that after $\overline{\phi_p}$ has become 0 V, a plate (wiring) P0 is selected from a plural plate wirings. When P0 varies from 4 V to 0 V, a memory cell signal appears on each data line. Now it is assumed that a signal at a low potential of 0 V has been stored in the memory cell connected with the data line D0. When P0 varies from 4 V to 0 V, 0 V in the memory cell is reduced toward −4 V. Then, since the word line W0 is at 0 V, if the reduction amount exceeds the threshold voltage of the MOS-FET T0, the storage terminal (node) 10 of the memory cell is communicated with the data line D0. Thus, a current flows from the data line D0 to the memory cell so that the memory cell signal appears on the data line D0. Then, a dummy word line $\overline{WD0}$ varies from 4 V to 0 V. Thus, a reference signal appears on the data line $\overline{D0}$. Incidentally, in the case where a signal at a high potential of 6 V has been stored at the storage terminal 10, the potential at the terminal is 2 V in accordance with the voltage change of P0. In this case, the potential on the data line D0 does not vary since the MOS-FET T0 constituting the memory cell in the OFF state.

After the memory cell signal and the reference signal have appeared on the data lines D0 (Dn) and $\overline{D0}$ ($\overline{Dn}$), respectively, $\phi_{SP}$ varies from 1 V to 2 V and $\overline{\phi_{SN}}$ varies from 1 V to 0 V. Thus, sense amplifiers SA0 to SAn operate to amplify the corresponding memory cell signals. Therefore, the data line D0 becomes 0 V and the data line $\overline{D0}$ becomes 2 V. Thereafter, when the word line W0 varies from 0 V to 4 V, 0 V (2 V in the case of reading the high potential) is stored in the memory cell. Next, a pair of data lines are selected by the Y decoder YD. Now it is assumed that the data lines D0, $\overline{D0}$ are selected. Thus, the potential on the data line selection line Y0 becomes 4 V and the memory cell signal is read out to data input/output lines I/O and $\overline{I/O}$. This signal is amplified by the output amplifier AMP to provide an output signal Dout. Next, the word line W0 is lowered from 4 V to 2 V. Thereafter, the plate P0 is boosted from 0 V to 4 V. Then, since the low potential of 0 V has been stored in the memory cell, the transistor T0 constituting the memory cell is in the ON state. Therefore, the voltage of 0 V in the memory does not vary. Incidentally, in the case where the high potential of 2 V has been stored in the memory cell, the transistor T0 is in the OFF state. Therefore, 2 V in the memory cell is boosted to 6 V. Thereafter, the word line W0 becomes 0 V thereby to complete the rewrite operation mentioned above. Also the dummy word line $\overline{WD0}$ varies from 0 V to 4 V. Thereafter, $\phi_{SP}$ and $\overline{\phi_{SN}}$ become 1 V and $\overline{\phi_p}$ becomes 4 V thereby to precharge the data lines to 1 V.

Figure 52B:
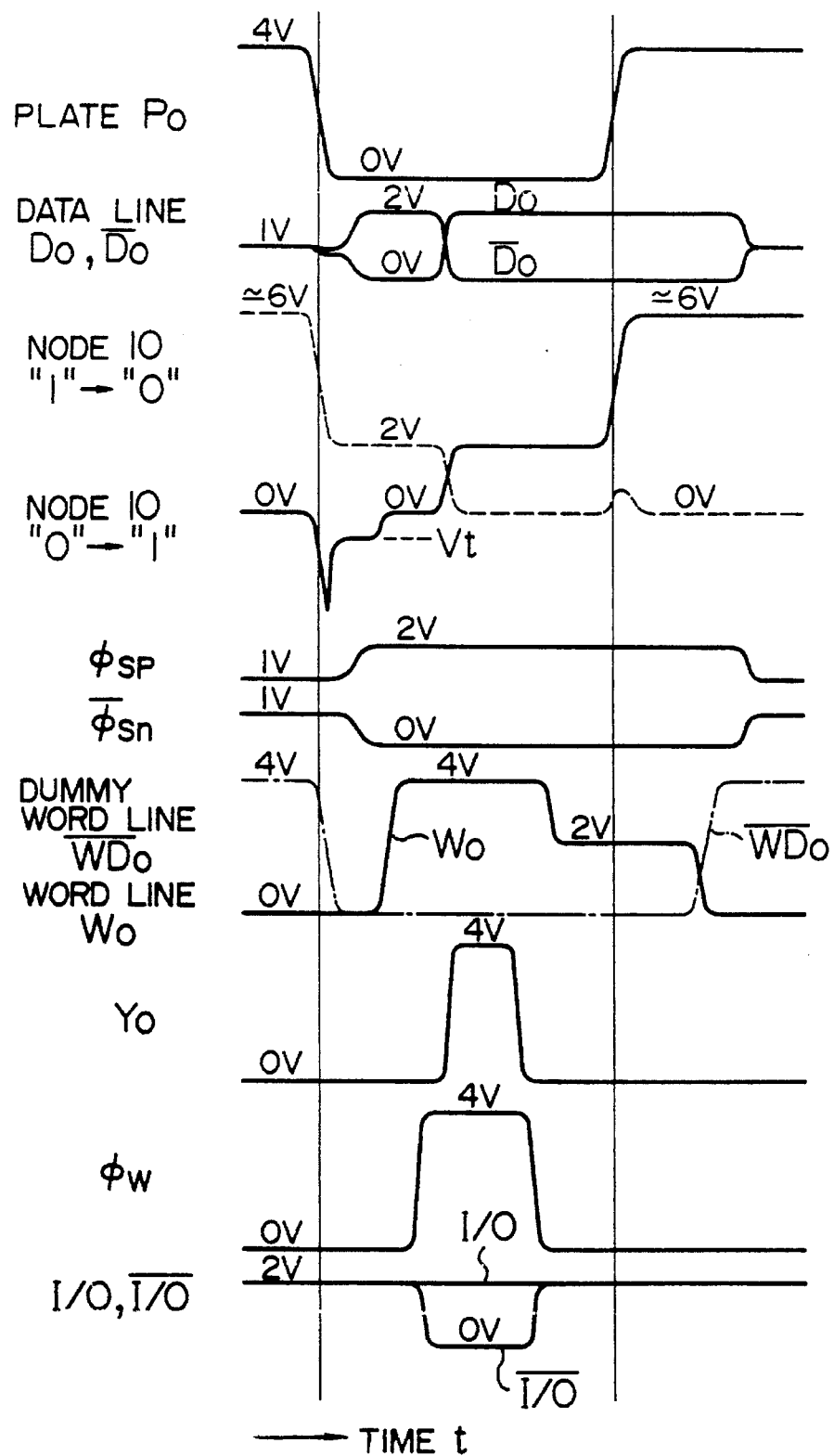

The write operation will be explained with reference to the waveform chart of FIG. 52B. After memory cell signals have been amplified by the sense amplifiers as in the read operation, a write signal Din is fetched into a data input buffer DiB. When a write control signal becomes 4 V, the potentials on the input/output lines I/O and $\overline{I/O}$ are separated into a high potential and a low potential in accordance with Din. It is now assumed that I/O and $\overline{I/O}$ have become 2 V and 0 V, respectively. Thereafter, a pair of data lines are selected by the Y decoder YD. It is now assumed that D0 and $\overline{D0}$ have been selected. Thus, the potential on the data line selection line Y0 becomes 4 V so that D0 and $\overline{D0}$ become 2 V and 0 V, respectively. Accordingly, a high potential of 2 V is written at the storage terminal 10 of the memory cell (see the waveform in the case where the terminal 10 is at a low potential). On the other hand, the operation of writing a high potential signal in the memory in which a low potential signal has been stored in the memory is as follows. After the sense amplifier has been operated, the potentials on D0 and $\overline{D0}$ are 2 V and 0 V, respectively. The potentials on I/O and $\overline{I/O}$ are 0 V and 2 V, respectively, in accordance with Din. Thereafter, the potential on Y0 is enhanced to 4 V so that the potentials on D0 and $\overline{D0}$ are 0 V and 2 V. Accordingly, the low potential of 0 V is written at the storage terminal of the memory cell (see the waveform in the case where the terminal 10 is at a high potential).

The operation after the signal has been written in the memory cell in the above manner is the same as the read operation as previously mentioned. Namely, the high potential signal in the memory cell is boosted and stored at about 6 V whereas the low potential is stored at 0 V.

As explained above, in accordance with this embodiment, the voltage amplitude of the data lines and that of the voltage to be written into the memory cells can be determined independently from each other. Therefore, the voltage amplitude of the data lines (voltage amplitude when the sense amplifiers operate), which affects the power consumption of the memory, can be decreased, and also the voltage amplitude of the plates, which decides the high potential level of the memory cells relative to the data retention time for the memory cell, is increased. In this embodiment, the voltage amplitude of the plate is set to be larger than the that of the data lines. In this way, the power consumption can be remarkably reduced while assuring a sufficient signal voltage for the memory cells. Therefore, reduced power consumption and high S/N can be simultaneously realized. Further, in this embodiment, the potential on the data lines during its precharge is set at an intermediate value between the high and low potentials of the voltage amplitude of the data lines. This permits the power consumption to be further reduced. Moreover, the voltage amplitude of the data line can be decreased to the neighborhood of a sum of the absolute values of the threshold voltages of the N channel MOS-FET and P channel MOS-FET. Since the threshold voltage is generally 0.5 V to 1 V, the charging/discharging current in the case of the data line voltage amplitude of 2 V can be decreased to $\frac{1}{2.5}$ in the case of that of 5 V. Further, in this embodiment, the memory cell signal is read by reducing the potential on the plate P0 from a high potential of 4 V to a low potential of 0 V. In the case where a signal line is driven using a MOS-FET, the discharging operation is performed at a higher speed than the charging operation. Therefore, the read operation in this embodiment can be performed at a higher speed than the read operation by boosting the word line from a low potential to a high potential.

Figure 53A:
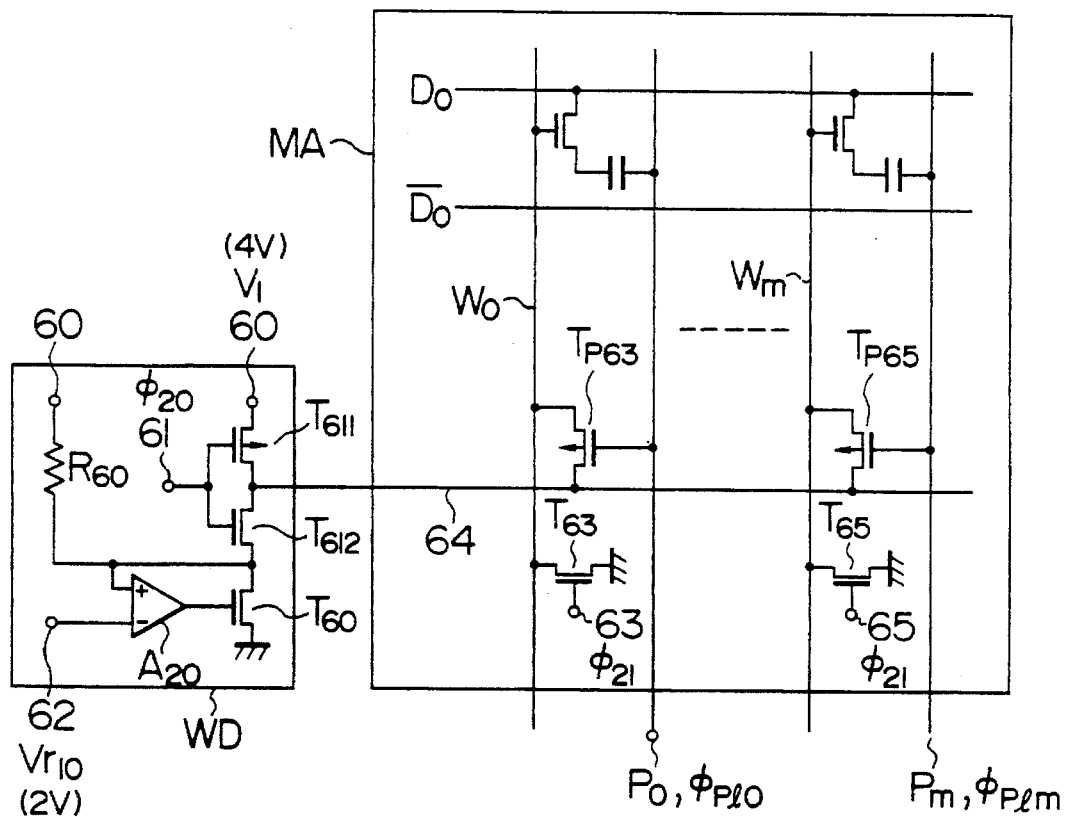
Figure 53B:
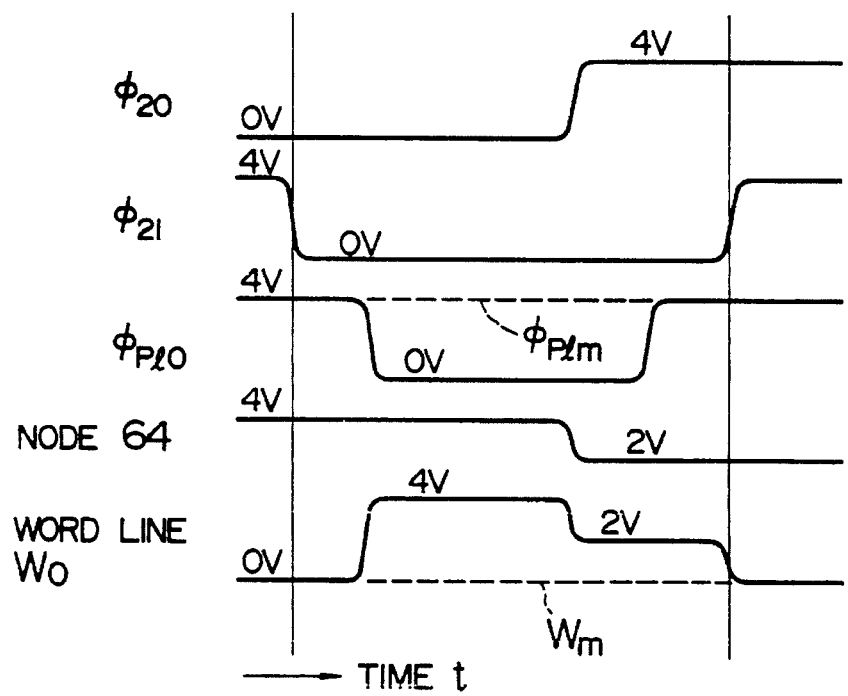

FIGS. 53A and 53B show an embodiment of the word line driving circuit in accordance with the present invention. In FIG. 53A, MA is a memory cell array; D0, $\overline{D0}$ is a data line; W0, Wm is a word line; and P0, Pm is a plate. WD is a word line intermediate potential setting circuit which serves to set an intermediate value of the word line together with a differential amplifier A20, a transistor T60, a resistor R60 and a reference voltage Vr10.

The operation of the circuit of FIG. 53A will be explained with reference to the waveform chart of FIG. 53B. During the stand-by time of a memory, a signal $\phi_{20}$ is 0 V, a signal $\phi_{21}$ is 4 V and plate driving signals $\phi_{p10}$ and $\phi_{p1m}$ are 4 V. Therefore, transistors T611, T63 and T65 are in the ON state while transistors T612, Tp63 and Tp65 are in the OFF state. Then, the word line W0, Wm is 0 V and a terminal 64 is 4 V. Thereafter, the signal $\phi_{21}$ becomes 0 V so that the transistors T63 and T65 are turned OFF. Next when the signal $\phi_{P10}$ becomes 0 V, the transistor Tp63 is turned ON so that the word line W0 becomes 4 V. When the signal $\phi_{20}$ becomes 4 V, the transistor T611 is turned OFF and the transistor T612 is turned ON. Thus, the terminal 64 and the word line W0 become 2 V. Thereafter, when $\phi_{p10}$ becomes 4 V and further $\phi_{21}$ becomes 4 V, the word line W0 becomes 0 V.

In accordance with this embodiment, the word line can be selected by selecting the plate so that a selection circuit for the word line is not required. Also, since the plate and the word line can be substantially, simultaneously selected, the high speed of a memory can be realized.

Figure 54A:
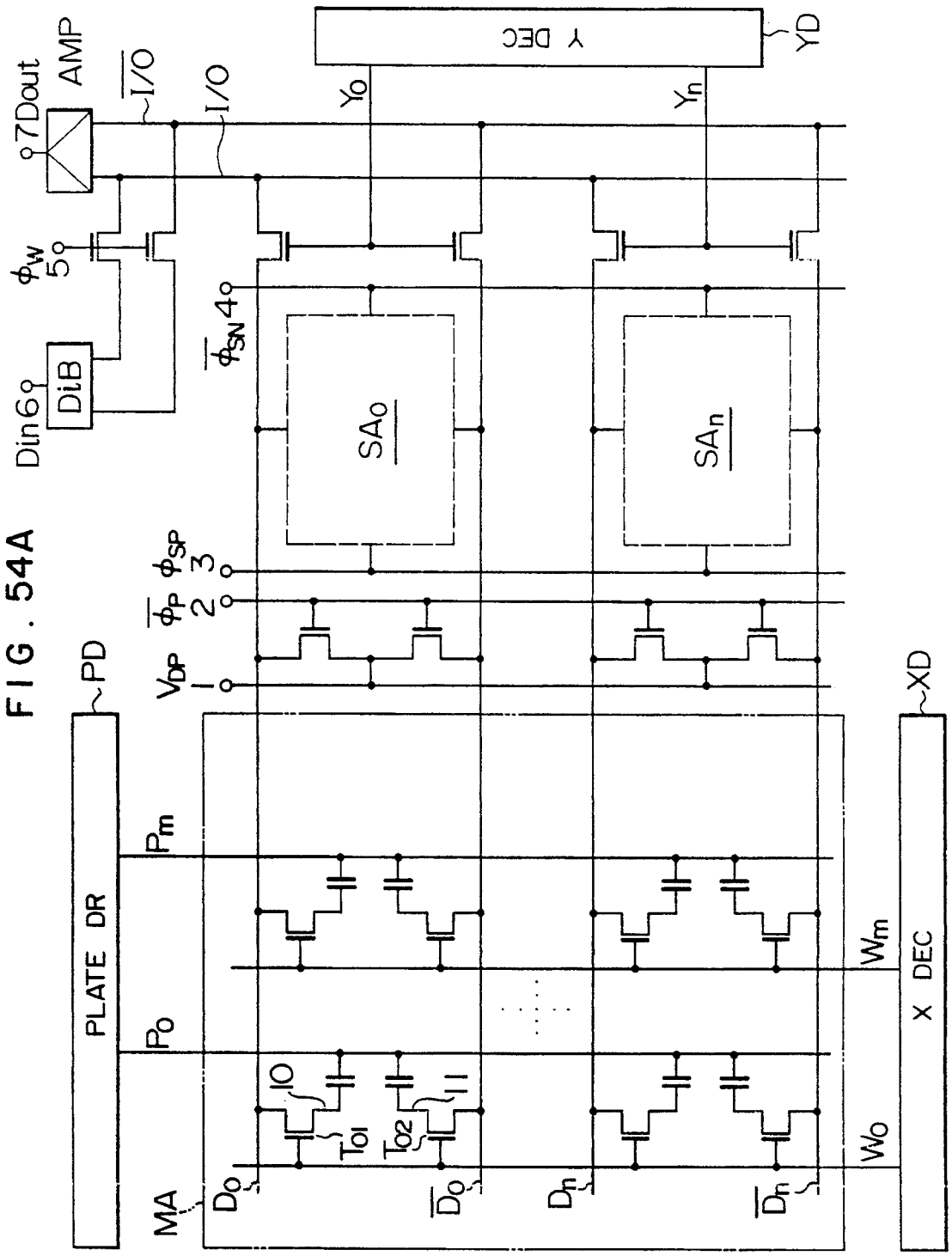
Figure 54B:
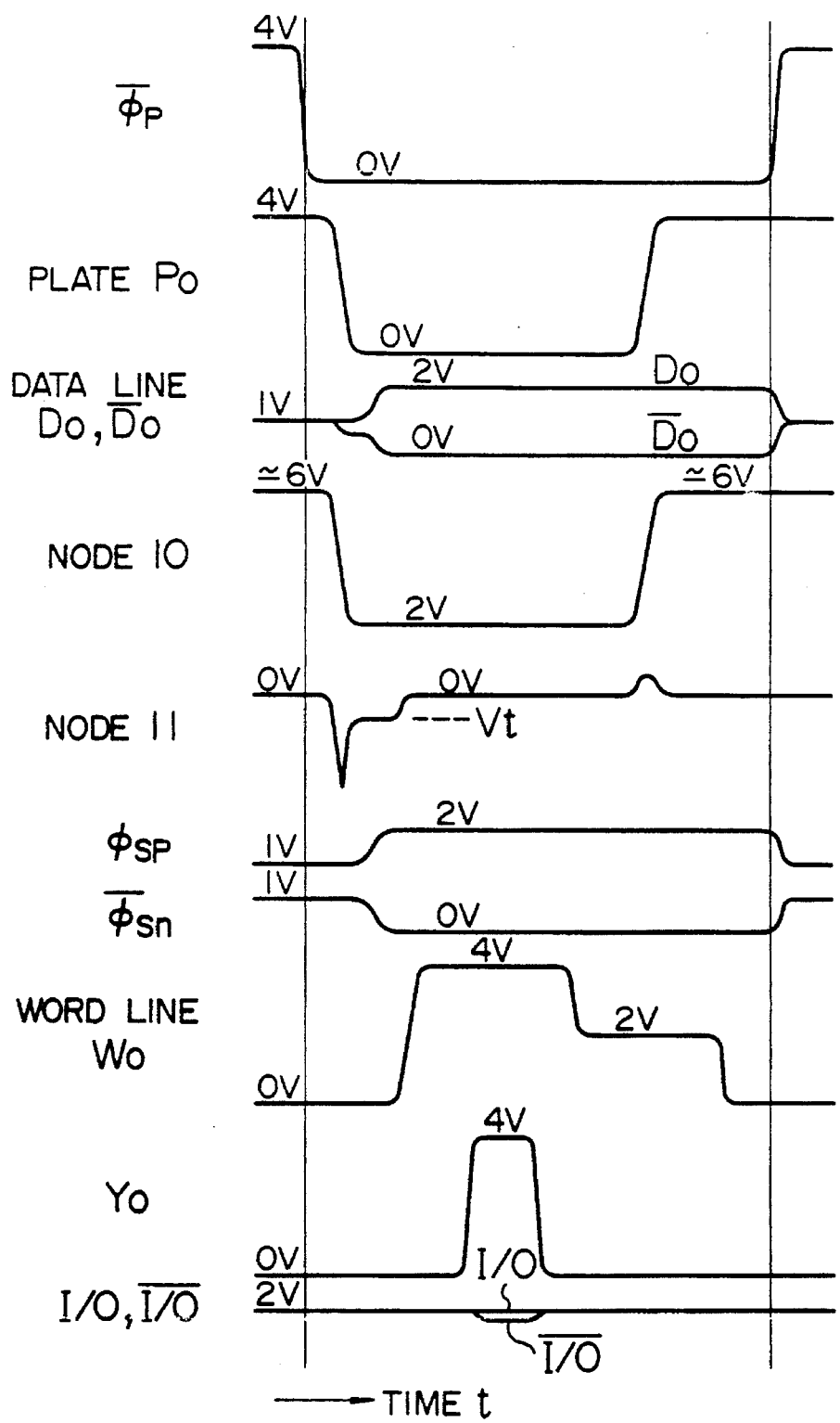
Figure 54C:
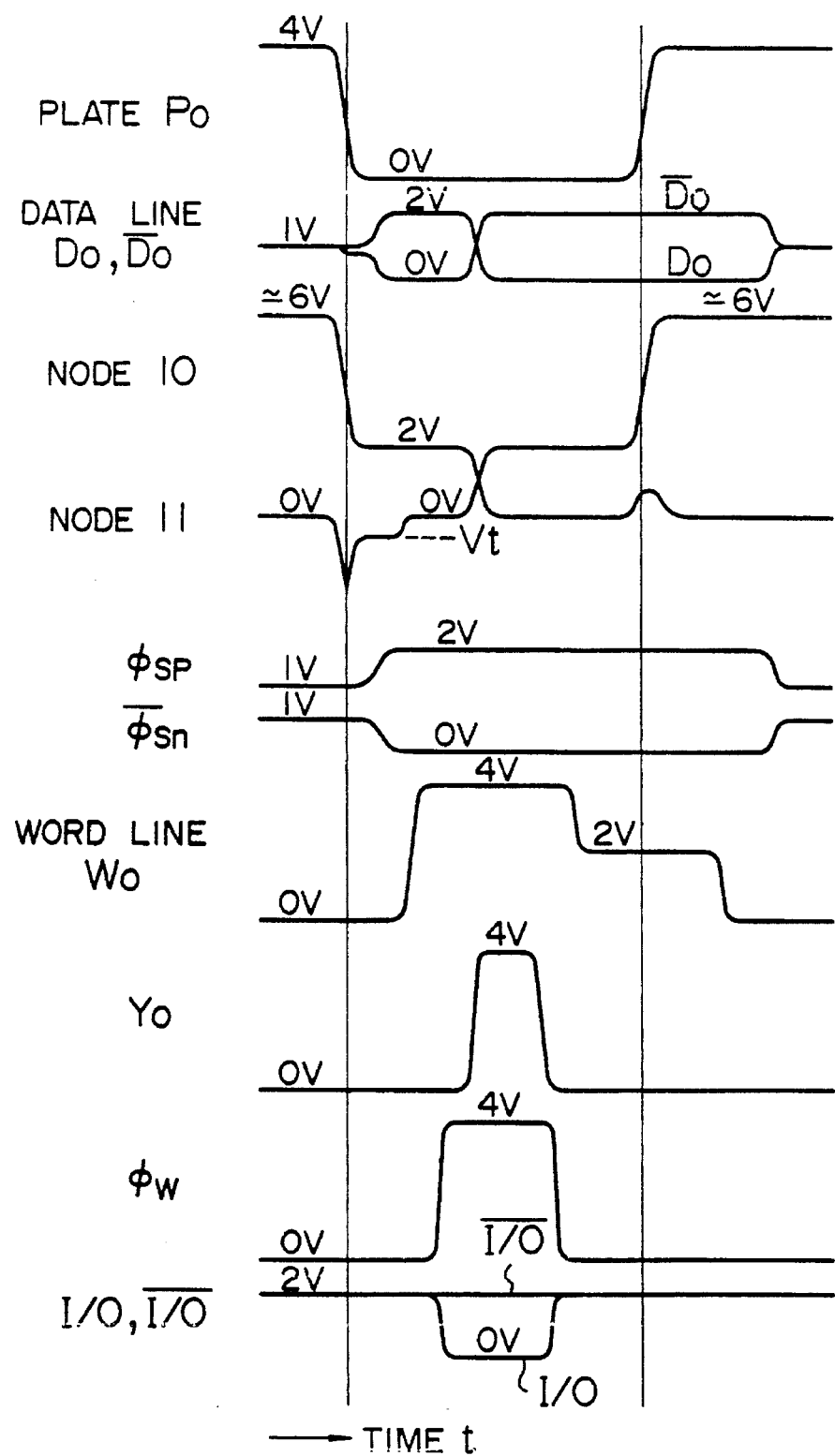

A further embodiment of the present invention will be explained with reference to FIGS. 54A, 54B and 54C. The memory cell shown in FIG. 54A is the same as the circuit of FIG. 37A except that the memory cell arrangement of two cells/one bit is adopted and the dummy word line is not provided. Due to the memory cell arrangement of two cells/one bit, two memory cell signals are simultaneously read out on the data lines to be a pair. Since the two signals are always complementary, any dummy cell is not required.

The operation of the memory circuit will be explained with reference to the waveform chart of FIG. 54B. While the data precharge signal $\overline{\phi_p}$ is 4 V, the data lines D0, $\overline{D0}$ (Dn, $\overline{Dn}$) are at a precharge potential level of 1 V. Then, the sense amplifier driving signals $\phi_{sp}$ and $\overline{\phi_{SN}}$ are 1 V and the sense amplifiers SA0 to SAn are in the OFF state. Next, the plate P0 is selected and varies from 4 V to 0 V. Thus, the signal in each of the memory cells connected with the plate P0 is read out on the corresponding data line. Now it is assumed that a high potential of 6 V has been stored at the storage terminal (node) 10 and a low potential of 0 V has been stored at the storage terminal (node) 11. When the plate 0 varies from 4 to 0 V, the potential at the terminal 10 varies from 6 V to 2 V. Then, the data line D0 is 1 V and the word line W0 is 0 V so that a transistor T01 in the OFF state whereby the voltage on the data line D0 is not varied. On the other hand, the potential at the terminal 11 is reduced from 0 V toward −4 V. Then, the data line $\overline{D0}$ is 1 V and the word line W0 is 0 V so that when the potential at the terminal 11 becomes lower than the threshold voltage Vt of MOS-FET (T02), the transistor T02 is turned ON, whereby a current flows the data line D0 to the terminal 11. Thus, the potential on the data line $\overline{D0}$ is slightly lowered. Accordingly, the memory cell signal is read out on both data lines D0 and $\overline{D0}$.

Thereafter, the sense amplifier driving signal $\phi_{SP}$ varies from 1 V to 2 V and $\overline{\phi_{SN}}$ varies from 1 V to 0 V thereby to operate the sense amplifiers. Thus, the data line D0 becomes 2 V and the data line $\overline{D0}$ becomes 0 V. Next, when the word line W0 becomes 4 V, 2 V is rewritten at the terminal 10 and 0 V is rewritten at the terminal 11. Thereafter, the data lines D0 and $\overline{D0}$ are selected by the Y decoder YD and so the data line selection line Y0 becomes 4 V. Thus, the memory cell signal is read out on the data input/output lines I/O and $\overline{I/O}$. This signal is amplified by the output amplifier AMP to provide an output signal Dout. Next, the word line W0 is lowered from 4 V to 2 V. Then, D0 is 2 V, $\overline{D0}$ is 0 V, the storage terminal 10 is 2 V and the storage terminal 11 is 0

V so that the transistor T01 is turned OFF and the transistor T02 is turned ON. Next, when the plte P0 is boosted from 0 V to 4 V, the potential at the storage terminal 10 is boosted about 6 V whereas the potential at the storage terminal 11 is held 0 V. Thereafter, the word line becomes 0 V thereby to complete the rewrite operation mentioned above. Accordingly, about 6 V is rewritten at the storage terminal 10 whereas 0 V is rewritten at the storage terminal 11. Thereafter, the data line percharge signal $\overline{\phi_P}$ is 4 V, and the sense amplifier driving signals $\phi_{SP}$ and $\overline{\phi_{SN}}$ become 1 V thereby to precharge the data lines to 1 V.

The write operation will be explained with reference to the waveform chart of FIG. 54C. After memory cell signals have been amplified by the sense amplifiers as in the read operation, a write signal Din is fetched into a data input buffer DiB. When a write control signal becomes 4 V, the potentials on the input/output lines I/O and $\overline{I/O}$ are separated into a high potential and a low potential in accordance with Din. It is now assumed that I/O and $\overline{I/O}$ have become 0 V and 2 V, respectively. Thereafter, a pair of data lines are selected by the Y decoder YD. It is now assumed that D0 and $\overline{D0}$ have been selected. Thus, the potential on the data line selection line Y0 becomes 4 V so that D0 and $\overline{D0}$ become 0 V and 2 V, respectively. Accordingly, 0 V is written at the storage terminal 10 of the memory cell whereas 2 V is written at the storage terminal 11.

The operation after the signal has been written in the memory cell in the above manner is the same as the read operation as previously mentioned. Namely, the potential at the storage terminal 11 is boosted to 6 V which is stored there whereas the potential of 0 V at the storage terminal 10 is stored as it is.

As understood from the description, also in accordance with this embodiment, the voltage amplitude of the data lines and the voltage to be written into the memory cells can be determined independently from each other. Therefore, the charging/discharging current for the data lines can be decreased and so power consumption of the memory can be reduced. Further, reduction of the voltage to be written into the memory cells due to decreasing of the voltage amplitude of the data lines is compensated for by the write operation from the plates. Therefore, the characteristics of data retention time and α-ray resistance soft error can be improved. Moreover, since the memory cell arrangement of two cells/bit provides memory cell signals twice those in the memory cell arrangement of one cell/bit, high S/N in the memory can be realized. Also, any dummy cell is not required.

Figure 55A:
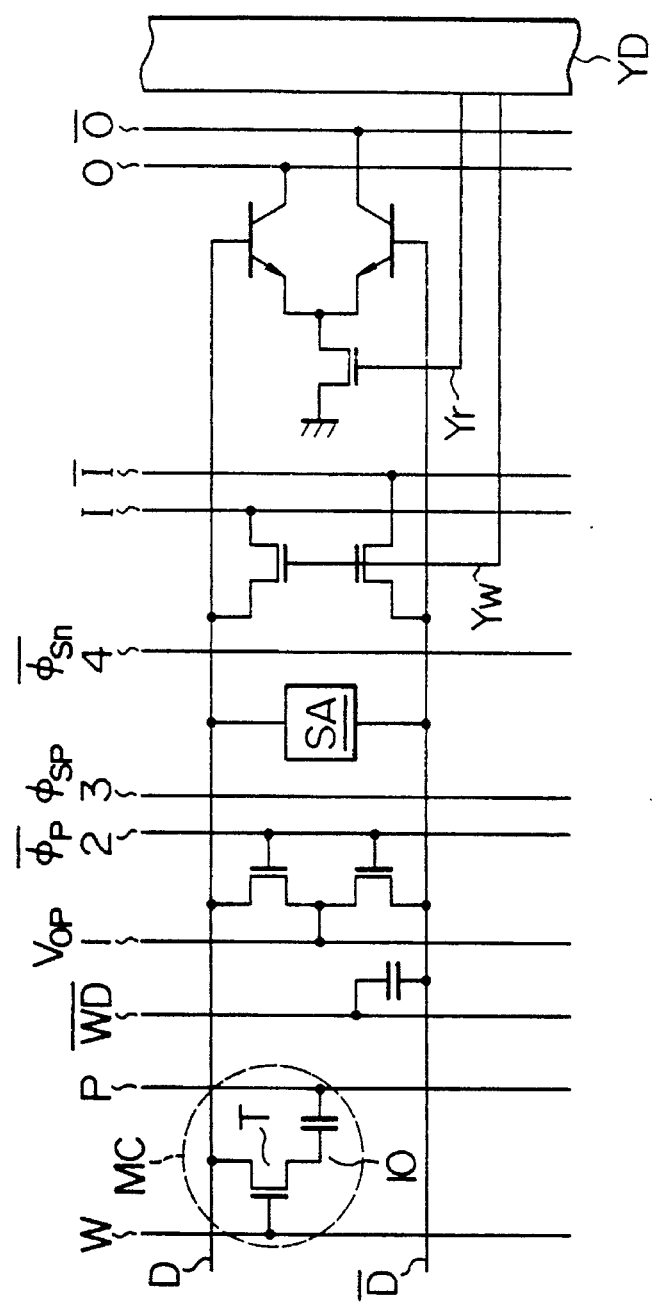

A further embodiment of the present invention will be explained with reference to FIGS. 55A, 55B and 55C. The memory circuit shown in FIG. 55A is different from the circuit of FIG. 37A in that bipolar transistors are used to read out the memory cell signals from the data lines. To this end, there are provided, as data input/output lines, two kinds of signal read lines O, $\overline{O}$ and signal write lines I, $\overline{I}$. Although only the relation between the data lines and the input/output lines, the remaining circuit arrangement is the same as that of FIG. 37A. The operation of the circuit of FIG. 55A is also the same as that as shown in FIGS. 37B and 37C except that the potentials of the data lines and their relative potentials are different for the reason why the bipolar transistors are used to read out the memory signals.

Figure 55B:
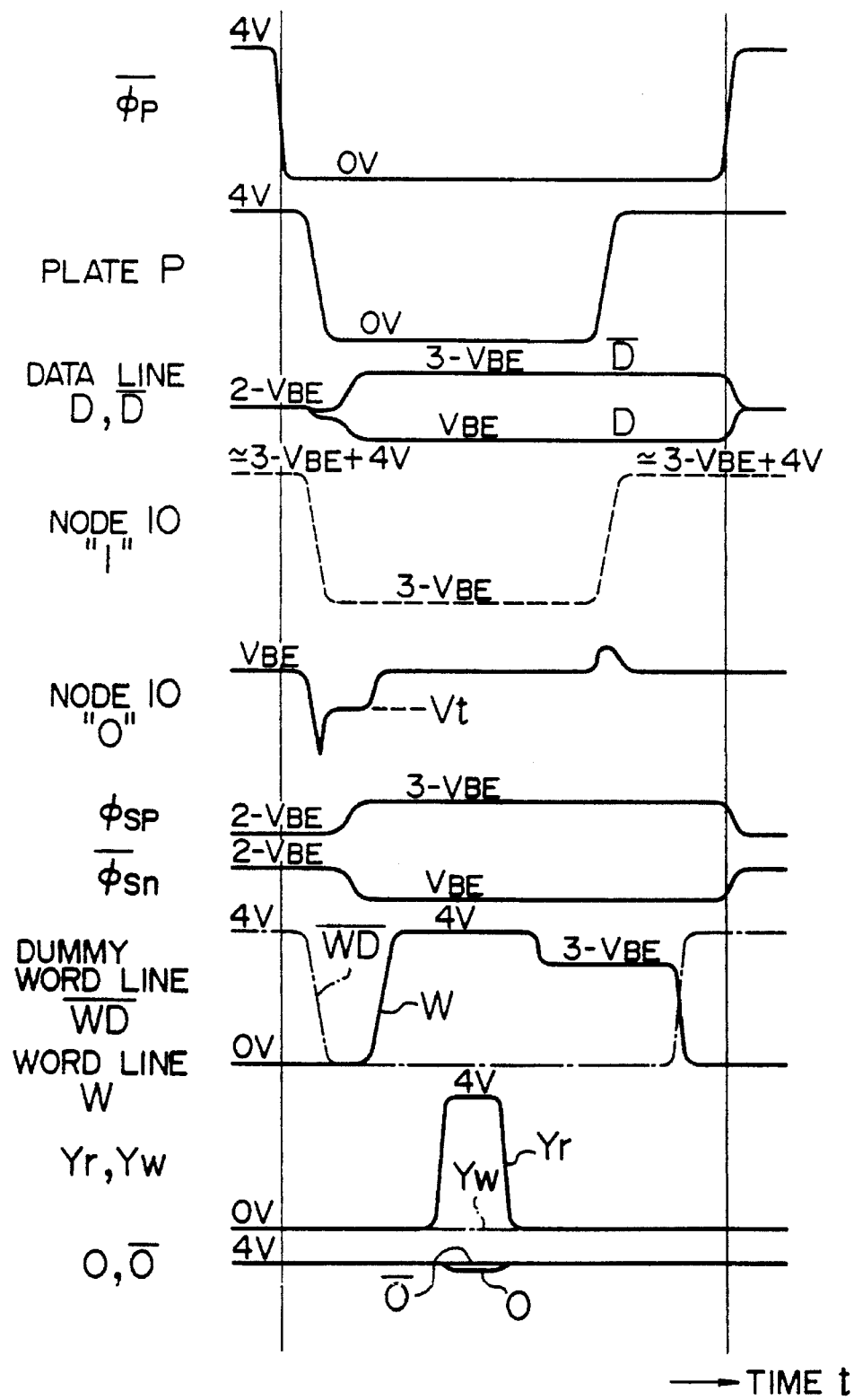
Figure 55C:
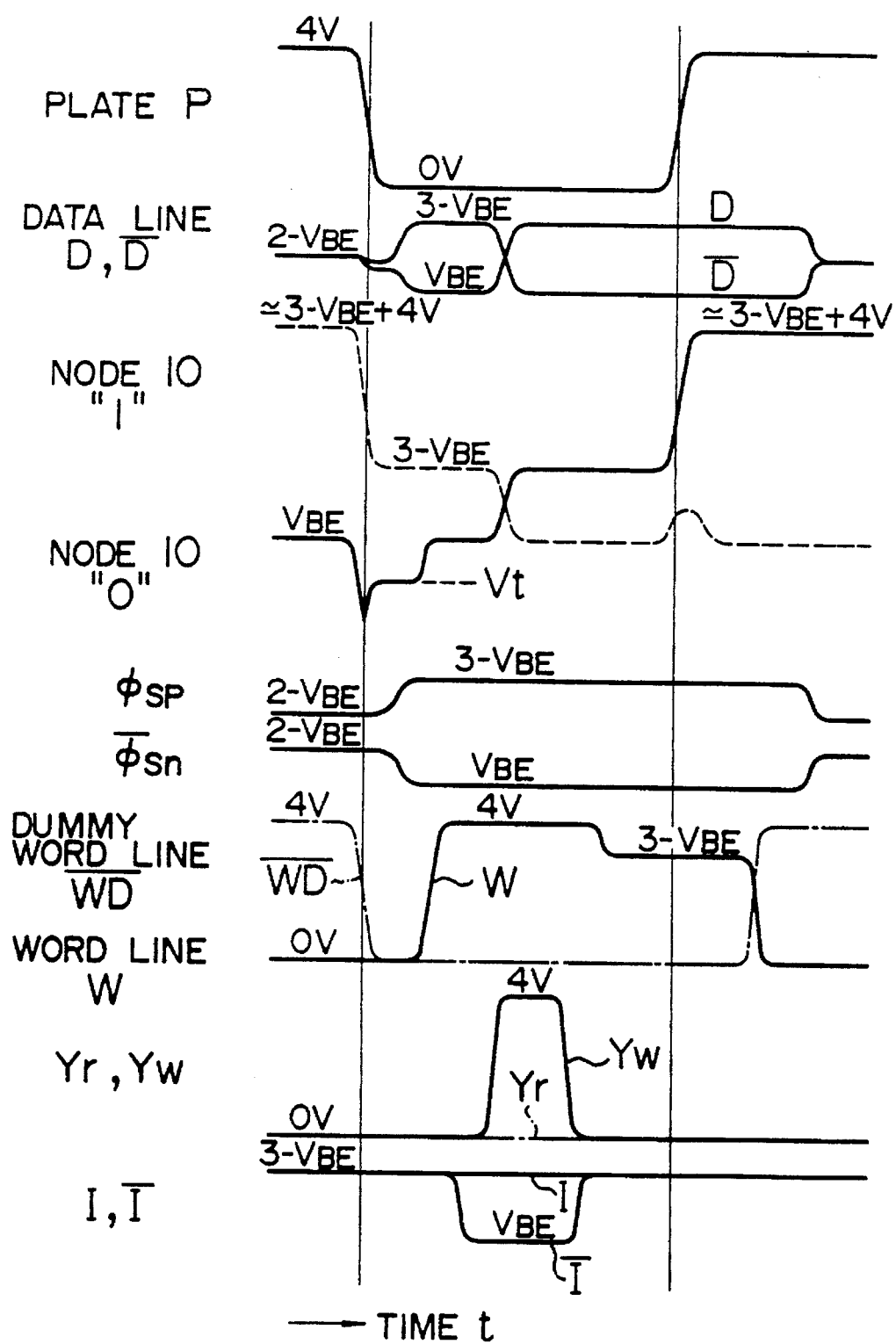

The read operation of the circuit of FIG. 55A will be explained with reference to the operation waveforms as shown in FIG. 55B. Now it is assumed that the forward voltage between the base and emitter of the bipolar transistor is VBE. While the precharge signals $\overline{\phi_p}$ of the data lines are 4 V, the data lines D and $\overline{D}$ are precharged at 2 VBE. Then, the sense amplifier driving signals $\phi_{sp}$ and $\overline{\phi_{SN}}$ are 2 VBE so that the sense amplifier(s) is in the OFF state. Next, when the plate P varies from 4 V to 0 V, the signal(s) in the memory cell(s) is read out on the data lines. Now it is assumed that a low potential of VBE has been stored at the storage terminal 10 of the memory cell. In this case, when the plate P varies from 4 V to 0 V, the potential at the storage terminal 10 lowers from VBE to −(4−VBE). Then, the data line D is 2 VBE and the word line W is 0 V so that when the potential at the terminal 10 becomes lower than −Vt, the transistor T constituting the memory cell is turned ON, whereby a current flows from the data line D to the storage terminal 10. Thus, the memory cell signal is read out on the data line D. On the other hand, at this time, the dummy word line $\overline{WD}$ varies from 4 V to 0 V so that a reference signal appears on the data line $\overline{D}$ (For simplicity of explanation, only the dummy word line for D is illustrated but that for D is also provided in an actual memory). In the case where a high potential of 3 VBE+4 V has been stored at the storage terminal 10, when the plate P varies from 4 V, the potential at the storage terminal 10 becomes 3 VBE. Then, the data line D is 2 VBE and the word line W is 0 V so that the transistor T is in the OFF state and so the potential of the data line D remains unchanged.

After the memory cell signal and the reference signal have appeared on the date lines D and $\overline{D}$, the sense amplifier driving signal $\phi_{sp}$ varies from 2 VBE to 3 VBE and the sense amplifier driving signal $\overline{\phi_{SN}}$ varies from 2 VBE to VBE. Thus, the sense amplifier(s) operates so that D becomes VBE and $\overline{D}$ becomes 3 VBE. Subsequently, when the potential of the word line W becomes 4 V, VBE is rewritten at the storage terminal 10. Thereafter, when a data line selection signal Yr becomes 4, the memory cell signal is read out on the signal read lines O and $\overline{O}$. This signal is amplified by the output amplifier AMP to provide an output signal Dour. Thereafter the potential of the word line W lowers from 4 V to 3 VBE. Then, the potential of the data line D is VBE and the potential at the storage terminal is also VBE so that the transistor T is in the ON state. Therefore, even when the plate P is boosted from 0 V to 4 V, the potential at the storage terminal 10 remains VBE. In the case where the high potential of 3 VBE+4 V has been stored at the storage terminal 10, when the potential of the-word line W becomes 3 VBE, the potential of the data line is 3 VBE and that at the storage terminal 10 is also 3 VBE so that the transistor T is in the OFF state. Thus, when the plate P is boosted from 0 V to 4 V, the potential at the storage terminal 10 is also boosted to 3 VBE+4 V.

Thereafter, the potential of the word line becomes 0 V thereby to complete the rewrite operation for the memory cell(s). The dummy word line WD varies from 1 V to 4 V. Thereafter, the data line precharge signal becomes 4 V and the sense amplifier driving signals $\phi_{SP}$ and $\overline{\phi_{SN}}$ become 2 VBE thereby to precharge the data lines at 2 VBE.

The write operation will be explained with reference to the waveform chart of FIG. 55C. After memory cell signals have been amplified by the sense amplifiers as in the read operation, a write signal Din is fetched into a data input buffer DiB. When a write control signal becomes 4 V, the potentials on the signal write lines I and $\overline{I}$ are separated into a high potential and a low potential in accordance with Din. It is now assumed that I and $\overline{I}$ have become 3 VBE and VBE, respectively. Thereafter, a data line selection signal Yw is placed at 4 V by the Y decoder YD. Thus, the data line D becomes 3 VBE and the data line $\overline{D}$ becomes VBE thereby to store 3 VBE at the storage terminal 10.

The operation after the signal has been written in the memory cell in the above manner is the same as the read operation as previously mentioned. Namely, the potential at the storage terminal 11 is boosted to 3 VBE+4 V which is stored there.

As understood from the above description, also in accordance with this embodiment, the voltage amplitude of the data lines can be decreased while assuring a sufficient memory cell signal so that power consumption of the memory can be reduced. Further, the potential of the data lines is decided using as a standard the forward voltage between the base and emitter of the bipolar transistor so that a memory LSI in which MOS-FETs and bipolar transistors are mixedly provided can be easily designed.

Figure 56:
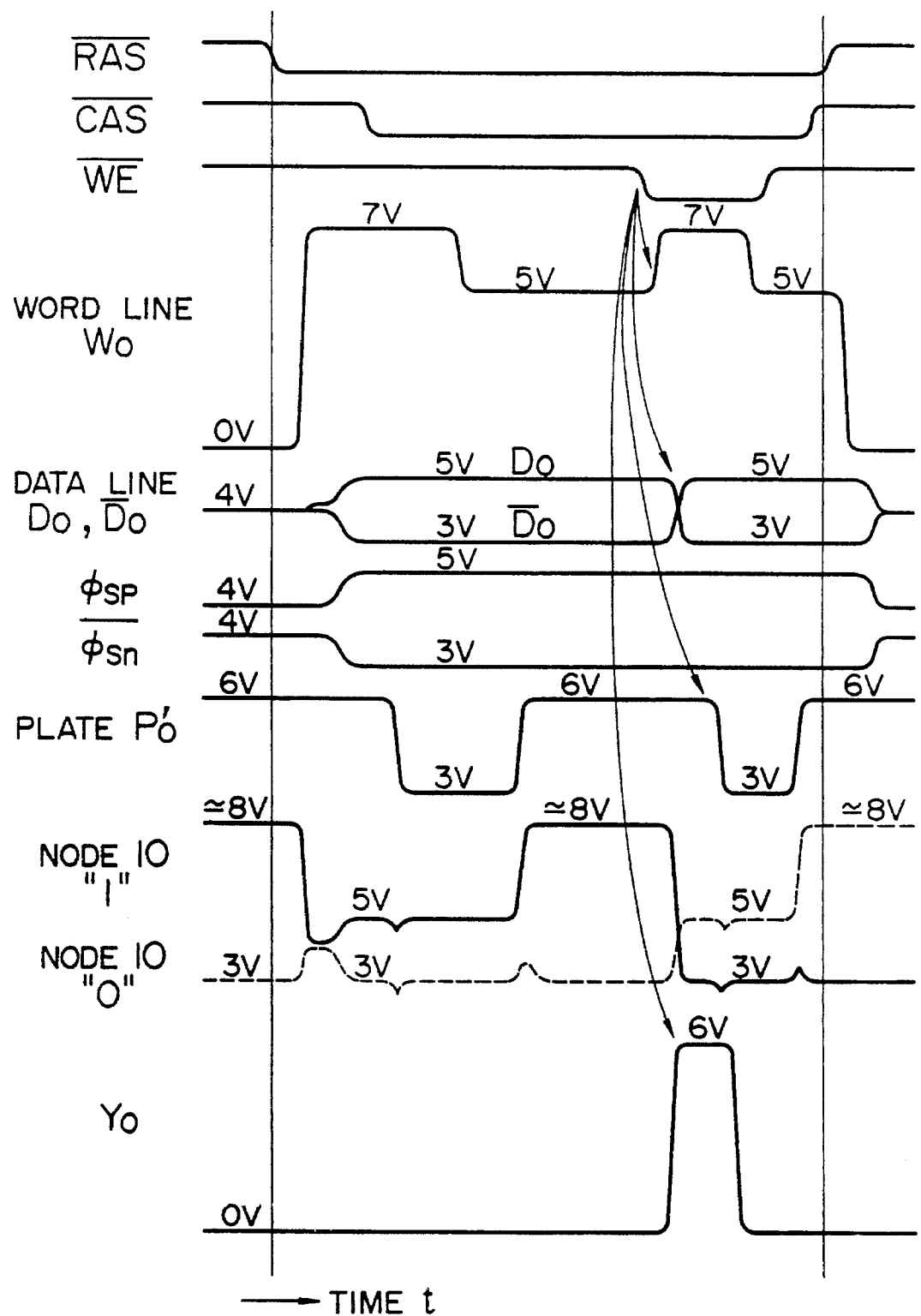

A further embodiment of the present invention will be explained with reference to FIG. 36. This embodiment relates to another operation for the circuit shown in FIG. 40A. FIG. 56A shows the operation waveforms in the case where a write instruction signal from the outside of a memory chip is input to the chip in the manner greatly delayed from an address strobe signal. The operation waveforms of FIG. 56 are the same as those of FIG. 40C except that the potential at the storage terminal of a memory cell is twice boosted from a plate. In FIG. 56, $\overline{RAS}$ is a row (X) address strobe signal, $\overline{CAS}$ is a column (Y) address strobe signal, and $\overline{WE}$ is a write instruction signal.

The operation from the read of a memory cell signal to boosting of the potential at a storage terminal through a plate is the same as that shown in FIG. 40B. In this embodiment, after the boosting by the plate, the $\overline{WE}$ signal varies from a high potential to a low potential thereby to provide a write operation. Thus, the potential of the word line W0 is boosted again from 5 V to 7 V. On the other hand, when the data line selection signal Y0 varies from 0 V to 6 V, signals are written on the data lines D0 and $\overline{D0}$ through the data input/output lines I/O and $\overline{I/O}$. It is now assumed that 3 V is written on D0 and 0 V is written on $\overline{D0}$. Thus, 3 V is stored at the storage terminal 10 of the memory cell. Next, the plate P0' varies from 6 V to 3 V again. Then, the potential of the word line W0 is 7 V so that the potential at the storage terminal 10 is held by the sense amplifier. Thereafter, the potential of the word line W0 lowers to 5 V. Next, the plate P0' varies from 3 V to 6 V. Then, the potential of the word line W0 is 5 V and that of the data line D0 is 3 V so that the transistor T0 constituting the memory cell is the ON state, whereby the potential of 3 V at the storage terminal 10 is held by the sense amplifier. Further, in the case where a high potential of 5 V has been stored at the storage terminal 10, when the potential of the word line W0 becomes 5 V, the transistor T0 is turned OFF. Thus, when the plate P0' varies 3 V to 6 V, the potential at the storage terminal 10 is boosted 5 V to about 8 V (see the waveform in the case where the terminal 10 is at a high potential level). After the above operation, the potential of the word line W0 becomes 0 V thereby to complete the write of signals into the memory cell. Thereafter, the data lines D0 and $\overline{D0}$ are precharged at 4 V and also $\phi_{sp}$ and $\overline{\phi}_{SN}$ become 4 V.

In accordance with this embodiment, the voltage amplitude of the data lines can be decreased also in the operation mode in which a write instruction is inputted with delay so that power consumption in a memory can be reduced.

Figure 57:
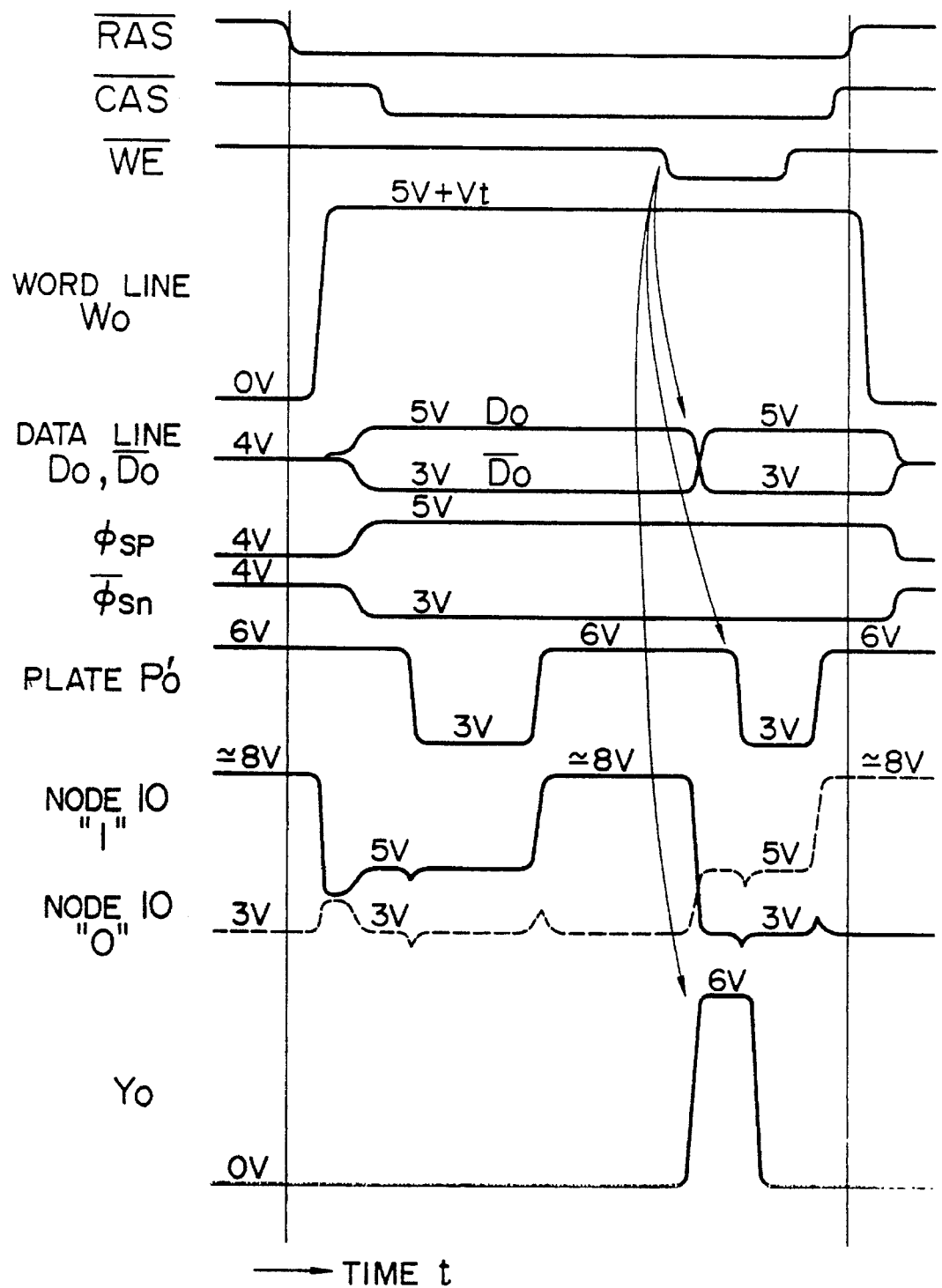

A further embodiment of the present invention will be explained with reference to FIG. 57. The operation waveforms shown in FIG. 57 are the same as those of FIG. 56 except that the potential of the word line is binary. In this case, as explained in connection with the embodiment of FIG. 48, if the higher potential is set at a value higher than the high potential of the data line D0 by the threshold value of MOS-FET, the potential at the storage terminal 10 can be boosted. Thus, in accordance with this embodiment, even when the write instruction signal is inputted with delay, only the boosting of the potential at the storage terminal is carried out again without changing the potential of the word line through the plate. Accordingly, it is not necessary to boost the potential of the word line in writing signals so that circuit-designing of a memory can be easily implmented.

Figure 58A:
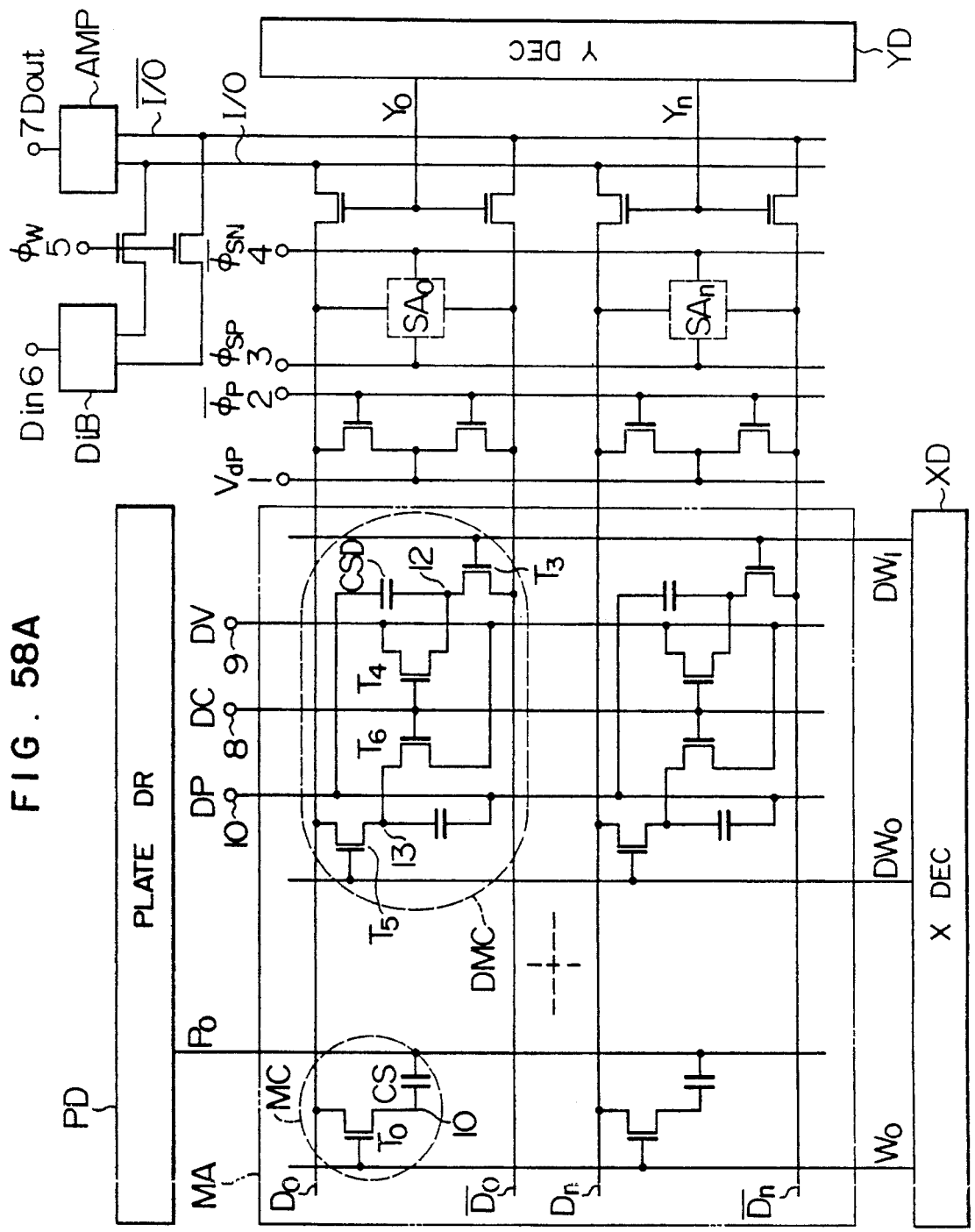
Figure 58B:
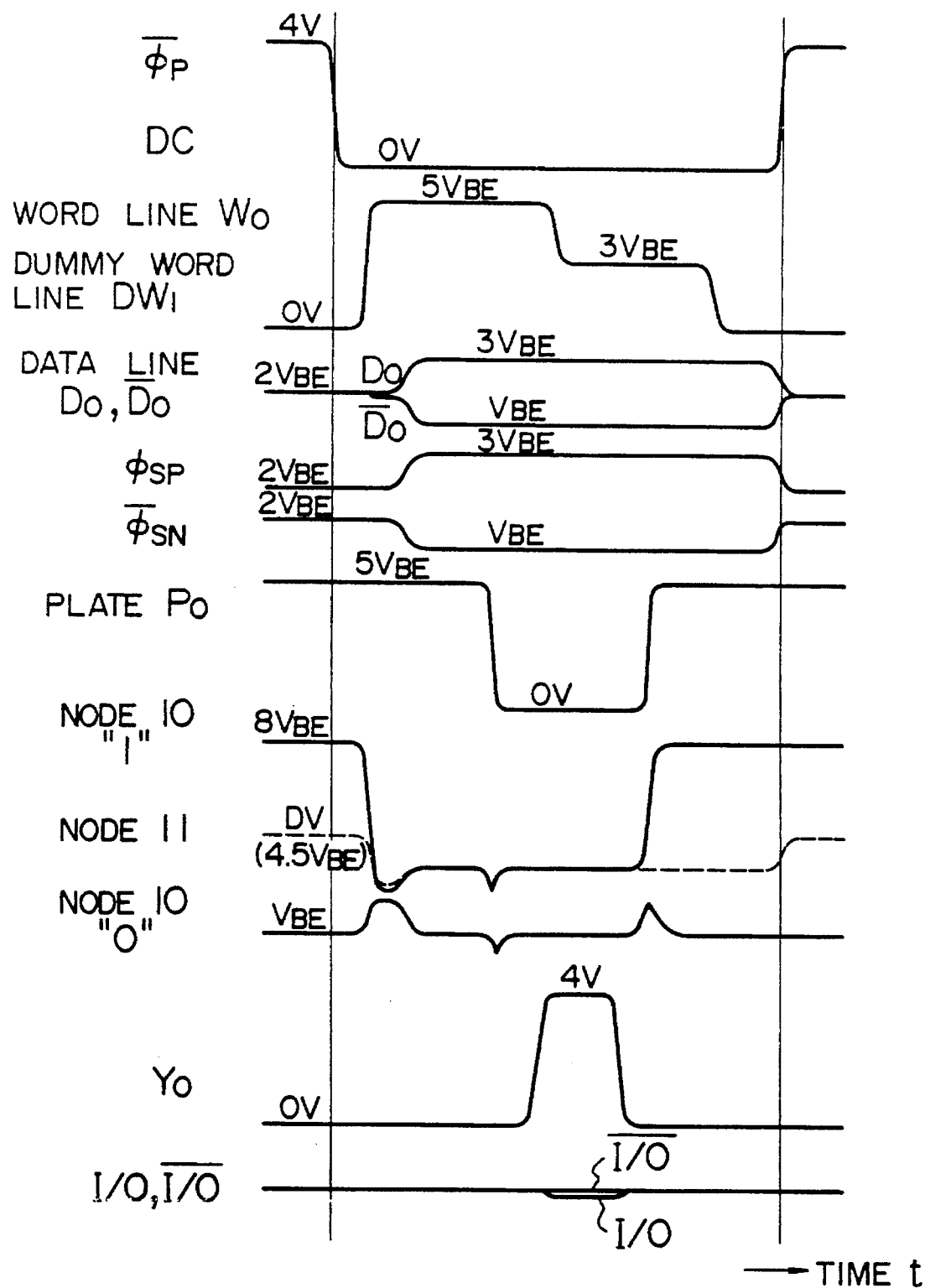
Figure 58C:
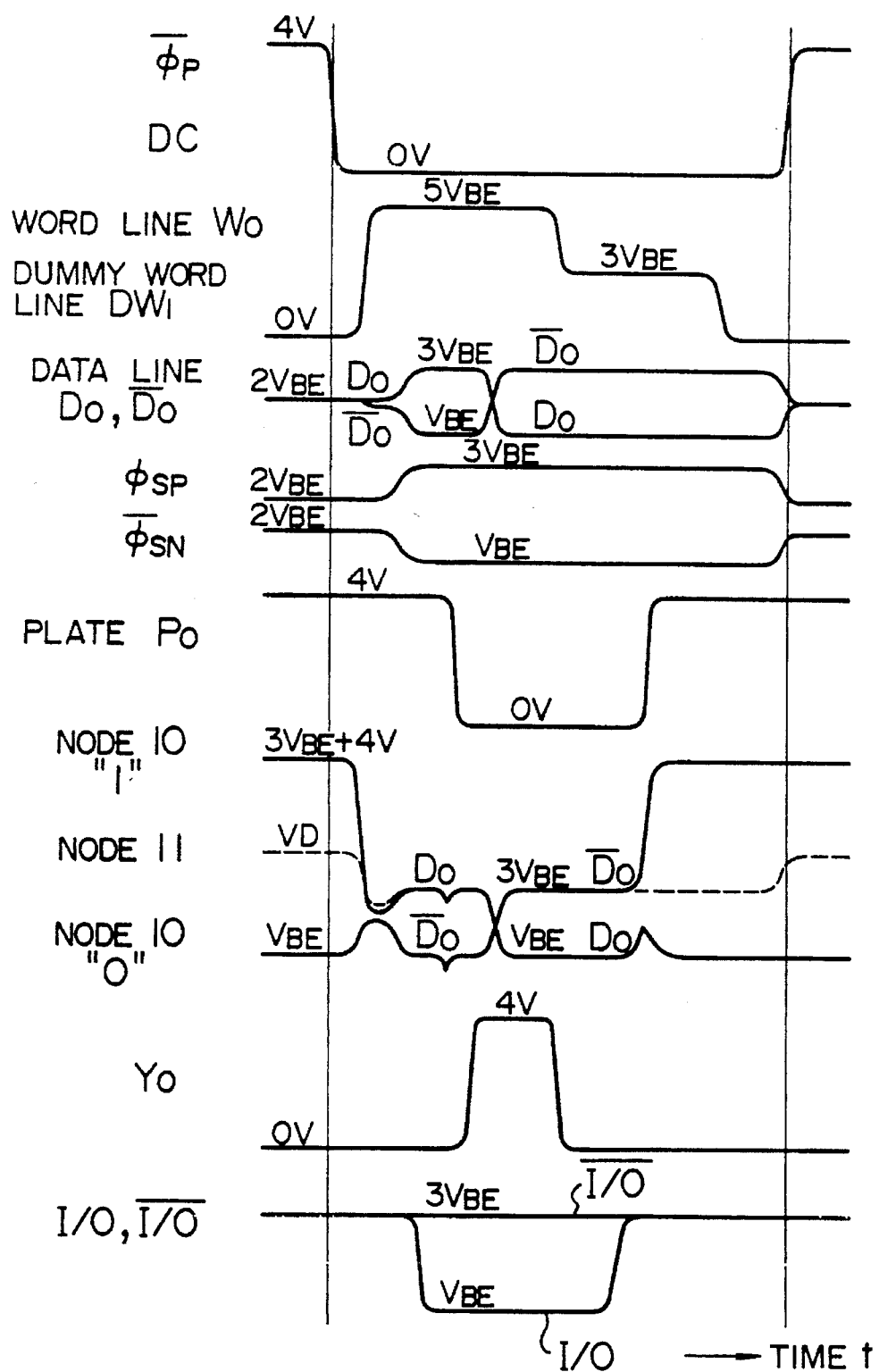

A further embodiment of the present invention will be explained with reference to FIGS. 58A, 58B and 58C. In FIG. 58A, MA is a memory cell array which is composed of plural data lines D0, $\overline{D0}$ to Dn, $\overline{Dn}$, word lines W0, W1 to Wn, dummy word lines WD0, WD1, plates (plate wirings) P0, P1 to Pm, dummy cells DMCs and memory cells MCs. MC is composed of a MOS-FET T0 and a storage capacitor Cs. DMC which serves to generate a reference voltage is composed of MOS-FETs T3, T4 and a storage capacitor Cs. 8 is a signal line which conducts a dummy cell write signal to write a storage voltage DV in the dummy cell(s). XD is an X decoder which serves to select one of the word lines and the dummy word line in accordance with an external address signal. The relation between the word line and dummy word line is such that when the word line W0 where the memory cell is connected with the data line D0 is selected, the dummy word line DW1 where the dummy cell is connected with the data line D0 is selected. YD is a Y decoder which serves to select a pair of data lines from the plural pairs of data lines D0, $\overline{D0}$ (Dn, $\overline{Dn}$). Y0 to Yn are a data line selection signal line which serves to conduct an output signal from the Y decoder, respectively. PD is a plate driving circuit which serves to control the voltage at one (plates P0 to Pm) of the terminals of the capacitor constituting each memory cell. This circuit also, like the X decoder, selects one of the plate wirings in accordance with the external address signal. SA0 to SAn are ordinary sense amplifiers each of which is a flip-flop composed of P channel MOS-FETs and N channel MOS-FETs and serves to the signal read out from each memory cell. Numeral 1 is a signal line for conducting a data line precharge voltage Vdp. Numeral 2 is a data line precharge signal line for conducting a precharge signal $\overline{\phi}_p$. Numerals 3 and 4 are sense amplifier driving signals which conduct sense amplifier signals $\phi_{sp}$ and $\overline{\phi}_{SN}$, respectively. I/O and $\overline{I/O}$ are data input/output lines which serve to conduct a signal to be written into each memory cell and a signal read out therefrom (Although not shown here, a precharge circuit is actually provided for the data input/output lines). AMP is an output amplifier which serves to amplify the signal read out from the memory cell to provide an output signal Dout. Dib is a data input buffer which serves to convert an input signal (write signal) from an external device into the corresponding signal level in the memory chip. $\phi_w$ is a write control signal.

The read operation of the circuit shown in FIG. 58A will be explained with reference to the operation waveforms shown in FIG. 58B. It should be noted that for convenience of explanation, an example of the voltage value of each waveform is illustrated.

While the data line precharge signal $\overline{\phi}_p$ is 4 V, the data lines D0, $\overline{D0}$ (Dn, $\overline{Dn}$) are at a precharge potential level of 2 $V_{BE}$ (1.6 V). Then the sense amplifier driving signals $\phi_{sp}$ and $\overline{\phi}_{SN}$ are 2 $V_{BE}$ and the sense amplifier is in an OFF state. It is assumed that after $\overline{\phi}_p$ has become 0 V, one word line W0 has selected from the plural word lines. Then, when W0 varies from 0 V to 5 $V_{BE}$ (4 V), a memory cell signal appears on each data line. Now it is assumed that a high potential of 3 $V_{BE}$+5 $V_{BE}$=8 $V_{BE}$ (6.4 V) has been stored at the storage terminal (node) of the memory cell connected with the data line D0. When the word line W0 varies from 0 V to 5 $V_{BE}$ (4 V), a read-out signal voltage corresponding a data line capacitance $C_o$ and a storage capacitance $C_s$ appears on the data line D0. The amount Vs of the read-out signal voltage is expressed by $$\Delta Vs('1') = Cs/(C_D + Cs) \times Vs('1')$$

where $C_s$: storage capacitance $C_D$: data line capacitance $V_{BE}$: forward voltage (0.8 V) between the base and emitter of a bipolar transistor Vs ('1'): storage voltage (8 $V_{BE}$–2 $V_{BE}$=6 $V_{BE}$ (4.8 V)) The amount Vs ('0') of the read-out signal voltage in the case where a low potential has been stored in expressed by $$Vs('0') = Cs/(Cp + Cs) \times Vs('0')$$

where Vs ('0'): storage voltage (2 $V_{BE}$–$V_{BE}$=$V_{BE}$ (0.8 V))

If such a voltage relation is set, as understood from the above equations, the read-out signals are greatly different for the stored '1' and '0'. In order to eliminate such a difference, the dummy cells are provided. The dummy cells are selected in such a way that selected is a dummy cell connected with the data line opposite to the data line with which a memory cell is connected. Namely, when the word line W0 is selected, the dummy word line WD1 is selected so that a reference read-out signal voltage $\Delta Vs_D$ appears on the data line $\overline{D0}$. The value of $\Delta Vs_D$ is decided by the voltage DV to be stored in the dummy cell. The value of DV is set at an intermediate value between '1' and '0', i.e. 4.5 $V_{BE}$ (3.6 V) If it is desired that the margin on the side of '1' is made large in view of α-ray soft error and refresh, the voltage of VD may be decreased.

After the memory cell signal and the reference signal have appeared on the data line respectively, $\phi_{sp}$ varies from 2 $V_{BE}$ (1.6 V) to 3 $V_{BE}$ (2.4 V) and $\overline{\phi_{SN}}$ varies 2 $V_{BE}$ to $V_{BE}$. Thus, the sense amplifiers SA0 to SAn operate to amplify the corresponding memory cell signals. Therefore, the data line D0 becomes 3 $V_{BE}$ and the data line $\overline{D0}$ becomes $V_{BE}$. Next, the plate P0 is lowered from 5 $V_{BE}$ (4 V) to 0 V. Then, the word line W0 is 5 $V_{BE}$ (4 V) so that even when the plate voltage varies, the potential on the data line D0 remains 3 $V_{BE}$. Thereafter, a pair of data lines are selected by the Y decoder YD. Now it is assumed that the data lines D0 and $\overline{D0}$ are selected. Thus, the potential on the data line selection Y0 becomes 4 V and the memory cell signal is read out to the data input/output lines I/O and $\overline{I/O}$. This signal is amplified by the output amplifier AMP to provide an output signal Dout. Next, the word line W0 is lowered from 5 $V_{BE}$ (4 V) to 3 $V_{BE}$ (2.4 V). Thereafter, the plate P0 is boosted from 0 V to 5 $V_{BE}$ (4 V). Then, since a high potential of 3 $V_{BE}$ has been stored at the storage terminal 10 of the memory cell, the transistor T0 constituting the memory cell is in the OFF state. The potential at the storage terminal 10 is boosted from 3 $V_{BE}$ to 3 $V_{BE}$+5 $V_{BE}$ (6.4 V). Incidentally, in the case where a low potential of $V_{BE}$ has been stored at the storage terminal 10 of the memory cell, the transistor T0 is in the ON state. Therefore, the potential at the storage terminal 10 remains $V_{BE}$. Thereafter, the word line W0 becomes 0 V thereby to complete the rewrite operation mentioned above. Also, $\phi_{sp}$ and $\overline{\phi_{SN}}$ become 2 V and $\overline{\phi_p}$ becomes 4 V thereby to precharge the data lines to 2 $V_{BE}$.

The write operation will be explained with reference to the waveform chart of FIG. 58C. After memory cell signals have been amplified by the sense amplifiers as in the read operation, a write signal Din is fetched into a data input buffer DiB. When a write control signal $\phi_w$ becomes 4 V, the potentials on the input/output lines I/O and $\overline{I/O}$ are separated into a high potential and a low potential in accordance with Din. It is now assumed that I/O and $\overline{I/O}$ have become $V_{BE}$ and 3 $V_{BE}$, respectively. Thereafter, a pair of data lines are selected by the Y decoder YD. It is now assumed that D0 and $\overline{D0}$ have been selected. Thus, the potential on the data line selection line Y0 becomes 4 V so that D0 and $\overline{D0}$ become $V_{BE}$ and 3 $V_{BE}$, respectively. Accordingly, a low potential of $V_{BE}$ is written at the storage terminal 10 of the memory cell (see the waveform in the case where the terminal 10 is at a high potential). On the other hand, the operation of writing a high potential signal in the memory in which a low potential signal has been stored in the memory is as follows. After the sense amplifier has been operated, the potentials on D0 and $\overline{D0}$ are $V_{BE}$ and 3 $V_{BE}$, respectively. The potentials on I/O and $\overline{I/O}$ are 3 $V_{BE}$ and $V_{BE}$, respectively, in accordance with Din. Thereafter, the potential on Y0 is enhanced to 4 V so that the potentials on D0 and $\overline{D0}$ are 3 $V_{BE}$ and $V_{BE}$. Accordingly, the low potential of 3 V is written at the storage terminal of the memory cell (see the waveform in the case where the terminal 10 is at a low potential).

The operation after the signal has been written in the memory cell in the above manner is the same as the read operation as previously mentioned. Namely, the high potential signal in the memory cell is boosted to 3 $V_{BE}$+5 $V_{BE}$=8 $V_{BE}$ (6.4 V) which is stored whereas the low potential signal of $V_{BE}$ is stored as it is. Further, the constant voltage DV is written in the dummy cell by the dummy cell write signal DC through MOS-FET T3.

As explained above, in accordance with this embodiment, the voltage amplitude of the data lines and that of the voltage to be written into the memory cells can be determined independently from each other. Therefore, the voltage amplitude of the data lines (voltage amplitude when the sense amplifiers operate), which affects the power consumption of the memory can be decreased, and the voltage amplitude of the plates, which decides the high potential level of the memory cells relative to the data retention time for the memory cell. In this embodiment, the voltage amplitude of the plate is set to be larger than that of the data lines. In this way, the power consumption can be remarkably reduced while assuring a sufficient signal voltage for the memory cells. Therefore, reduced power consumption and high S/N can be simultaneously realized. Further, in this embodiment, the potential on the data lines during its precharge is set at an intermediate value between the high and low potentials of the voltage amplitude of the data lines. This permits the power consumption to be further reduced. Moreover, the voltage amplitude of the data line can be decreased to the neighborhood of a sum of the absolute values of the threshold voltages of the N channel MOS-FET and P channel MOS-FET. Since the threshold voltage is generally 0.5 V to 1 V, the charging/discharging current in the case of the data line voltage amplitude of 2 $V_{BE}$ (1.6 V) can be decreased to about ⅓ in the case of that of 5 V. Further, in this embodiment, dummy cells are provided so that the storage voltage can be freely controlled. Therefore, the read-out signal amount of '1' or '0' can be controlled so that a memory having the characteristics of high α-ray soft error resistance, unvaried refresh and low power consumption can be designed. Moreover, the respective operation voltages such as the potential on the data lines are decided using as a standard the forward voltage between the base and the emitter of the bipolar transistor so that a memory LSI in which MOS-FETs and bipolar transistors are mixedly provided can be easily designed.

Figure 59:
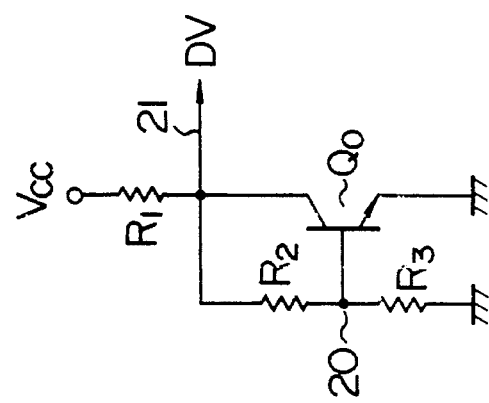

FIG. 59 shows an exemplary arrangement of a circuit for generating the dummy cell write voltage DV which is composed of a bipolar transistor Q0 and resistors R1, R2 and R3. The voltage value of DV at a terminal 21 is expressed by $$DV = V(R2+R3)/R3$$

where V is the base-emitter voltage of the transistor Q0. Thus, the value of DV can be optionally set in accordance with the resistances of the resistors R2 and R3.

A further embodiment of the present invention will be explained with reference to FIG. 60. The memory circuit shown in FIG. 60 is the same as that of FIG. 58A except that a plate for the storage capacitor of a memory cell is commonly provided for two word lines, which permits the memory to be integrated with higher degree than the arrangement of FIG. 58A.

Figure 60A:
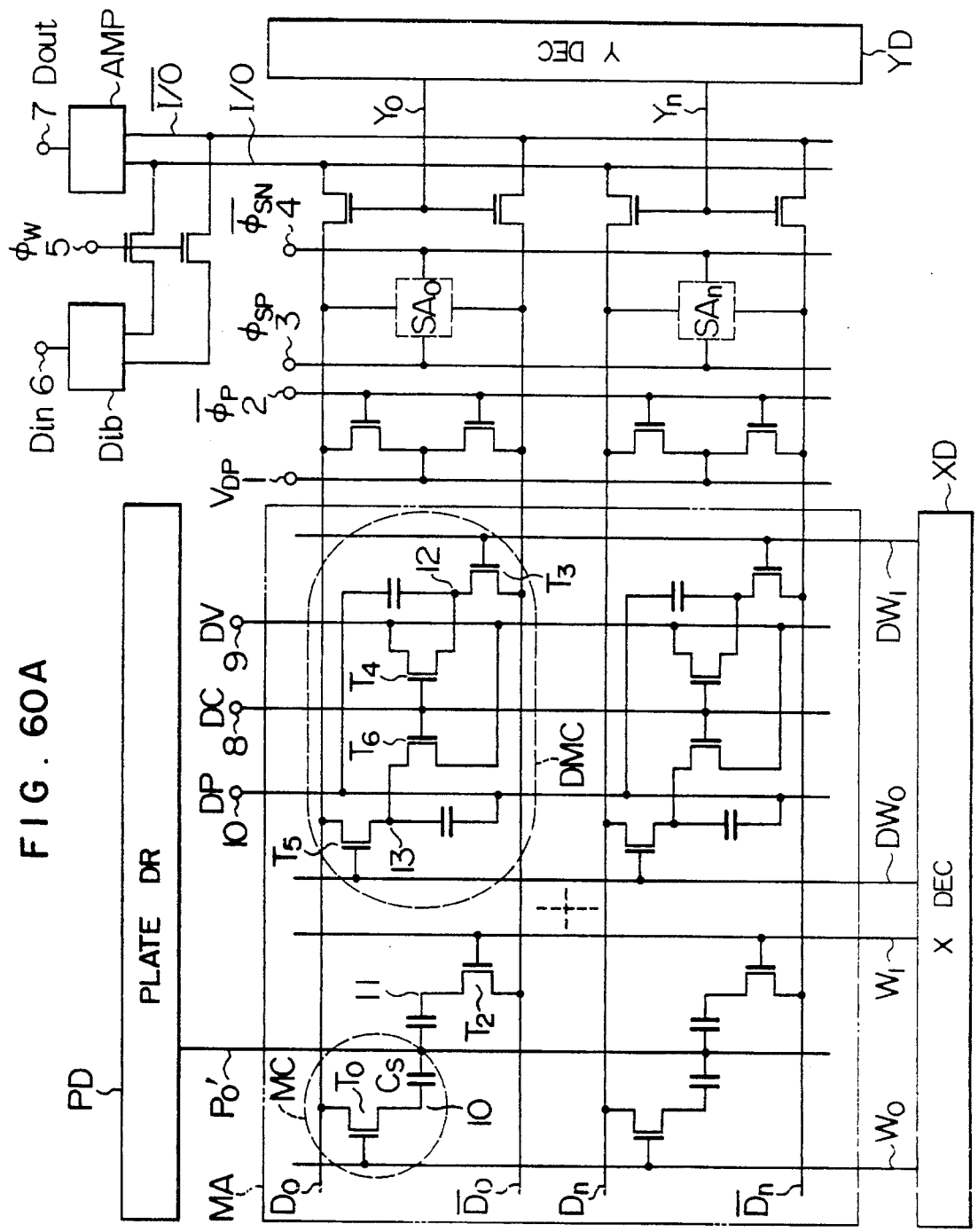
Figure 60B:
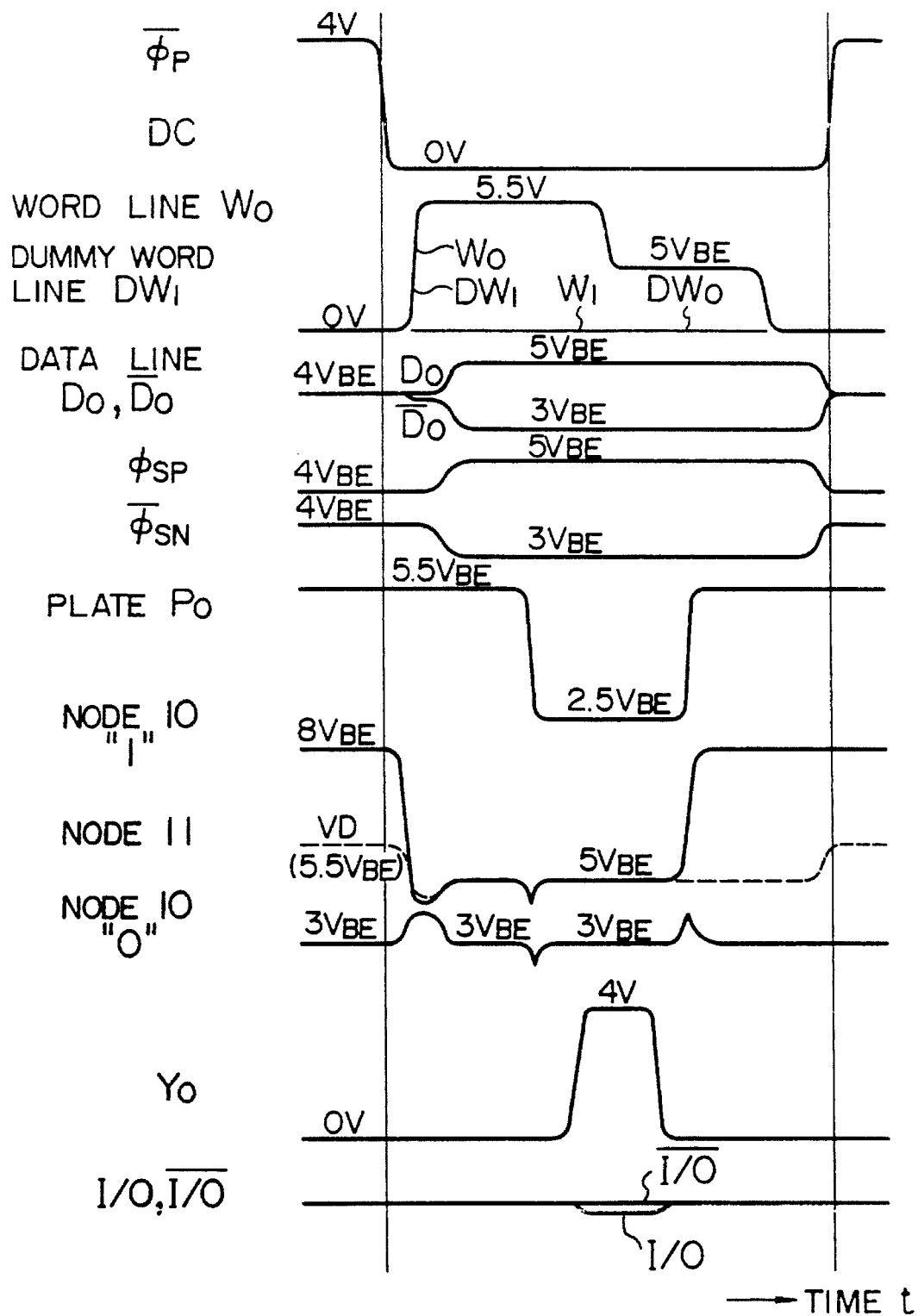

The read operation of the circuit shown in FIG. 60A will be explained with reference to a waveform chart shown in FIG. 60B. While the data line precharge signal $\overline{\phi}_p$ is 4 V, the data lines D0, $\overline{D0}$ (Dn, $\overline{Dn}$) are precharged at 4 $V_{BE}$ (3.2 V). Then, the sense amplifier driving signals $\phi_{SP}$ and $\overline{\phi}_{SN}$ are 4 V and the sense amplifiers SA0 to SAn are in the OFF state. After $\overline{\phi}_p$ has been changed to 0 V, one of the word lines is selected. Now it is assumed that the word line W0 has been selected. When W0 is changed from 0 V to 5.5 V, a memory cell signal appears at each data line. Now it is assumed that the memory cells connected with the word line W0 have stored a signal at a high potential level (8 $V_{BE}$). Therefore, read from the dummy cells is '1' information on D0, Dn and is '0' information on $\overline{D0}$, $\overline{Dn}$. Next, when $\phi_{SP}$ is changed from 4 V to 5 V, and $\overline{\phi}_{SN}$ is changed from 4 V to 3 V, the sense amplifiers SA0 to SAn operate to amplify the memory signals. Thus, the data line D0 becomes 5 V and the data line $\overline{D0}$ becomes 3 V. Thereafter, a pair of the data lines is selected by the Y decoder YD. It is now assumed that D0 and $\overline{D0}$ are selected. Thus, the potential at the data line selection line Y0 becomes high so that the memory cell signal is read out to the data input/output lines I/O and $\overline{I/O}$. This signal is amplified by the output amplifier AMP to provide the Dout.

The rewrite operation of a signal into a memory cell will be explained. After the sense amplifier has been operated, D0 is at a high potential of 5 $V_{BE}$ and $\overline{D0}$ is a low potential of 3 $V_{BE}$. Then, the storage terminal 10 of the memory cell is at the high potential of 5 $V_{BE}$ like D0 since the word line W0 is at the high potential level. Then, the potential at the plate P0' is changed from 5.5 $V_{BE}$ (4.4 V) to 2.5 $V_{BE}$ (2 V). However, the potential on the data line and at the storage terminal are held 5 $V_{BE}$ by the sense amplifier and not varied. Thereafter, the potential on the word line W0 is lowered from 5.5 V to 5 $V_{BE}$. Then, assuming that the threshold voltage of a transistor constituting the memory cell is 1 V, both potentials of at the storage terminal 10 and on the data line D0 are 5 $V_{BE}$ and also that on the word line W0 is 5 $V_{BE}$ so that the transistor T0 is in the OFF state. Therefore, when the potential on the plate P0' is changed from 2.5 $V_{BE}$ to 5.5 $V_{BE}$, the potential at the storage terminal 10 is boosted from 5 $V_{BE}$ to about 8 $V_{BE}$ (6.4 V). Thus, the high potential of about 8 $V_{BE}$ is written in the memory cell.

On the other hand, the rewrite operation in the case where a signal at a low potential has been stored in the memory will be explained with reference to the waveform in the case where the terminal 10 in FIG. 40B is at a low potential. After the sense amplifier has been operated, both potentials on the data line D0 and at the storage terminal 10 are 3 $V_{BE}$. Therefore, even if the potential on the word line W0 is subsequently lowered from 5.5 V to 5 $V_{BE}$ (4 V), the transistor T0 constituting the memory cell is an ON state. Thus, even if the potential at the plate P0' is subsequently changed in any fashion, since the data line potential is fixed, the potential at the storage terminal 10 is held 3 $V_{BE}$. Accordingly, the low potential of 3 $V_{BE}$ is rewritten in the memory cell.

Meanwhile, in this embodiment, the potential of the memory cell connected with a non-selected word line is varied in its potential. Then, the behavior of a storage terminal 11 of the memory cells connected with a non-selected word line W1 will be explained. The operation in the case where a high potential has been stored at the storage terminal 11 is as follows. During the stand-by time of the memory, the plate P0 is at 5.5 $V_{BE}$ and the storage terminal 11 is at 8 $V_{BE}$. After the sense amplifier has amplified the memory signal, P0' becomes 2.5 $V_{BE}$ and then the storage terminal 11 becomes 5 $V_{BE}$. Then, the word line W1 becomes 0 V and the data line $\overline{D0}$ becomes 3 $V_{BE}$ so that a transistor T1 is never in the ON state and so the signal in the memory cell is not destroyed. Thereafter, the plate P0' becomes 5.5 $V_{BE}$ and the storage terminal 11 returns to 8 V.

The operation in the case where a low potential has been stored at the storage terminal 11 is as follows. During the stand-by time of the memory, the plate P0' is at 5.5 $V_{BE}$ and the storage terminal 11 is at 3 $V_{BE}$. After the sense amplifier has amplified the memory signal, P0' becomes 2.5 $V_{BE}$ and then the storage terminal 11 becomes 0 V. Then, the word line W1 becomes 0 V and the data line $\overline{D0}$ becomes 5 V so that a transistor T1 is never in the ON state and so the signal in the memory cell is not destroyed. Thereafter, the plate P0 becomes 5.5 $V_{BE}$ and the storage terminal 11 returns to 8 $V_{BE}$.

Thereafter, the potential on the word line W0 becomes 0 V to complete the rewrite operation. Subsequently, $\phi_{SP}$ and $\overline{\phi}_{SN}$ become 4 V. $\overline{\phi}_p$ becomes the high potential to precharge the data line to 4 V.

Figure 60C:
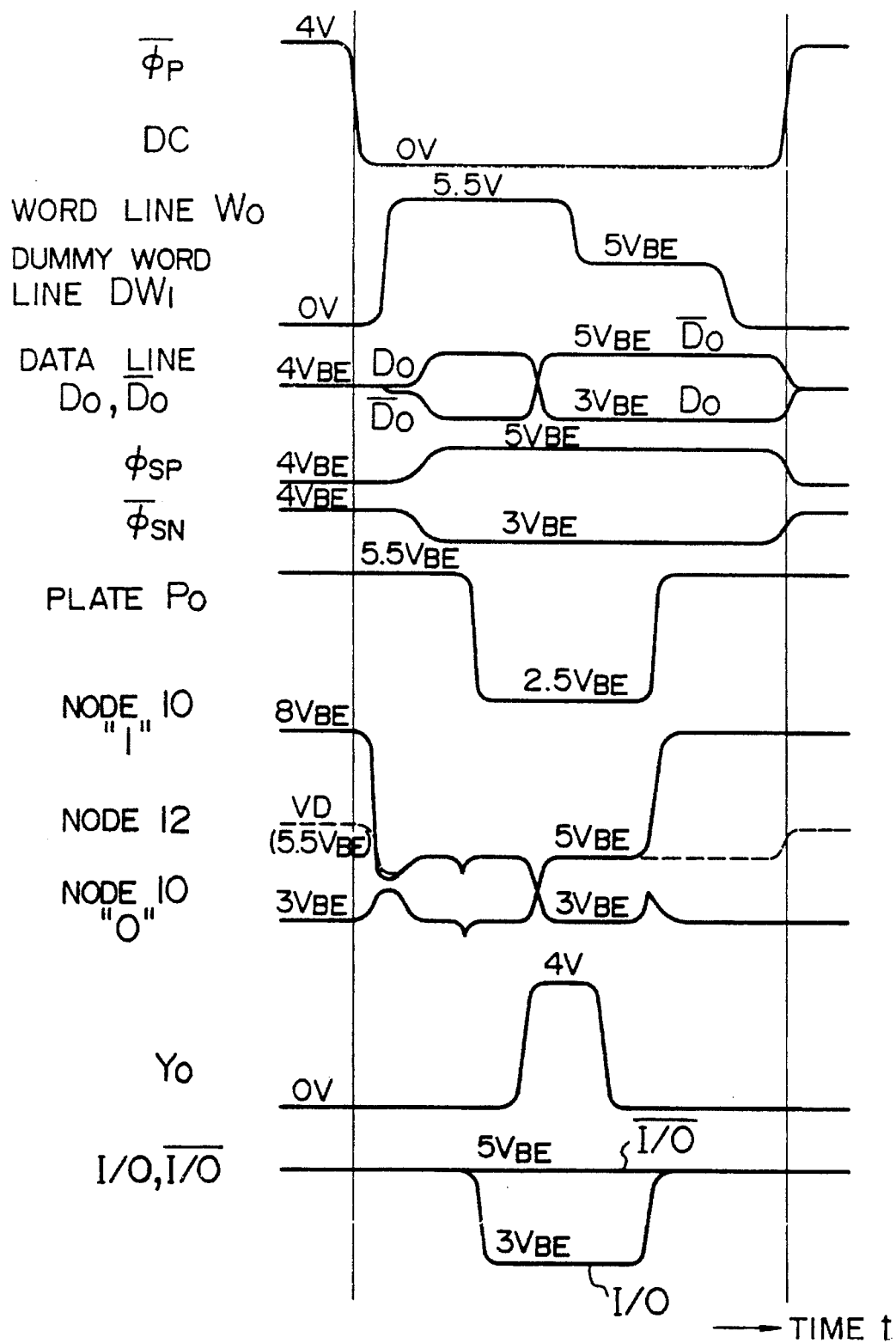

The write operation in the circuit shown in FIG. 60A will be explained with reference to the waveform chart of FIG. 60C. After memory cell signals have been amplified by the sense amplifiers as in the read operation, a write signal Din is fetched into a data input buffer DiB. When a write control signal becomes a high potential, the potentials on the input/output lines I/O and $\overline{I/O}$ are separated into a high potential and a low potential in accordance with Din. It is now assumed that I/O and $\overline{I/O}$ have become 3 $V_{BE}$ and 5 $V_{BE}$, respectively. Thereafter, a pair of data lines are selected by the Y decoder YD. It is now assumed that D0 and $\overline{D0}$ have been selected. Thus, the potential on the data line selection line Y0 becomes 4 V so that D0 and $\overline{D0}$ become 3 $V_{BE}$ and 5 $V_{BE}$, respectively. Accordingly, a low potential of 3 $V_{BE}$ is written at the storage terminal 10 of the memory cell. The operation after the signal has been written in the memory cell in the above manner is the same as the read operation as previously mentioned.

As understood from the description, also in accordance with this embodiment, the voltage amplitude of the data lines and that of the voltage to be written into the memory cells can be determined independently from each other. Therefore, the charging/discharging current for the data lines can be decreased and so power consumption of the memory can be reduced. Further, reduction of the voltage to be written into the memory cells due to decreasing of the voltage amplitude of the data lines is compensated for by the write operation from the plates. Therefore, the characteristics of data retention time and α-ray resistance soft error can be improved. Further, in this embodiment, dummy cells are provided so that the storage voltage can be freely controlled.

Therefore, the read-out signal amount of '1' or '0' can be controlled so that a memory having the characteristics of high α-ray soft error resistance, unvaried refresh and low power consumption can be designed. Moreover, the respective operation voltages such as the potential on the data lines are decided using as a standard the forward voltage between the base and the emitter of the bipolar transistor so that a memory LSI in which MOS-FETs and bipolar transistors are mixedly provided can be easily designed. Furthermore, since one plate is commonly provided for two word lines W0 and W1, the areas of the memory chip can be decreased.

In accordance with this embodiment, the voltage amplitude of the data lines in operating the sense amplifiers can be greatly decreased so that the data line charging/discharging current can be decreased, thereby reducing the power consumption in a memory cell array to ½ to ⅓ of the conventional memory cell array. Further, the memory cell signal at a high potential is boosted from the plate so that the memory cell signal can be increased. Accordingly, the present invention is efficient to implement the low power consumption in a memory and the high S/N thereof. More specifically, the present invention can improve the characteristics of data retention time, α-ray soft error resistance, noise reduction and reliability.

A further embodiment of the present invention will be explained with reference to FIG. 61 which shows a low power consumption memory chip and a power source for operating it. It should be noted that a battery is used as the power source.

Figure 61:
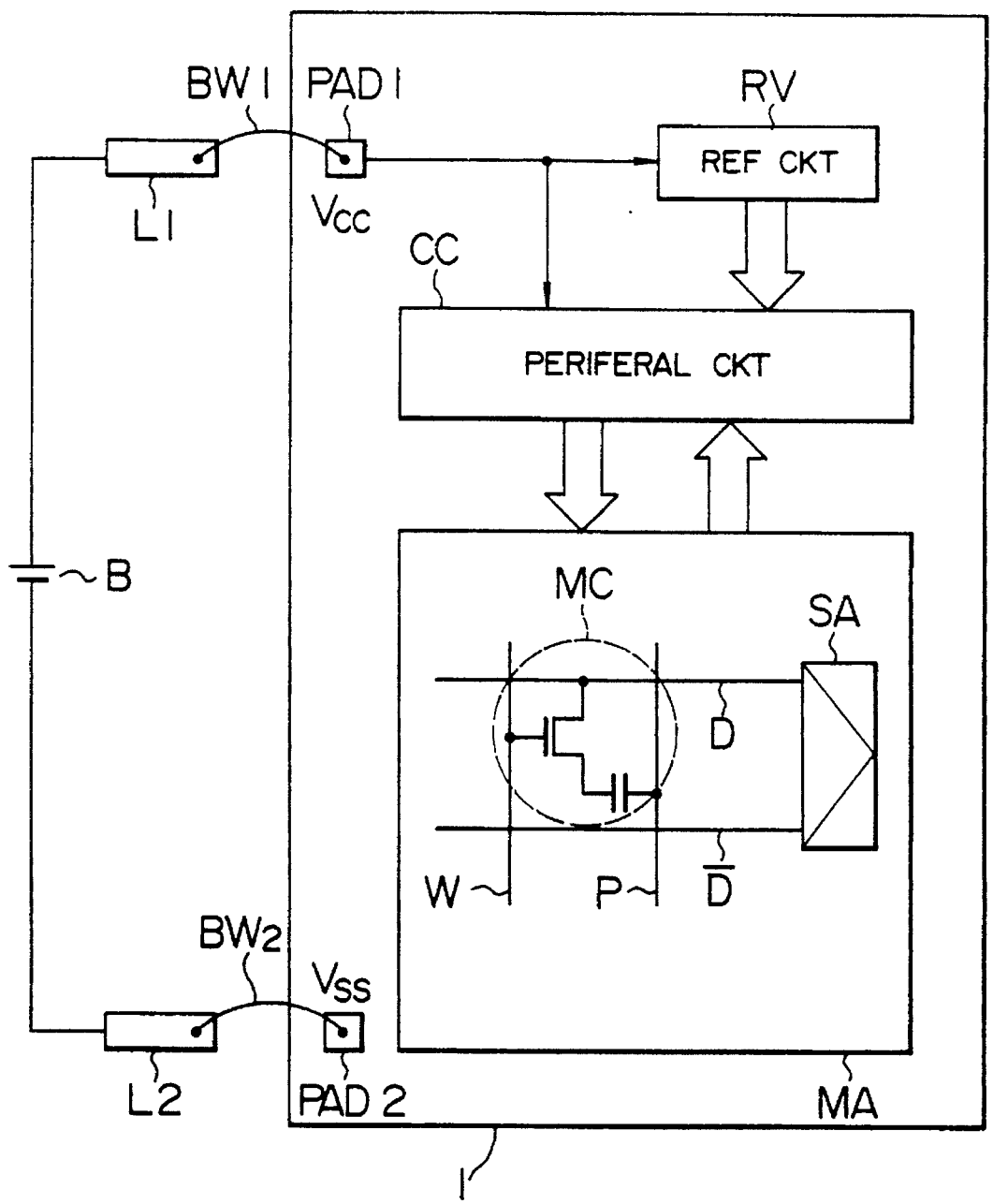

In FIG. 61, numeral 1 is a memory chip. MA is a memory array which is composed of memory cells MCs, data lines D, $\overline{D}$, word lines W, plate wirings P, sense amplifiers SA, etc. CC is a peripheral circuit which is composed of an input/output interface circuit and a circuit for generating a driving signal for the memory array. This peripheral circuit also include a voltage limiting circuit as disclosed in U.S. Pat. No. 4,482,985. RV is a reference voltage generating circuit which generate several kind of voltages between the power supply voltage and 0 V. This voltage is sent to the voltage limiting circuit which current-amplifies the voltage to provide a voltage to be used in the memory array. The reference voltage generating circuit is also disclosed in e.g. the above U.S. Pat. No. 4,482,985. PAD1 and PAD2 are bonding pads (only those for power sources ($V_{cc}$, $V_{ss}$) are shown). BW1 and BW2 are bonding wires, and L1 and L2 represent the schematic of package pins. B is a battery.

The peripheral circuit uses the voltage generated by the voltage limiting circuit and the voltage input from the outside of the chip. Decreasing the voltage amplitude of the pulse signals by the voltage limiting circuit intends to reduce power consumption in the memory chip. The memory array provides very large charging/discharging current on the data lines. The voltage amplitude of the data lines is set at a relatively large value for the purpose of assuring the charges to be stored in the memory cell. However, the charges stored in the memory cell is about 1/10 or less of the charge on the data line. Namely, most charges are not employed but consumed as useless charging/discharging current. Meanwhile, if the charges stored in the memory cell can be increased irrespectively of the voltage amplitude of the data lines, the voltage amplitude of the data lines may be decreased. Then, in accordance with this embodiment, the stored charges are increased irrespectively of the voltage amplitude of the data lines so as to decrease the voltage amplitude of the data lines, thereby reduce the power consumption in the memory. As a technique of increasing the stored charges, there are proposed a method of increasing the capacitance of the capacitor in the memory cell and a method of writing a memory cell signal into the memory cell selected by the word line from a plate thereby to increase the stored charges. By means of these methods, reduced power consumption can be realized while assuring sufficient stored charges.

In accordance with this embodiment, power consumption of DRAM can be greatly reduced. Thus, the characteristic of data retention can be improved and also noise can be reduced so that malfunction of DRAM can be obviated. Further, DRAM can be operated using a battery so that it can be widely applied to a portable device. Incidentally, although in this embodiment, a battery is used as a power source, the voltage produced from a commercially available power supply may be employed.

Figure 62A:
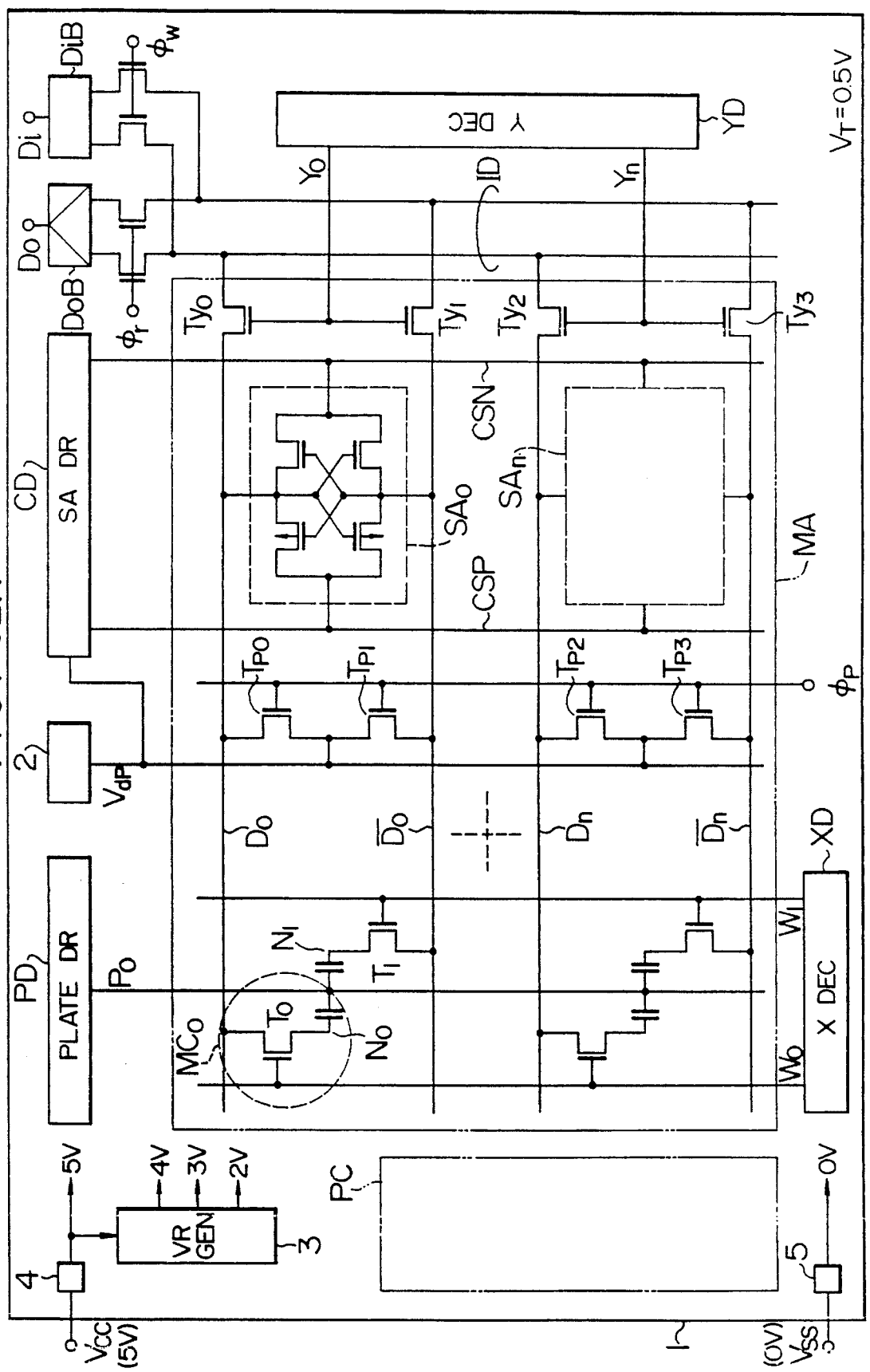
Figure 62B:
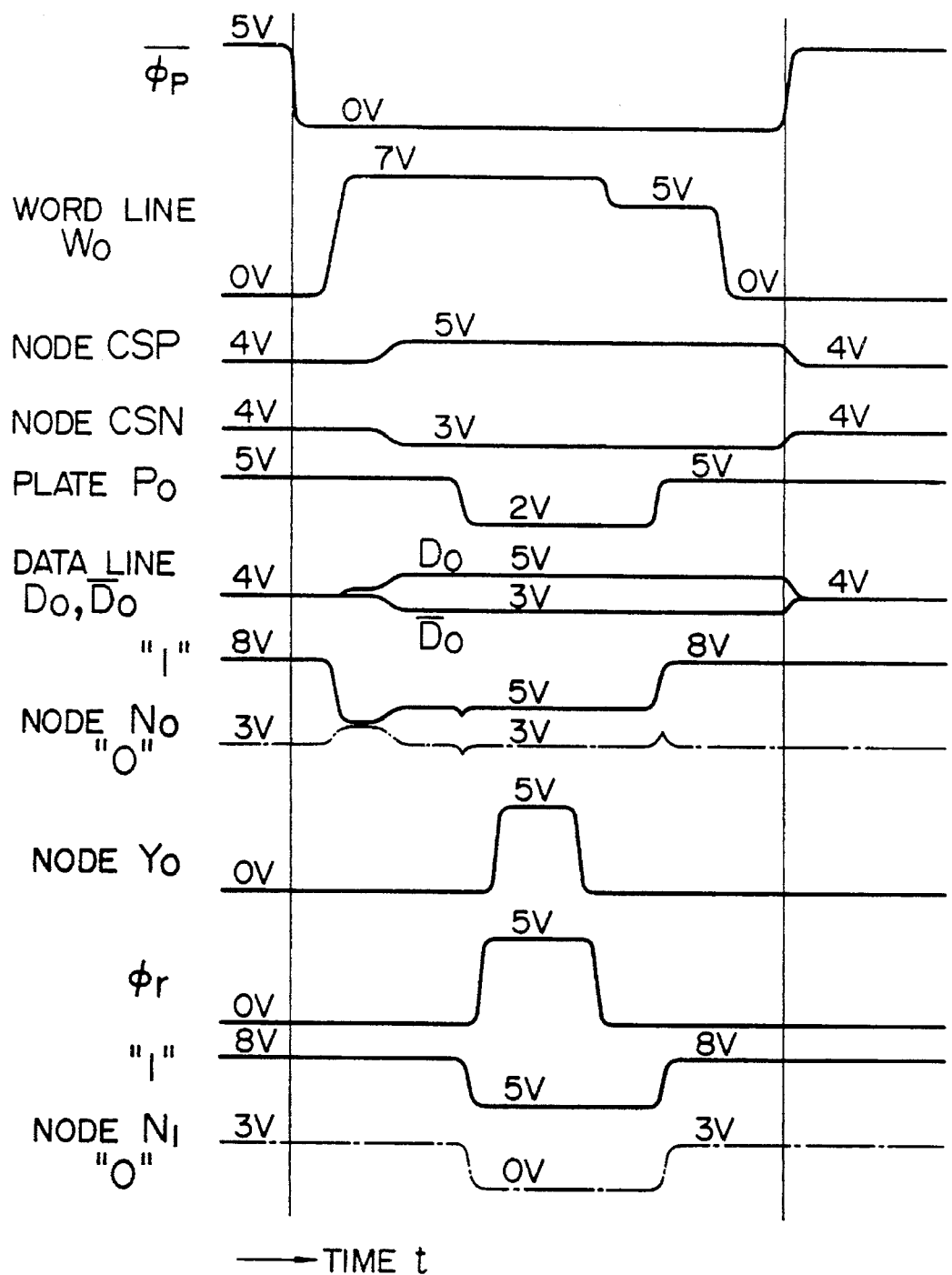

A further embodiment of the present invention will be explained with reference to FIGS. 62A and 62B. This embodiment is directed to a method of writing a memory cell signal from a plate thereby to decrease the data line voltage amplitude. FIG. 62A shows a memory chip in the case where 5 V is applied as a power supply voltage from the outside. Of MOS-FETs shown in FIG. 62, the MOS-FET with an arrow is a P channel MOS-FET (PMOS) and the MOS-FET with no arrow is an N channel MOS-FET (NMOS). It is assumed that the threshold voltage of MOS-FET is |0.5 V|. In FIG. 62A, numeral 1 is a memory chip. MA is a memory array which is composed of plural data lines D0, /D0 to Dn, /Dn, plural word lines W0, W1, . . . , a plate (plate wiring) P0, memory cells one MC0 of which is shown, sense amplifiers SA0 to SAn, data line precharging transistors Tp0 to Tp3, and switching transistors Ty0 to Ty3. Although only one plate wiring is shown, plural plates wirings are actually provided one for several to several tens word lines and selectively driven. XD is an X decoder which serves to select one of the plural word lines. YD is a Y decoder which serves to select one pair of the plural pairs of data lines. Y0 to Yn are output signal lines which conduct the corresponding output signals from the Y decoder. PD is a plate driving circuit which serves to selectively drive the plural plate wirings. Numeral 2 is a data line precharging voltage generating circuit which serves to generate a data line precharging voltage using a reference voltage produced by a reference voltage generating circuit. CD is a sense amplifier driving signal generating circuit which serves to drive the sense amplifiers through sense amplifier driving signal lines CSP and CSN. I/Os are data input/output lines each of which conducts the signal to be written into the corresponding memory cell and the signal read out from the corresponding memory cell. DOB is an output amplifier which serves to amplify the signal read out from the memory cell to provide an output signal Do. DiB is a data input buffer which serves to receive an input signal Di from the chip outside to produce the signal to be written into the memory cell. PC is a timing pulse generating circuit which serves to generate signals for controlling the above memory array, X decoder, Y decoder, sense amplifier driving signal generating circuit, etc. Numeral 3 is a reference voltage generating circuit which serves to generate several kinds of reference voltages to be used within the chip on the basis of a power supply voltage applied from the outside of the chip (In this embodiment, three kinds (4 V, 3 V and 2 V) of reference voltages are generated). This reference voltage generating circuit is disclosed in e.g. U.S. Pat. No. 4,482,985. Numerals 4 and 5 are bonding pads (only bonding pads for power supplies ($V_{cc}$, $V_{ss}$) are shown).

The read operation of the circuit shown in FIG. 62A will be explained with reference to the operation waveforms shown in FIG. 62B. Now, the read operation of a memory cell MC0 will be mainly explained.

While the data line precharge signal $\overline{\phi_p}$ is 5 V, the data lines are precharged at a data line precharge voltage Vdp (=4 V). Then, the sense amplifier signal lines CSP and CSN are also 4 V. Therefore, the sense amplifiers are in the OFF state. After $\overline{\phi_p}$ has been changed to 0 V, one of the word lines is selected by the X decoder. It is assumed that the word line W0 has been selected. When W0 becomes 7 V, a memory cell signal appears on each data line. Now, it is assumed that a signal (1) at a high potential level has been stored in the memory cell MC0. Therefore, the potential of the data line D0 becomes slightly higher than 4 V. Next, CSP and CSN are changed from 4 V to 5 V and to 3 V, respectively by the sense amplifier driving signal generating circuit CD. Thus, the sense amplifiers SA0 to SAn operate to amplify the memory signals. Then, the data line D0 becomes a high potential level of 5 V and the data line $\overline{D0}$ becomes a low potential of 3 V. Thereafter, the potential at the plate P0 is changed from 5 V to 2 V by the plate driving circuit PD. Then, the potential at the storage node N0 of each selected memory cell or that of the data line thereof varies through capacitive coupling, but the potential at each node is recovered to its previous level since it is held by the sense amplifier. Next, a pair of data lines are selected from the plural pairs of data lines by the Y decoder YD. It is now assumed that D0 and $\overline{D0}$ are selected. Thus, the potential of the data line selection line Y0 from the Y decoder becomes 5 V so that the memory cell signal is read out on the data input/output lines IOs. This signal is amplified by the output amplifier DOB to provide an output signal D0. Incidentally, on the contrary, in a write operation, an input signal taken by the data input buffer DiB is written in the memory cell by the data input/output lines and the data lines when Y0 becomes 5 V.

After the input and output of the memory cell signal has been performed in the above manner, the potential of the word line W0 becomes 5 V. Then, the storage node N0 of the memory cell MC0 is 5 V and the data line D0 is also 5 V so that the transistor T0 is in the OFF state. Next, the potential of the plate P0 varies from 2 V to 5 V. Thus, the storage node N0 of the memory cell MC0 is boosted from 5 V to about 8 V. Next, when the word line W0 becomes 0 V, 8 V is stored in the memory cell MC0. Thereafter, $\overline{\phi_p}$ becomes 5 V thereby to precharge the data lines. Also, CSP and CSN become 4 V.

In the case where a signal at a low potential level ("0") has been stored in the memory cell MC0, after the sense amplifier has been operated, D0 and $\overline{D0}$ become 3 V and 5 V, respectively. Therefore, even when the potential of the word line W0 has become 5 V, the transistor T0 in the memory cell MC0 remains ON. Thereafter, when the plate P0 varies from 2 V to 5 V, the potential at the storage node N0 of the memory cell MC0 is slightly increased, but it is returned to 3 V since it is held by the sense amplifier. Thereafter, when the word line W0 becomes 0 V, 3 V is stored in the memory cell MC0.

Meanwhile, in this embodiment, the plate potential of a non-selection memory cell is also varied, whereby the potential at the storage node of the non-selection memory cell is varied. This will be explained with respect to the potential change at a node N1. Assuming that the signal at the high potential level ('1') has been stored at the storage node N1, during the stand-by time of the memory, N1 is 8 V. Thereafter, when the plate P0 varies in the sequence of 5 V-2 V-5 V, N1 varies in the sequence of 8 V-5 V-8 V. Then, W1 is 0 V and D0 is 5 V or 3 V and so the transistor T1 of the memory cell is in the OFF state so that any problem does not occur. On the other hand, assuming that the signal at the low potential level (0) has been stored at the storage node N1; during the stand-by time of the memory, N1 is 3 V. Thereafter, when the plate P0 varies in the sequence of 5 V-2 V-5 V, N1 varies in the sequence of 3 V-0 V-3 V. Then, W1 is 0 V and D0 is 5 V or 3 V and so the transistor T1 of the memory cell is in the OFF state so that any problem does not occur. In this way, by boosting the lower potential level of the memory cell, erroneous selection of the non-selection memory cell due to the potential change of the plate can be prevented.

As understood from the above description, also in accordance with this embodiment, the voltage amplitude of the data lines and that of the voltage to be written into the memory cells can be determined independently from each other. Therefore, by decreasing the charging/discharging current for the data lines which provide a large parasitic capacitance and also a large charging/discharging current and increasing the voltage amplitude of the plates which provide a small parasitic capacitance, power consumption in the memory can be reduced while assuring a sufficient memory cell signal. In this case, setting the voltage amplitude of the data lines at a larger value than that of the plates is efficient to realize them. In this embodiment in which the data line voltage amplitude is 1 V, the charging/discharging current can be decreased to ⅕ of the conventional case where it is 5 V. The data line voltage amplitude may be decreased to the neighborhood of the threshold voltage of the MOS-FETs which constitute the sense amplifier, but it is desired to satisfy, in view of the stability of the operation, the condition, $|V_{tn}|+|V_{tp}|<\Delta Vd$ (Vtn: threshold voltage of NMOS, Vtp: threshold voltage of PMOS, Vd: data line voltage amplitude). The power consumption in driving the plate may be neglected in e.g. a memory array of 256 word lines×1024 data line pairs since the capacitance charged/discharged at a time is as small as 200 to 300 pF for the data line and 2 to 3 pF for the plate.

Further, in accordance with this embodiment, the precharging potential of the data line is set at an intermediate level between the high potential and the low potential of the data line voltage amplitude. Thus, the power consumption can be further reduced. Moreover, a capacitor in each memory cell is generally made using a thin oxide film. Correspondingly, in this embodiment, the plate potential is set, during the stand-by time of the memory, at an intermediate level between two storage potential level used in the memory cell. Therefore, the electric field applied to the capacitor of the memory cell is made small, thereby improving the reliability of the memory. Further, in this embodiment, the memory cell signal is larger on the high potential side than the low potential side so that the characteristics of data retention and α-ray soft error resistance can be improved.

Figure 63A:
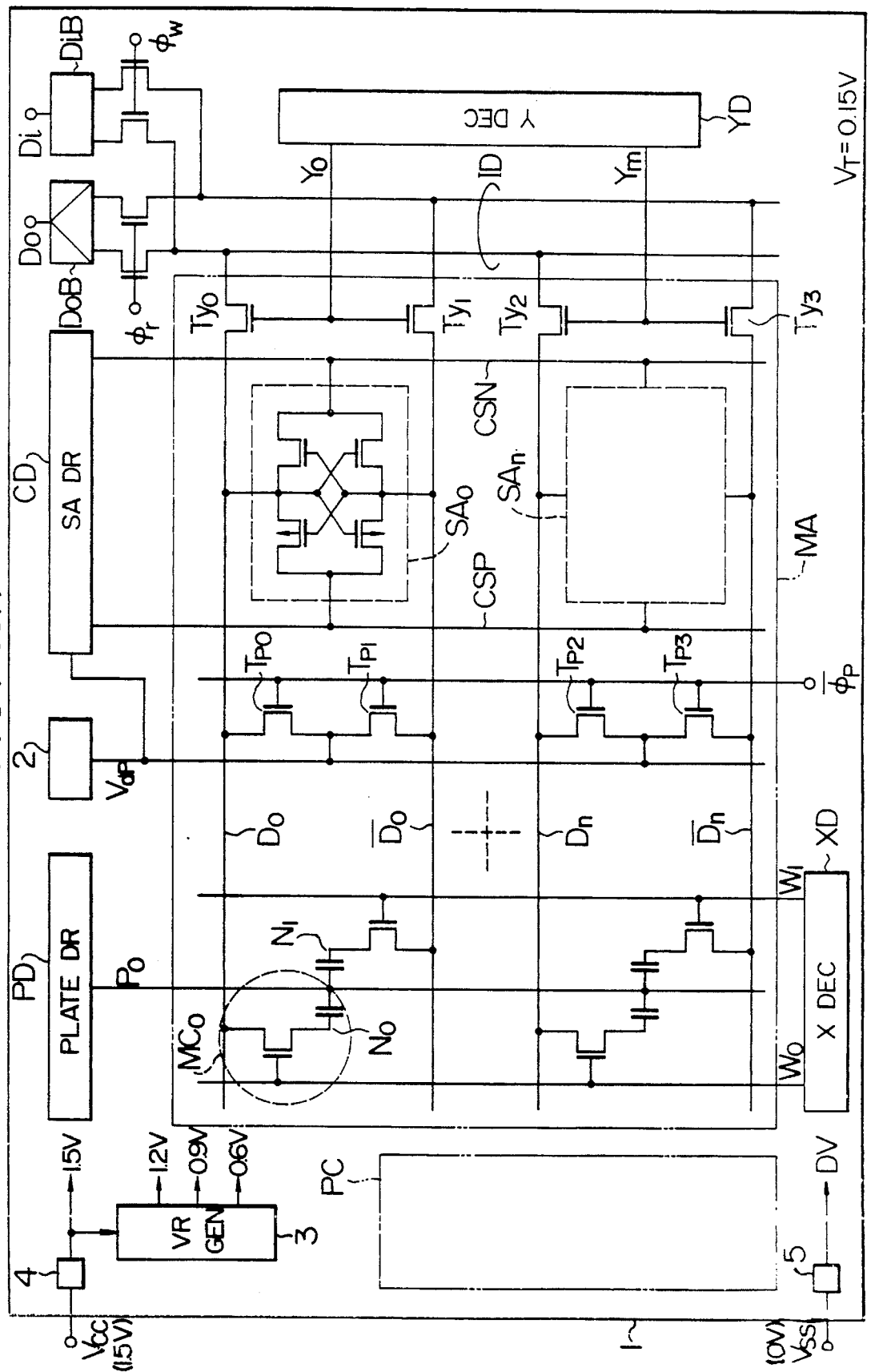
Figure 63B:
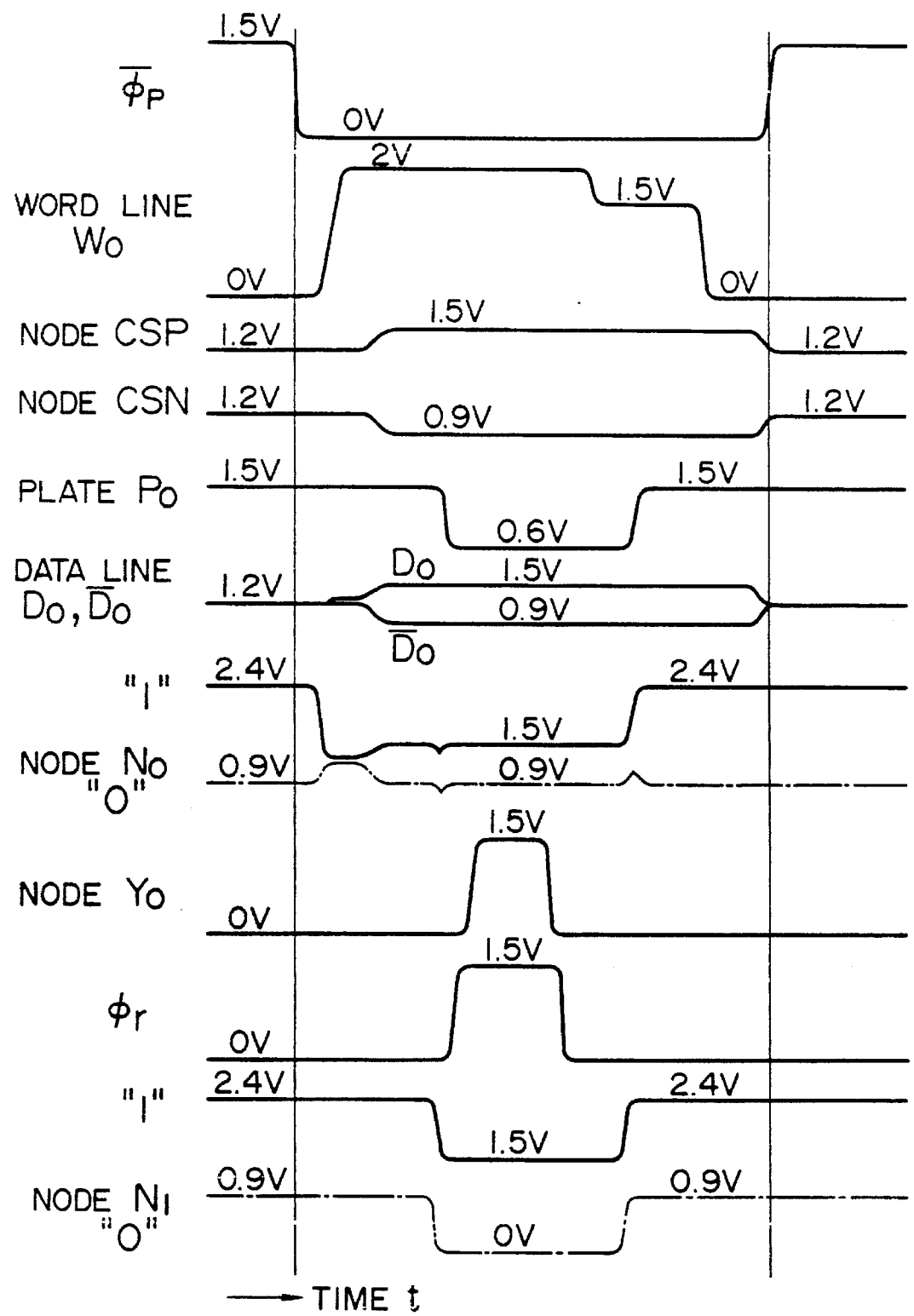

A further embodiment of the present invention will be explained with reference to FIGS. 63A and 63B. This embodiment is also directed to a method of writing a memory cell signal from a plate thereby to decrease the data line voltage amplitude. FIG. 63A shows a memory chip in the case where 1.5 V is applied as a power supply voltage ($V_{cc}$). Although the circuit arrangement of FIG. 63A is the same as that of FIG. 62A, the operation voltages therein are different from the latter. Therefore, three kinds of reference voltages of 1.2 V, 0.9 V and 0.6 V which are generated from the reference voltage generating circuit 3 are used. Like reference symbols in FIG. 63A refer to like elements in FIG. 62A. The threshold voltage of MOS-FET is set at |0.15 V|.

The read operation of the circuit shown in FIG. 63A will be explained with reference to the operation waveforms shown in FIG. 63B. Now, the read operation of a memory cell MC0 will be mainly explained.

While the data line precharge signal $\overline{\phi_p}$ is 1.5 V, the data lines are precharged at a data line precharge voltage Vdp (=1.2 V). Then, the senser amplifier signal lines CSP and CSN are also 1.2 V. Therefore, the sense amplifiers are in the OFF state. After $\overline{\phi_p}$ has been changed to 0 V, one of the word lines is selected by the X decoder. It is assumed that the word line W0 has been selected. When W0 becomes 2 V, a memory cell signal appears on each data line. Now, it is assumed that a signal ('1') at a high potential level has been stored in the memory cell MC0. Therefore, the potential of the data line D0 becomes slightly higher than 1.2 V. Next, CSP and CSN are changed from 1.2 V to 1.5 V and to 0.9 V, respectively by the sense amplifier driving signal generating circuit CD. Thus, the sense amplifiers SA0 to SAn operate to amplify the memory signals. Then, the data line D0 becomes a high potential level of 1.5 V and the data line $\overline{D0}$ becomes a low potential of 0.9 V. Thereafter, the potential at the plate P0 is changed from 1.5 V to 0.6 V by the plate driving circuit PD. Then, the potential at the storage node N0 of each selected memory cell or that of the data line thereof varies through capacitive coupling, but the potential at each node is recovered to its previous level since it is held by the sense amplifier. Next, a pair of data lines are selected from the plural pairs of data lines by the Y decoder YD. It is now assumed that D0 and $\overline{D0}$ are selected. Thus, the potential of the data line selection line Y0 from the Y decoder becomes 1.5 V so that the memory cell signal is read out on the data input/output lines IOs. This signal is amplified by the output amplifier DOB to provide an output signal $D_O$. Incidentally, on the contrary, in a write operation, an input signal taken by the data input buffer DiB is written in the memory cell by the data input/output lines and the data lines when Y0 becomes 1.5 V.

After the input and output of the memory cell signal has been performed in the above manner, the potential of the-word line W0 becomes 1.5 V. Then, the storage node N0 of the memory cell MC0 is 1.5 V and the data line D0 is also 1.5 V so that the transistor T0 is in the OFF state. Next, the potential of the plate P0 varies from 0.6 V to 1.5 V. Thus, the storage node N0 of the memory cell MC0 is boosted from 1.5 V to about 2.4 V. Next, when the word line W0 becomes 0 V, 2.4 V is stored in the memory cell MC0. Thereafter, $\overline{\phi_p}$ becomes 1.5 V thereby to precharge the data lines. Also, CSP and CSN become 1.2 V.

In the case where a signal at a low potential level ('0') has been stored in the memory cell MC0, after the sense amplifier has been operated, D0 and $\overline{D0}$ become 0.9 V and 1.5 V, respectively. Therefore, even when the potential of the word line W0 has become 1.5 V, the transistor T0 in the memory cell MC0 remains ON. Thereafter, when the plate P0 varies from 0.6 V to 1.5 V, the potential at the storage node N0 of the memory cell MC0 is slightly increased, but it is returned to 0.9 V since it is held by the sense amplifier. Thereafter, when the word line W0 becomes 0 V, 0.9 V is stored in the memory cell MC0.

Meanwhile, also in this embodiment, the plate potential of a non-selection memory cell is also varied, whereby the potential at the storage node of the non-selection memory cell is varied. This will be explained with respect to the potential change at a node N1. Assuming that the signal at the high potential level (1) has been stored at the storage node N1, during the stand-by time of the memory, N1 is 2.4 V. Thereafter, when the plate P0 varies in the sequence of 1.5 V-0.6 V-1.5 V, N1 varies in the sequence of 2.4 V-1.5 V-2.4 V. Then, W1 is 0 V and D0 is 1.5 V or 0.9 V and so the transitor T1 of the memory cell is in the OFF state so that any problem does not occur. On the other hand, assuming that the signal at the low potential level ('0') has been stored at the storage node N1, during the stand-by time of the memory, N1 is 0.9 V. Thereafter, when the plate P0 varies in the sequence of 1.5 V-0.6 V-1.5 V, N1 varies in the sequence of 0.9 V-0 V-0.9 V. Then, W1 is 0 V and D0 is 1.5 V or 0.9 V and so the transistor T1 of the memory cell is in the OFF state so that any problem does not occur. In this way, by boosting the lower potential level of the memory cell, erroneous selection of the non-selection memory cell due to the potential change of the plate can be prevented.

As understood from the description, also in accordance with this embodiment, the voltage amplitude of the data lines and that of the voltage to be written into the memory cells can be determined independently from each other. Therefore, by decreasing the charging/discharging current for the data lines which provide a large parasitic capacitance and also a large charging/discharing current and increasing the voltage amplitude of the plates which provide a small parasitic capacitance, power consumption in the memory can be reduced while assuring a sufficient memory cell signal. In this case, setting the voltage amplitude of the data lines at a larger value than that of the plates is efficient to realize them. In this embodiment in which the data line voltage amplitude is 1 V, the charging/discharging current can be decreased to ⅕ of the conventional case where it is 5 V. The data line voltage amplitude may be decreased to the neighborhood of the threshold voltage of the MOS-FETs which constitute the sense amplifier, but it is desired to satisfy, in view of the stability of the operation, the condition, $|V_{tn}|+|V_{tp}|<Vd$ (Vtn: threshold voltage of NMOS, Vtp: threshold voltage of PMOS, Vd: data line voltage amplitude).

Further, in accordance with this embodiment, the precharging potential of the data line is set at an intermediate level between the high potential and the low potential of the data line voltage amplitude. Thus, the power consumption can be further reduced. Moreover, a capacitor in each memory cell is generally made using a thin oxide film. Correspondingly, in this embodiment, the plate potential is set, during the stand-by time of the memory, at an intermediate level between two storage potential level used in the memory cell. Therefore, the electric field applied to the capacitor of the memory cell is made small, thereby improving the reliability of the memory. Further, in this embodiment, the memory cell signal is larger on the high potential side than the low potential side so that the characteristics of data retention and α-ray soft error resistance can be improved.

Further, in accordance with this embodiment, DRAM with a power supply voltage of 1.5 V and reduced power consumption can be realized. Therefore, DRAM which can be operated during both the stand-by and operation of a memory can be realized. Also, DRAM can be operated with a power supply voltage so that exchange between a normal power supply source and battery can be easily made. Thus, the application of DRAM can be extended.

Figure 64A:
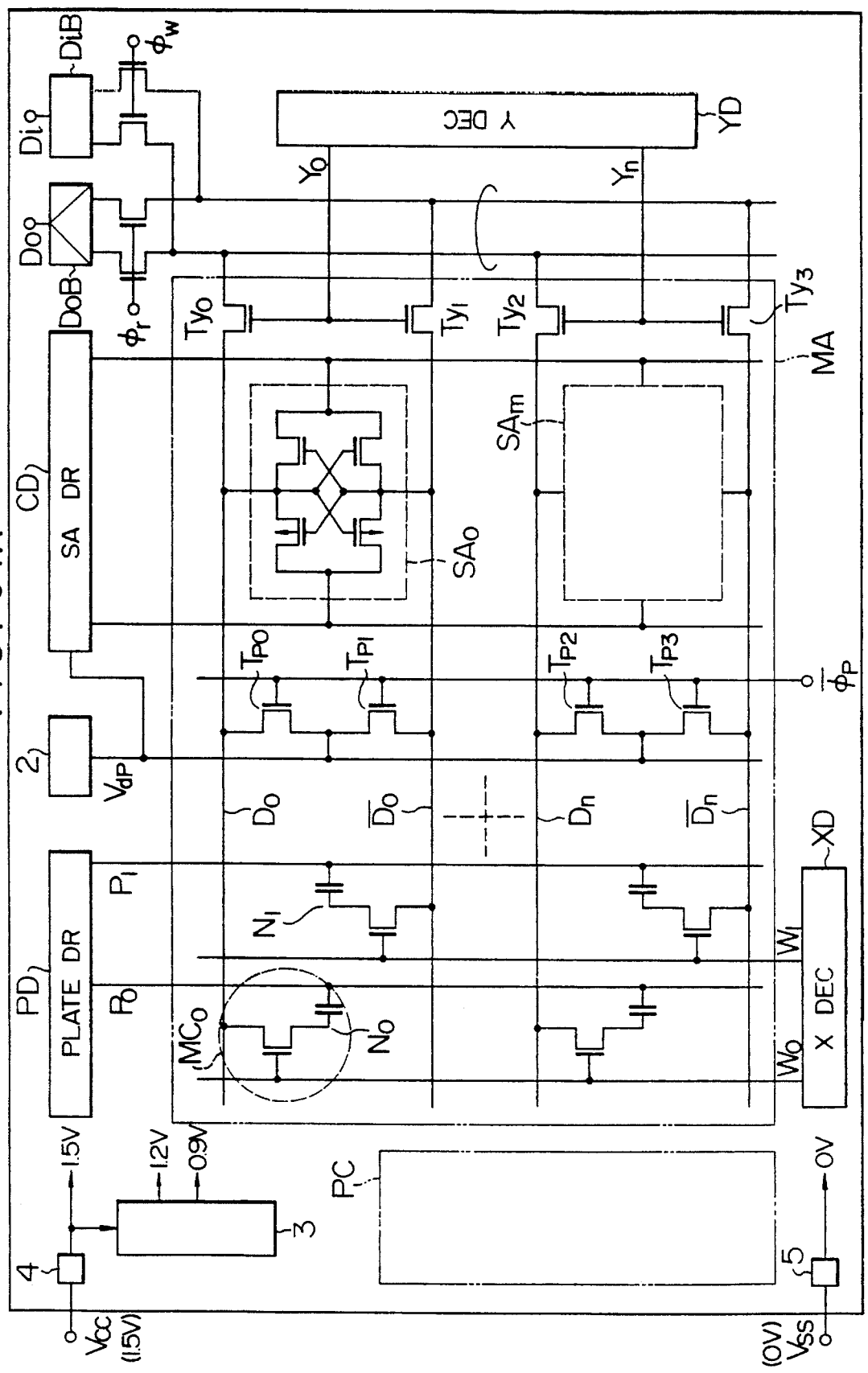

A further embodiment of the present invention will be explained with reference to FIGS. 64A and 64B. This embodiment is also directed to a method of writing a memory cell signal from a plate thereby to decrease the data line voltage amplitude. This embodiment is different from the embodiment of FIG. 63A in only that a plate wiring is provided for each word line. The other circuit arrangement and operation are the same as the embodiment of FIGS. 64A and 64B. In this embodiment, the plate wiring is provided for each word line so that even when the plate potential varies, the potential at the storage node of each memory cell connected with a non-selected word line does not vary. Namely, even when the voltage amplitude of the plate is made laerger than the voltage difference between the lower level side potential of a memory cell signal and 0 V, a non-selected memory cell will be not in the selection state. Therefore, the voltage to be written from the plate can be larger than in the embodiment of FIGS. 63A and 63B and so the voltage to be written in the memory cell is made larger than the power supply voltage. In this way, in accordance with this embodiment, the storage voltage in the memory cell can be further increased so that the characteristics of date retention and α-ray soft error resistance can be further improved. Thus, the power supply voltage can be easily decreased, which is efficient to operate a memory at a low voltage.

Figure 64B:
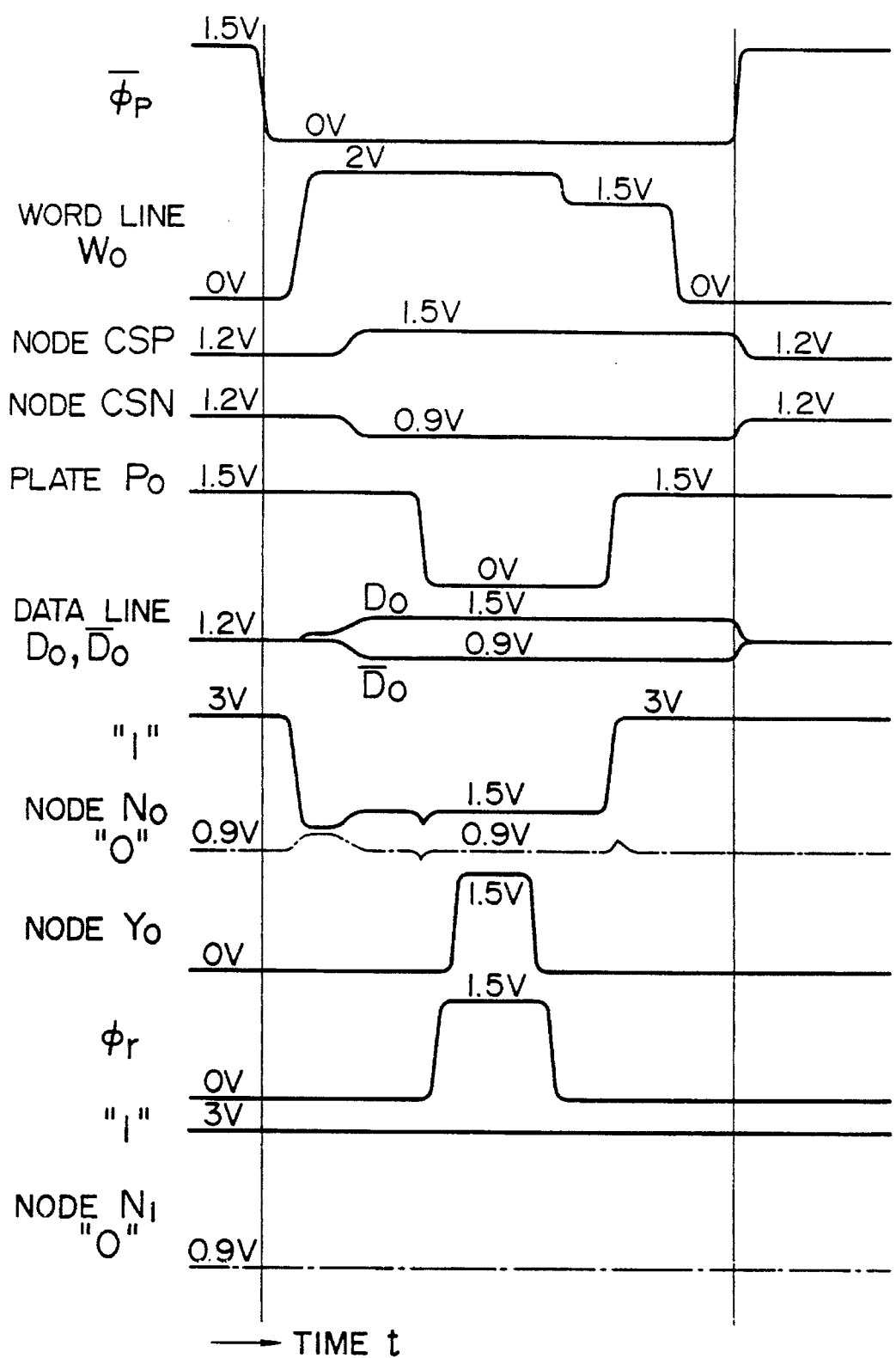

Incidentally, in the waveform shown in FIG. 64B, the low level side potential on the data line is set at a level higher than 0 V, but the low and high level potentials may be set at 0 V and 0.6 V, respectively. In this case, the intermediate level of the word line voltage is required to be decreased correspondingly.

FIGS. 65A to 69B show concrete examples of several controlling circuits for the memory arrays used in the embodiments of FIGS. 61A to FIG. 64B. Although these are directed to the case of a power supply voltage of 5 V, they may be applied to the case of a power supply voltage of 1.5 V as long as the voltage relation is correspondingly changed.

Figure 65A:
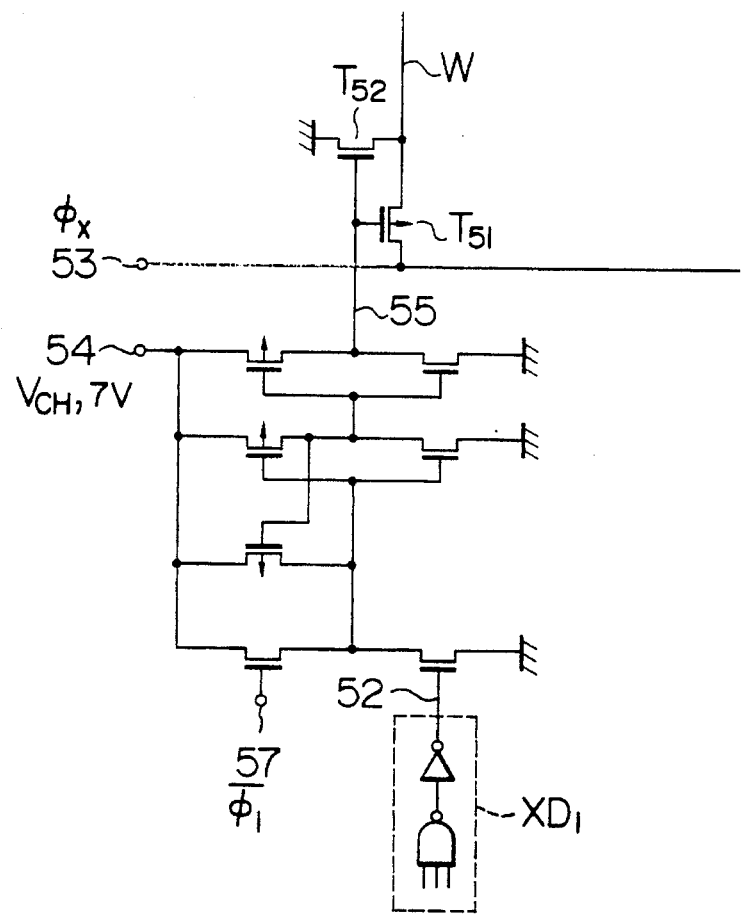

FIG. 65A shows a concrete circuit configuration of the X decoder. In FIG. 65A, XD1 is a decoder section which serves to select one word line in response to an address signal; W is a word line; numeral 54 is a node to which a voltage VCH of 7 V is applied; and x is a word line driving signal.

Figure 65B:
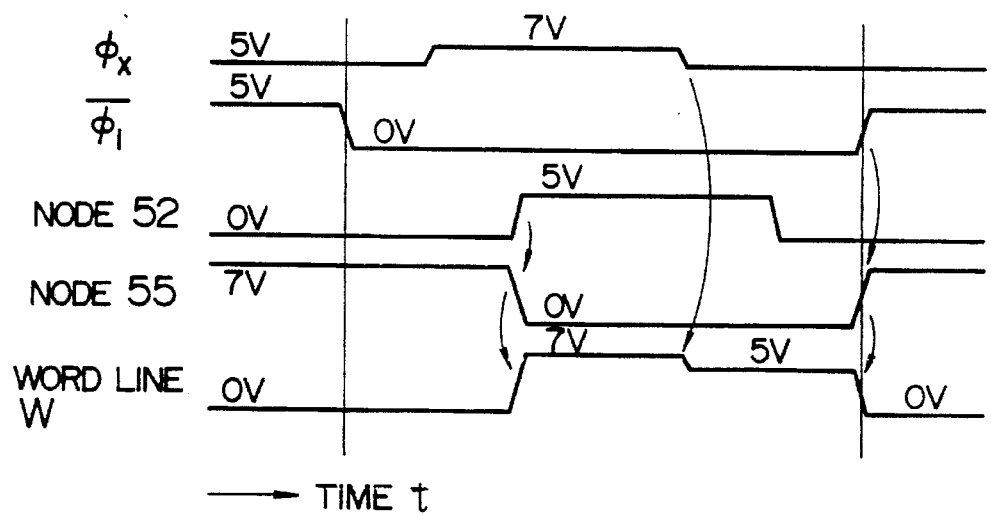

The operation of the circuit shown in FIG. 65A will be explained with reference to the operation waveforms shown in FIG. 65B. During the stand-by time of a memory, an output node of the decoder XD1 is 0 V. Then, a signal $\overline{\phi_1}$ is 5 V and a node 55 is 7 V. Therefore, a transistor T51 is the OFF state whereas a transistor T52 is the ON state, and so the word line W is 0 V. Now, it is assumed that after the signal $\overline{\phi_1}$ has become 0 V, an address signal is applied to the memory whereby the output node of the decoder XD1 becomes 5 V. Thus, the node 55 becomes 5 V, and so T51 and T52 are turned ON and OFF, respectively. Thus, the signal $\phi_x$ appears on the word line W. Then, $\phi_x$ is 7 V so that the word line becomes also 7 V. Thereafter, x lowers to 5 V so that the word line W becomes also 5 V. Further, when the node 52 of the decoder XD1 becomes 0 V and then the signal $\overline{\phi_1}$ becomes 5 V, the node 55 becomes 7 V so that the word line W returns to 0 V.

Figure 66A:
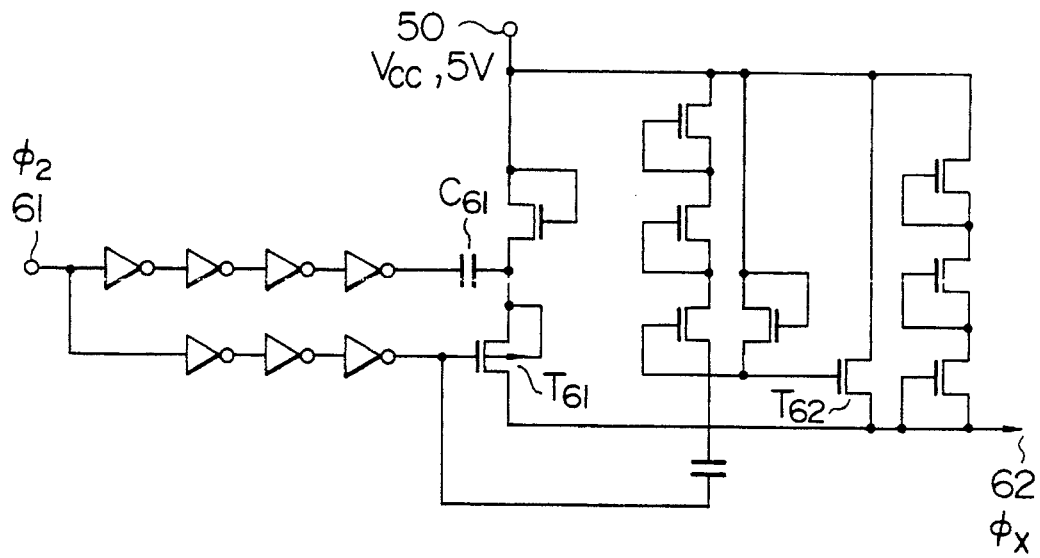
Figure 66B:
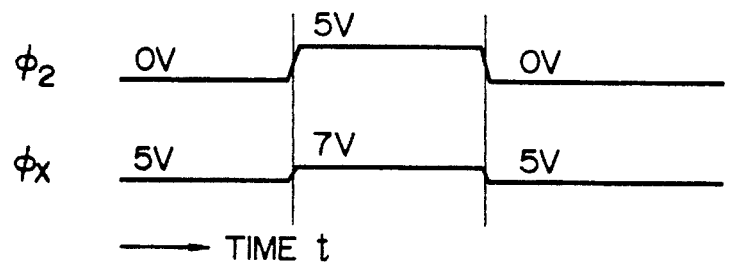

FIG. 66A shows a concrete configuration of the circuit for generating the word line driving signal used in the circuit of FIG. 65A. The operation of this circuit will be explained with reference to FIG. 66B. While a signal $\phi_2$ is 0 V, a transistor T62 is ON and a transistor T61 is OFF so that an output node 62 is 5 V. When $\phi_2$ becomes 5 V, T62 and T61 are turned ON and OFF, respectively so that the output node 62 is boosted to 7 V by a capacitor C61. Thereafter, when $\phi_2$ returns to 0 V, the node 62 also returns to 0 V. In this way, the $\phi_x$ signal is generated.

Figure 67:
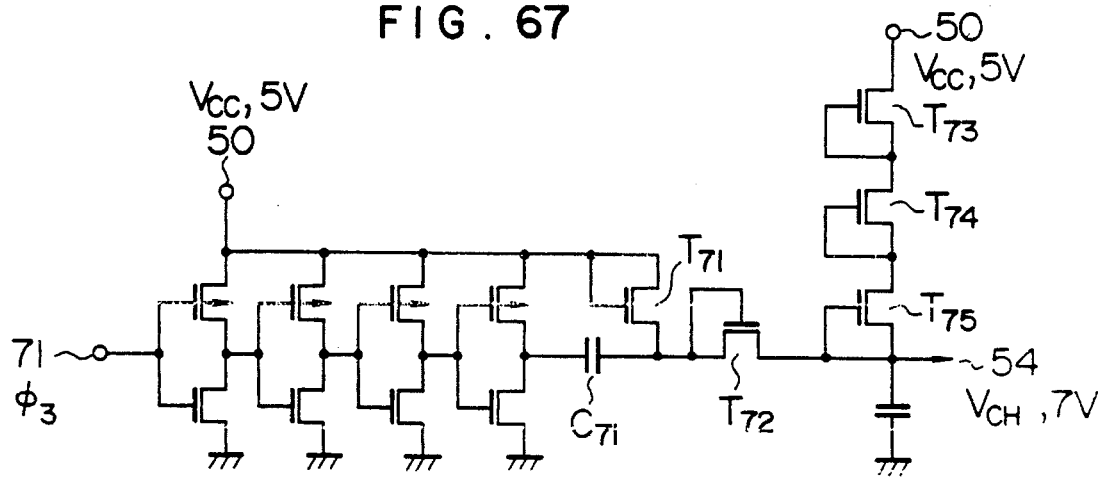

FIG. 67 shows a concrete configuration of the circuit for generating the voltage VCH of 7 V. As seen from the figure, this voltage is generated by rectifying a pulse signal 3 through capacitor C71 and transistors T71 and T72. The value of this voltage is decided by the threshold voltages of transistors T73, T74 and T75.

Figure 68A:
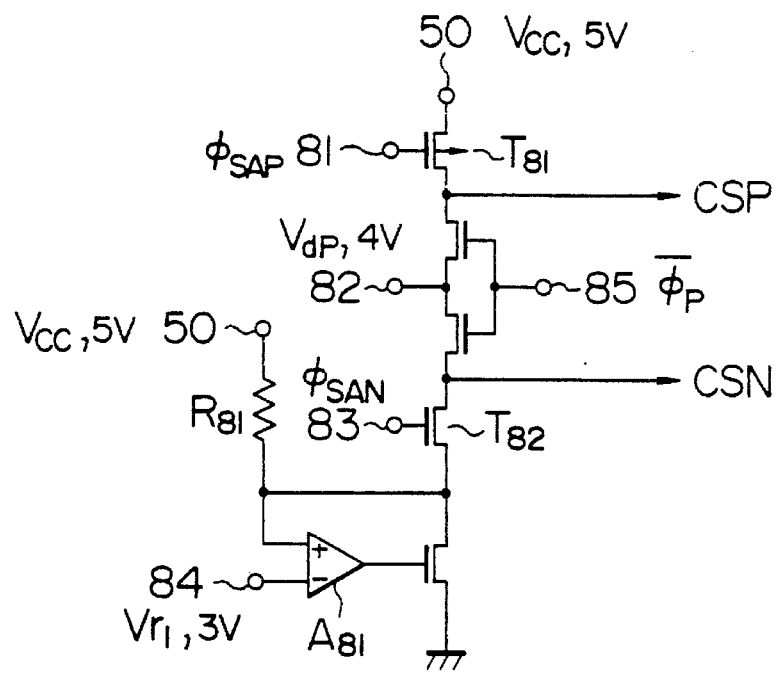

FIG. 68A shows a concrete configuration of the circuit for generating the sense amplifier driving signal. In FIG. 68A, CSP and CSN are a sense amplifier driving signal line, respectively. A81 is a differential amplifier. Vr1 is a reference voltage (3 V) generated by the reference voltage generating circuit (not shown). Vdp is a data line percharge voltage (4 V) which is generated on the basis of the reference voltage as mentioned previously.

Figure 68B:
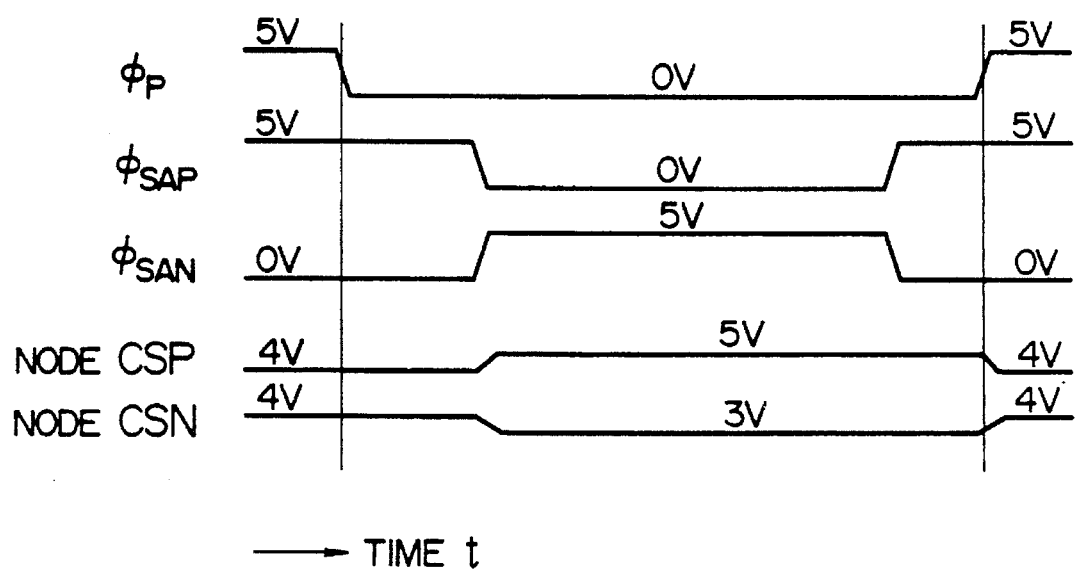

The operation of this circuit will be explained with reference to FIG. 68B. During the stand-by time of a memory, $\overline{\phi_p}$ is 5 V, $\phi_{sap}$ is 5 V and $\phi_{san}$ is 0 V so that CSP and CSN are precharged at 4 V. When $\overline{\phi_p}$ becomes 0 V, a word line is selected whereby a memory cell signal appears on a data line. Thereafter, $\phi_{sap}$ and $\phi_{san}$ become 0 V and 5 V, respectively. Thus, transistors T81 and T82 are turned ON so that CSP and CSN become 5 V and 3 V, respectively. Thereafter, $\phi_{sap}$ becomes 5 V, $\phi_{san}$ becomes 0 V and $\overline{\phi_p}$ becomes 5 V so that CSP and CSN are precharged at 4 V.

Figure 69A:
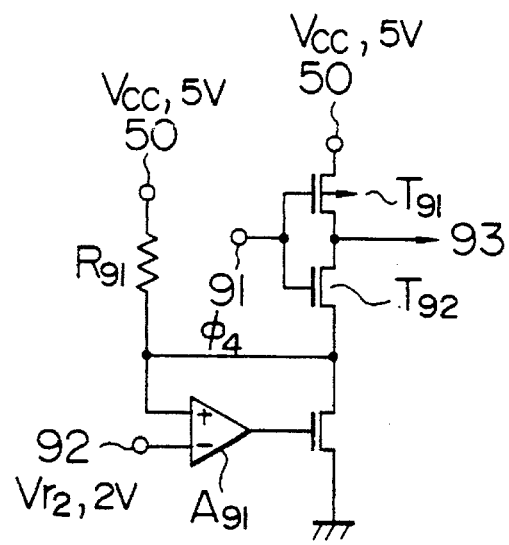
Figure 69B:
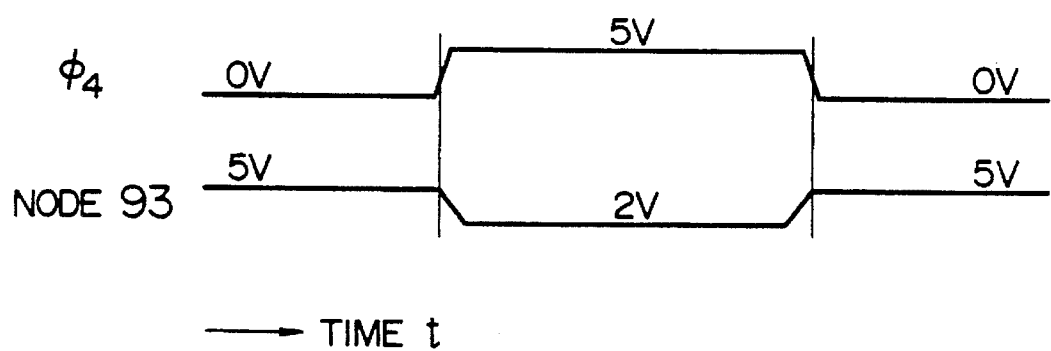

FIG. 69A shows a concrete configuration of the plate driving circuit. In FIG. 69A, A91 is a differential amplifier; Vr2 is a reference voltage (2 V) generated by the reference voltage generating circuit; and numeral 93 is an output node. The operation of this circuit will be explained referring to FIG. 69B. While $\phi_4$ is 0 V, a transistor T91 is ON and a transistor T92 is OFF so that the output is 5 V. When $\phi_4$ becomes 5 V, T91 and T92 are turned OFF and ON, respectively so that the output becomes 2 V. Thereafter, when $\phi_4$ becomes 0 V, the output returns to 5 V.

FIGS. 70A to 70D show embodiments of a memory chip which permits DRAM operating at a power supply voltage of 1.5 V to be operated also at the power supply voltage of 3 V.

Figure 70A:
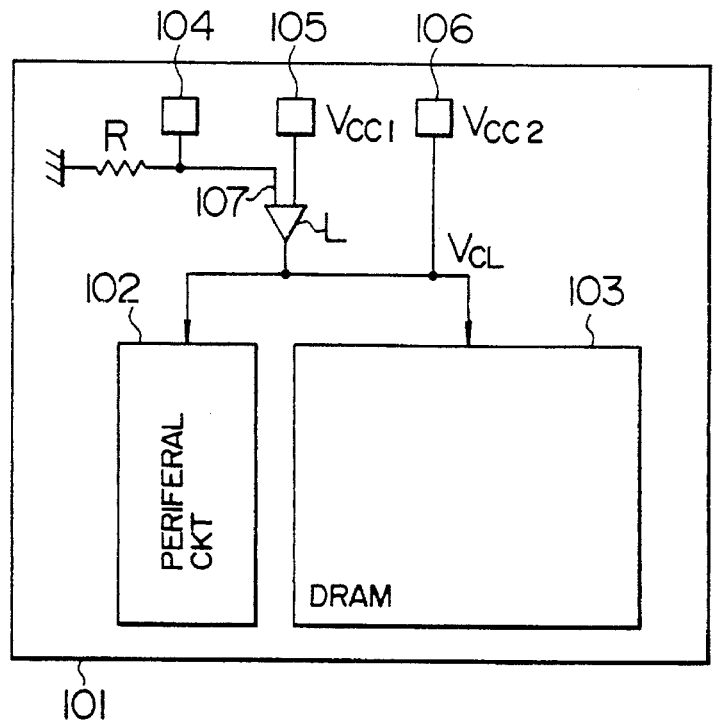

FIG. 70A shows a memory chip which permits DRAM to be exchanged between for 1.5 V and 3 V through the selective bonding of the chip in packaging it. In FIG. 70A, numeral 101 is a memory chip; and numeral 102 is a peripheral circuit which is composed of an input/output interface circuit and a circuit for generating timing pulses for controlling the memory array. The input/output interface circuit is disclosed in e.g. the data book for a 4-bit single chip microcomputer published by Nippon Electric Co., Ltd., pages 997–999. L is a voltage limiter which serves to drop the voltage input from the outside to 1.5 V (Vc1) for internal use. Numerals 104 to 106 are bonding pads (numerals 105 and 106 are for power supplies and numeral 104 is for control of the voltage limiter).

The manner of operating such a chip at a power supply voltage of 1.5 V is as follows. The bonding pad 106 is connected with a power supply pin for the package. It is assumed that when a node 107 is at a low level, the voltage limiter L is OFF to provide an output terminal with high impedance, and when a node 107 is at a high level, it is ON thereby to operate. Therefore, the bonding pad 104 is not connected with anywhere but is placed in the open state. Also the bonding pad 105 is placed in the open state. Thus, the voltage of 1.5 V is applied to the memory array 103 and the peripheral circuit 102. On the other hand, the manner of operating the chip at a power supply voltage of 3.3 V is as follows. The bonding pad 105 is connected with the power supply pin for the package. The bonding pad 104 is also connected with the power supply pin thereby to place the node 107 in the high level. Thus, the voltage limiter L becomes ON, The bonding pad 106 is placed in the open state. Thus, the voltage lowered to 1.5 V by the voltage limiter is applied to the peripheral circuit 102 and memory array 105.

In this way, in accordance with this embodiment, the circuits in the chip other than the input/output interface circuit are always operated at a fixed voltage so that the operation speed and power consumption can be held substantially constant. Such a memory chip is convenient to use for a user. Further, two kinds of products can be made from one chip so that the production cost of the memory chip can be reduced. Moreover, the products are classified according to the bondings so that the number of the products can be easily adjusted. Further, in this embodiment, the ON/OFF is switched according the bonding, but is may be switched by using fuse provided on the chip. Also, it may be controlled by using the result of a logic gate provided in the memory chip to which plural input signals to the memory chip are applied. Incidentally, the idea of this embodiment may be also applied to the other chip in which the circuits indicated by numerals 102 and 103 are a combination of a memory circuit and a logic circuit or only logic circuits.

Figure 70B:
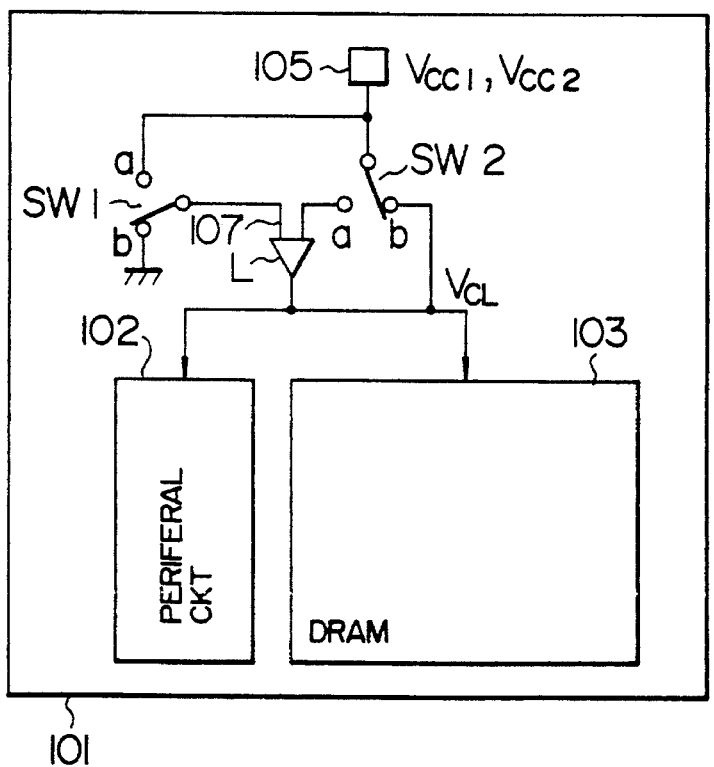

FIG. 70B shows an embodiment in the case where the above switching is carried out through the master-slice of aluminium (Al). In FIG. 70B, Al master-slice portions are represented by SW1 and SW2. In the case where the chip shown in FIG. 70B is to be operated at a power supply voltage of 1.5 V, both switches SW1 and SW2 are connected with their "b" side. Thus, the power supply voltage of 1.5 V is directly applied from the bonding pad of the power supply to the memory array 103 and peripheral circuit 102. The voltage limiter is OFF since the input node 107 is at the low level. On the other hand, in the case where the chip is to be operated at a power supply voltage of 3.3 V, both switches SW1 and SW2 are connected with their "a" side (as shown in FIG. 70B). Thus, the input node 107 is at the high level so that the voltage limiter becomes ON. Therefore, the voltage lowered to 1.5 V by the voltage limiter is applied to the memory array and peripheral circuit.

In this way, also in accordance with this embodiment, the circuits in the chip other than the input/output interface circuit are always operated at a fixed voltage so that the operation speed and power consumption can be held substantially constant. Such a memory chip is convenient to use for a user. Further, two kinds of products can be made from one chip so that the production cost of the memory chip can be reduced. Moreover, the products are classified according to the Al master-slice so that a small number of bonding pads are required thereby reducing the chip area.

Figure 70C:
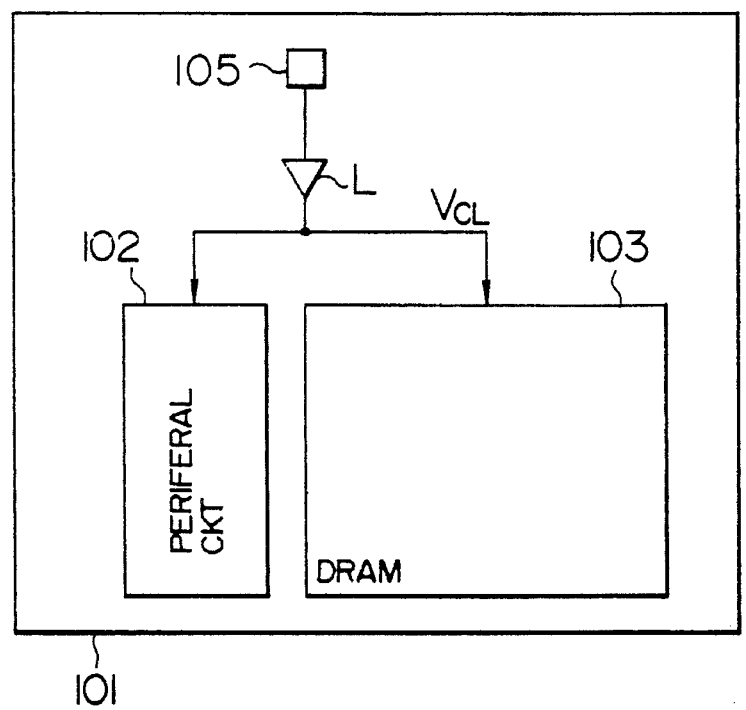
Figure 70D:
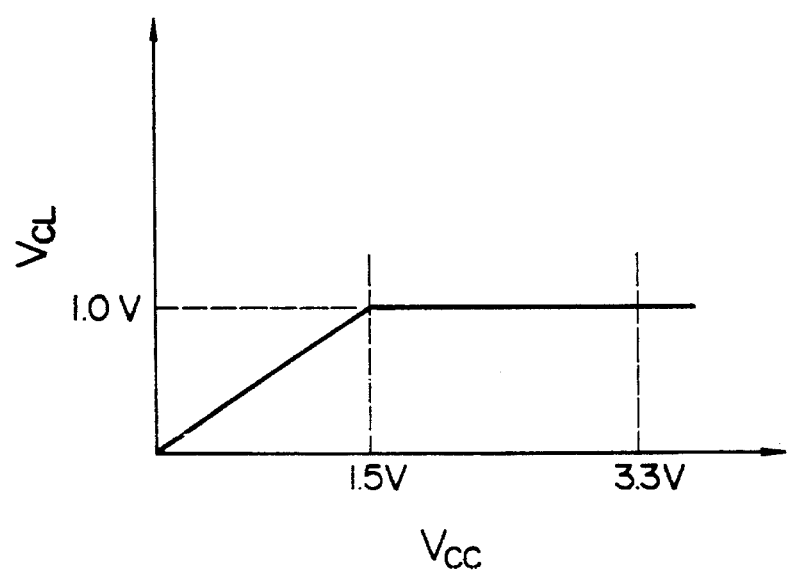

FIG. 70C shows an embodiment of the memory chip which can be used even when the power supply voltage is continuously varied in the range of 1.5 V to 3.3 V. In this embodiment, the characteristic of the voltage limiter as shown in FIG. 70D is adopted. Specifically, the output is fixed to 1.5 V even when the power supply voltage is varied from 1.5 V to 3.3 V. Also the memory array and the peripheral circuit are adapted to operate at 1 V.

In accordance with this embodiment, when the power supply voltage is varied in the range of 1.5 V to 3.3 V, the memory array and the peripheral circuit are operated at 1 V. Therefore, with any optional power supply voltage between 1.5 V and 3.3 V, the memory chip can be operated. The circuits in the chip are always operated at the fixed voltage of 1 V so that the operation speed and power consumption can be held substantially constant. Such a memory chip is convenient to use for a user. Further, the ON/OFF control of the voltage limiter is not required so that the chip arrangement can be simplified. Incidentally, in this embodiment, 1.5 V corresponds to one battery and 3.3 V corresponds to two batteries so that the memory chip can be operated using one battery or two batteries.

In accordance with this embodiment, the power consumption in DRAM can be greatly reduced. Particularly, the voltage amplitude of the data lines in operating the sense amplifiers can be greatly reduced as compared with the conventional case so that the charging/discharging current on the data line can be reduced. Further, the memory cell signal can be increased by rewriting it from a plate. Thus, the characteristics of data retention and α-ray soft error resistance of DRAM can be improved. Accordingly, reduced power supply voltage and reduced power consumption in DRAM can be realized so that DRAM can be operated using a battery(s).

Explanation will be given for several embodiments of improvements of the sense amplifier in their circuit configuration and operation which can assure the high speed operation of a memory at a relatively low power supply voltage (2 V or less). In the embodiments explained hereinafter, the sense amplifier is improved on the basic premise of a precharging system of precharging the potential on a data line at an intermediate level between the high potential and low potential appearing on the data line (simply called "half precharge system") in which with the high potential of a power supply voltage of $V_{cc}$ and the low potential of 0 V, the data line is precharged at ½ $V_{cc}$.

Figure 71A:
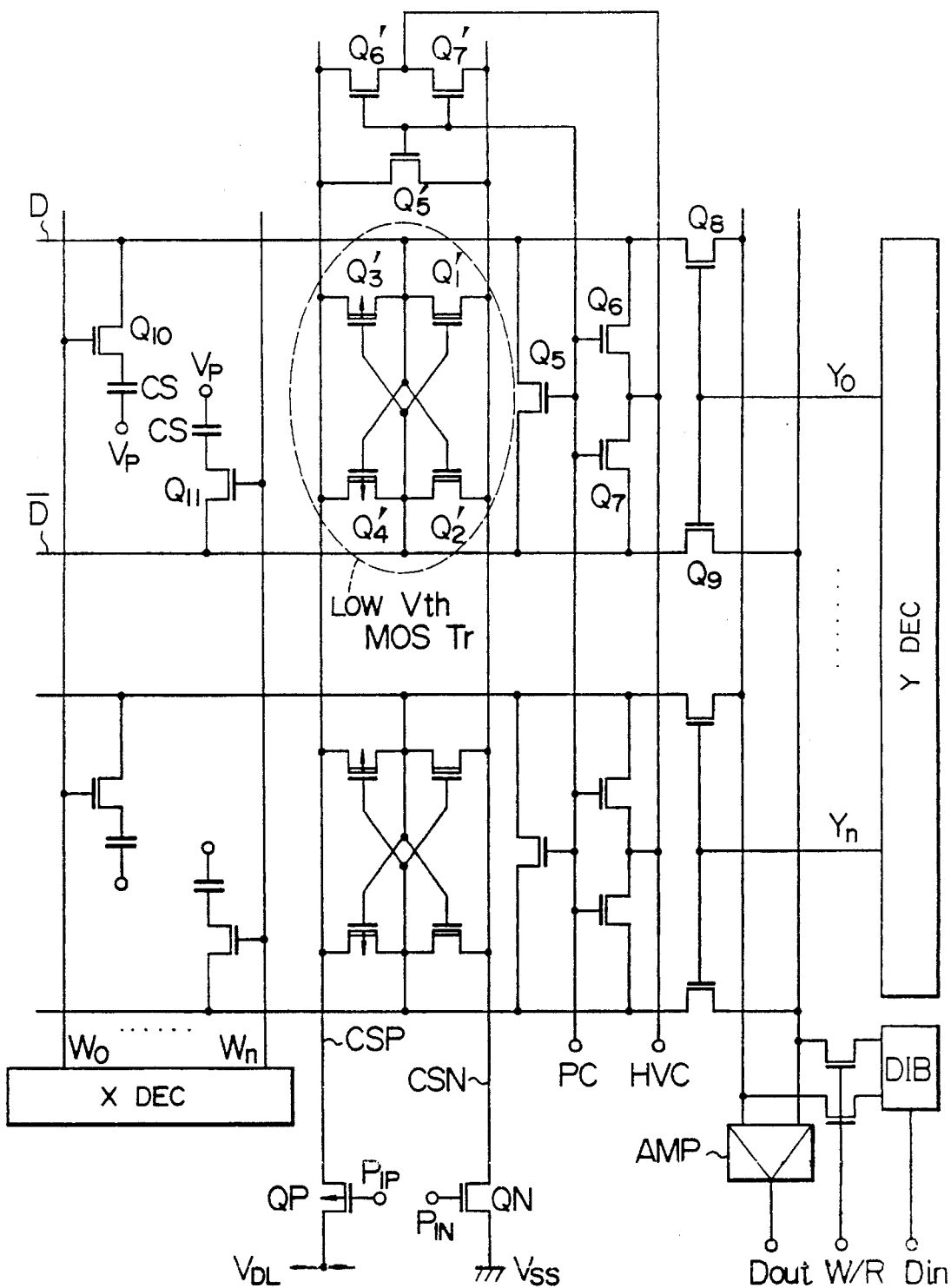
FIGS. 71A to 78C are views showing embodiments relative to a sense amplifier, etc. used in the dynamic RAM of the present invention.
Figure 71B:
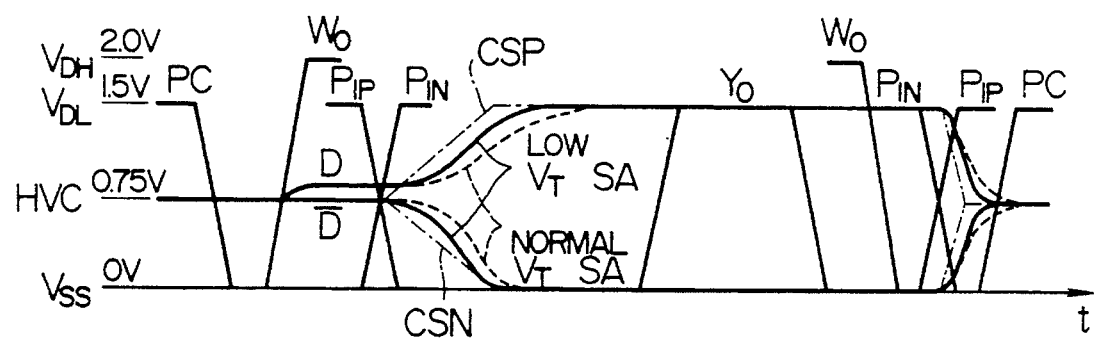
Figure 71C:
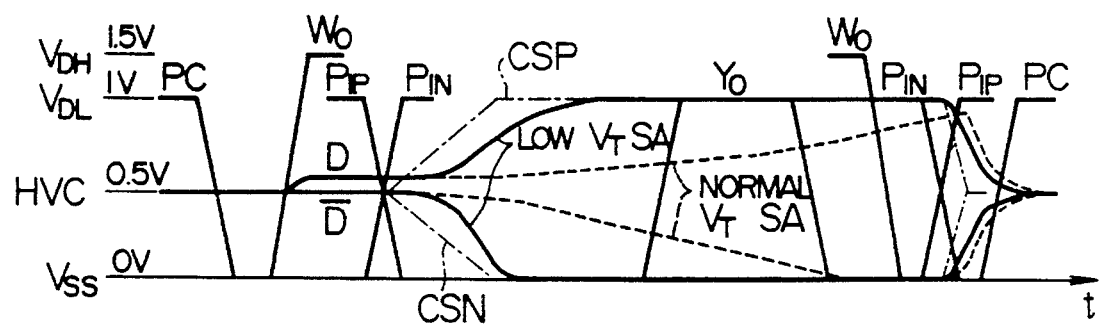

FIG. 71A shows the circuit arrangement in accordance with one embodiment of the present invention in which MOS-FETs (Q1', Q2', Q3' and Q4') each having a low threshold voltage Vth is used in a sense amplifier. The operation of the data line in the case where it is operated at a low voltage amplitude (1 V) will be explained with reference to the waveform chart of FIG. 71C. When the voltage on a word line W0 is boosted from VSS (0 V) to VDH (1.5 V), data stored in a storage capacitor Cs is read out on a data line D. Next, when P1P is varied from VDL (1.0 V) to VSS (0 V), and P1N is varied from VSS (0 V) to VDL (1.0 V), transistors QP and QN for driving sense amplifiers are turned ON and OFF so that a sense amplifier driving line varies from HVC (0.5 V) to VDL (1.0 V) and another sense amplifier driving line CSN varies from HVC (0.5 V) to VSS (0 V). Then, in the sense amplifier in this embodiment, the transistors (Q1', Q2', Q3' and Q4') each having a low threshold voltage are used so that the gate-source (drain) voltage sufficiently exceeds the threshold voltage. Thus, the transistors in the sense amplifier are sufficiently turned ON thereby to sufficiently amplify the signal voltage on the data line. On the other hand, in the sense amplifier constituted by transistors each having an ordinary (i.e. relatively high), the gate-source (drain) voltage becomes close to the threshold voltage. Thus, the transistors in the sense amplifier are not sufficiently turned ON so that the signal voltage on the data line can not be amplified. The subsequent operation of the data line is the same as the conventional DRAM. FIG. 71B shows the waveform chart in the case where the data line is operated at the voltage amplitude of 1.5 V. In this case, the charging/discharging speed of the data line is slightly increased because of the use of the sense amplifier in accordance with this embodiment.

Figure 71D:
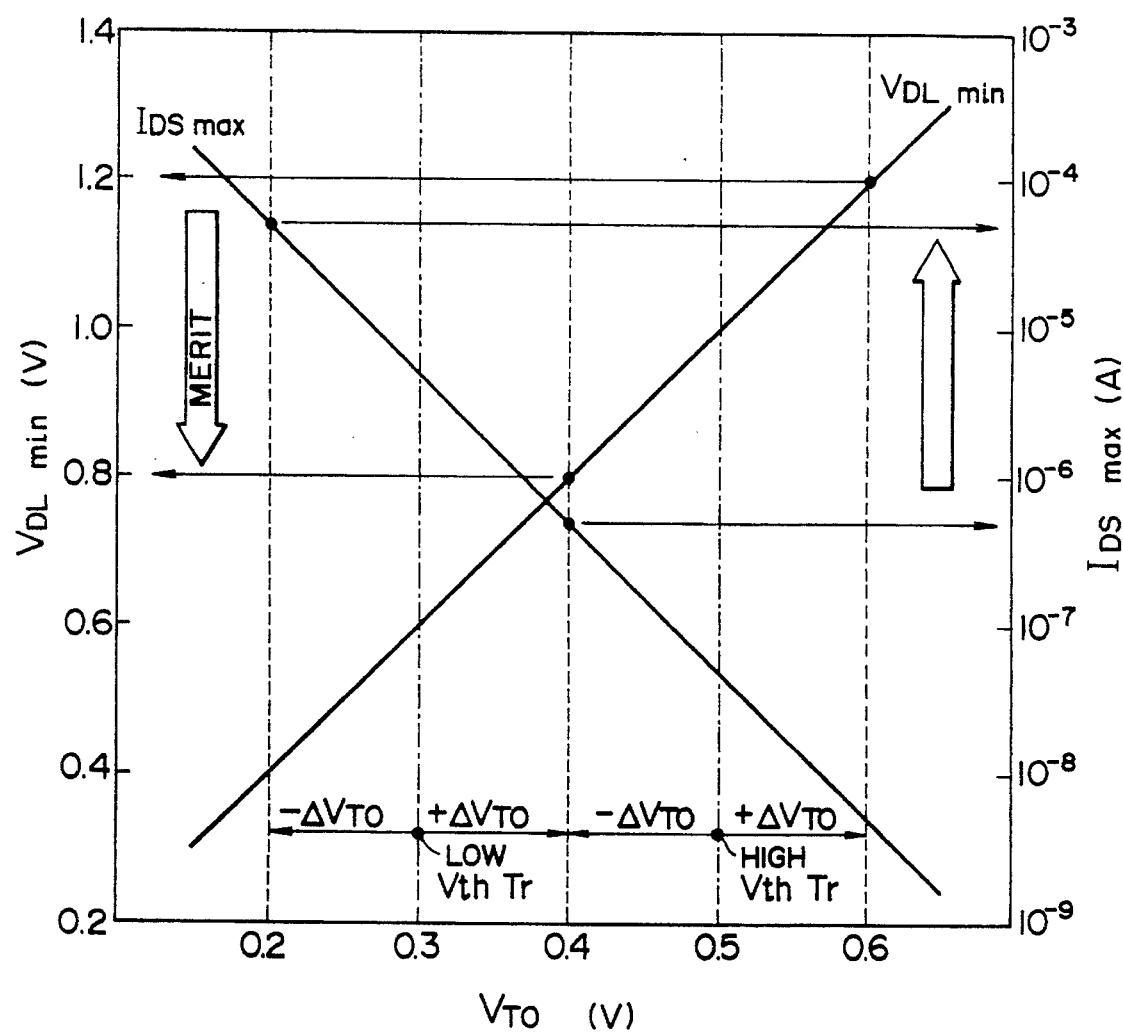

FIG. 71D is a graph for explaining the advantages or merits of this embodiment. In the graph, VDLmin is the data line charging/discharging voltage when the sense amplifier reaches its operation limit. IDS is a sum of the currents flowing between the gates and sources (drains) in the all the sense amplifiers with the gate-source (drain) voltage of 0 V in 64 Mbit DRAM in which with respect to Q1, Q2, Q3 and Q4, W/L=2 μm/0.5 μm and 16000 sense amplifiers are operated. The current flowing between the drain and source when the gate-source (drain) voltage is set at 0 V is minutely disclosed in R. M. Swanson and J. D. Meindle, "Ion-Implanted Complementary MOS Transistors in Low-Voltage Circuits", Vol. SC7, No. 2, pp. 146–153. It is assumed that the relation between the gate-source voltage VGS of a MOS transistor and the square root ID the drain-source current can be expressed by ID=A VGS+B. VTO in the graph of FIG. 71D represents the value of VGS when ID=0 in the equation.

Figure 71E:
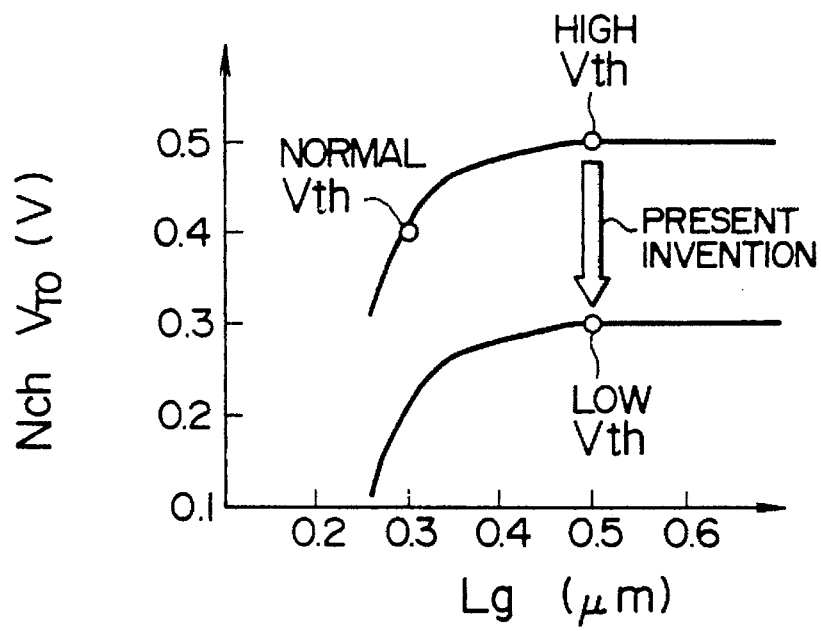
Figure 71F:
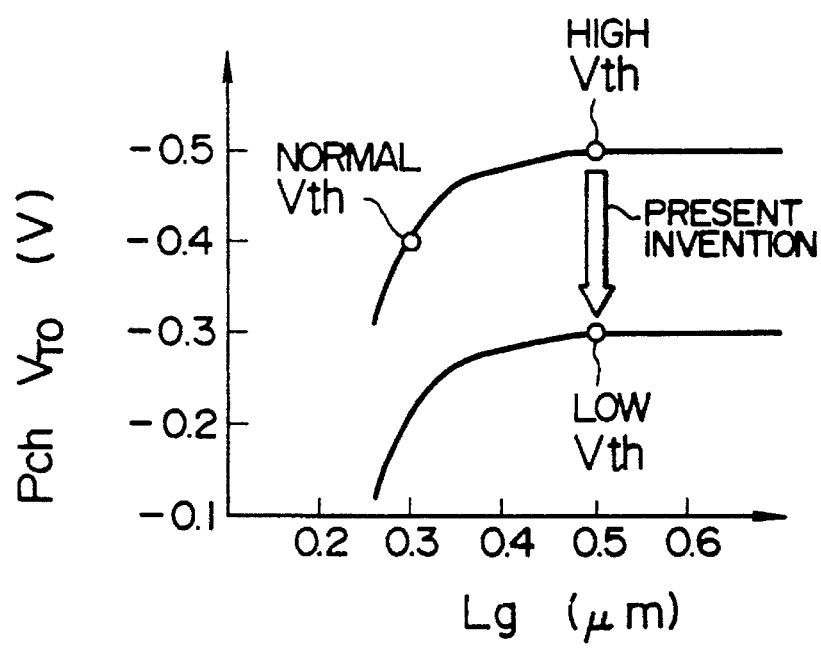

FIGS. 71E and 71F are graphs showing the relation between VTO and the channel length Lg of the transistor. The sense amplifier (Q1', Q2', Q3' and Q4') in accordance with this embodiment uses low Vth MOS transistors, the other sense amplifier uses normal Vth MOS transistors, and the conventional sense amplifier uses high Vth MOS transistors. In this case, a comparatively long channel length Lg of 0.5 μm is adopted. This intends to prevent the threshold voltage of the transistors in the sense amplifier from being varied due to processing variations of Lg and so the sensibility of the sense amplifier from being reduced. In the transistors other than those in the sense amplifier, a comparatively short channel length Lg of e.g. 0.3 μm is adopted in order to provide a high driving capability.

The operation of this embodiment is different from the case of using the conventional sense amplifier when VDL is a low voltage of 1.0 V or so. More specifically, in the case where the high Vth MOS transistors (VTO=0.5 V) as shown in FIGS. 71E and 71D are used in the sense amplifier, as seen from the graph of FIG. 71D, the sense amplifier will not be operated at VDL of 1.2 V (the worst value of VTO is 0.6 V). On the other hand, in the case the low Vth MOS transistors are used in the sense amplifier in accordance with this embodiment, the sense amplifier can still operate at VDL of 1.2 V. This is because VTL is a sufficiently small value of 0.4 V (worst or largest value) for the gate-source (drain) voltage of 0.6 V in the sense amplifier. In accordance with this embodiment, the operation range of the sense amplifier can be extended to VTL>0.8 V. Then, the current IDSmax flowing the drain and sources in the sense amplifiers is 100 μA (when 16000 sense amplifiers are operated), which is negligibly small as compared with the charging current on the data line.

The low Vth MOS transistors as shown in FIGS. 71E and 71F can be made by varying the amount of ion implanatation in masking the sense amplifier section. Further, the same effect as the low voltage operation of sense amplifiers can be realized by using low Vth MOS transistors in the parts where a low voltage is provided between the gate and source of each transistor (e.g. transistors for switching input/output lines in sharing a memory array). Moreover, the same effect can be also obtained by depletion type MOS transistors in place of the low Vth MOS transistors. In this case, during the precharging time when the sense amplifiers are not operated, the substrate potential of the N channel MOS transistors in the sense amplifiers is raised (that of the P channel MOS. transistors is lowered) so as not to conduct a current between the data lines.

Accordingly, in accordance with this embodiment, a memory circuit which can operate at a comparatively low power supply voltage without injuring the speed performance can be realized. The idea in this embodiment can also applied to the circuit components other than the sense amplifiers whereby an LSI memory with the performances of a high operation speed and reduced power consumption can be provided. Further, without being limited to the memory LSI, the other LSI such as a logic LSI (e.g. pass gate) which can operate at a comparatively low power supply voltage can also be provided.

Figure 72A:
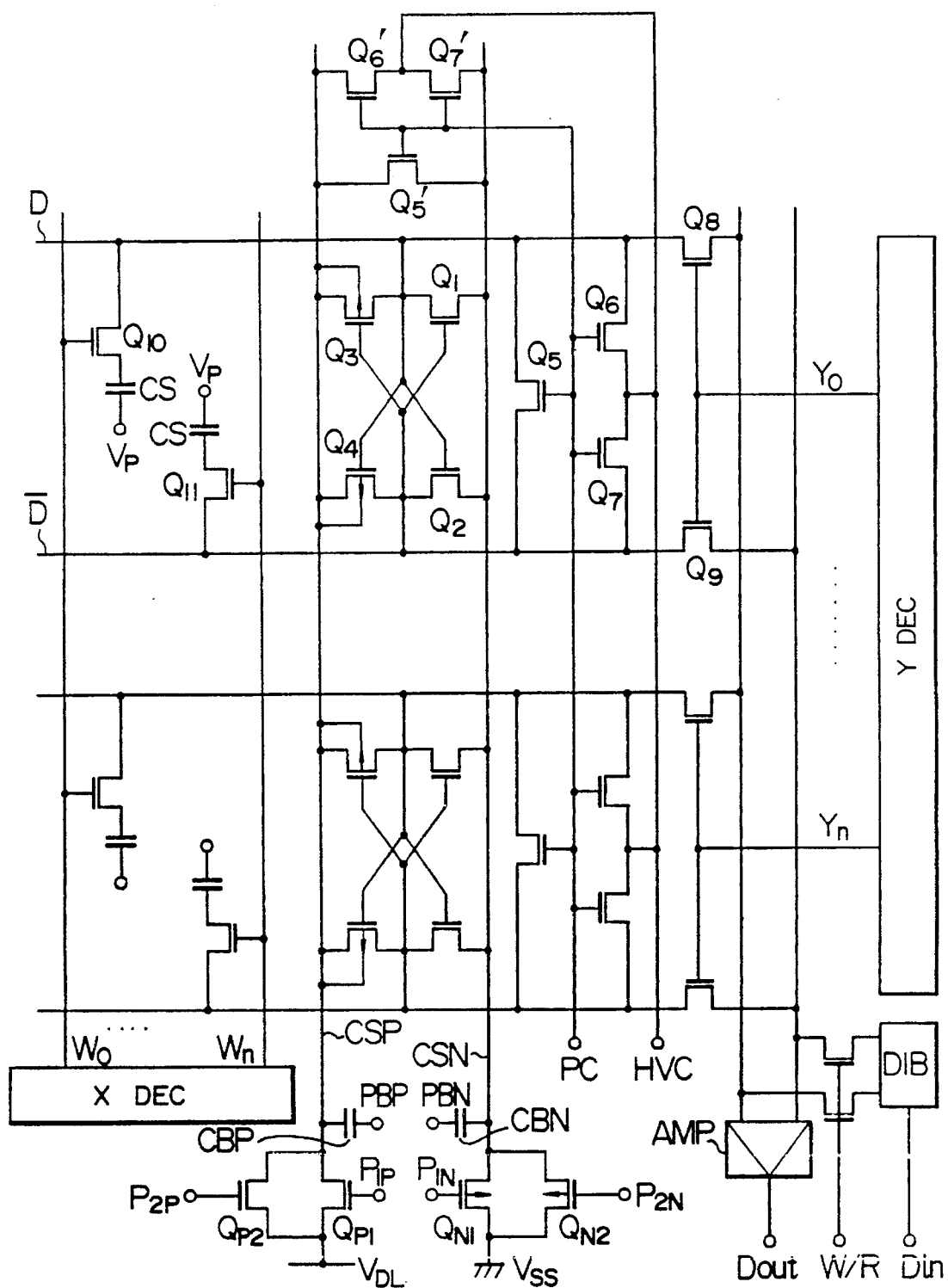
Figure 72B:
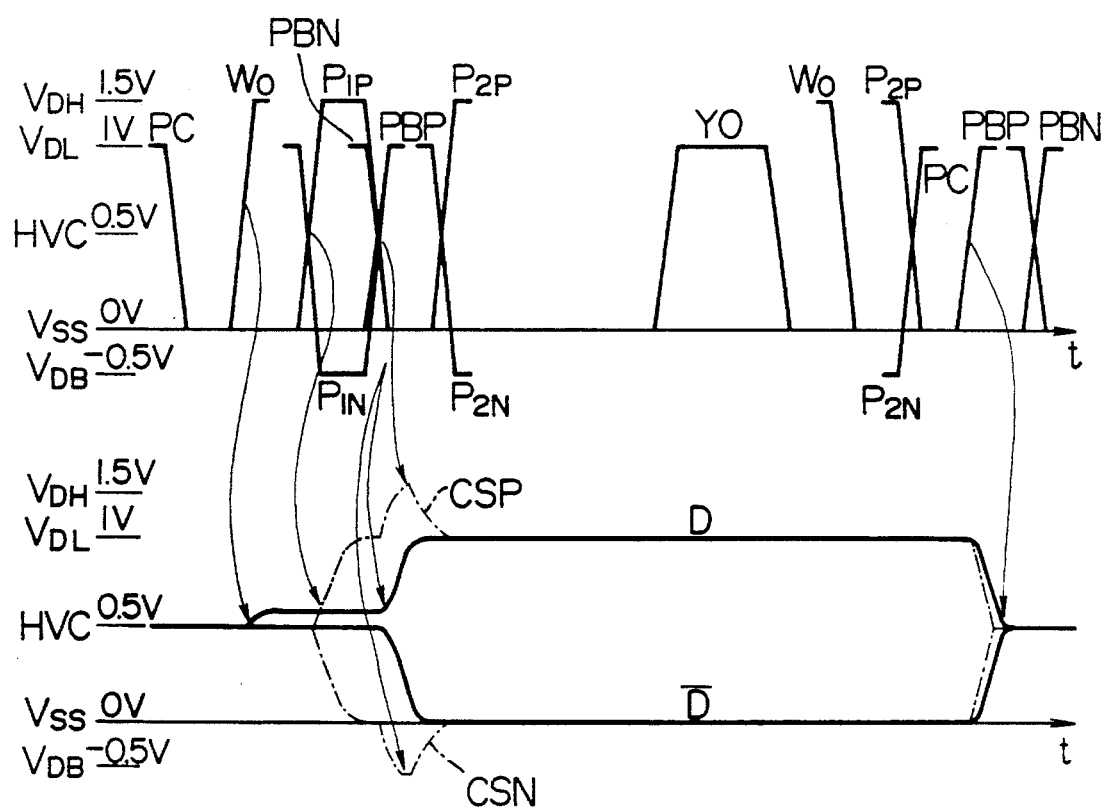

FIGS. 72A and 72B show the circuit configuration in accordance with a further embodiment of the present invention in which the conventional sense amplifier driving transistors are connected in parallel in their two sets (QP1, QP2; QN1, QN2) and the sense amplifier driving lines CSP and CSN are provided with boosting capacitors CBP and CBN, respectively. The substrate potential of P channel MOS transistors constituting a sense amplifier is at the same level as that of the sense amplifier driving lines CSP and CSN.

The operation of the circuit of FIG. 72A will be explained with reference to the waveform chart of FIG. 72B. When the voltage of a word line W0 is varied from VSS (0 V) to VDH (1.5 V), the data stored in a storage capacitor CS is read out on a data line D. Next, when P1P is varied from VSS (0 V) to VDH (1.5 V), and P1N is varied from VDL (1.0 V) to VDB (–0.5 V), sense amplifier driving transistors QP1 and QN1 are turned on so that a sense amplifier driving line CSP varies from HVC (0.5 V) to VDL (1.0 V) and another sense amplifier driving line CSN varies from HVC (0.5 V) to VSS (0 V). When PBP is varied from VSS (0 V) to VDL (1.0 V) and PBN is varied from VDL (1.0 V) to VSS (0 V), the sense amplifier driving lines are boosted. Namely, CSP varies from VDL (1.0 V) to VDH (1.5 V) or so and CSN varies from VSS (0 V) to VDB (–0.5 V) or so. Then, by varying P1P from VDH (1.5 V) to VSS (0 V) and varying P1N from VDB (–0.5 V) to VDL (1.0 V), the electrons injected into the sense amplifier driving lines are not discharged from the sense amplifier driving transistors. Thus, the gate-source (drain) voltage of the transistors (Q1, Q2, Q3 and Q4) constituting a sense amplifier becomes VDL/2+0.5 V or so, so that the sense amplifier is sufficiently turned on thereby amplifying the voltages on data lines D and $\overline{D}$ to VDL (1.0 V) and VSS (0 V), respectively. After the sense amplifier driving lines have been boosted, P2P is varied from VSS (0 V) to VDH (1.5 V) and P2N is varied from VDL (1.0 V) to VDB (–0.5 V). Thus, the sense amplifier driving transistors QP2 and QN2 are turned on so that the amplification by the sense amplifier can be sufficiently performed. The subsequent operation of the date lines is the same as the conventional system.

In order to provide the boosted voltages on the order shown in FIG. 72B, the capacitance of the boosting capacitors CBP and CBN may be 150 pF or so (assuming that 1000 sense amplifiers each having the data line capacitance of about 300 pF are connected with the sense amplifier driving lines). Any voltage values at the respective terminals other than the values shown in FIG. 72B may be used as long as the voltage amplitude between the sense amplifier driving lines CSP and CSN is larger than that between the data lines D and $\overline{D}$. The voltage of VDH may be generated by boosting VDL or reducing an external power supply voltage. Either CSP or CSN may be boosted. The VDL wiring may be provided with a boosting capacitor CBP for boosting VDL. In this case, the substrate potential of the sense amplifier driving transistors QP1 and QP2 is set at the same level as that of VDL. Further, the sense amplifier driving transistors QP1, QP2, QN1 and QN2 may be P channel MOS transistors, N channel MOS transistors or bipolar transistors as long as the potential of the sense amplifier driving line can be varied from HVC to VDL on the side of CSP and can be varied from HVC to VSS on the side of CSN. Further, by boosting the sense amplifier driving lines so that the substrate potential of each transistor is not forward-biased, the latch-up thereof, etc. can be prevented. By placing the substrate potential of Q3 and Q4 in the sense amplifier at the same potential level as the sense amplifier driving line CSP or placing that of Q1 and Q2 in the sense amplifier at the same potential level as the sense amplifier driving line CSN, the increase of the threshold voltage thereof due to the body effect can be prevented, thereby further improving the operation of the sense amplifiers. Placing the substrate potential in the sense amplifier at the same potential as the sense amplifier driving line can be realized by using the triple well structure of the substrate. Moreover, by using the low Vth MOS transistors in the embodiment of FIG. 71A in the sense amplifier (Q1, Q2, Q3 and Q4), the operation at further reduced voltage can be carried out.

Accordingly, in accordance with this embodiment, a memory circuit which can operate at a comparatively low power supply voltage without injuring the speed performance can be realized. The idea in this embodiment can also applied to the circuit components other than the sense amplifiers whereby an LSI memory with the performances of-a high operation speed and reduced power consumption can be provided. Further, without being limited to the memory LSI, the other LSI such as a logic LSI which can operate at a comparatively low power supply voltage can also be provided.

FIGS. 73A to 73D show the concept of a further embodiment of the present invention.

Figure 73A:
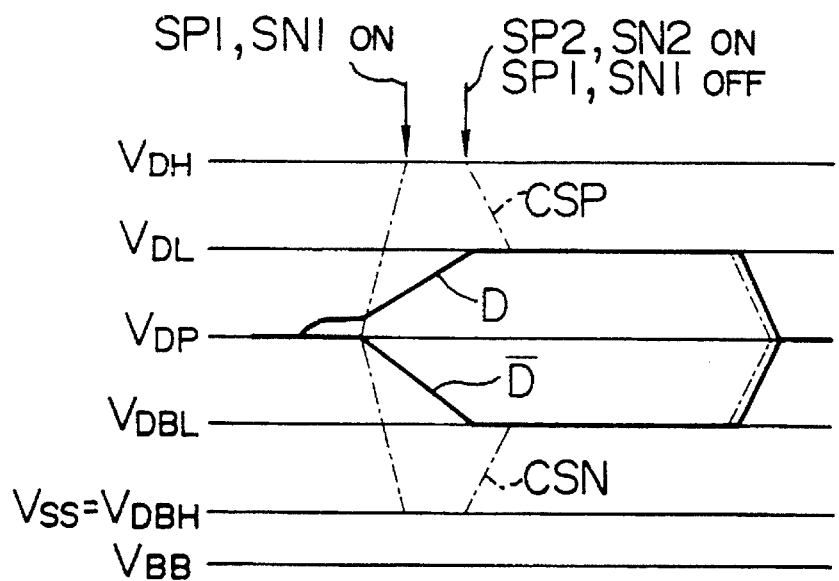
Figure 73B:
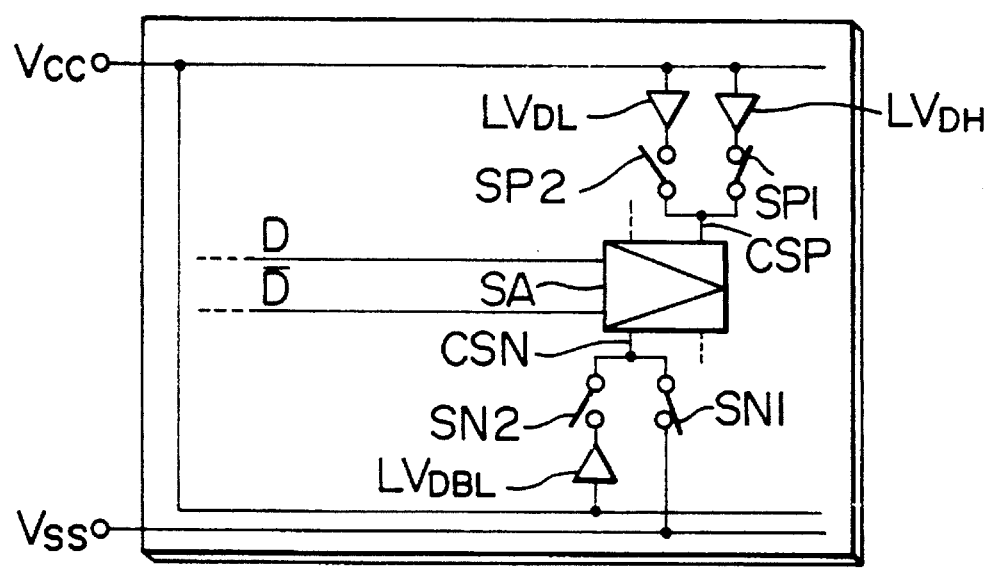

In the circuit arrangement of FIG. 73B, constant voltage generating circuits LVDH, LVDL and LVDBL are provided in a memory chip in order to generate constant voltages VDH, VDL and VDBL. The constant voltages VDH, VDL, VDBL and VDBH (=VSS) are connected with sense amplifier driving lines CSP (VDH and VDL) and CSN (VDBL and VDBH) through switches SP1, SP2, SN1 and SN2, respectively. Their voltage relation is VDH≧VDL>VDP (precharge voltage)>VDBL≧VDBH (=ground voltage VSS)≧VBB (substrate voltage).

The operation of this circuit of FIG. 73B will be explained with reference to FIG. 73A. First, data line D, $\overline{D}$ and sense amplifier driving lines CSP, CSN are precharged at a precharge voltage VDP. Next, the switches SP1 and SN1 are turned on to vary the voltage of CSP to VDH and that of CSN to VDBH (VSS). Thus, the gate-source (drain) voltage of the transistors in a sense amplifier can be made larger than VDP so that the sense amplifier is sufficiently turned on thereby to amplify the data lines D and $\overline{D}$ to about VDL and VDBL, respectively. Next, the switches SP1 and SN$_1$ are turned off and the switches SP2 and SN$_2$ are turned on. Thus, CSP and CSN become VDL and VDBL, respectively, so that the data lines D and $\overline{D}$ can be fixed at VDL and VDBL, respectively. The timing of turning SP1 and SN1 OFF and turning SP2 and SN2 ON set decided when D and $\overline{D}$ become about VDL and VDEL, respectively. Thus, the data line D is prevented from becoming higher than VDL and the data line $\overline{D}$ is prevented from becoming lower than VDBL. The relation between the values of VDH, VDL and an external power supply voltage V$_{cc}$ may be optionally set (For example, VDH=VCC or VDL=VCC). The voltage of VDH may be also generated by boosting VDL. Further, the substrate voltage VBB is not necessarily required to be lower than VDBH (For example, it may be that VDBH (=VSS)=VBB). Also, the substrate voltage VBB may be applied to the memory array part and the sense amplifier part or either one of them while the ground voltage may be applied to the remaining parts. This can be realized by the triple structure of the substrate.

Accordingly, in accordance with this embodiment, a memory circuit which can operate at a comparatively low power supply voltage without injuring the speed performance can be realized. The idea in this embodiment can also be applied to the circuit components other than the sense amplifiers whereby an LSI memory with the performances of a high operation speed and reduced power consumption can be provided. Further, without being limited to the memory LSI, the other LSI such as a logic LSI which can operate at a comparatively low power supply voltage can also be provided.

Figure 73C:
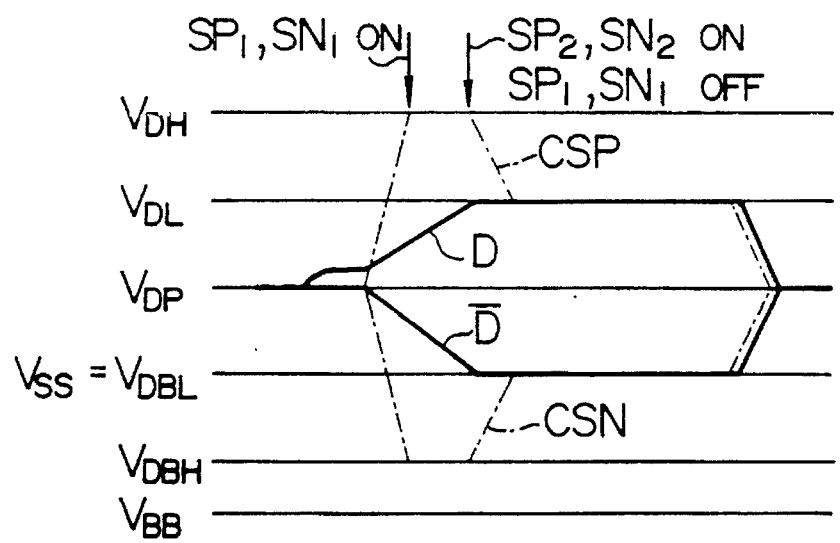
Figure 73D:
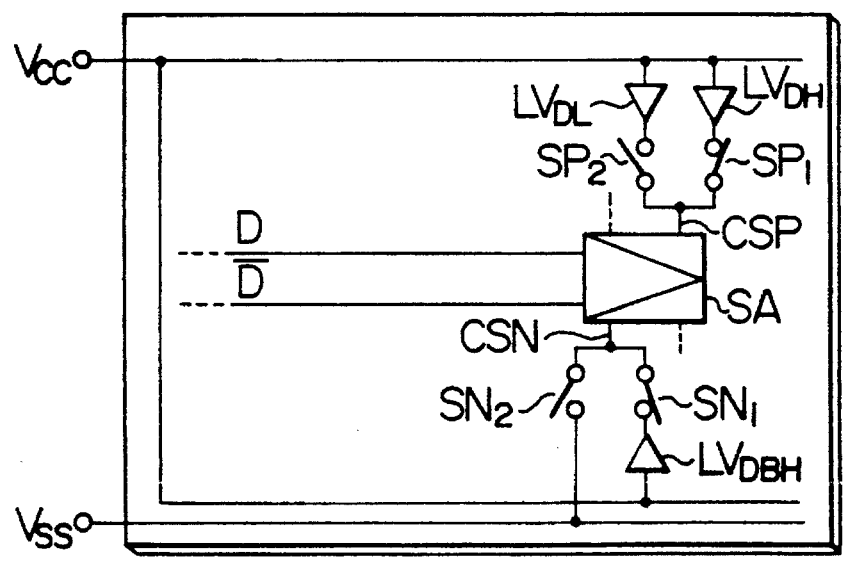

In the circuit arrangement of FIG. 73D, constant voltage generating circuits LVDH, LVDL and LVDBL are provided in a memory chip in order to generate constant voltages VDH, VDL and VDBL. The constant voltages VDH, VDL, VDBH and VDBL (=VSS) are connected with sense amplifier driving lines CSP (VDH and VDL) and CSN (VDBH and VDBL) through switches SP1, SP2, SN1 and SN2, respectively. Their voltage relation is VDH≧VDL>VDP (precharge voltage)>VDBL≧VDBH (=ground voltage VSS)≧VBB (substrate voltage).

The operation of this circuit of FIG. 73D will be explained with reference to FIG. 73C. First, data lines D, $\overline{D}$ and sense amplifier driving lines CSP, CSN are precharged at a precharge voltage VDP. Next, the switches SP1 and SN1 are turned on to vary the voltage of CSP to VDH and that of CSN to VDBH. Thus, the gate-source (drain) voltage of the transistors in a sense amplifier can be made larger than VDP so that the sense amplifier is sufficiently turned on thereby to amplify the data lines D and $\overline{D}$ to about VDL and VDBL (VSS), respectively. Next, the switches SP1 and SN1 are turned off and the switches SP2 and SN1 are turned on. Thus, CSP and CSN become VDL and VDBL, respectively, so that the data lines D and $\overline{D}$ can be fixed at VDL and VDBL (VSS), respectively. The timing of turning SP1 and SN1 off and turning SP2 and SN2 on set decided when D and $\overline{D}$ become about VDL and VDBL, respectively. Thus, the data line D is prevented from becoming higher than VDL and the data line $\overline{D}$ is prevented from becoming lower than VDBL. The relation between the values of VDH, VDL and an external power supply voltage V$_{cc}$ may be optionally set (For example, VDH=VCC or VDL=VCC). The voltage of VDH may be also generated by boosting VDL. Further, the substrate voltage VBB is not necessarily required to be lower than VDBH (For example, VDBH=VBB). Also, the substrate voltage VBB may be applied to the memory array part and the sense amplifier part or either one of them while the ground voltage may be applied to the remaining parts. This can be realized by the triple structure of the substrate.

Accordingly, in accordance with this embodiment, a memory circuit which can operate at a comparatively low power supply voltage without injuring the speed performance can be realized. The idea in this embodiment can also applied to the circuit components other than the sense amplifiers whereby an LSI memory with the performances of a high operation speed and reduced power consumption can be provided. Further, without being limited to the memory LSI, the other LSI such as a logic LSI which can operate at a comparatively low power supply voltage can also be provided.

Figure 73E:
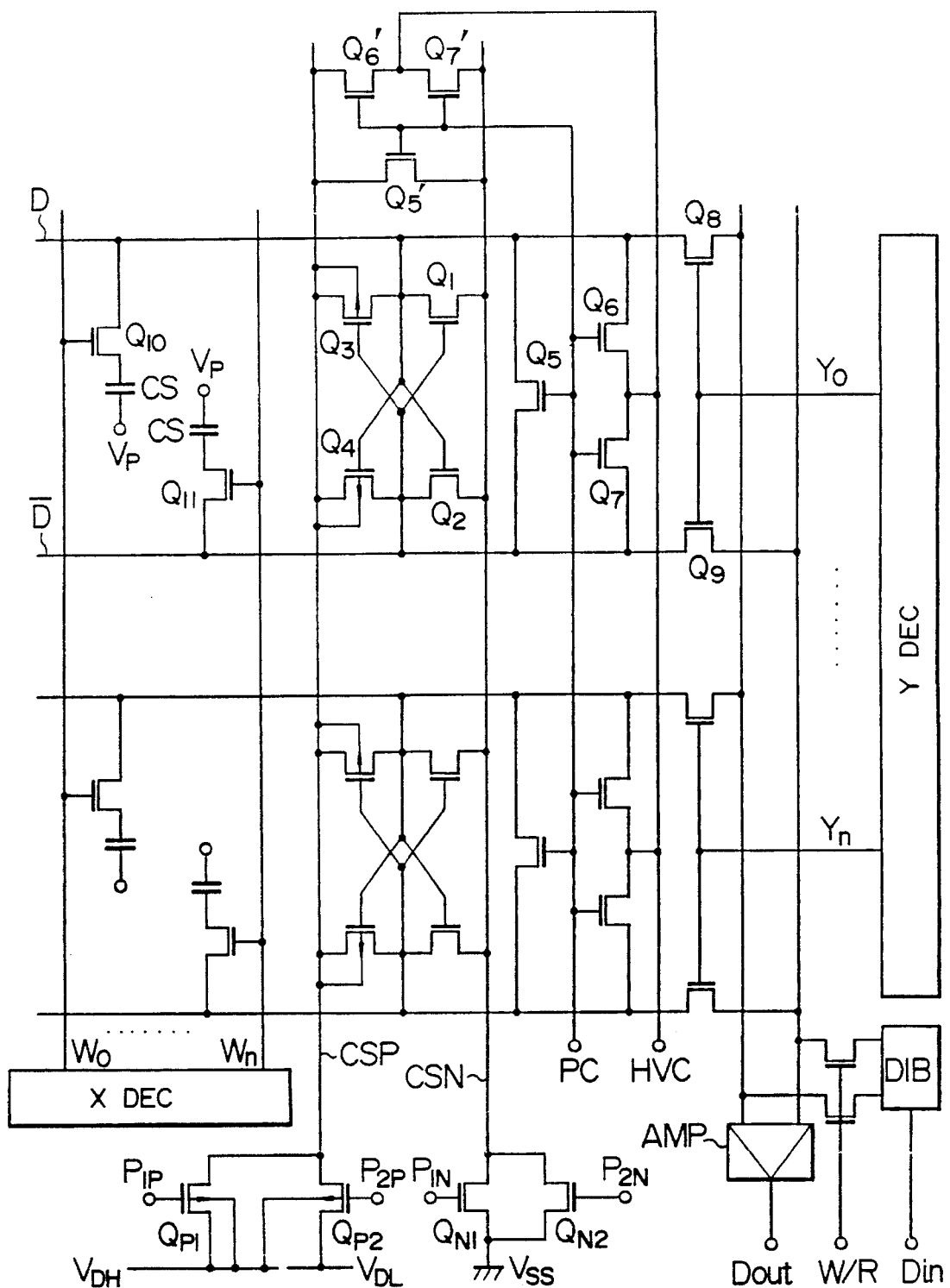

FIG. 73E is a concrete circuit arrangement of the embodiments of FIGS. 73B and 73D. Only the side of the sense amplifier driving line CSP in FIG. 73C will be explained. In the circuit arrangement of FIG. 73E, the conventional sense amplifier driving transistors are connected in parallel in their two sets (QP1, QP2; QN1, QN2). And the drain of the P channel MOS transistor QP1 is set at VDH (e.g. 1.5 V) whereas the drain of the P channel MOS transistor QP2 is set at VDL (e.g. 1.0 V). Further, the substrate voltage of QP1 and QP2 is set at VDH.

The operation of the circuit of FIG. 73E will be explained with reference to the waveform chart of FIG. 73F. When the voltage of a word line W0 is varied from VSS (0 V) to VDH (1.5 V), the data stored in a storage capacitor CS is read out on a data line D. Next, when P1P is varied from VDH (1.5 V) to VSS (0 V), and P1N is varied from VSS (0 V) to VDL (1.0 V), sense amplifier driving transistors QP1 and QN1 are turned on so that a sense amplifier driving line CSP varies from HVC (0.5 V) to VDH (1.5 V) and another sense amplifier driving line CSN varies from HVC (0.5 V) to VSS (0 V). Thus, the gate-source (drain) voltage of the transistors Q3 and Q4 in a sense amplifier becomes VDL/2+0.5 V or so, so that the sense amplifier is sufficiently turned on thereby amplifying the voltages on a data line D to VDL (1.0 V). Also the gate-source (drain) voltage of the transistors Q1 and Q2 in the sense amplifier is increased thereby to amplify a data line to VSS (0 V). Around the time when the voltage of the data line-D exceeds VDL (1.0 V), if P1P is varied from VSS (0 V) to VDH (1.5 V) and P2P is varied from VDH (1.5 V) to VSS (0 V), QP1 is turned OFF and QP2 is turned ON so that CSP varies from VDH (1.5 V) to VDL (1.0 V). Thus, the voltage of the data line D is fixed at VDL (1.0 V). Then, if P2N is varied from VSS (0 V) to VDL (1.0 V), the sense amplifier driving transistor QN2 is turned on so that the amplification by the sense amplifier can be sufficiently performed. The subsequent operation of the date lines is the same as the conventional system.

Figure 73F:
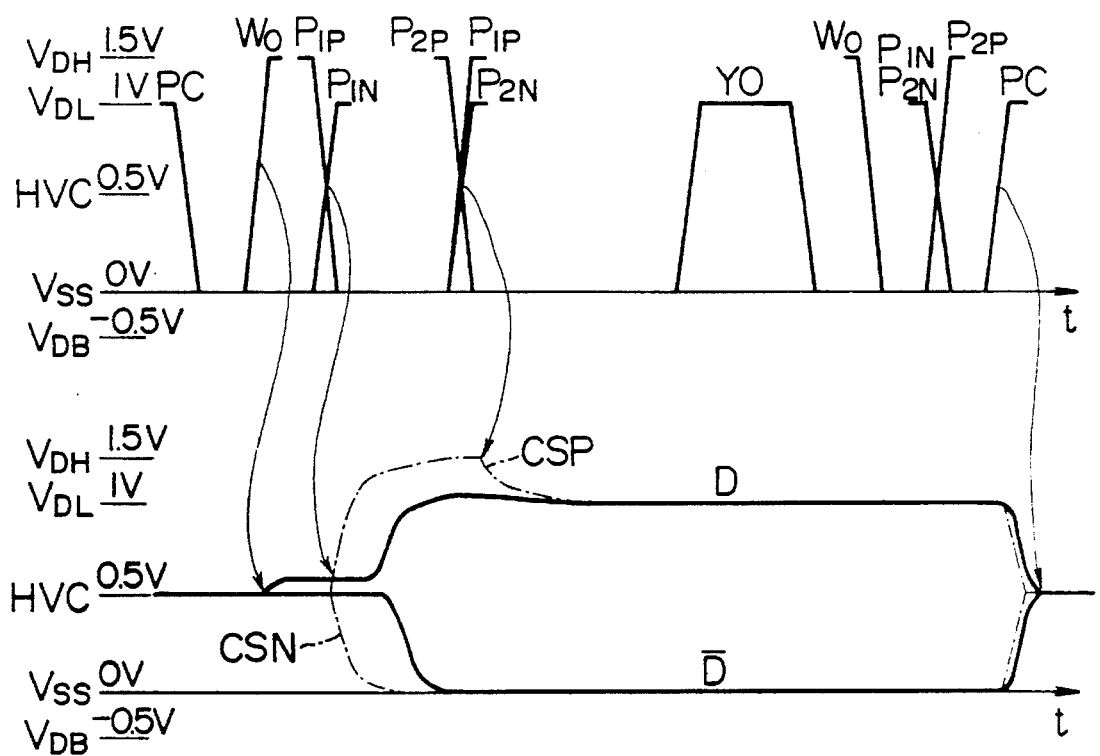

Any voltage values at the respective terminals other than the values shown in FIG. 73F may be used as long as the voltage of the sense amplifier driving lines CSP is larger than the charging voltage VDL of the data line. The voltage of VDH may be generated by boosting VDL or reducing an external power supply voltage. Further, the sense amplifier driving transistors QP1, QP2, QN1 and QN2 may be P channel MOS transistors, N channel MOS transistors or bipolar transistors as long as the potential of the sense amplifier driving line can be varied from HVC to VDL on the side of CSP and can be varied from HVC to VSS on the side of CSN. By placing the substrate potential of Q3 and Q4 in the sense amplifier at the same potential level as the sense amplifier driving line CSP or placing that of Q1 and Q2 in the sense amplifier at the same potential level as the sense amplifier driving line CSN, the increase of the threshold voltage thereof due to the body effect can be prevented, thereby further improving the operation of the sense amplifiers. Placing the substrate potential in the sense amplifier at the same potential as the sense amplifier driving line can be realized by using the triple well structure of the substrate. Moreover, by using the low Vth MOS transistors in the embodiment of FIG. 71A in the sense amplifier (Q1, Q2, Q3 and Q4), the operation at further reduced voltage can be carried out.

Accordingly, in accordance with this embodiment, a memory circuit which can operate at a comparatively low power supply voltage without injuring the speed performance can be realized. The idea in this embodiment can also be applied to the circuit components other than the sense amplifiers whereby an LSI memory with the performances of a high operation speed and reduced power consumption can be provided. Further, without being limited to the memory LSI, the other LSI such as a logic LSI which can operate at a comparatively low power supply voltage can also be provided.

Incidentally, the voltage relation should not be limited to those as shown in FIGS. 73A to 73E since the same effect as mentioned above can be obtained by causing the gate-source voltage of the MOS transistors operating with a small amplitude to sufficiently exceed the threshold voltage thereof only during a certain period of the operation.

Figure 74A:
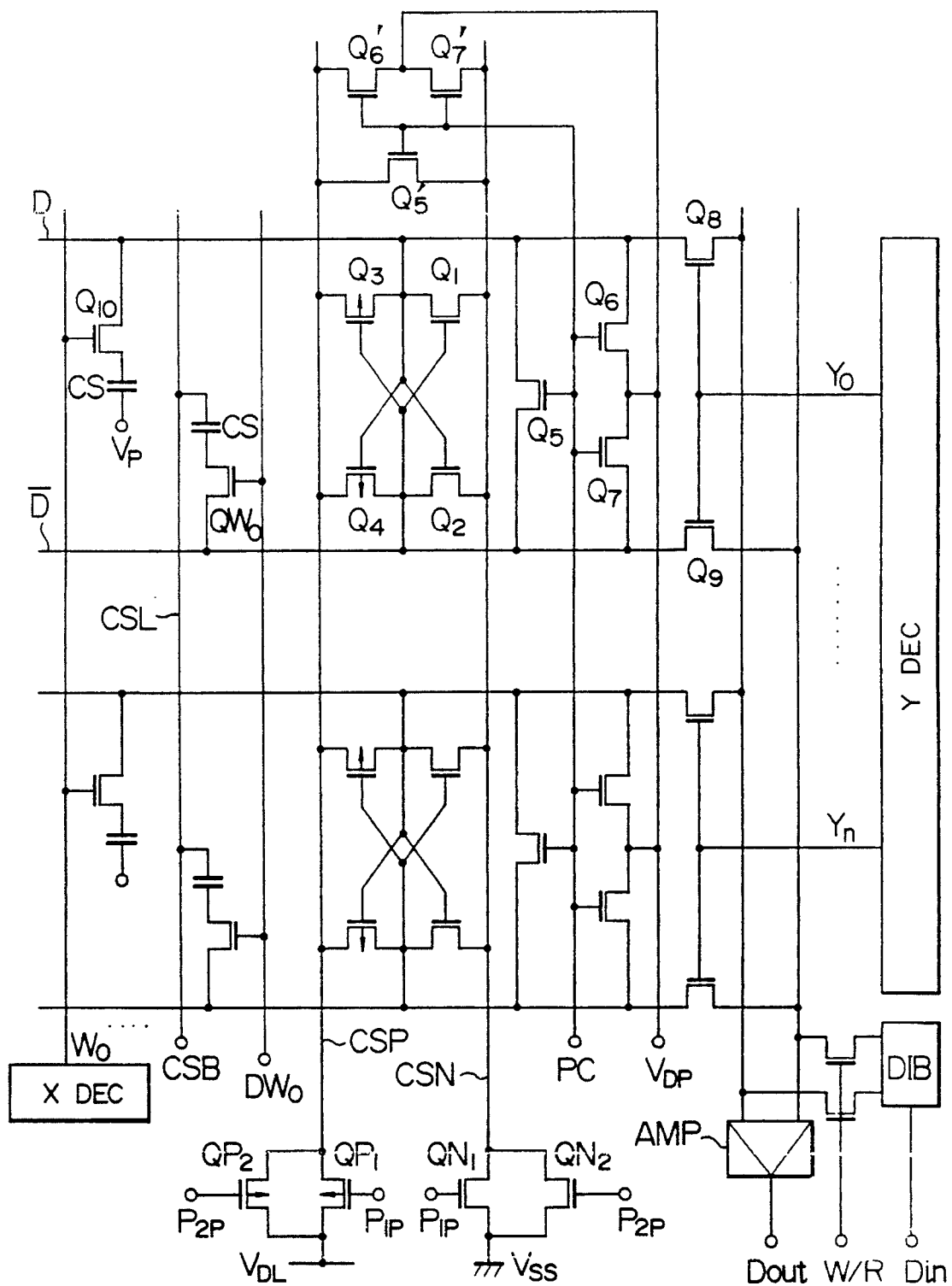
Figure 74B:
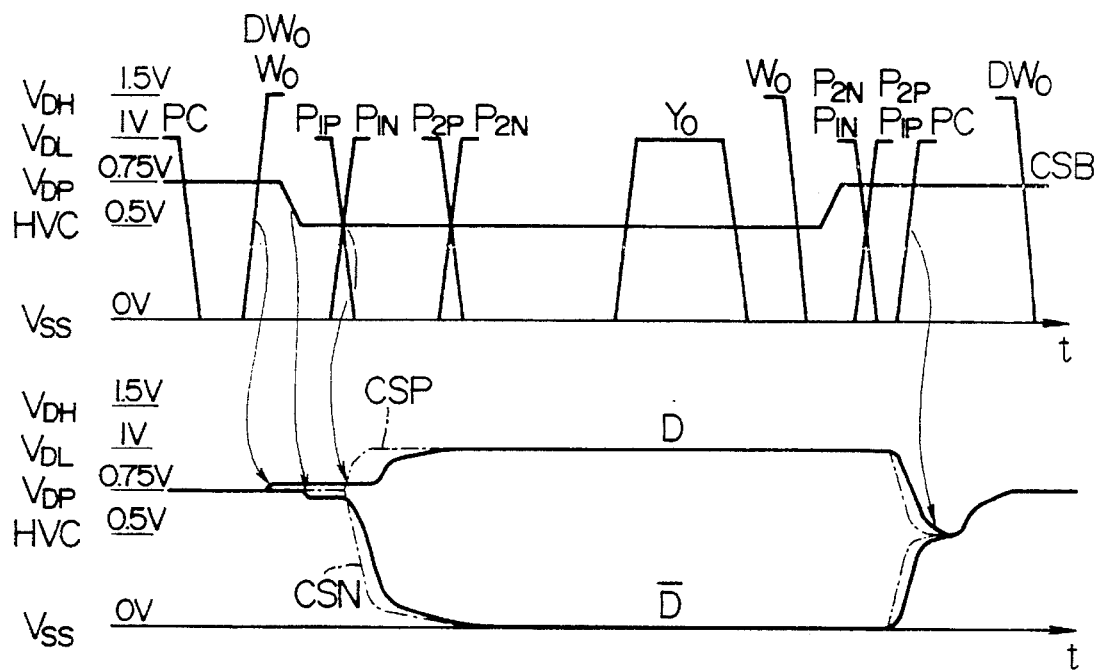
Figure 74C:
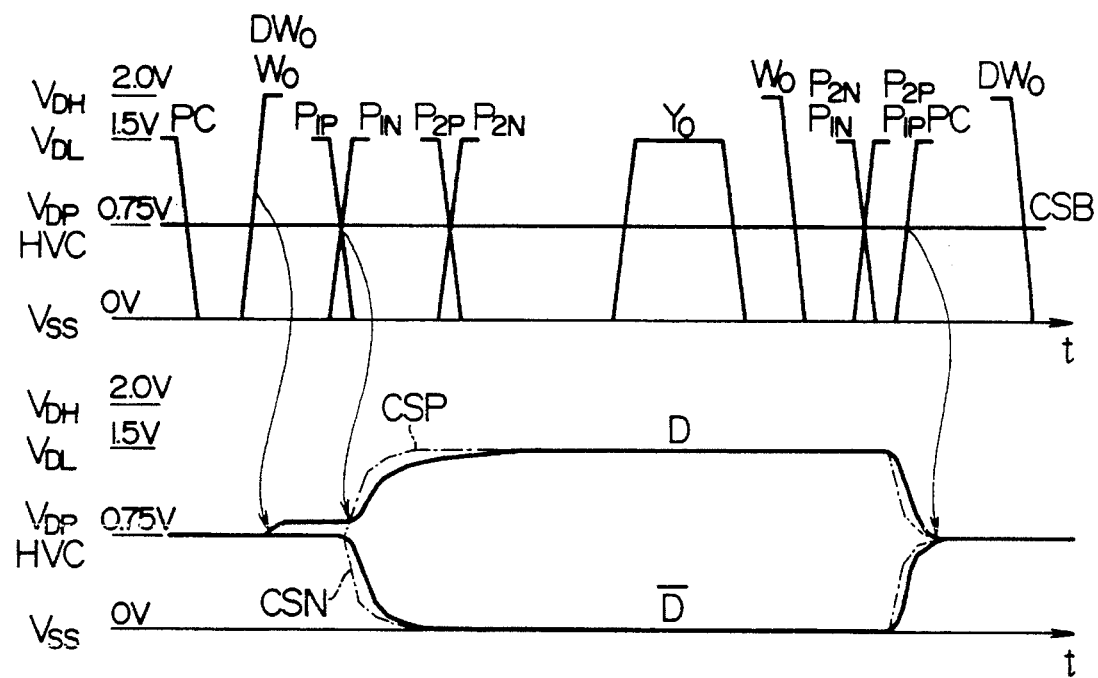

FIG. 74A shows the circuit arrangement of a further embodiment of the present invention in which plate terminals of the storage capacitors CSs connected with reference data lines DS are adapted to be driven at a time. As a precharge voltage to be applied to a precharge circuit (Q5', Q6', Q7', Q5, Q6 and Q7), a constant voltage VDP, which has the characteristic as shown in FIG. 74E or FIG. 74F, is adopted.

The operation of the circuit of FIG. 74A will be explained with reference to the waveform chart shown in FIG. 74B. First, when the voltage of a word line W0 is varied from VSS (0 V) to VDH (1.5 V), the data stored in the storage capacitor CS is read out on the data line $\overline{D}$. Specifically, in the case of reading "1", CD/(CD+CS)×(VDL−VDP)=0.25 CD/(CD+CS) VOLT is read out whereas in the case of reading "0", CD/(CD+CS)×(VDP−VSS)=0.75 CD/(CD+CS) volt (where CD is a data line capacitance) is read out. Then, the voltage of a dummy word line DW0 is varied from VSS (0 V) to VDH (1.5 V) while the voltage of the reference data line D is held at the precharge voltage VDP (0.75 V). Next, the voltage of the plate terminal CSB of the storage capacitor CS' connected with the data line D is varied from VDP (0.75 V) to HVC (0.5 V). Thus, the voltage of the reference data line $\overline{D}$ is lowered by CD/(CD+CS)×(VDP−HVC)=0.25 CD/(CD+CS) volt so that the signal voltage difference between the data lines D and $\overline{D}$ is VDL/2×CD/(CD+CS)=0.5 CD/(CD+CS) volt for both cases of reading "1" and "0". Next, when P1P is varied from VDL (1.0 V) to VSS (0 V), and P1N is varied from VSS (0 V) to VDL (1.0 V), sense amplifier driving transistors QP1 and QN1 are turned on so that a sense amplifier driving line CSP varies from VDP (0.75 V) to VDL (1.0 V) and another sense amplifier driving line CSN varies from VDP (0.75 V) to VSS (0 V). Thus, the gate-source (drain) voltage of the transistors Q1 and Q2 in a sense amplifier becomes VDP, so that the sense amplifier is sufficiently turned on thereby amplifying the voltages on a data line $\overline{D}$ to VSS (0 V). Also, the gate-source (drain) voltage of the transistors Q3 and Q4 in the sense amplifier is increased thereby to amplify a data line D to VDL (1.0 V). Then, if P2P is varied from VSS (0 V) to VDL (1.0 V), the sense amplifier driving transistor QN2 is turned ON so that the amplification by the sense amplifier can be sufficiently performed. The subsequent operation of the data line is the same as the conventional system. The voltage of the plate CSB is varied from HVC (0.5 V) to VDP (0.75 V) before precharging the data lines. The dummy word line DW0 is varied from VDH (1.5 V) to VSS (0 V) around the time when the data line voltage has been restored to VDP (0.75 V) after the precharging. Although the above explanation is directed to the case where VDP has the characteristic shown in FIG. 74E, the same effect can be obtained also in the case where VDP has the characteristic shown in FIG. 74F. Further, any voltage values at the respective terminals other than the values shown in FIGS. 74B, 74E, and 74F as long as VDP>VDL/2=HVC (FIG. 74F), or VDP<VDL/2=HVC (FIG. 74F). As seen from FIGS. 74E and 74F, when VDL is comparatively high, more precisely 1.5 V or more, VDP equals HVC. The operation of this case is the same as the conventional system as shown in FIG. 74C. Incidentally, the technique for driving the plate voltage has been explained in relation to the embodiments previously mentioned.

Figure 74D:
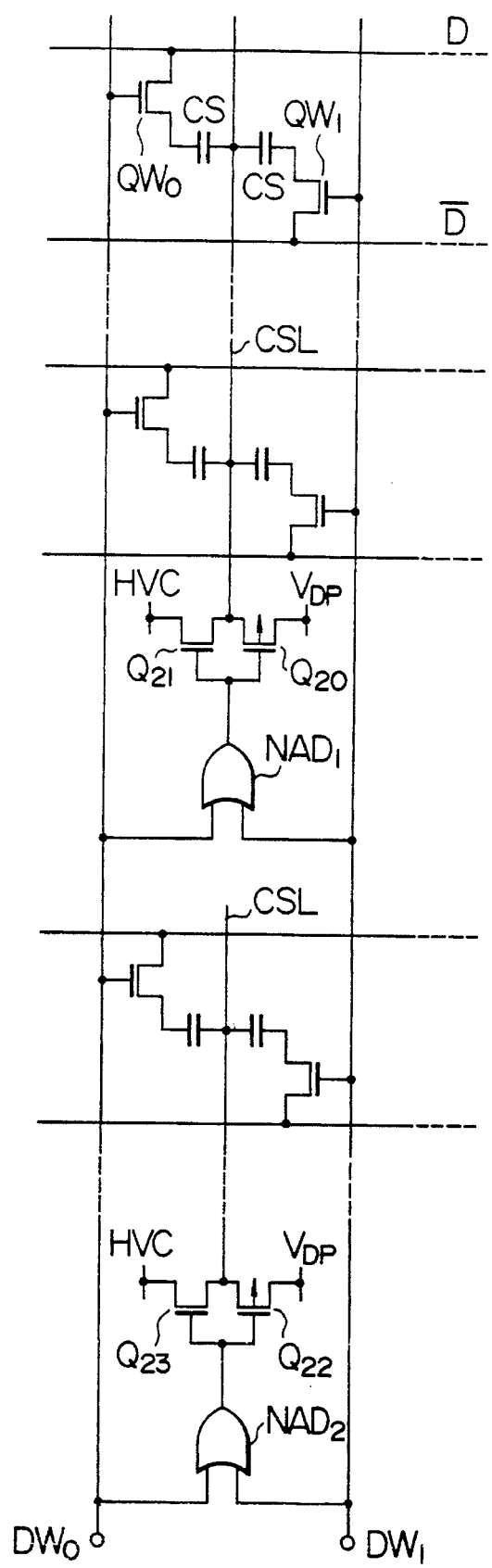
Figure 74E:
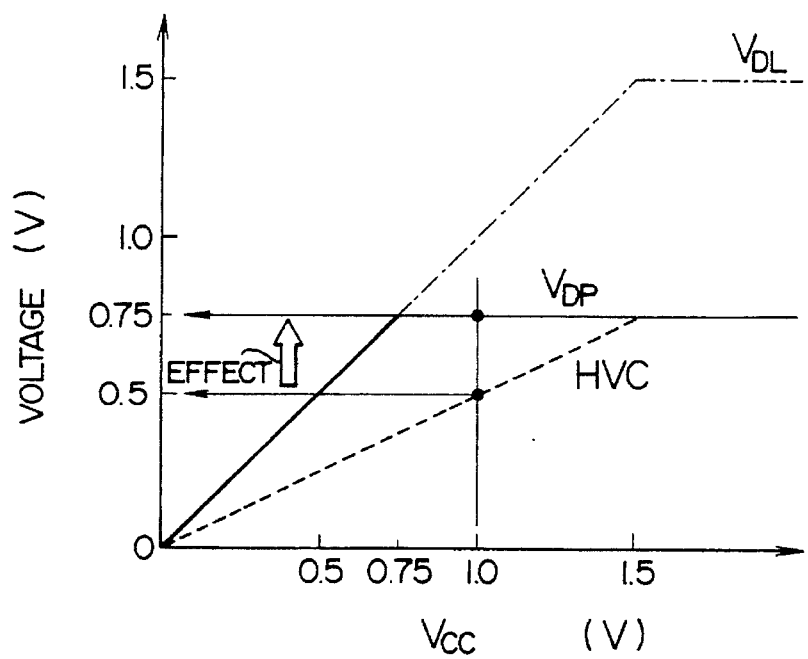
Figure 74F:
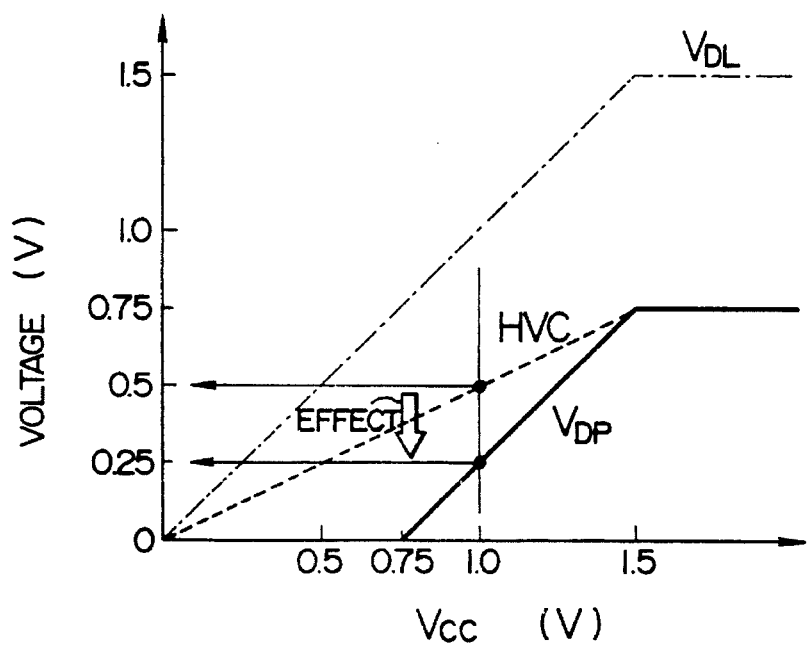

In order to drive the plate voltage for dummy word lines at a high speed, as shown in FIG. 74D, a driver consisting of MOS transistors Q20 and Q21 (Q22 and Q23) may be provided on the way of a plate driving line CSL to use signals from the dummy word lines DW1 and DW2 as switching signals through gates NAD1 and NAD2. Q20, Q21, Q22, Q23, NAD1 and NAD2 are arranged cyclically in the memory. But they may be arranged collectively outside the memory array. Although each of NAD1 and NAD2 of FIG. 74D is constituted by an OR circuit, it may be constituted by a NOR circuit and an inverter. Further the dummy cell may be in any optional format. Specifically, with the plate voltage for the dummy word lines set at a fixed voltage (VP) as usual, the dummy word line DW0 may be varied from VDH (1.5 V) to VSS (0 V) when the data line voltage immediately after the precharging becomes HVC (0.5 V). Otherwise, with a MOS transistor for writing provided between CS' and QW0, HVC (1.5 V) may be written.

The voltage of VDP may be generated by boosting VDL or reducing an external power supply voltage. Further, the sense amplifier driving transistors QP1, QP2, QN1 and QN2 may be P channel MOS transistors, N channel MOS transistors or bipolar transistors as long as the potential of the sense amplifier driving line can be varied from HVC to VDL on the side of CSP and can be varied from HVC to VSS on the side of CSN. By placing the substrate potential of Q3 and Q4 in the sense amplifier at the same potential level as the sense amplifier driving line CSP or placing that of Q1 and Q2 in the sense amplifier at the same potential level as the sense amplifier driving line CSN, the increase of the threshold voltage thereof due to the body effect can be prevented, thereby further improving the operation of the sense amplifiers. Placing the substrate potential in the sense amplifier at the same potential as the sense amplifier driving line can be realized by using the triple well structure of the substrate. Further, by commonly using the sense amplifier driving line CSP or CSN and a wiring for precharging, the precharging speed can be enhanced without increasing the wiring area. Moreover, by using the low Vth MOS transistors in the embodiment of FIG. 71A in the sense amplifier (Q1, Q2, Q3 and Q4), the operation at further reduced voltage can be carried out.

Accordingly, in accordance with this embodiment, by varying the operation amplitude of the circuit in accordance with the power supply voltage, a memory circuit which can operate at a comparatively low power supply voltage without injuring the speed performance can be realized. The idea in this embodiment can also be applied to the circuit components other than the sense amplifiers whereby an LSI memory with the performances of a high operation speed and reduced power consumption can be provided. Further, without being limited to the memory LSI, the other LSI such as a logic LSI which can operate at a comparatively low power supply voltage can also be provided.

Figure 75A:
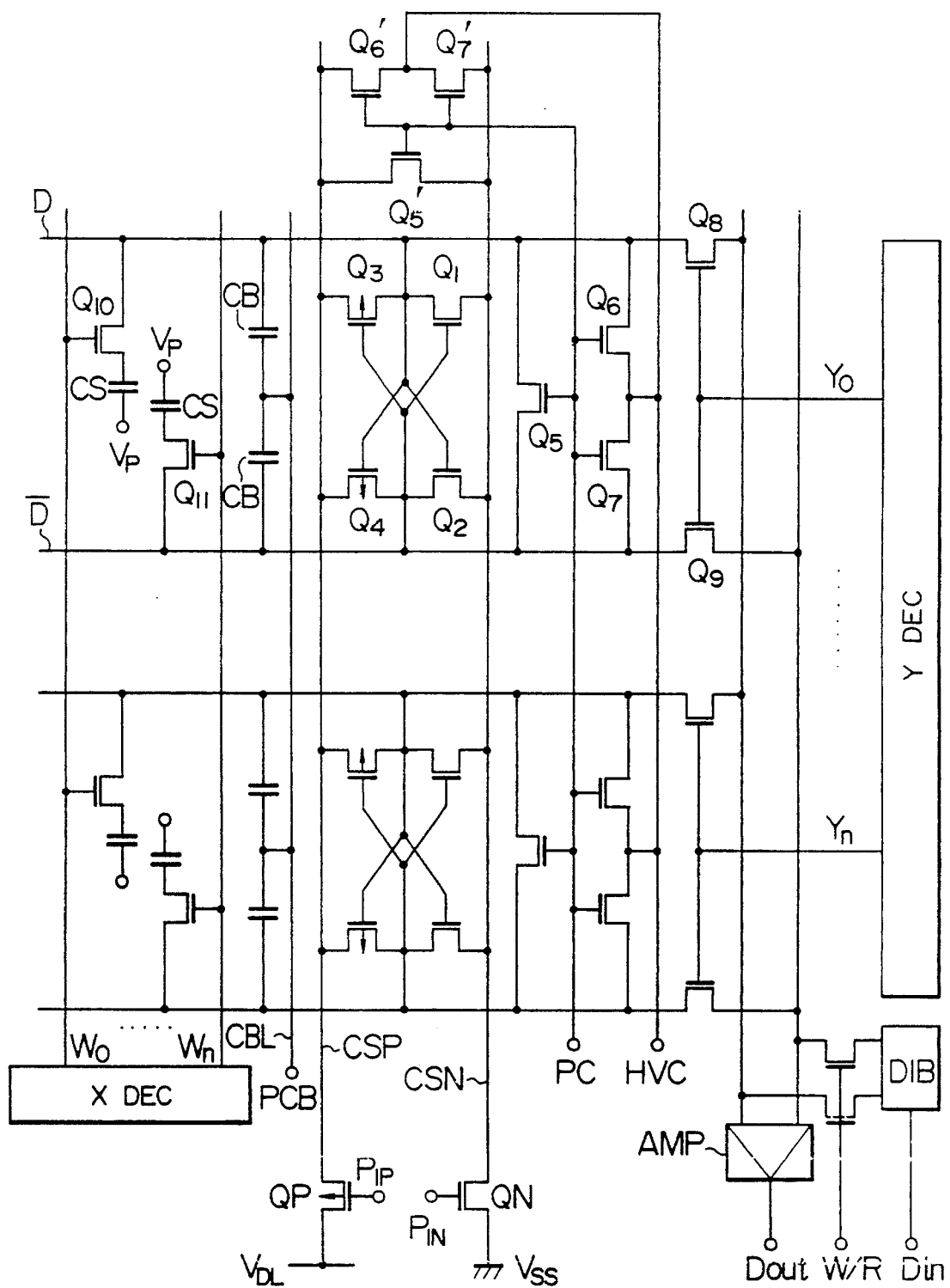

FIG. 75A shows the circuit arrangement of a further embodiment of the present invention in which a boosting capacitor CB is connected with each data line.

The operation of the circuit of FIG. 75A will be explained with reference to the waveform chart of FIG. 75B. When the voltage of a word line W0 is varied from VSS (0 V) to VDH (1.5 V), the data stored in a storage capacitor CS is read out on a data line D. Next, when the voltage of a boosting terminal PCB is varied from VSS (0 V) to VDL (1.0 V), both data lines D, $\overline{D}$ are boosted by 0.2 V or so (assuming that CB is about 70 fF). Next, when P1P is varied from VDL (1.0 V) to VSS (0 V), and P1N is varied from VSS (0 V) to VDL (1.0 V), sense amplifier driving transistors QP and QN are turned on so that a sense amplifier driving line CSP varies from HVC (0.5 V) to VDL (1.0 V) and another sense amplifier driving line CSN varies from HVC (0.5 V) to VSS (0 V). Thus, the gate-source (drain) voltage of the transistors Q1 and Q2 a sense amplifier becomes VDL/2+0.5 V or so, so that the sense amplifier is sufficiently turned on thereby amplifying the voltages on the data line $\overline{D}$ to VSS (0 V). Also, the gate-source (drain) voltage of the transistors Q3 and Q4 in the sense amplifier is increased thereby to amplify the data line D to VDL (1.0 V). The subsequent operation of the data lines is the same as the conventional system. In this case, the voltage at the boosting terminal PCB is varied from VDL (1.0 V) to VSS (0 V) before precharging the data lines.

Figure 75B:
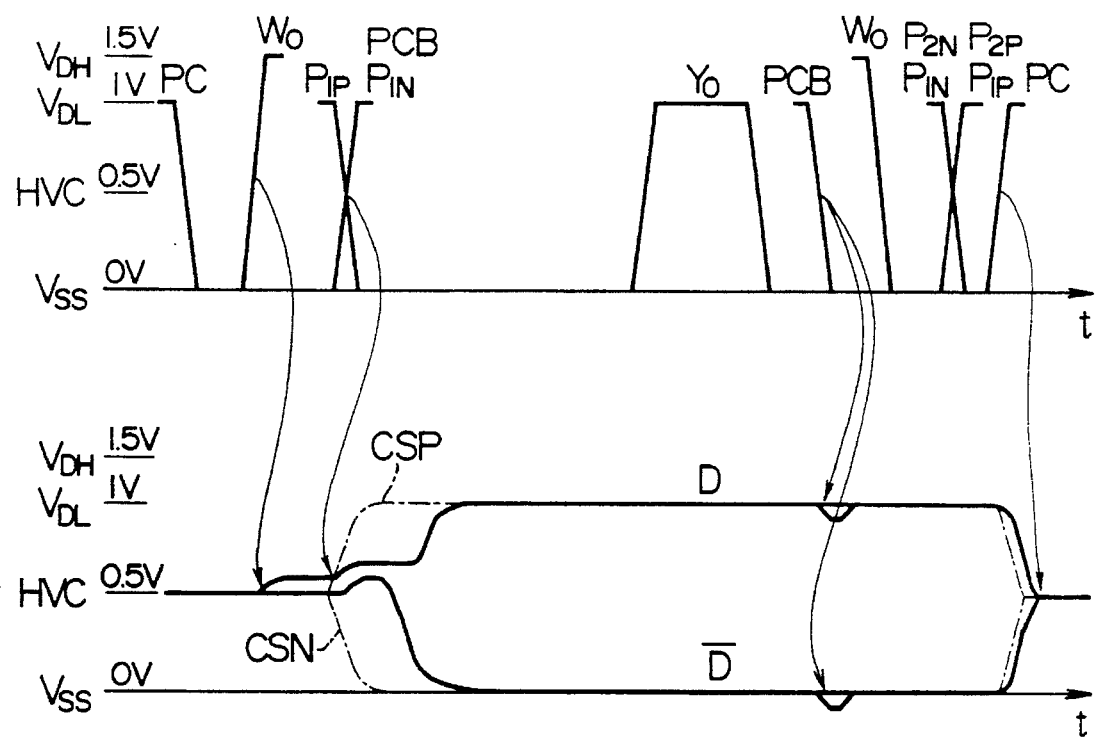

Any voltage value at the respective terminals other than the values shown in FIG. 75B as long as in driving the sense amplifier, a voltage difference between the data line voltage and VSS is VDL/2 or more. Further, the boosting voltage may be applied with the phase reverse to the case mentioned above so that both voltages of the data lines D and $\overline{D}$ are lowered. Also in this case, the above voltage difference in driving the sense amplifier has only to be required to be VDL/2 or more. The boosting line and the sense amplifier CSP (or CSN) may be commonly used. Further, the sense amplifier driving transistors QP and QN may be P channel MOS transistors, N channel MOS transistors or bipolar transistors as long as the potential of the sense amplifier driving line can be varied from HVC to VDL on the side of CSP and can be varied from HVC to VSS on the side of CSN. By placing the substrate potential of Q3 and Q4 in the sense amplifier at the same potential level as the sense amplifier driving line CSP or placing that of Q1 and Q2 in the sense amplifier at the same potential level as the sense amplifier driving line CSN, the increase of the threshold voltage thereof due to the body effect can be prevented, thereby further improving the operation of the sense amplifiers. Placing the substrate potential in the sense amplifier at the same potential as the sense amplifier driving line can be realized by using the triple well structure of the substrate. Moreover, by using the low Vth MOS transistors in the embodiment of FIG. 71A in the sense amplifier (Q1, Q2, Q3 and Q4), the operation at further reduced voltage can be carried out.

Accordingly, in accordance with this embodiment, a memory circuit which can operate at a comparatively low power supply voltage without injuring the speed performance can be realized. The idea in this embodiment can also be applied to the circuit components other than the sense amplifiers whereby an LSI memory with the performances of a high operation speed and reduced power consumption can be provided. Further, without being limited to the memory LSI, the other LSI such as a logic LSI which can operate at a comparatively low power supply voltage can also be provided.

Figure 76A:
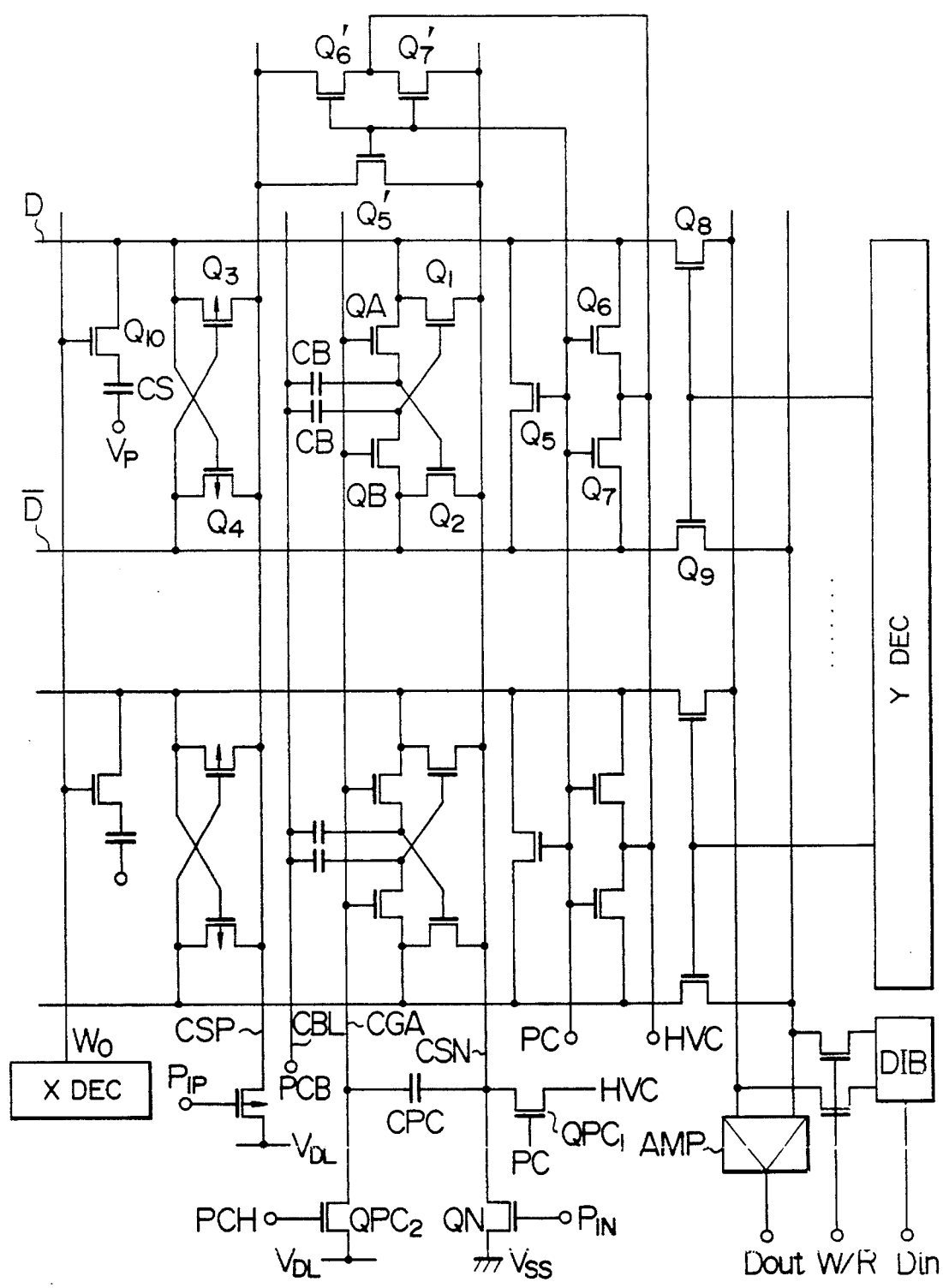

FIG. 76A shows the circuit arrangement of a further embodiment of the present invention in which the data line boosting capacitors CBs in FIG. 75A are connected with the gates of MOS transistors Q1 and Q2 constituting a sense amplifier and these gates and CBs are adapted to be separatable from the data lines by MOS transistors.

Figure 76B:
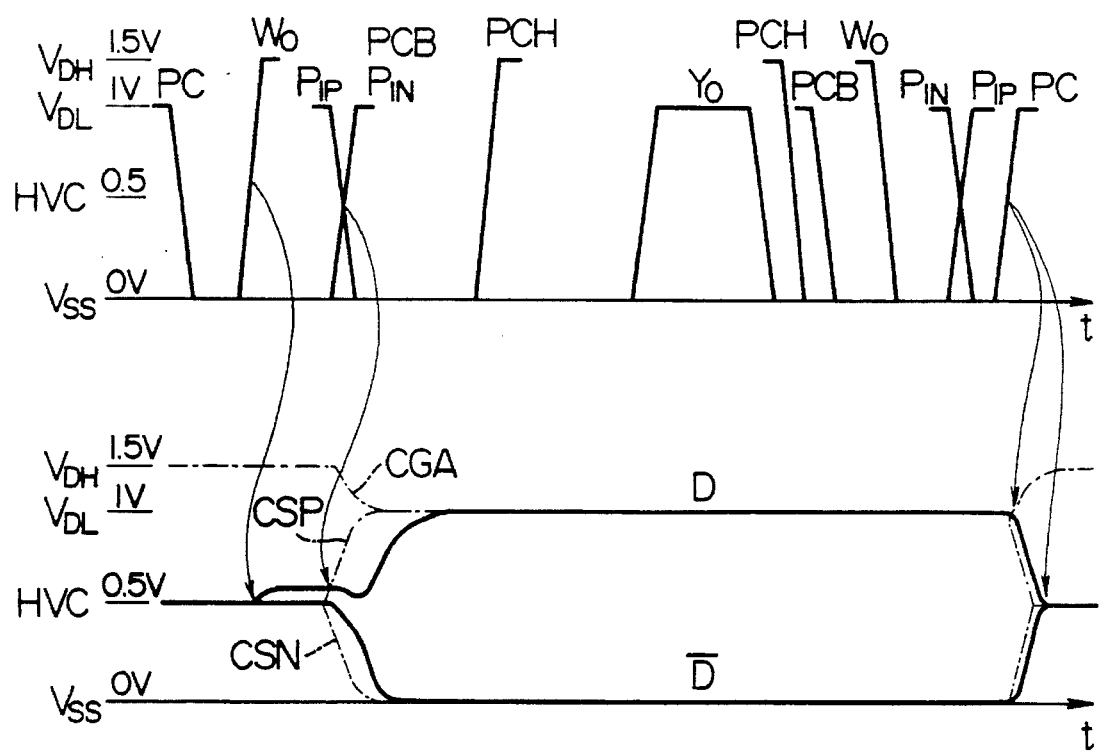

The operation of the circuit of FIG. 76A will be explained with reference to the waveform chart of FIG. 76B. As mentioned above, when the word line W0 becomes a high potential, data is read out on the data line D from the storage capacitor CS. Then, the gate voltage of QA and QB is held at substantially the same potential VDH as the word line W0 (The value of the voltage CGA may be a value which permits QA and QB to be sufficiently turned on in its precharging). Thus, the data on the data line D is sent to also the gate of Q1 through QA. Also the reference voltage of D is sent to the gate of Q2. Next, sense amplifier driving transistors QP and QN are turned on thereby to vary a sense amplifier driving line CSP from HVC (0.5 V) to VDC (1.0 V) and to vary another sense amplifier driving line CSN from HVC to VSS (0 V). Then, the gate voltage CGA of QA and QB is lowered to the potential of VDL by a capacitor CPC inserted between it and CSN so that QA and QB become their high resistance state, thereby electrically separating the data lines D and $\overline{D}$ from gates of Q1 and Q2. Thus, the boosting capacitors CBs boost only the gates of Q1 and Q2 so that a sufficient voltage can be obtained with a small capacitance than in the previous embodiment. Thereafter, when the voltage of a boosting terminal PCB is varied from VSS to VDL, both gate voltages of Q1 and Q2 are boosted to VD½+0.2 or more. Thus, Q1 and Q2 are sufficiently turned ON thereby to amplify the data line $\overline{D}$ to VSS at a high speed. Also, the gate-source voltage of Q3 becomes large thereby to amplify the data line D to VDL at a high speed. The subsequent operation of the data lines and the boosting terminal PCB is the same as in the previous embodiment. Incidentally, precharging of CGA is carried out through QPC2 during the period when the sense amplifier driving transistor QN is in the ON state. The precharging voltage is VDL (1.0 V). Thus, in precharging CSN, CGA is boosted to about VDH through its capacitive coupling with CPC.

Accordingly, in accordance with this embodiment, a memory circuit which can operate at a comparatively low power supply voltage without injuring the speed performance can be realized. The idea in this embodiment can also be applied to the circuit components other than the sense amplifiers whereby an LSI memory with the performances of a high operation speed and reduced power consumption can be provided. Further, without being limited to the memory LSI, the other LSI such as a logic LSI which can operate at a comparatively low power supply voltage can also be provided.

Figure 77A:
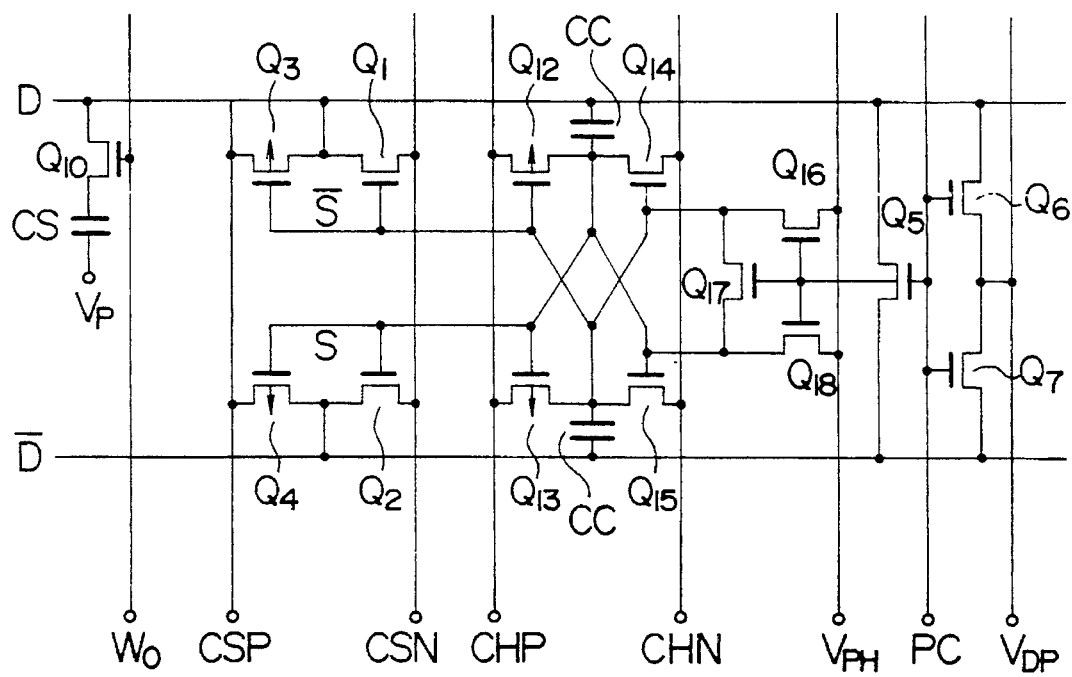

FIG. 77A shows the circuit arrangement of a further embodiment of the present invention. In this circuit arrangement, the sense amplifier is composed of two stages of a sense amplifier consisting of MOS transistors Q12 to Q15 coupled with each other through data lines and capacitors CC and the conventional sense amplifier consisting of MOS transistors Q1 to Q4. The former sense amplifier operates at a higher voltage VDH (1.5 V) than VDL (1.0 V) in the conventional sense amplifier. CHP and CHN are common driving lines for these sense amplifiers.

Figure 77B:
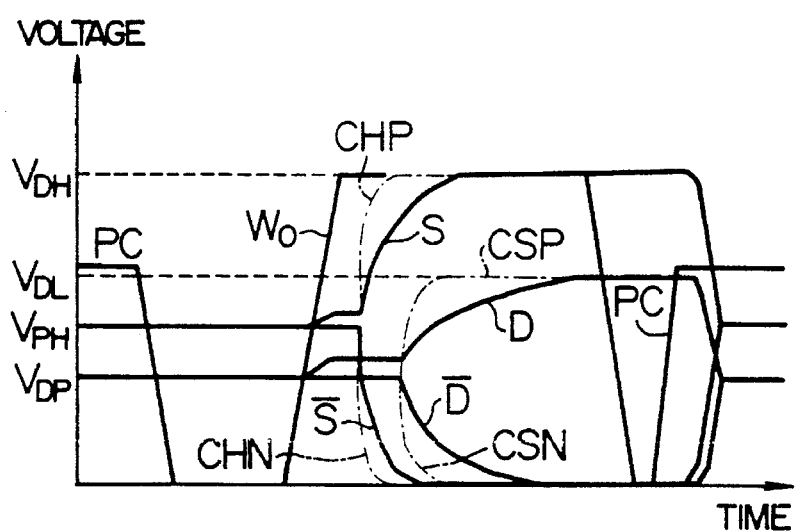

The operation of the circuit of FIG. 77A will be explained with reference to the waveform chart of FIG. 77B. As previously mentioned, when the word line W0 becomes a high potential, data is read out from the storage capacitor CS. The data (change of the potential on the data line) is sent to the sense amplifier consisting of Q12 to Q15 through the coupling capacitor CC. Next, when CHP is varied from VPH (0.75 V) to VDH (1.5 V), and CHN is varied from VPH (0.75 V) to VSS, the sense amplifier consisting of Q12 to Q15 starts the amplification in accordance with the data on the data line. Then, the gate-source voltage of Q12 to Q15 is 0.75 V which is a precharging voltage. This voltage is sufficiently higher than the threshold voltage 0.6 V of the MOS transistors and the capacitance involved at the output of the sense amplifier is ⅒ or so (only the capacitances of the gate and CC) of that on the data line so that the sense amplifier can carry out the amplification at a high speed. Thus, the output voltage of VSS (0 V) and VDH (1.5 V) are provided. Next, if CSP and CSN are varied to VDL and VSS as usual, the gate-source voltage in the transistors in the conventional sense amplifier is sufficiently higher than the threshold voltage thereof (1.5 V for NMOS Q2 and −1.0 V for PMOS Q3) since the input terminal of the conventional sense amplifier consisting of Q1 to Q4 is connected with the sense amplifier consisting of Q12 to Q15. Therefore, charging/discharging can be performed at a high speed for the data lines. The minimum value of the data line voltage amplitude in this embodiment is theoretically 0.6 V where the maximum value of the gate-source voltage of PMOSs (Q3, Q4) equals the threshold voltage thereof. Considering the operation speed, that voltage amplitude is actually about 0.8 V.

Further, in accordance with this embodiment, it is possible to set the low level of CHN at a negative value so that the gate-source voltage of PMOS can be further increased which permits the operation at a further reduced voltage. For example, if the low level of CHN is set at −0.5 V, with the gate-source voltage of 0.8 V which allows a normal operation, the data line voltage amplitude can be reduced to 0.3 V which is lower than the threshold voltage of the transistors in the sense amplifier.

Further, also in this embodiment, during the precharting time, the data lines are short-circuited and precharged by the precharging signal PC as in the embodiment of e.g. FIG. 71A, but further in this embodiment, the output terminal of the sense amplifier consisting of Q12 to Q15 is also short-circuited and precharged. To this end, transistors Q16, Q17 and Q18 are provided. The precharging voltage is 0.75 V which is ½ of VDH (1.5 V). Therefore, the amplitude of the precharging signal PC may be 1.35 V or more.

In this way, in accordance with this embodiment, even if the voltage amplitude of the data lines is smaller than the threshold voltage of the transistors in the sense amplifier for driving the data lines, the gate-source voltage thereof in driving can be made sufficiently higher than the threshold voltage, which makes it possible to realize the high speed operation and reduced power consumption. Thus, in accordance with this embodiment, a memory circuit which can operate at a substantially low power supply voltage without injuring the speed performance thereof can be provided. Further, the gist of the present invention is that by decreasing the voltage amplitude of signal lines (data lines in this embodiment) with large load capacitance, the circuit for driving the signal lines is driven with a voltage amplitude which is sufficiently larger than the operating threshold voltage of the elements constituting the sense amplifier. Therefore, the idea in this embodiment can also be applied to the circuit components other than the sense amplifiers whereby an LSI memory with the performances of a high operation speed and reduced power consumption can be provided. Further, without being limited to the memory LSI, the other LSI such as a logic LSI which can operate at a comparatively low power supply voltage can also be provided. Moreover, by optimizing the combination of a small or large voltage amplitude and a threshold voltage, an LSI with the performances of high speed operation and reduced power consumption can be provided. For example, by using depletion type MOS-FETs for a part of Q1 to Q4, further high speed operation can be realized.

Figure 78A:
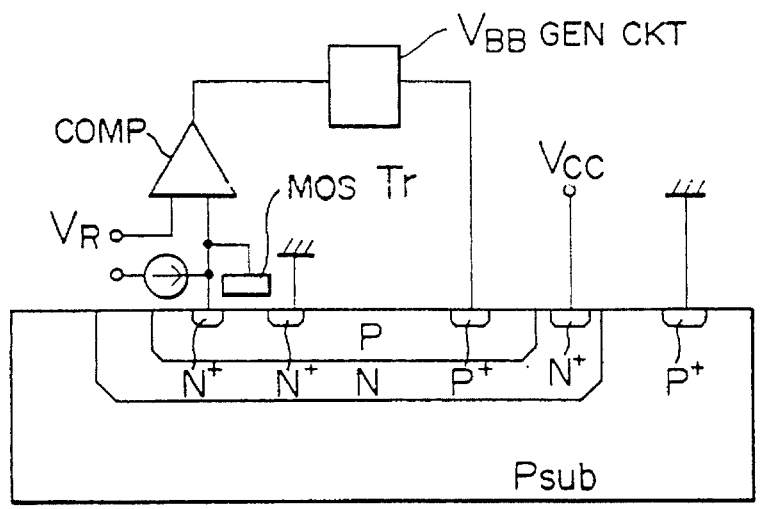

FIG. 78A is a schematic view of the circuit arrangement and section of a further embodiment of the present invention. This circuit serves to control the substrate voltage VBB of transistors in a sense amplifier thereby to optimize the threshold voltage VT thereof for operation. To this end, this circuit is composed of an MOS transistor for monitoring the threshold voltage, a reference voltage (VR) generating circuit, a comparator circuit COMP and a substrate voltage (VBB) generating circuit.

Figure 78B:
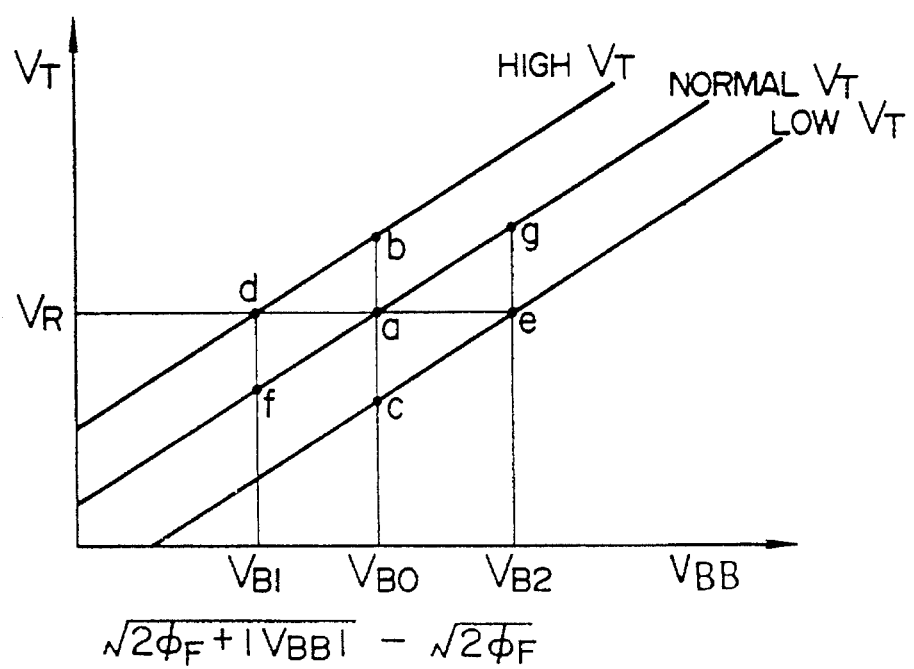

The operation of FIG. 78A will be explained with reference to FIG. 78B which represents a relation between VBB and VT. The threshold voltage VT of a MOS transistor is varied by varying the substrate voltage VBB thereof. For example, as seen from FIG. 78B, in the case of NMOS, if VBB is increased in its negative direction, the threshold voltage VT is enhanced whereas if VBB is decreased in the same direction, VT is lowered. In order to operate a sense amplifier at a low voltage (1.0 V or so) and also at a high speed, the threshold voltage may be lowered. To this end, in accordance with this embodiment, as seen from FIG. 78A, the threshold voltage of a MOS transistor in diode-connection is monitored through its constant current driving, the monitored threshold voltage is compared with the reference voltage VR by the comparator circuit COMP, and an output voltage from the VBB generating circuit is controlled by the output from the comparator circuit so that the threshold voltage of the monitoring MOS transistor equals the reference voltage VR. Thus, even if the threshold voltage of the MOS transistor is located at a point b higher than a point a indicative of an optimum value due to fabrication variation, by lowering VBB to VB1, the threshold voltage can be shifted so as to be equal to VR. Further, if the threshold voltage is located at a lower point (point c), by enhancing VBB to VB2, the threshold voltage can be also shifted to a point e so as to be equal to VR. Therefore, in accordance with this embodiment, a sense amplifier stabilized against fabrication variation can be provided. Further, by setting VR at (a point f) lower than (the standard point a) during the operation time and setting it at (a higher point g) during the stand-by time, the high speed operation during the operation time and the reduced power consumption can be simultaneously realized, Moreover, with the well provided with the same circuit, during the operation time, VR is set negative for NMOS and positive for PMOS in order to place their threshold voltage in a depletion type whereas during the stand-by time, it is set positive for NMOS and negative for PMOS to place their threshold voltage in an enhancement type which is normal. Thus, the high speed operation and low voltage amplitude can be further advanced. In the case where the substrate voltage is required to be varied at a high speed because the operation cycle is short, the triple well structure may be used to separate the substrate part corresponding to the sense amplifier section whereby reduced power consumption can be realized also for the VBB generating circuit.

Figure 78C:
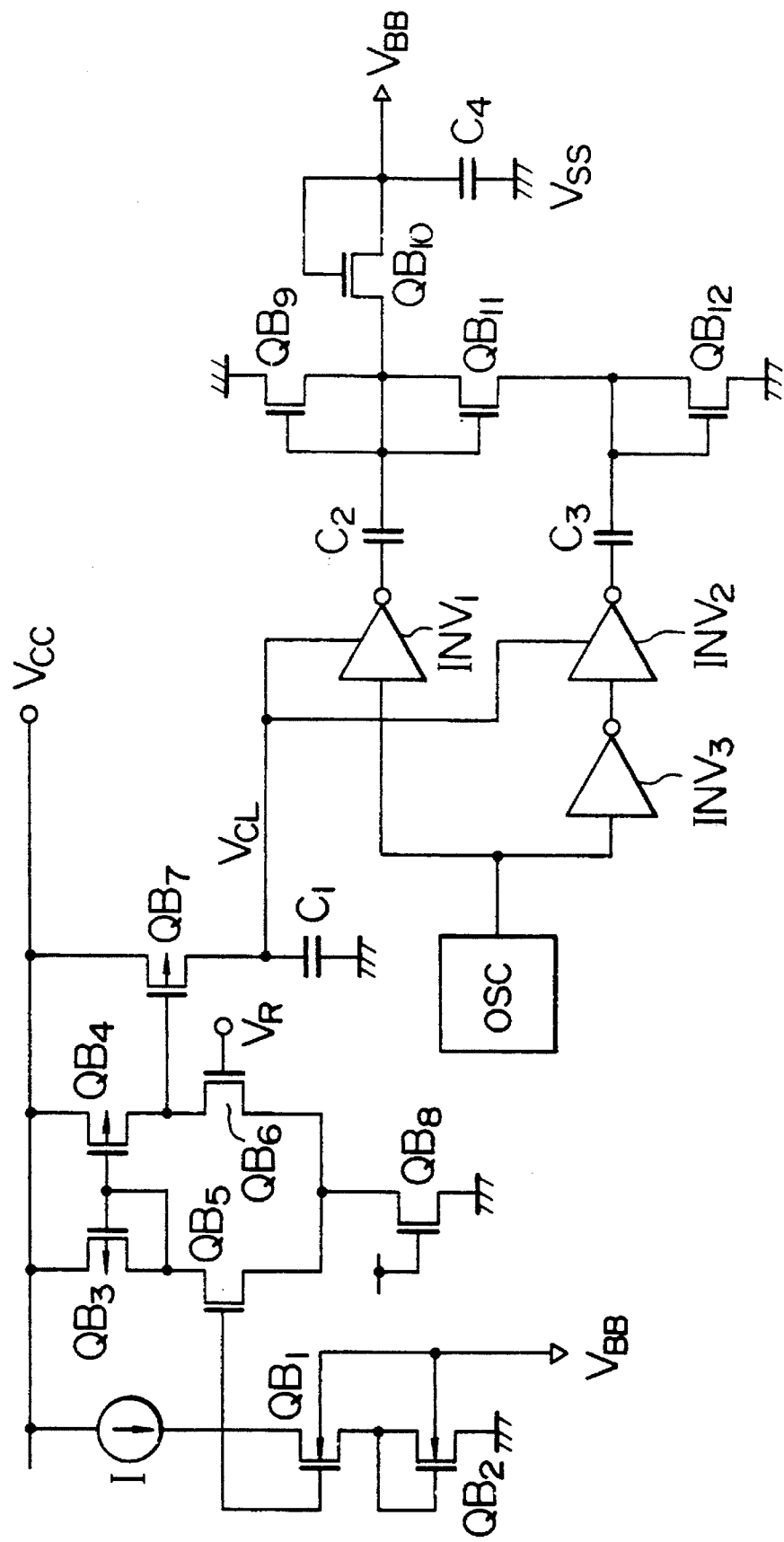

FIG. 78C shows a concrete structure of FIG. 78A. In FIG. 78C, QB1 and QB2 are MOS transistors for monitoring; QB3 to QB8 constitute a comparator; OSC is an oscillating circuit for the VBB generating circuit; and INV1, INV2, C2, C3 and QB9 to QB12 constitute the VBB generating circuit. It should be noted that two stages of monitoring MOS transistors are connected for the purpose of an optimum bias for the comparator circuit. Correspondingly, VR is required to be twice as large as an objective threshold voltage. Incidentally, the number of the stages of the monitoring transistors is not limited but may be any number which permits an input voltage for the comparator circuit to be optimized. Further, the rectifying circuit (C2, C3 and QB9 to QB12) in the VBB generating circuit is adapted to generate a double voltage in order to extend the control range of the threshold voltage, but this may be changed in accordance with the rate of change for the operation voltage of the sense amplifier or the substrate voltage. In this way, in accordance with this embodiment, the threshold voltage in the sense amplifier can be stabilized regardless of fabrication variation and also can be varied in the operation time and stand-by time so that DRAM with the characteristics of a high speed and reduced power consumption can be provided.

Accordingly, in accordance with this embodiment, a memory circuit which can operate at a comparatively low power supply voltage without injuring the speed performance can be realized. The idea in this embodiment can also be applied to the circuit components other than the sense amplifiers whereby an LSI memory with the performances of a high operation speed and reduced power consumption can be provided. Further, without being limited to the memory LSI, the other LSI such as a logic LSI which can operate at a comparatively low power supply voltage can also be provided. Incidentally, the gist of the present invention is that means of detecting the operation threshold voltage of the elements is provided and the threshold voltage is controlled by an output from the means so that it is an optimum value for circuit operation and so the circuit arrangement should not be limited to the arrangement mentioned above.

The present invention has been explained in relation to DRAM, but may be applied to an LSI in any form including a random access memory (RAM) (dynamic or static), a read only memory (ROM), a logic LSI such as a microcomputer, etc. Further, the elements or devices to be used may be bipolar transistors, MOS transistors, the combination thereof, or transistors made of the material e.g. GaAs other than Si.

Accordingly, in accordance with the present invention, a memory circuit which can operate at a comparatively low power supply voltage without injuring the speed performance can be realized. This memory circuit can be used as a memory for battery back-up or battery operation. The idea in this embodiment can also be applied to the circuit components other than the sense amplifiers whereby an LSI memory with the performances of a high operation speed and reduced power consumption can be provided. Further, without being limited to the memory LSI, the other LSI such as a logic LSI which can operate at a comparatively low power supply voltage can also be provided.

Further, in accordance with the present invention, one chip ULSI which can operate in accordance with a wide range of power supply voltage can be realized. Also, the ULSI with reduced power consumption can be accomplished. One chip ULSI which can correspond to a number of input/output levels can also be realized.

It is further understood by those skilled in the art that the foregoing description is preferred embodiments of the disclosed devices and that various changes and modifications may be made in the invention without departing from the spirit and scope thereof.

We claim:

1. A semiconductor device comprising:
    a plurality of data line pairs, a plurality of word lines intersecting said plurality of data line pairs, memory cells located at the intersecting points, sense amplifiers each for amplifying a difference voltage of a data line pair of said plurality of data line pairs to a first voltage in a term of an amplifying operation, and a common driving line pair for driving said sense amplifiers;
    wherein the voltage amplitude between said common driving line pair is made larger than the maximum value of said first voltage between the data line pair in a part of the term of the amplifying operation.

2. A semiconductor device according to claim 1:
    wherein the common driving line pair is one of a plurality of common driving line pairs and, wherein the voltage of one of said common driving line pairs is boosted by boosting capacitors.

3. A semiconductor device according to claim 1 further comprising:

first, second and third power supply lines, and three switches connecting said first, second and third power supply lines with said common driving line pair respectively;

wherein the voltage between said first and second power supply lines is larger than the voltage between said second and third power supply lines which is substantially equal to the maximum value of said first voltage between the data line pair.

4. A semiconductor device according to claim 3, wherein one of the voltages of the power supply lines is generated on the chip.

5. A semiconductor device comprising:

a plurality of data lines, a plurality of word lines intersecting the plurality of data lines, memory cells located at the intersecting points, sense amplifiers each for amplifying a memory cell signal read out on each of the data lines, common driving lines for driving said sense amplifiers, and an internal voltage generator to generate a first internal voltage;

wherein said first internal voltage is substantially an intermediate value between a first external voltage and a second external voltage when the difference between the first and second external voltages is larger than a first reference voltage, whereas the difference between the first internal voltage and one of the external voltages is made constant when the difference between the first and the second external voltages is larger than a second reference voltage.

6. A semiconductor device comprising:

a plurality of data lines, a plurality of word lines intersecting the plurality of data lines, memory cells located at the intersecting points, sense amplifiers each for amplifying a memory cell signal read out on each of the data lines, and common driving lines for driving said sense amplifiers;

wherein when said sense amplifiers start to operate, voltage of the data lines is varied to effectively boost an absolute value of the gate-source voltage of transistors in each of the sense amplifiers.

7. A semiconductor device according to claim 6, wherein said voltage of the data lines is boosted by capacitors.

8. A semiconductor device comprising:

a plurality of data lines, a plurality of word lines intersecting the plurality of data lines, memory cells located at the intersecting points, sense amplifiers each for amplifying a memory cell signal read out on each of the data lines, and common driving lines for driving said sense amplifiers;

wherein said sense amplifiers operate with a voltage amplitude higher than that of the data lines and each of said sense amplifiers includes an inverter which operates with a voltage amplitude as that of the data lines.

9. A semiconductor device comprising:

a plurality of data lines, a plurality of word lines intersecting the plurality of data lines, memory cells located at the intersecting points, sense amplifiers each for amplifying a memory cell signal read out on each of the data lines, and common driving lines for driving said sense amplifiers;

wherein a threshold voltage of each of the transistors in each of the sense amplifiers is varied in accordance with the operating condition of the sense amplifiers.

10. A semiconductor device according to claim 9, wherein said threshold voltage is varied dynamically.

11. A semiconductor device according to claim 10, wherein said threshold voltage is varied in range including 0 V.

12. A semiconductor device according to claim 10, wherein said threshold voltage is varied by varying a substrate voltage.

* * * * *